(12) United States Patent
Lee et al.

(10) Patent No.: US 12,384,810 B2
(45) Date of Patent: Aug. 12, 2025

(54) ORGANOMETALLIC COMPOUND AND LIGHT-EMITTING DEVICE INCLUDING ORGANOMETALLIC COMPOUND

(71) Applicant: Samsung Display Co., Ltd., Yongin-si (KR)

(72) Inventors: Hyunjung Lee, Yongin-si (KR); Soobyung Ko, Yongin-si (KR); Haejin Kim, Yongin-si (KR); Sujin Shin, Yongin-si (KR); Mina Jeon, Yongin-si (KR); Junghoon Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 885 days.

(21) Appl. No.: 17/563,330

(22) Filed: Dec. 28, 2021

(65) Prior Publication Data
US 2022/0246868 A1 Aug. 4, 2022

(30) Foreign Application Priority Data
Jan. 18, 2021 (KR) .................. 10-2021-0007031

(51) Int. Cl.
*C07F 15/00* (2006.01)
*H10K 50/11* (2023.01)
(Continued)

(52) U.S. Cl.
CPC ....... *C07F 15/0086* (2013.01); *H10K 85/346* (2023.02); *H10K 50/11* (2023.02);
(Continued)

(58) Field of Classification Search
CPC ............ H01L 51/0077; H01L 51/0078; H01L 51/0079; H01L 51/008; H01L 51/0081;
(Continued)

(56) References Cited

U.S. PATENT DOCUMENTS

| | | | |
|---|---|---|---|
| 7,652,287 B2 * | 1/2010 | Jeong | .................. H01L 29/7869 257/E29.151 |
| 9,059,412 B2 | 6/2015 | Zeng et al. | |

(Continued)

FOREIGN PATENT DOCUMENTS

| | | |
|---|---|---|
| CN | 103102372 | 5/2013 |
| CN | 111952482 | 11/2020 |

(Continued)

OTHER PUBLICATIONS

English translation of KR-20180074644-A obtained from Google Patents (Year: 2018).*

*Primary Examiner* — Elizabeth M. Dahlburg
*Assistant Examiner* — Braelyn R Watson
(74) *Attorney, Agent, or Firm* — KILE PARK REED & HOUTTEMAN PLLC

(57) ABSTRACT

Provided are an organometallic compound represented, a light-emitting device including the organometallic compound, and an electronic apparatus including the light-emitting device. The organometallic compound is represented by Formula 1, which is defined in the specification:

(Continued)

[Formula 1]

20 Claims, 3 Drawing Sheets

(51) Int. Cl.
  *H10K 50/12* (2023.01)
  *H10K 85/30* (2023.01)
  *H10K 101/10* (2023.01)
  H10K 59/12 (2023.01)
  H10K 59/80 (2023.01)
(52) U.S. Cl.
  CPC .............. *H10K 50/12* (2023.02); *H10K 59/12* (2023.02); *H10K 59/8792* (2023.02); *H10K 2101/10* (2023.02)
(58) Field of Classification Search
  CPC .............. H01L 51/0082; H01L 51/0083; H01L 51/0084; H01L 51/0085; H01L 51/0086; H01L 51/0087; H01L 51/0088; H01L 51/0089; H01L 51/0091; H01L 51/0092; H10K 85/30–351; H10K 85/371; H10K 85/381; H10K 85/346; H10K 50/11; H10K 50/12; H10K 2101/10; H10K 59/8792; H10K 59/12; C09K 11/06; C09K 2211/182–188; C09K 2211/185; C07F 5/00; C07F 5/003; C07F 5/06–069; C07F 7/00; C07F 7/003; C07F 7/22–28; C07F 9/00; C07F 9/005; C07F 15/0086; C07B 2200/05
  See application file for complete search history.

(56) References Cited

U.S. PATENT DOCUMENTS

| | | | |
|---|---|---|---|
| 9,238,668 | B2 | 1/2016 | Li et al. |
| 9,318,725 | B2 | 4/2016 | Li |
| 9,425,415 | B2 | 8/2016 | Li et al. |
| 9,461,254 | B2 | 10/2016 | Tsai et al. |
| 9,698,359 | B2 | 7/2017 | Li et al. |
| 9,899,614 | B2 | 2/2018 | Li et al. |
| 10,340,466 | B2 | 7/2019 | Lin et al. |
| 2007/0196691 | A1* | 8/2007 | Ikemizu ............. C09K 11/06 313/506 |
| 2009/0292080 | A1* | 11/2009 | Stossel ............. H10K 85/342 546/4 |
| 2012/0302753 | A1 | 11/2012 | Li et al. |
| 2013/0048963 | A1 | 2/2013 | Beers et al. |
| 2013/0168656 | A1 | 7/2013 | Tsai et al. |
| 2014/0027733 | A1 | 1/2014 | Zeng et al. |
| 2014/0364605 | A1 | 12/2014 | Li et al. |
| 2017/0098788 | A1* | 4/2017 | Lee .................. C07F 15/0033 |
| 2019/0081252 | A1* | 3/2019 | Kim .................. H10K 50/81 |
| 2020/0119289 | A1 | 4/2020 | Lin et al. |
| 2020/0365816 | A1 | 11/2020 | Kim et al. |

FOREIGN PATENT DOCUMENTS

| | | | | |
|---|---|---|---|---|
| KR | 2018074644 A | * | 7/2018 | ......... H01L 27/3211 |
| KR | 10-2019-0030585 | | 3/2019 | |

* cited by examiner

ORGANOMETALLIC COMPOUND AND LIGHT-EMITTING DEVICE INCLUDING ORGANOMETALLIC COMPOUND

CROSS-REFERENCE TO RELATED APPLICATION(S)

This application claims priority to and benefits of Korean Patent Application No. 10-2021-0007031 under 35 U.S.C. § 119, filed on Jan. 18, 2021 in the Korean Intellectual Property Office, the entire contents of which are incorporated herein by reference.

BACKGROUND

1. Technical Field

Embodiments relate to an organometallic compound and a light-emitting device including the organometallic compound.

2. Description of the Related Art

Among light-emitting devices, organic light-emitting devices (OLEDs) are self-emission devices that, as compared with devices in the art, have wide viewing angles, high contrast ratios, short response times, and have excellent characteristics in terms of brightness, driving voltage, and response speed.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state, thereby generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound having excellent colorimetric purity and long lifespan and a light-emitting device including the organometallic compound.

Additional aspects will be set forth in part in the description which follows and, in part, will be apparent from the description, or may be learned by practice of the embodiments of the disclosure.

According to an embodiment, an organometallic compound may be represented by Formula 1.

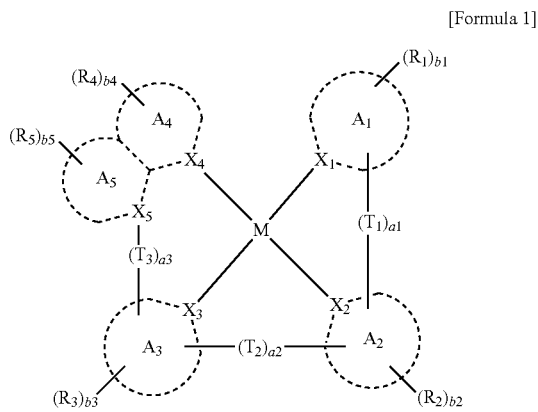

[Formula 1]

In Formula 1,

M may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_3$ may each independently be C or N, $X_4$ and $X_5$ may each be C, $A_1$ to $A_5$ may each independently be a $C_3$-$C_{60}$ carbocyclic group or a $C_1$-$C_{60}$ heterocyclic group, $T_1$ to $T_3$ may each independently be a single bond, a double bond, *—$N(Z_{11})$—*', *—$B(Z_{11})$—*', *—$P(Z_{11})$—*', *—$C(Z_{11})(Z_{12})$—*', *—$Si(Z_{11})(Z_{12})$—*', *—$Ge(Z_{11})(Z_{12})$—*', *—S—*', *—Se—*', *—O—*, *—C(=O)—*', *—S(=O)—*', *—$S(=O)_2$—*', *—$C(Z_{11})$=*', *=C($Z_{11}$)—*', *—$C(Z_{11})$=C($Z_{12}$)—*', *—C(=S)—*', or *—C≡C—*', and * and *' each indicate a binding site to an adjacent atom, a1 to a3 may each independently be an integer from 0 to 3, $R_1$ to $R_5$ and $Z_{11}$ and $Z_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b1 to b5 may each independently be an integer from 0 to 10, when b4 is 2 or greater, at least two $R_4$(s) of $R_4$(s) in the number of b4 may optionally be combined to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b5 is 2 or greater, at least two $R_5$(s) of $R_5$(s) in the number of b5 may optionally be combined to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and In an embodiment, a bond between $X_1$ and M and a bond between $X_4$ and M may each be a coordinate bond, and a bond between $X_2$ and M and a bond between $X_3$ and M may each be a covalent bond.

In an embodiment, $X_1$ may be N, and $X_2$ and $X_3$ may each be C.

In an embodiment, $A_1$ may be a $X_1$-containing 6-membered ring, $A_4$ may be a $X_4$-containing 5-membered ring or may be a $X_4$-containing 5-membered ring to which at least one 5-membered ring is condensed, and $A_5$ may be a $X_5$-containing 5-membered ring.

In an embodiment, the $X_1$-containing 6-membered ring of $A_1$ may be a benzene group, a pyridine group, or a pyrimidine group. The $X_4$-containing 5-membered ring of $A_4$, the 5-membered ring which may be condensed to the $X_4$-containing 5-membered ring of $A_4$, and the $X_5$-containing 5-membered ring of $A_5$ may each independently be a pyrrole group, a pyrazole group, an imidazole group, a triazole group, a furan group, an oxazole group, an isoxazole group, a thiazole group, an isothiazole group, an oxadiazole group, or a thiadiazole group.

In an embodiment, the organometallic compound may emit blue light having a maximum emission wavelength in a range of about 400 nanometers (nm) to about 490 nm.

According to an embodiment, a light-emitting device may include a first electrode, a second electrode facing the first electrode, and an interlayer disposed between the first electrode and the second electrode. The interlayer may include an emission layer and at least one organometallic compound represented by Formula 1 above.

In an embodiment, the first electrode may be an anode, the second electrode may be a cathode, and the interlayer may further include a hole transport region between the first electrode and the emission layer and an electron transport region between the emission layer and the second electrode. The hole transport region may include a hole injection layer, a hole transport layer, an emission auxiliary layer, an electron blocking layer, or any combination thereof. The electron transport region may include a buffer layer, a hole blocking layer, an electron control layer, an electron transport layer, an electron injection layer, or any combination thereof.

In an embodiment, the emission layer may include the at least one organometallic compound represented by Formula 1.

In an embodiment, the at least one organometallic compound represented by Formula 1 comprised in the emission layer may serve as a phosphorescent dopant that emits phosphorescence from the emission layer, or the at least one organometallic compound represented by Formula 1 comprised in the emission layer may serve as a delayed fluorescence dopant that emits delayed fluorescence from the emission layer.

In an embodiment, the emission layer may include a host and a dopant, and the dopant may include the at least one organometallic compound represented by Formula 1.

According to an embodiment, an electronic apparatus may include the light-emitting device.

In an embodiment, the electronic apparatus may further include a thin-film transistor. The thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color-conversion layer, a touchscreen layer, a polarization layer, or any combination thereof.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
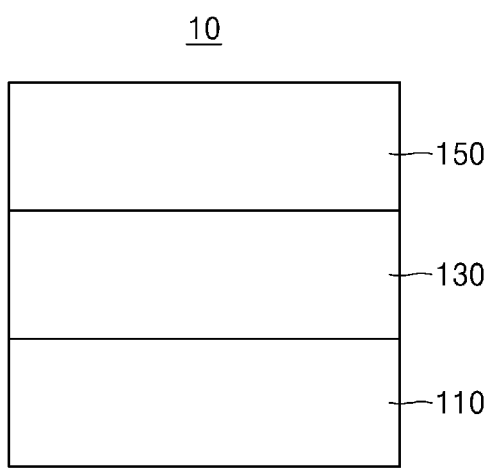
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

According to an embodiment, an organometallic compound may be represented by Formula 1:

[Formula 1]

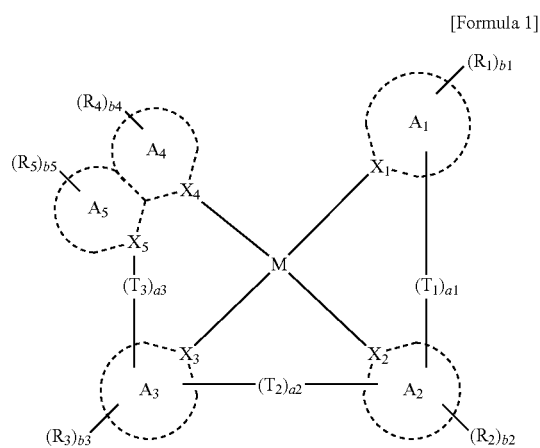

In Formula 1, M may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In an embodiment, in Formula 1, M may be Pt, Pd, Cu, Ag, Au, Rh, Ir, Ru, or Os.

In embodiments, M in Formula 1 may be Pt, but embodiments are not limited thereto.

In Formula 1, $X_1$ to $X_3$ may each independently be C or N, and $X_4$ and $X_5$ may each be C.

In an embodiment, in Formula 1, $X_1$ may be N, and $X_2$ and $X_3$ may each be C, but embodiments are not limited thereto.

In an embodiment, in Formula 1, a bond between $X_1$ and M and a bond between $X_4$ and M may each be a coordinate bond, and a bond between $X_2$ and M and a bond between $X_3$ and M may each be a covalent bond.

In Formula 1, $A_1$ to $A_5$ may each independently be a $C_3$-$C_{60}$ carbocyclic group or a $C_1$-$C_{60}$ heterocyclic group.

In an embodiment, in Formula 1, $A_1$ may be a $X_1$-containing 6-membered ring, $A_4$ may be a $X_4$-containing 5-membered ring or may be a $X_4$-containing 5-membered ring to which at least one 5-membered ring is condensed, and $A_5$ may be a $X_5$-containing 5-membered ring.

In embodiments, the $X_1$-containing 6-membered ring of $A_1$ may be a benzene group, a pyridine group, or a pyrimidine group, and the $X_4$-containing 5-membered ring of $A_4$, the 5-membered ring which may be condensed to the $X_4$-containing 5-membered ring of $A_4$, and the $X_5$-containing 5-membered ring of $A_5$ may each independently be a pyrrole group, a pyrazole group, an imidazole group, a triazole group, a furan group, an oxazole group, an isoxazole group, a thiazole group, an isothiazole group, an oxadiazole group, or a thiadiazole group, but embodiments are not limited thereto.

In an embodiment, in Formula 1, $A_1$ to $A_5$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a tetrazole group, a benzopyrazole group, a benzimidazole group, a benzotriazole, a benzoxazole group, a benzothiazole group, a benzoxadiazole group, a benzothiadiazole group, an indazole group, an imidazopyridine group, an imidazopyrimidine group, an imidazopyrazine group, an imidazopyridazine group, a pyrazolopyridine group, a pyrazolopyrimidine group, a pyrazolopyrazine group, a pyrazolopyridazine group, a 5,6,7,8-tetrahydroisoquinoline group, a 5,6,7,8-tetrahydroquinoline group, or an imidazooxazole group.

In an embodiment, the group represented by

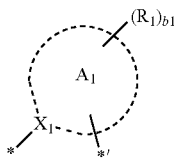

in Formula 1 may be a group represented by one of Formulae A1-1 to A1-3:

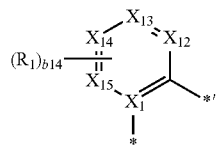

A1-1

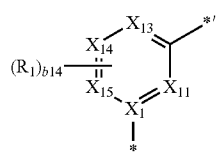

A1-2

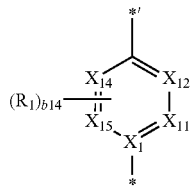

A1-3

In Formulae A1-1 to A1-3, $X_1$ and $R_1$ may be respectively the same as described in connection with $X_1$ and $R_1$ in Formula 1, $X_{11}$ to $X_{15}$ may each independently be the same as described in connection with $X_1$ in Formula 1, b14 may be an integer from 0 to 4,

* indicates a binding site to M in Formula 1, and

*' indicates a binding site to $T_1$ in Formula 1.

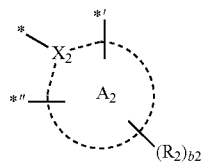

In an embodiment, the group represented by 2 in Formula 1 may be a group represented by one of Formulae A2-1 to A2-7:

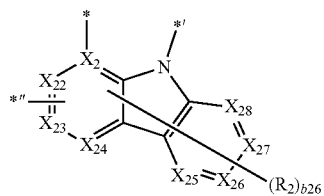

A2-1

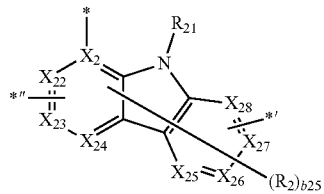

A2-2

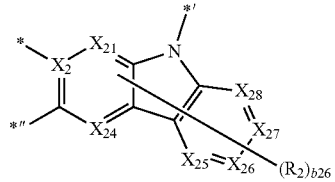

A2-3

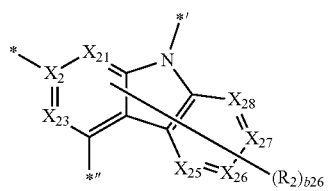

A2-4

A2-5
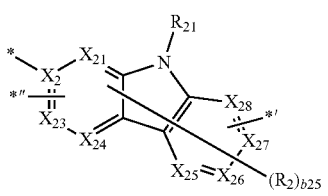

A2-6
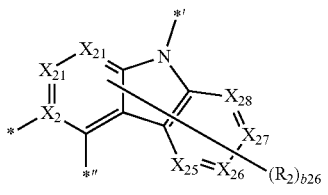

A2-7
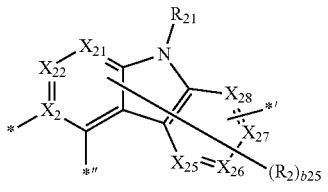

In Formulae A2-1 to A2-7, $X_2$ and $R_2$ may respectively be the same as described in connection with $X_2$ and $R_2$ in Formula 1, $R_{21}$ may be the same as described in connection with $R_2$ in Formula 1, $X_{21}$ to $X_{28}$ may each independently be the same as described in connection with $X_2$ in Formula 1, b25 may be an integer from 0 to 5, b26 may be an integer from 0 to 6,

* indicates a binding site to M in Formula 1, and

*' indicates a binding site to $T_1$ in Formula 1.

*" indicates a binding site to $T_2$ in Formula 1.

In an embodiment, the group represented by

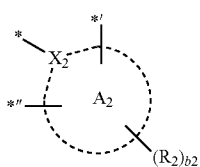

in Formula 1 may be a group represented by one of Formulae A2-1(1) to A2-1(3):

A2-1(1)
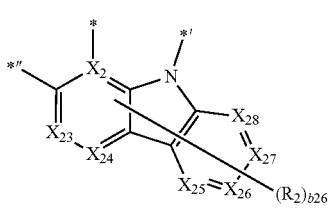

A2-1(2)
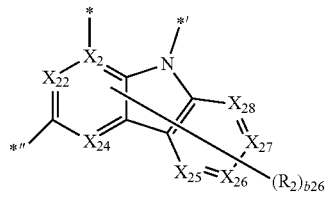

A2-1(3)
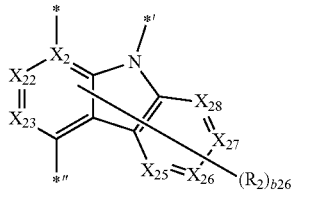

wherein, in Formulae A2-1(1) to A2-1(3), $X_2$, $X_{22}$ to $X_{28}$, $R_2$, b26, *, *', and *" may respectively be the same as described in connection with $X_2$, $X_{22}$ to $X_{28}$, $R_2$, b26, * *', and *" in Formula A2-1.

In an embodiment, the group represented by

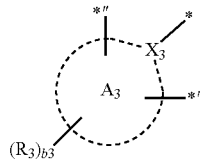

in Formula 1 may be a group represented by one of Formulae A3-1 to A3-8:

A3-1
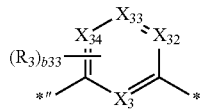

A3-2
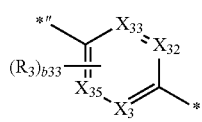

A3-3
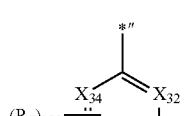

A3-4
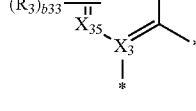

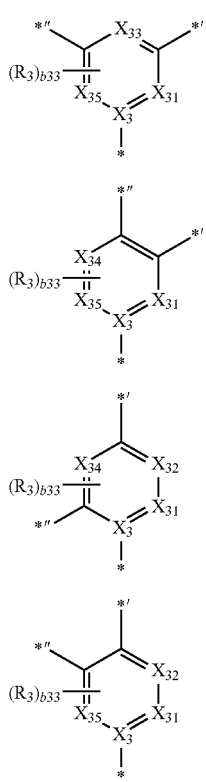

A3-5

A3-6

A3-7

A3-8

In Formulae A3-1 to A3-8, $R_3$ may be the same as described in connection with $R_3$ in Formula 1, $X_{31}$ to $X_{35}$ may each independently be the same as described in connection with $X_3$ in Formula 1, b33 may be an integer from 0 to 3, \* indicates a binding site to M in Formula 1, \*' indicates a binding site to $T_2$ in Formula 1, and \*'' indicates a binding site to $T_3$ in Formula 1.

In an embodiment, the group represented by

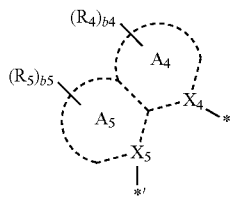

in Formula 1 may be a group represented by one of Formulae A45-1 to A45-16:

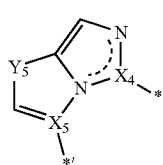

A45-1

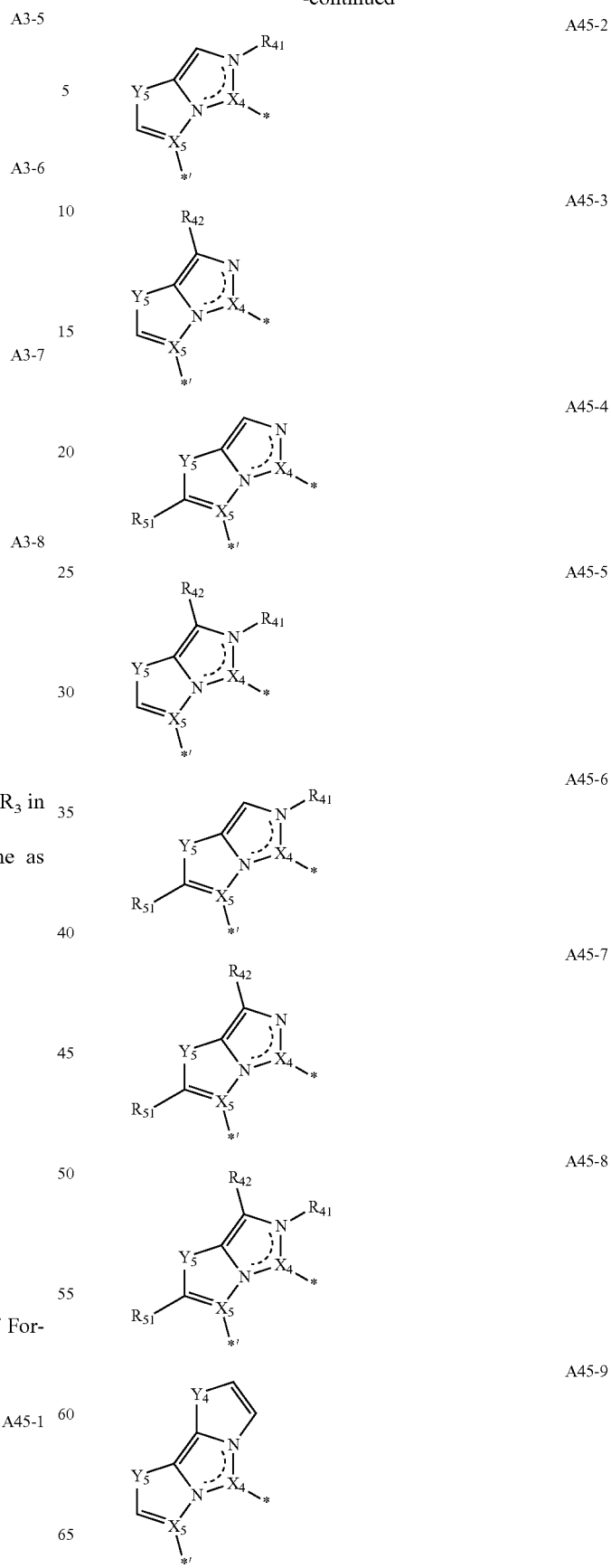

A45-2

A45-3

A45-4

A45-5

A45-6

A45-7

A45-8

A45-9

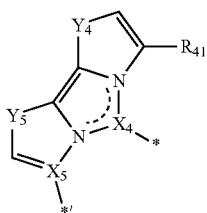

A45-10

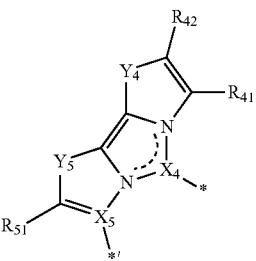

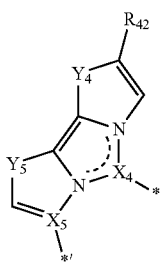

A45-11

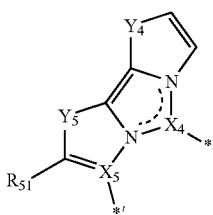

A45-12

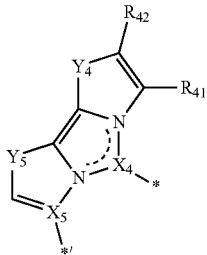

A45-13

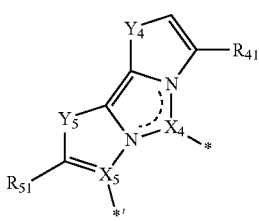

A45-14

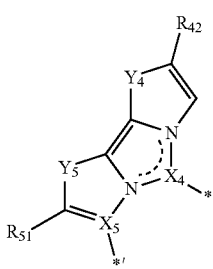

A45-15

A45-16

In Formulae A45-1 to A45-16, $Y_4$ may be O, S, N($R_{4a}$), C($R_{4a}$)($R_{4b}$), or Si($R_{4a}$)($R_{4b}$), $Y_5$ may be O, S, N($R_{5a}$), C($R_{5a}$)($R_{5b}$), or Si($R_{5a}$)($R_{5b}$), $R_{41}$ and $R_{42}$ may each be the same as described in connection with $R_4$ in Formula 1, except that $R_{41}$ and $R_{42}$ may not each be hydrogen, $R_{51}$ may be the same as described in connection with $R_5$ in Formula 1, except that $R_{51}$ may not be hydrogen, $X_4$ and $X_5$ may each independently be the same as described in connection with $X_4$ and $X_5$ in Formula 1, $R_{4a}$ and $R_{4b}$ may each independently be the same as described in connection with $R_4$ in Formula 1, $R_{5a}$ and $R_{5b}$ may each independently be the same as described in connection with $R_5$ in Formula 1, \* indicates a binding site to M in Formula 1, and \*' indicates a binding site to $T_3$ in Formula 1.

In an embodiment, at least one of $R_{41}$ and $R_{42}$ of Formulae A45-1 to A45-16 may include a group represented by Formula 2:

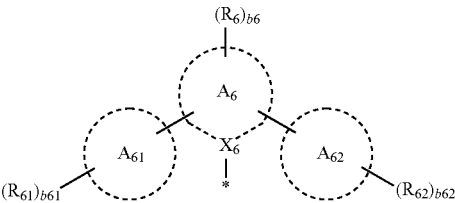

2

In Formula 2, $X_6$ may be C or N, $A_6$, $A_{61}$, and $A_{62}$ may each independently be a $C_3$-$C_{60}$ carbocyclic group or a $C_1$-$C_{60}$ heterocyclic group, $R_6$, $R_{61}$, and $R_{62}$ may each independently be the same as described in connection with $R_4$ in Formula 1, b6, b61, and b62 may each independently be the same as described in connection with b4 in Formula 1, and \* indicates a binding site to an adjacent atom.

In an embodiment, the group represented by

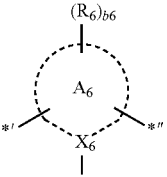

in Formula 2 may be a group represented by one of Formulae A6-1 to A6-6:

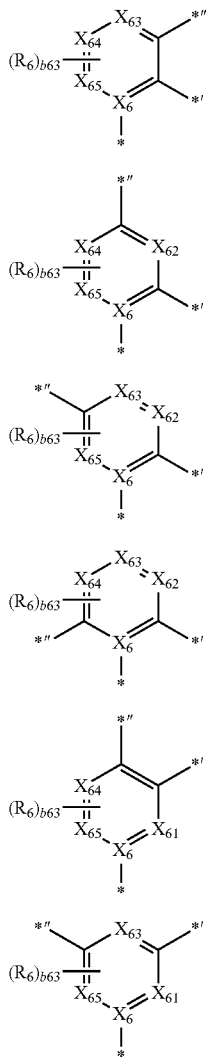

A6-1

A6-2

A6-3

A6-4

A6-5

A6-6

In Formulae A6-1 to A6-6, $X_6$ and $R_6$ may respectively be the same as described in connection with $X_6$ and $R_6$ in Formula 2, $X_{61}$ to $X_{65}$ may each independently be the same as described in connection with $X_6$ in Formula 2, b63 may be an integer from 0 to 3,

* indicates a binding site to an adjacent atom,

*' indicates a binding site to $A_{61}$, and

*" indicates a binding site to $A_{62}$.

In Formula 1, $T_1$ to $T_3$ may each independently be a single bond, a double bond, *—N($Z_{11}$)—*', *—B($Z_{11}$)—*', *—P($Z_{11}$)—*', *—C($Z_{11}$)($Z_{12}$)—*', *—Si($Z_{11}$)($Z_{12}$)—*', *—Ge($Z_{11}$)($Z_{12}$)—*', *—S—*', *—Se—*', *—O—*', *—C(=O)—*', *—S(=O)—*', *—S(=O)$_2$—*', *—C($Z_{11}$)=*', *=C($Z_{11}$)—*', *—C($Z_{11}$)=C($Z_{12}$)—*', *—C(=S)—*', or *—C≡C—*', and * and *' each indicate a binding site to an adjacent atom.

In an embodiment, in Formula 1, $T_1$ and $T_3$ may each be a single bond, and $T_2$ may be *—O—*' or *—S—*', but embodiments are not limited thereto.

In an embodiment, in Formula 1, a1 to a3 may each independently be an integer from 0 to 3.

In embodiments, in Formula 1, $R_1$ to $R_5$, $Z_{11}$, and $Z_{12}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

In embodiments, $R_1$ to $R_5$, $Z_{11}$, and $Z_{12}$ may each independently be:

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$)

In an embodiment, in Formula 1, b1 to b5 may each independently be an integer from 0 to 10.

In embodiments, in Formula 1, when b4 is 2 or greater, at least two $R_4$(s) of $R_4$(s) in the number of b4 may optionally be combined to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In embodiments, in Formula 1, when b5 is 2 or greater, at least two $R_5$(s) of $R_5$(s) in the number of b5 may optionally be combined to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the organometallic compound Formula 1 may be an organometallic compound represented by Formula 1-1:

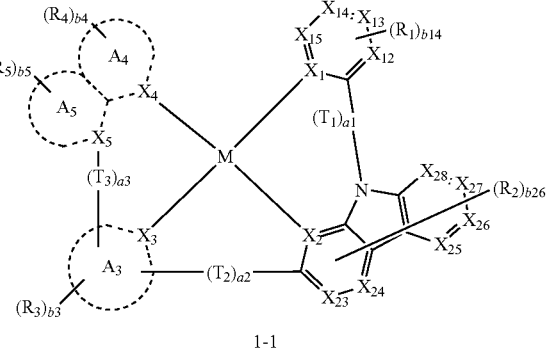

[Formula 1-1]

1-1

In Formula 1-1,

M, $X_1$ to $X_5$, $A_3$ to $A_5$, $T_1$ to $T_3$, a1 to a3, $R_1$ to $R_5$, and b3 to b5 may respectively be the same as described in connection with M, $X_1$ to $X_5$, $A_3$ to $A_5$, $T_1$ to $T_3$, a1 to a3, $R_1$ to $R_5$, and b3 to b5 in Formula 1, $X_{12}$ to $X_{15}$ may each independently be the same as described in connection with $X_1$ in Formula 1, $X_{23}$ to $X_{28}$ may each independently be the same as described in connection with $X_2$ in Formula 1, b14 may be an integer from 0 to 4, and b26 may be an integer from 0 to 6.

In an embodiment, the organometallic compound may be selected from Compounds 1 to 30, but embodiments are not limited thereto:

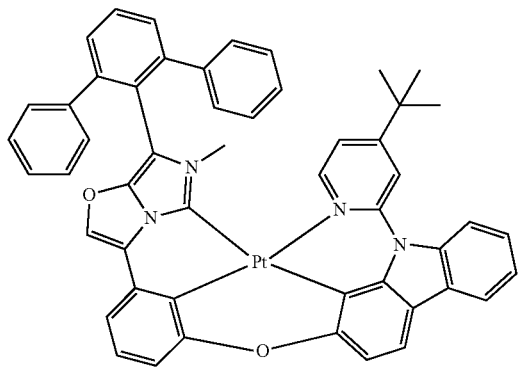

1

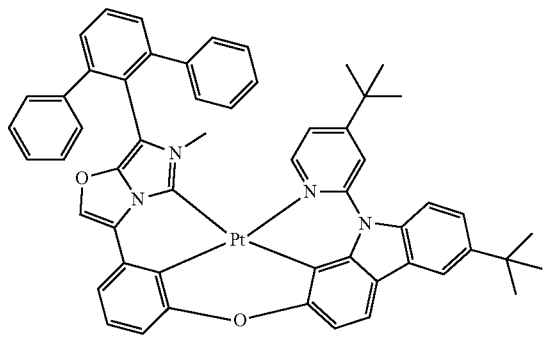

2

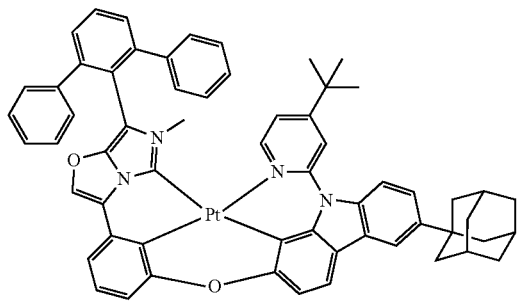

3

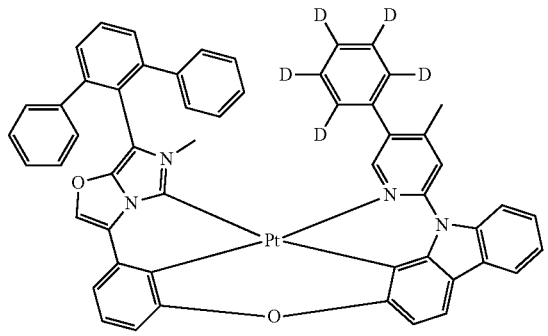

4

-continued
5
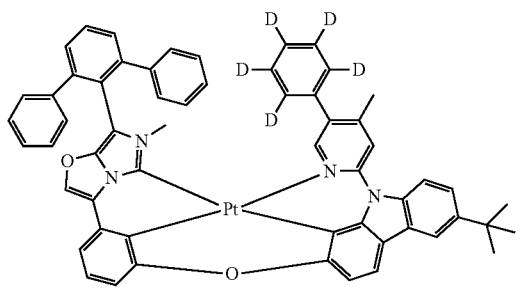
6
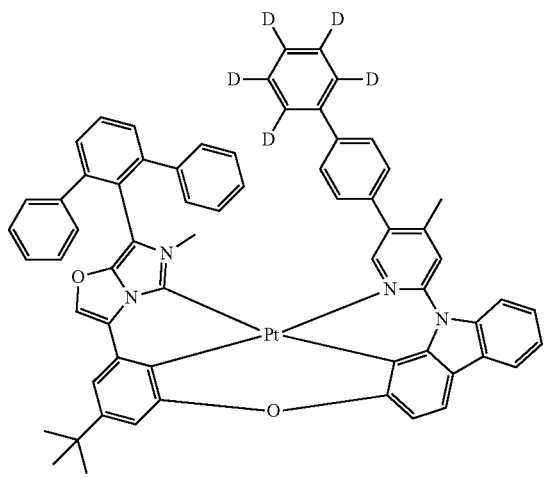
7
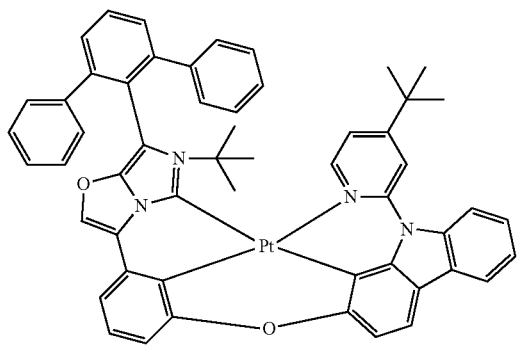
8
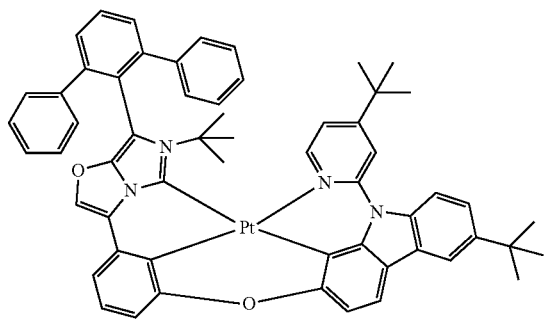
9
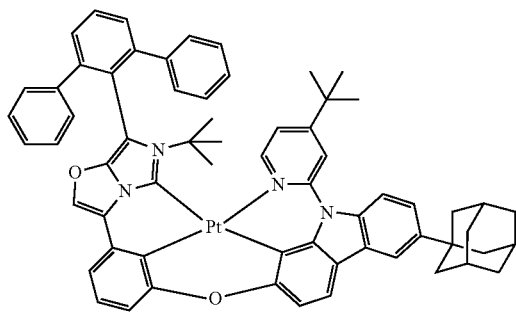
10
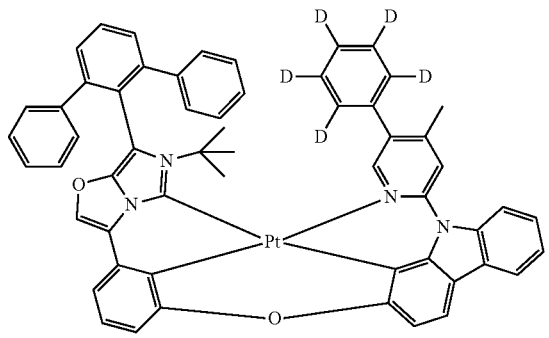

-continued
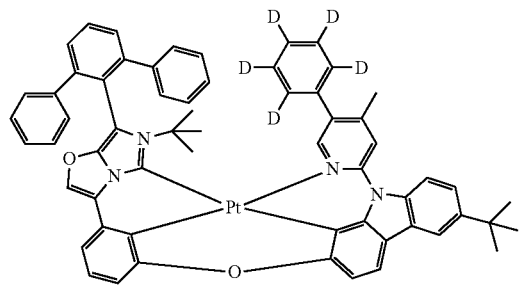
11
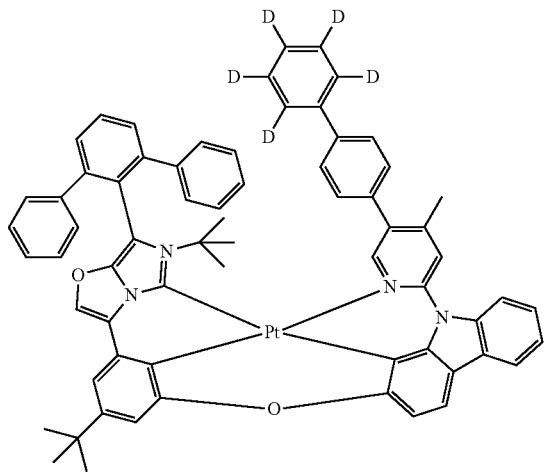
12
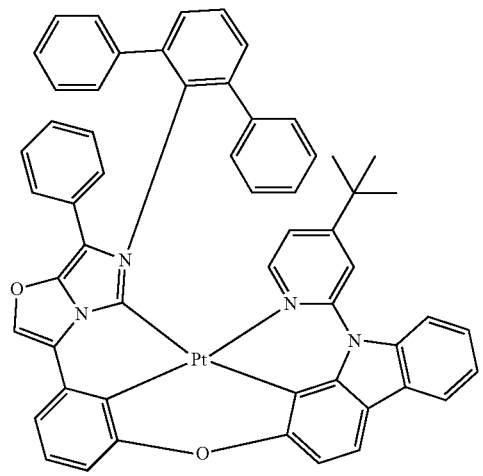
13
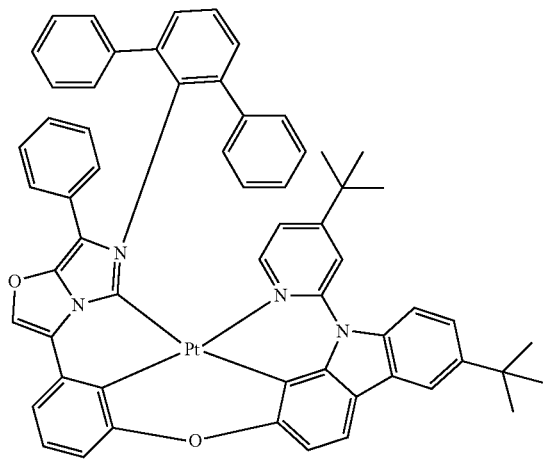
14
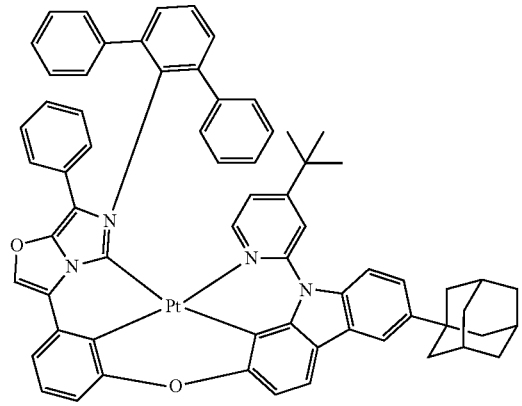
15
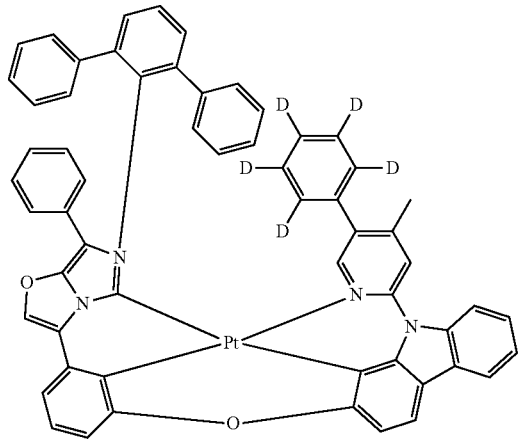
16

-continued
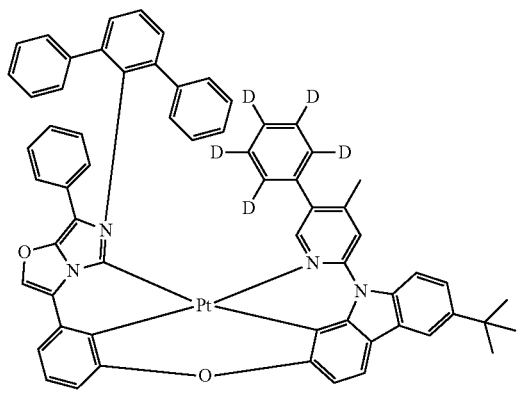
17
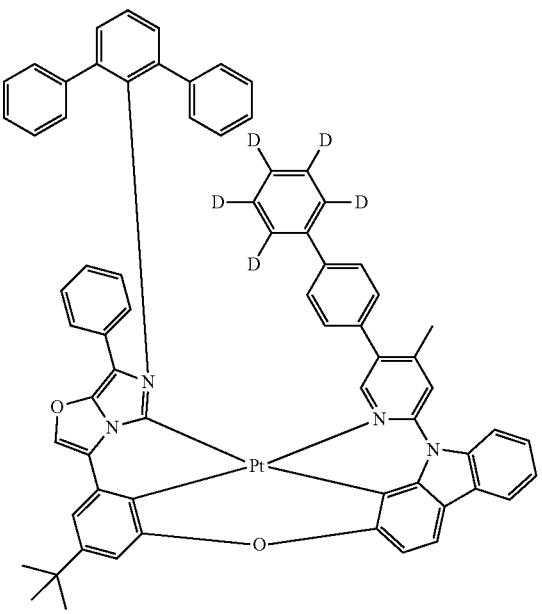
18
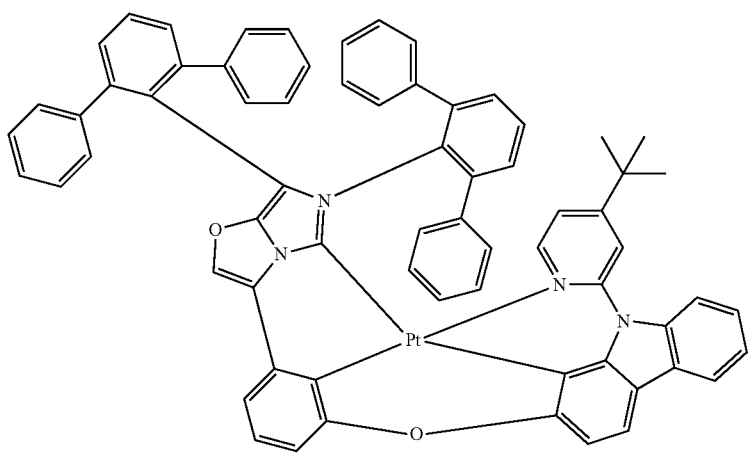
19
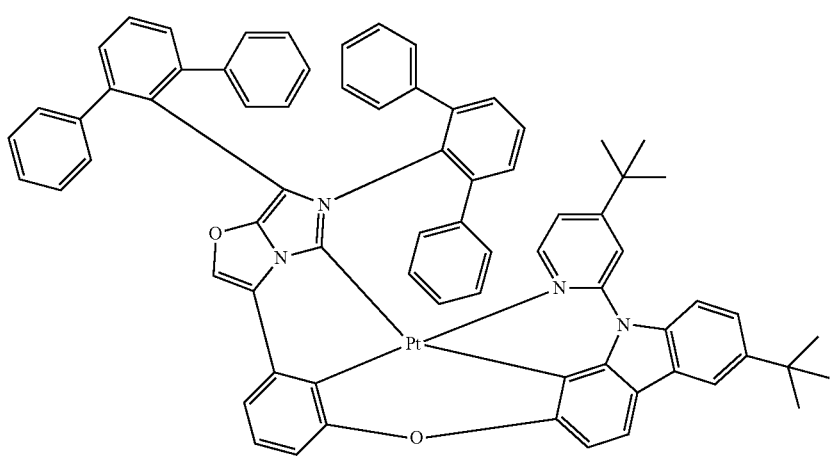
20

21
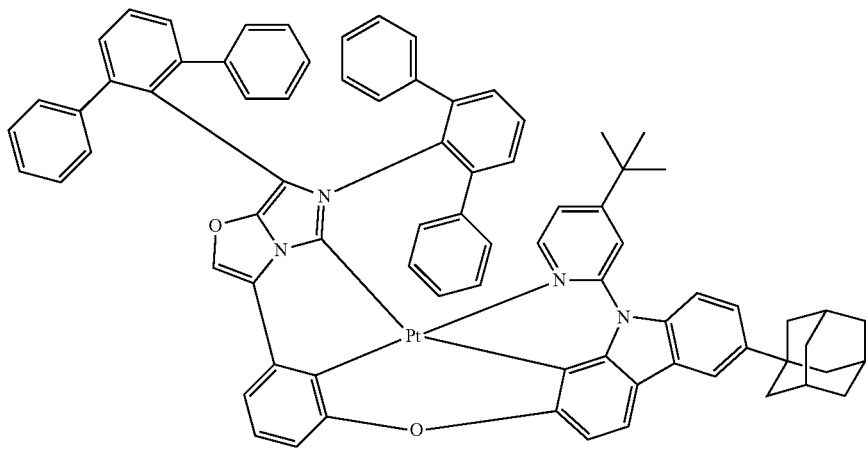
22
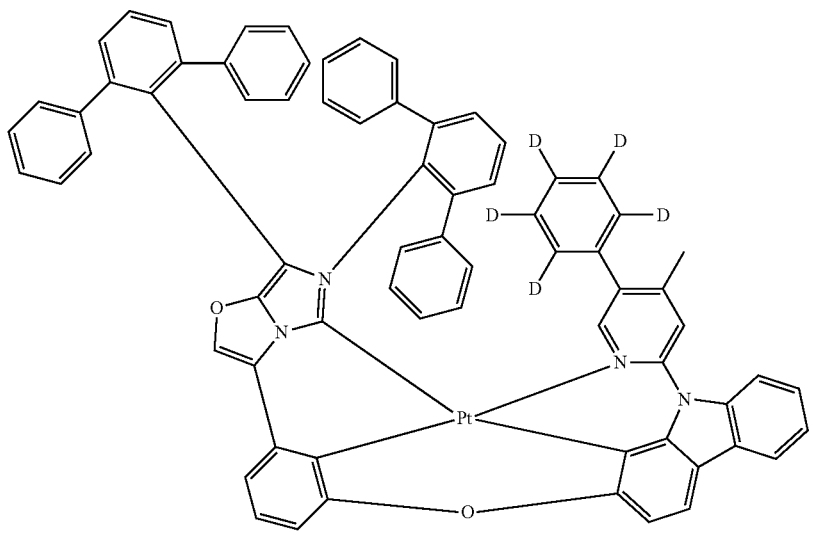
23
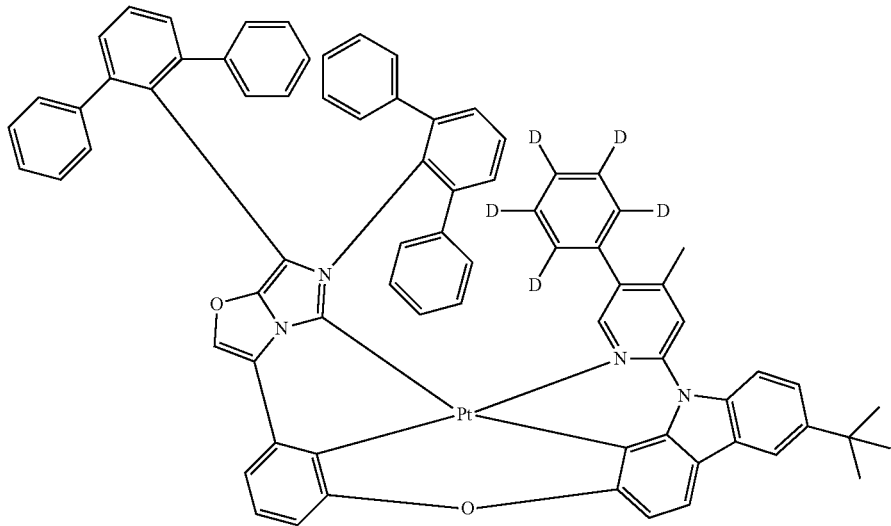

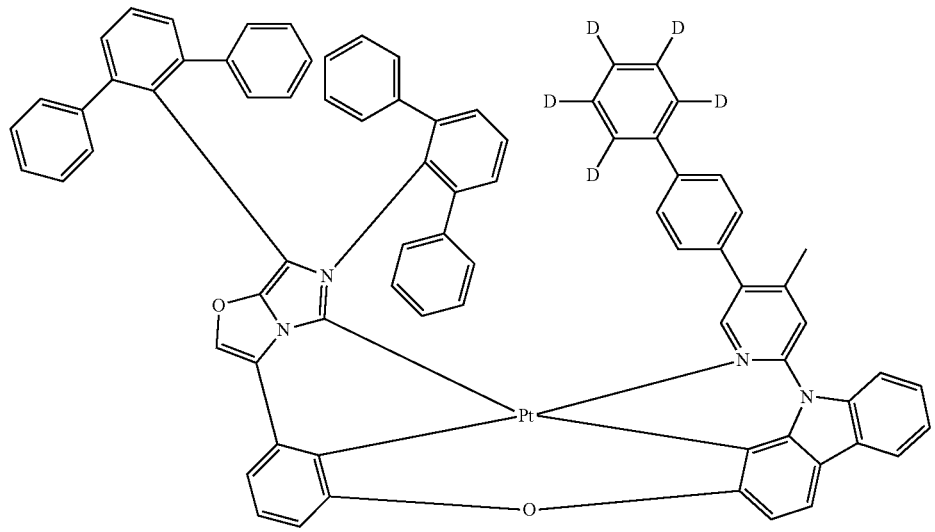
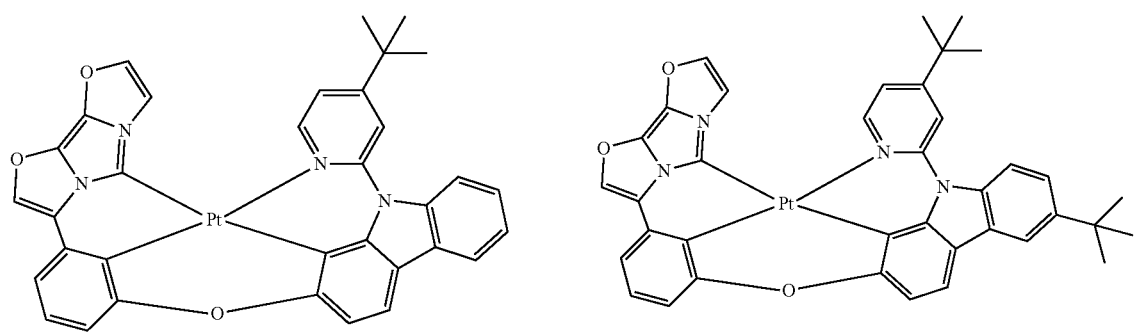
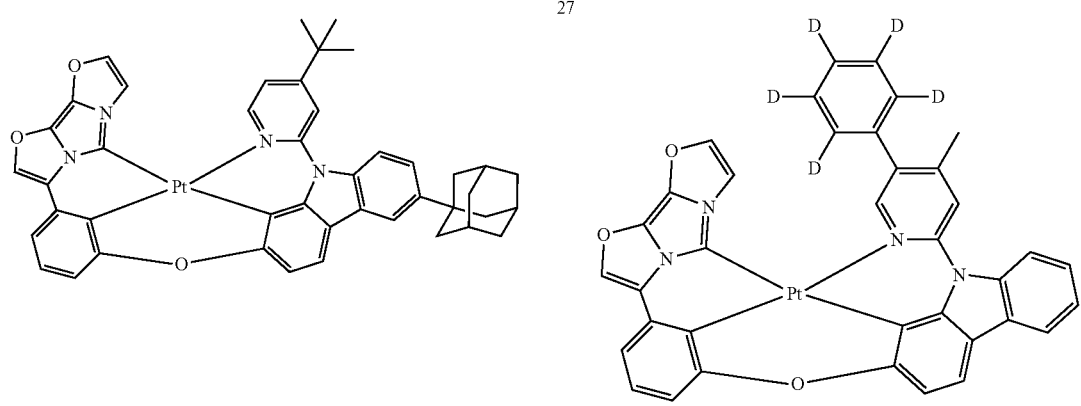

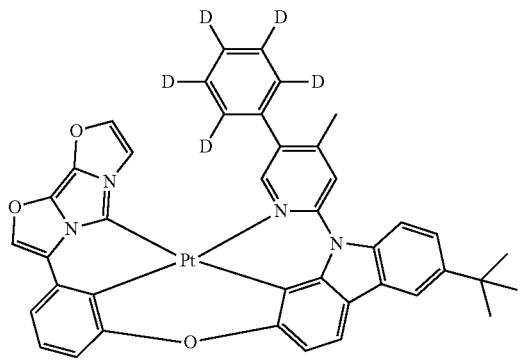

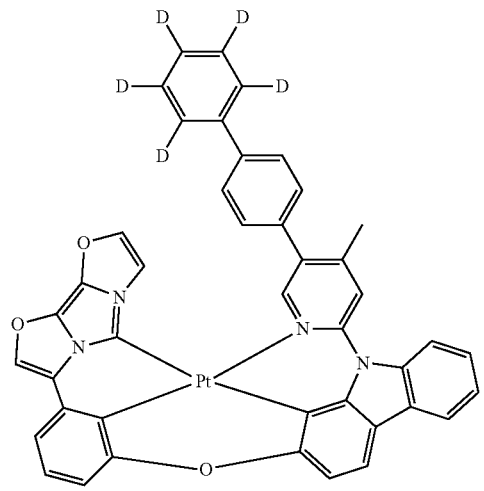

In embodiments, an energy level ($E_{3MC}$) of a triplet metal centered state (3MC state) of an organometallic compound represented by Formula 1 may be greater than an energy level ($E_{3MLCT}$) of a triplet metal-to-ligand charge transfer state ($^3$MLCT state) of the organometallic compound.

For example, $E_{3MC}$ of the organometallic compound may be in a range of about 0.40 kilocalories per mole (kcal/mol) to about 1.00 kcal/mol. For example, $E_{3MC}$ of the organometallic compound may be in a range of about 0.40 kcal/mol to about 0.85 kcal/mol. For example, $E_{3MC}$ of the organometallic compound may be in a range of about 0.41 kcal/mol to about 0.81 kcal/mol.

In an embodiment, $^3$MLCT(%) (a ratio of $^3$MLCT) of the organometallic compound may be in a range of about 10% to about 60%. For example, $^3$MLCT(%) of the organometallic compound may be in a range of about 10% to about 30%.

In the organometallic compound, $X_5$ in Formula 1 may be C, and thus, due to enhanced sigma binding force between an adjacent N-heterocyclic carbene and M, a binding force between M and $X_1$ to $X_4$ and a rigidity of the organometallic compound may be improved. Accordingly, lifespan characteristics of a light-emitting device including the organometallic compound may be improved. In an embodiment, $X_5$ in Formula 1 may be C, and $A_4$ including $X_4$ and $A_5$ including $X_5$ are condensed in Formula 1. Thus, according to a principle of an increase in MLCT along with an increase in a sigma binding force, a device including the organometallic compound may have improved stability. Furthermore, in Formula 1, when a bond between $X_1$ and M and a bond between $X_4$ and M are each a coordinate bond, the binding force may be increased due to an increase in a sigma binding force. Accordingly, a device including the organometallic compound may have a long lifespan. As a result, when the organometallic compound is applied to a light-emitting device, it is possible to prevent transition of triplet excitons to $^3$MC state, which is a non-luminescent state, due to ligand rupture. Thus, stability in an excited state, lifespan, and efficiency of the light-emitting device may be excellent.

Methods of synthesizing the organometallic compound represented by Formula 1 may be easily understood to those of ordinary skill in the art by referring to Synthesis Examples and Examples described herein.

At least one organometallic compound represented by Formula 1 may be used in a light-emitting device (e.g., an organic light-emitting device). Accordingly, in an embodiment, a light-emitting device may include a first electrode, a second electrode facing the first electrode, and an interlayer disposed between the first electrode and the second electrode. The interlayer may include an emission layer and the at least one organometallic compound represented by Formula 1 as described herein.

In embodiments, the first electrode of the light-emitting device may be an anode, the second electrode of the light-emitting device may be a cathode, and the interlayer may further include a hole transport region between the first electrode and the emission layer and an electron transport region between the emission layer and the second electrode. The hole transport region may include a hole injection layer, a hole transport layer, an emission auxiliary layer, an electron blocking layer, or any combination thereof. The electron transport region may include a buffer layer, a hole blocking layer, an electron control layer, an electron transport layer, an electron injection layer, or any combination thereof.

In embodiments, the at least one organometallic compound may be included between the first electrode and the second electrode of the light-emitting device. Accordingly, the at least one organometallic compound may be included in the interlayer of the light-emitting device, for example, in the emission layer in the interlayer.

In embodiments, the emission layer in the interlayer of the light-emitting device may include a dopant and a host, and the dopant may include the at least one organometallic compound. For example, the organometallic compound may serve as a dopant. The emission layer may emit red light, green light, blue light, and/or white light. In embodiments, the emission layer including the at least one organometallic compound may emit blue light. In an embodiment, the organometallic compound may emit blue light having a maximum emission wavelength in a range of about 400 nanometers (nm) to about 490 nm.

In embodiments, the light-emitting device may include a capping layer located outside the first electrode or the second electrode.

In embodiments, the light-emitting device may further include at least one of a first capping layer located outside a first electrode and a second capping layer located outside a second electrode, and at least one of the first capping layer and the second capping layer may include the organometallic compound represented by Formula 1. The first capping layer and the second capping layer may be respectively understood by referring to the descriptions of the first capping layer and the second capping layer provided herein.

In embodiments, the light-emitting device may include a first capping layer located outside the first electrode and including the organometallic compound represented by Formula 1, a second capping layer located outside the second electrode and including the organometallic compound represented by Formula 1, or the first capping layer and the second capping layer.

The expression that an "(interlayer and/or a capping layer) includes at least one organometallic compound" as used herein may be construed as meaning that the "(interlayer and/or the capping layer) may each include one organometallic compound of Formula 1 or two or more different organometallic compounds of Formula 1".

For example, the interlayer and/or the capping layer may include Compound 1 only as the organometallic compound. In an embodiment, Compound 1 may be included in the emission layer of the light-emitting device. In embodiments, Compounds 1 and 2 may be included in the interlayer as organometallic compounds. In such an embodiment, Compounds 1 and 2 may be included in a same layer (for example, both Compounds 1 and 2 may be included in an emission layer) or in different layers (for example, Compound 1 may be included in an emission layer, and Compound 2 may be included in an electron transport region).

The term "interlayer" as used herein refers to a single layer and/or all layers located between a first electrode and a second electrode in a light-emitting device.

According to embodiments, an electronic apparatus may include the light-emitting device. The electronic apparatus may further include a thin-film transistor. In embodiments, the electronic apparatus may further include a thin-film transistor including a source electrode and drain electrode, and a first electrode of the light-emitting device may be electrically connected to at least one of the source electrode and the drain electrode. In an embodiment, the electronic apparatus may further include a color filter, a color-conversion layer, a touchscreen layer, a polarization layer, or any combination thereof. The electronic apparatus may be understood by referring to the description of the electronic apparatus provided herein.

[Description of FIG. 1]

FIG. 1 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

[First Electrode 110]

In FIG. 1, a substrate may be further included under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a structure consisting of a single layer or a multi-layered structure including two or more layers. In embodiments, the first electrode 110 may have a triple-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: at least two emitting units sequentially stacked between the first electrode 110 and the second electrode 150, and a charge generation layer located between the at least two emitting units. When the interlayer 130 includes the at least two emitting units and a charge generation layer, the light-emitting device 10 may be a tandem light-emitting device.

[Hole Transport Region in Interlayer 130]

The hole transport region may have a structure consisting of a layer consisting of a single material, a structure consisting of a layer including different materials, or a multi-layered structure having layers including different materials.

The hole transport region may include a hole injection layer, a hole transport layer, an emission auxiliary layer, an electron blocking layer, or any combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include a compound represented by Formula 201, a compound represented by Formula 202, or any combination thereof:

[Formula 201]

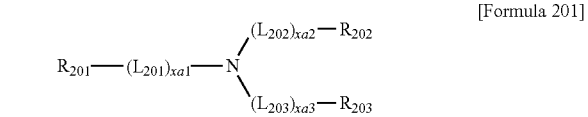

[Formula 202]

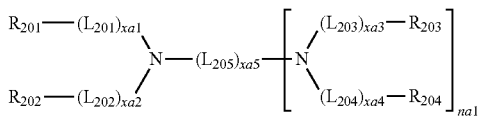

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In embodiments, Formulae 201 and 202 may each include at least one of groups represented by Formulae CY201 to CY217:

CY201

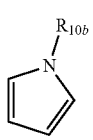

CY202

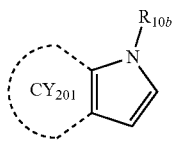

CY203

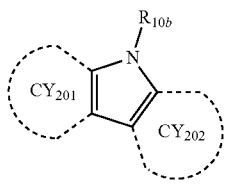

CY204

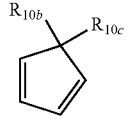

CY205

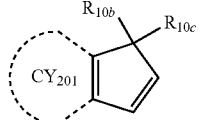

CY206

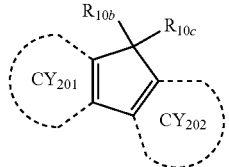

CY207

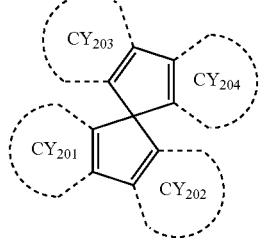

CY208

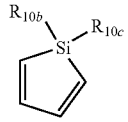

CY209

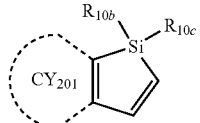

CY210

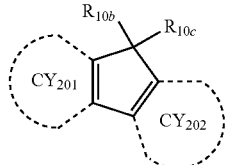

CY211

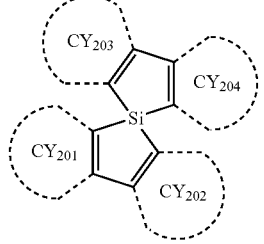

CY212

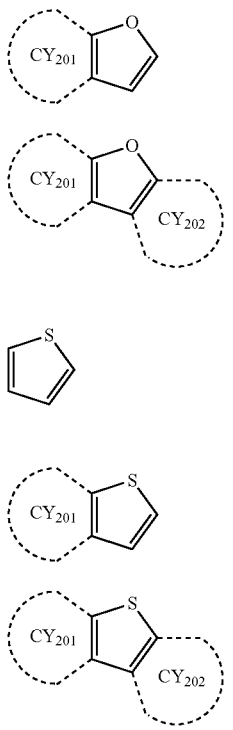

CY213

CY214

CY215

CY216

CY217

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, in Formulae CY201 to CY217, ring $CY_{201}$ to ring $CY_{204}$ may each independently be a benzene group, a naphthalene group, a phenanthrene group, or an anthracene group.

In embodiments, Formulae 201 and 202 may each include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In embodiments, Formulae 201 and 202 may each not include groups represented by Formulae CY201 to CY203.

In embodiments, Formulae 201 and 202 may each not include groups represented by Formulae CY201 to CY203, and include at least one of groups represented by Formulae CY204 to CY217.

In embodiments, Formulae 201 and 202 may each not include groups represented by Formulae CY201 to CY217.

In embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

HT1

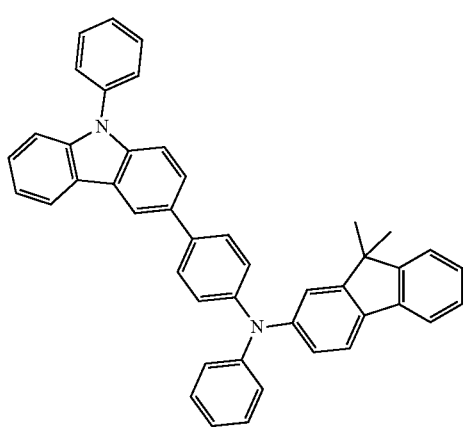

HT2

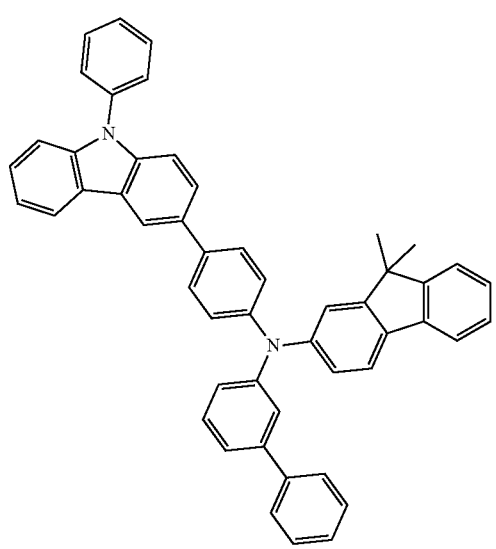

-continued
HT3
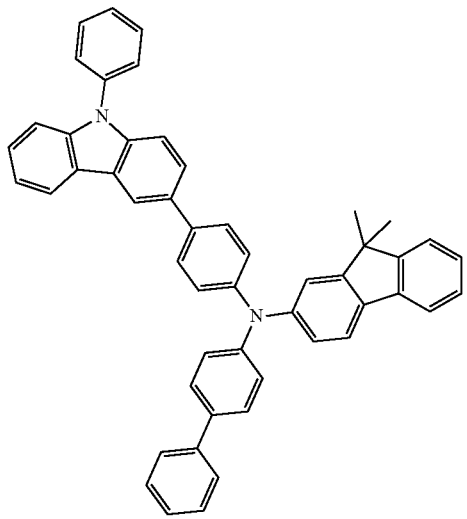
HT4
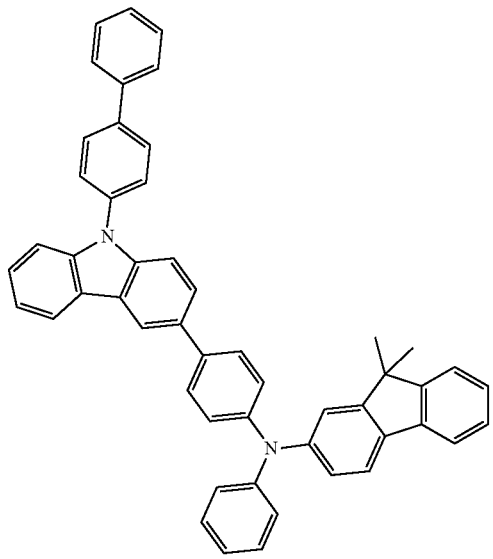
HT5
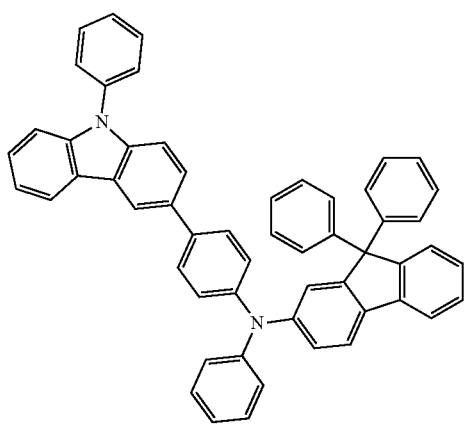
HT6
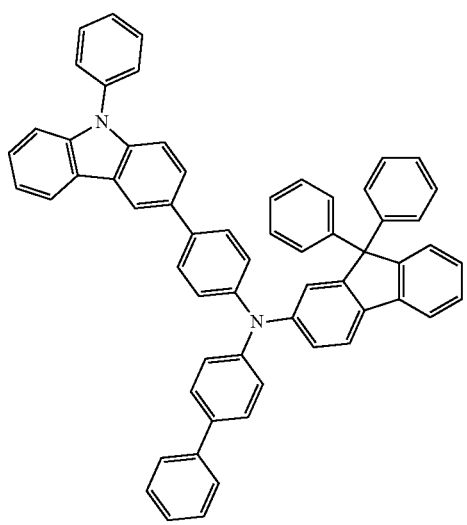
HT7
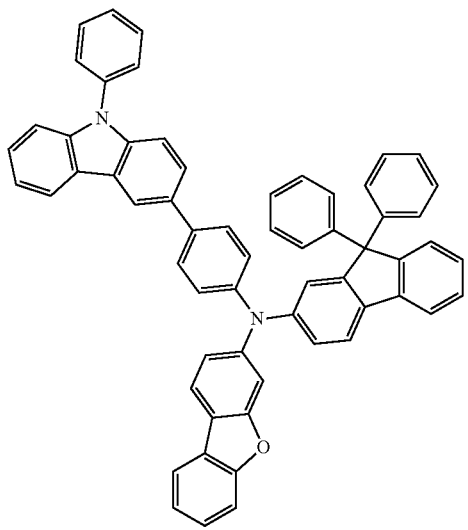
HT8
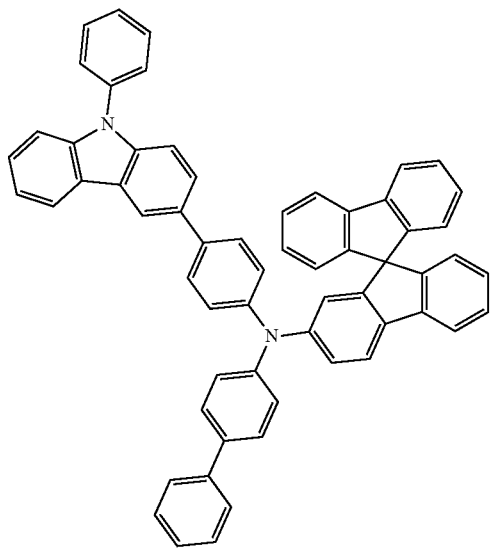

-continued
HT9
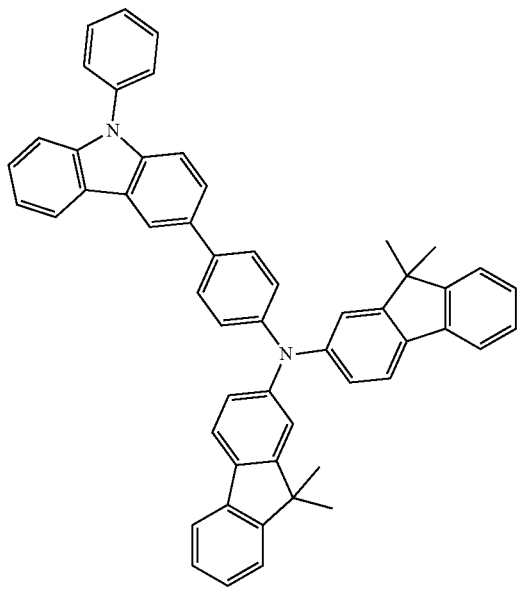
HT10
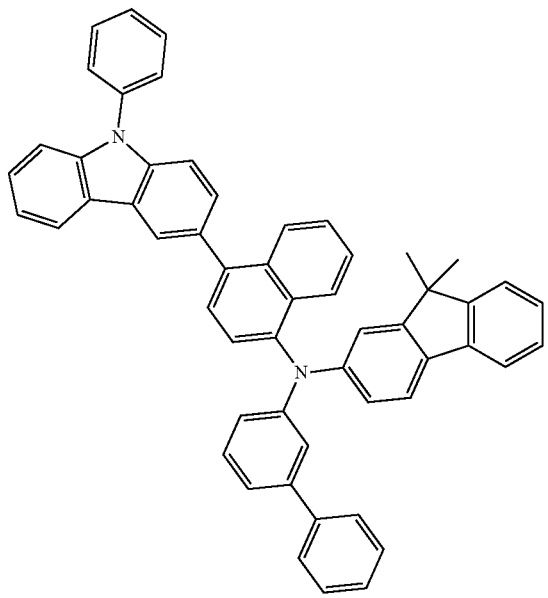
HT11
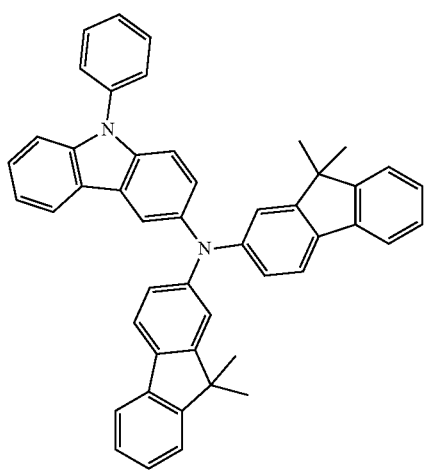
HT12
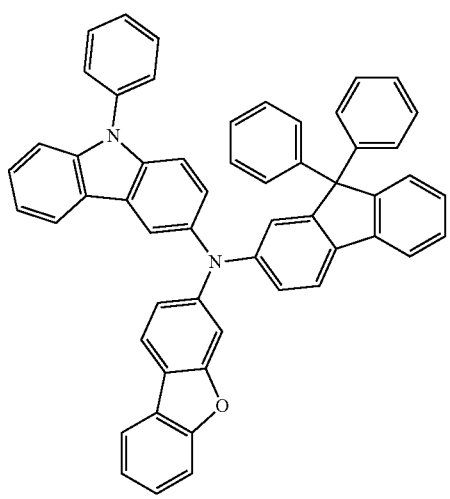

-continued
HT13
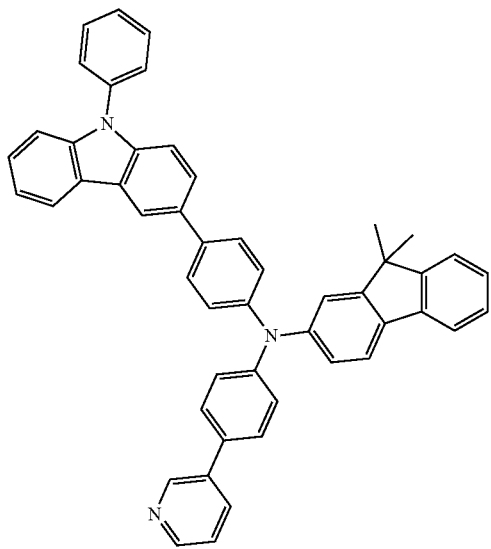
HT14
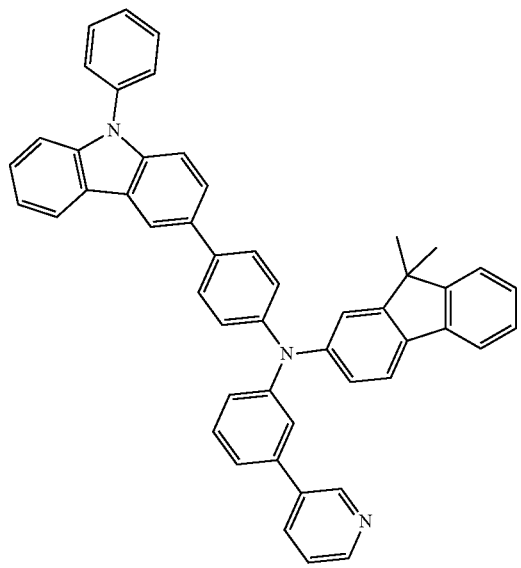
HT15
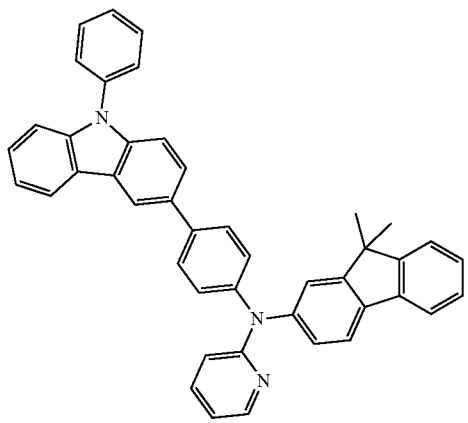
HT16
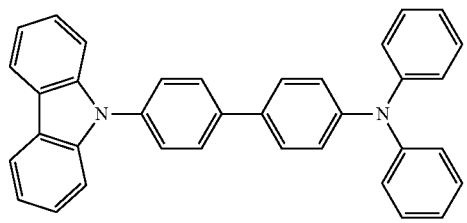
HT17
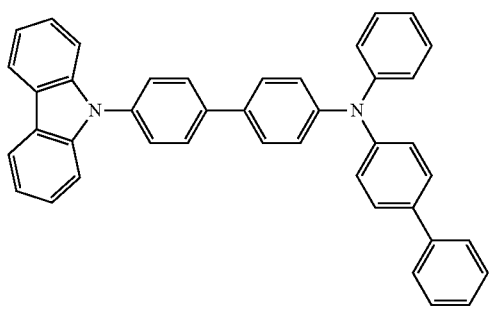
HT18
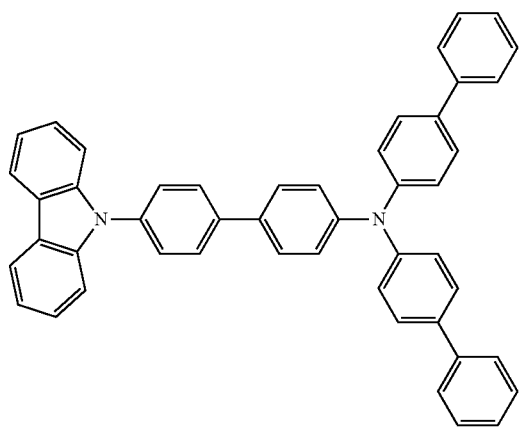

-continued
HT19
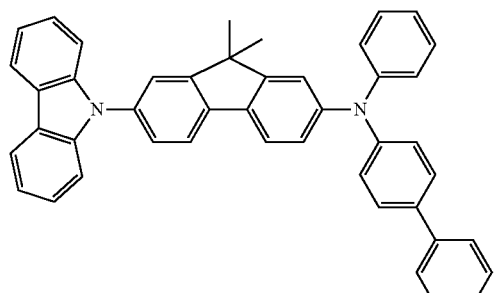
HT20
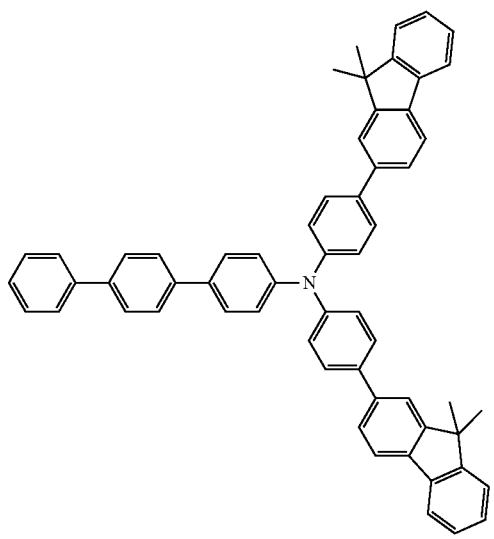
HT21
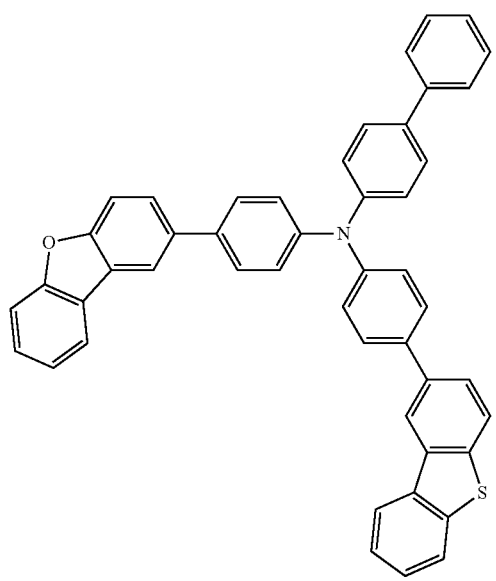
HT22
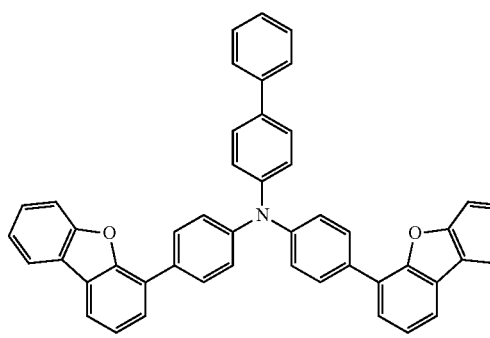
HT23
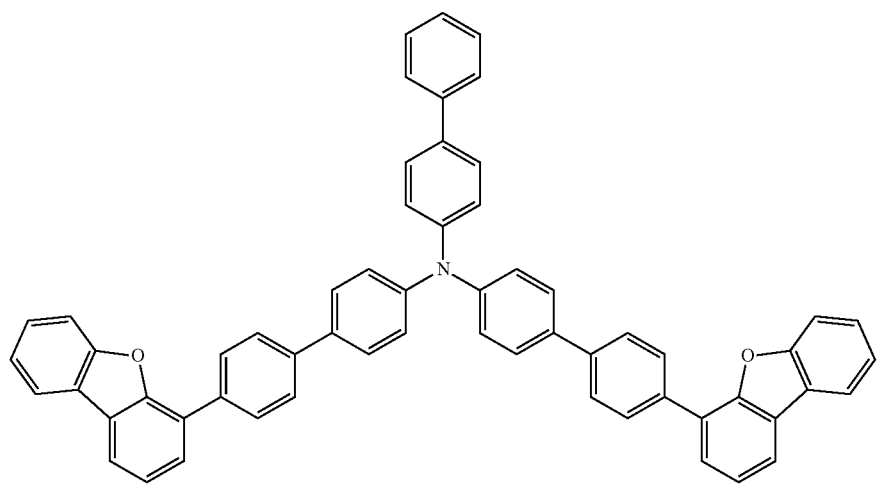

-continued
HT24
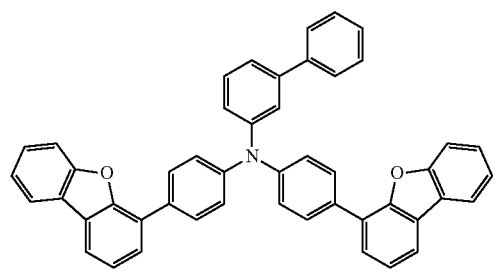
HT25
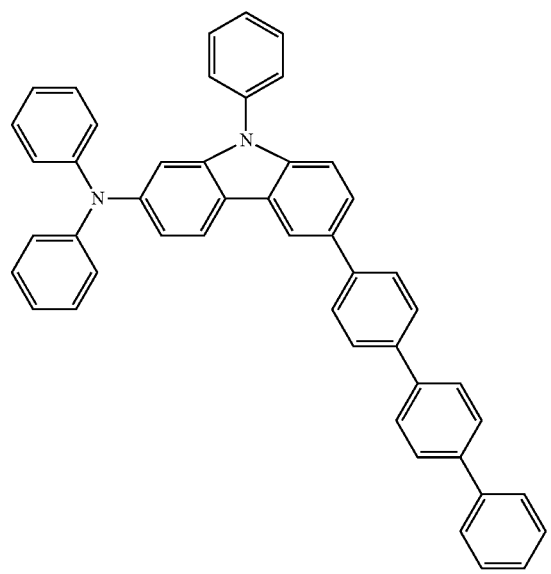
HT26
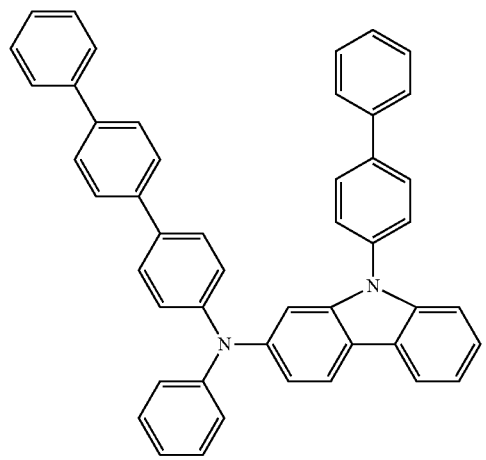
HT27
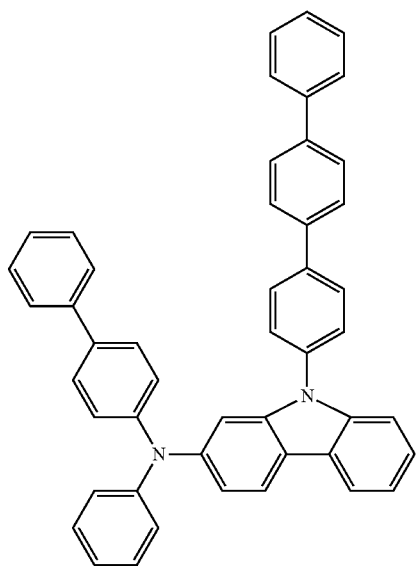
HT28
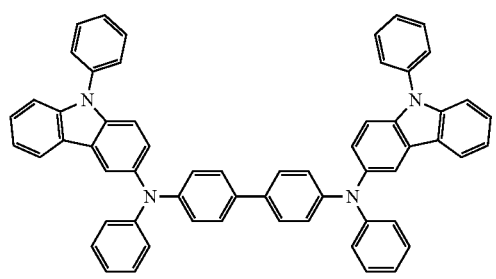
HT29
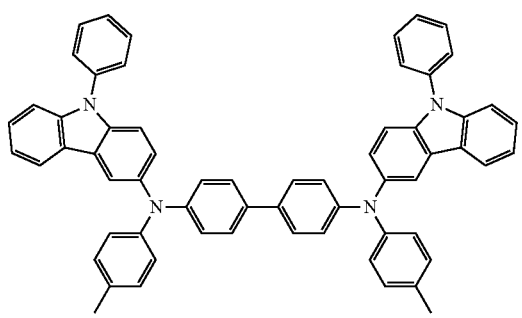

-continued
HT30
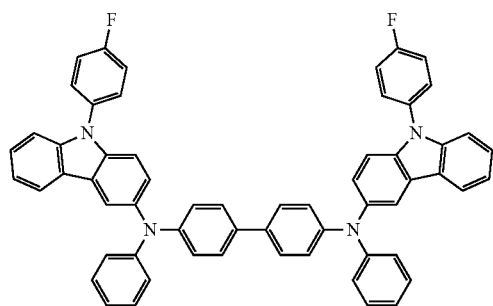
HT31
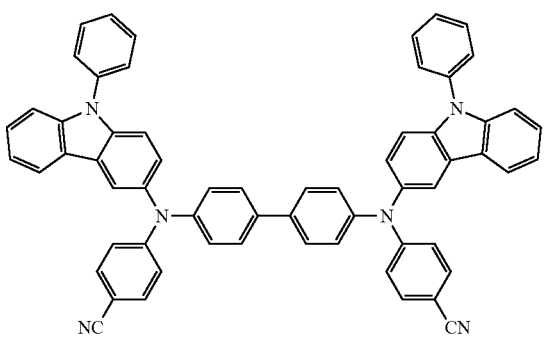
HT32
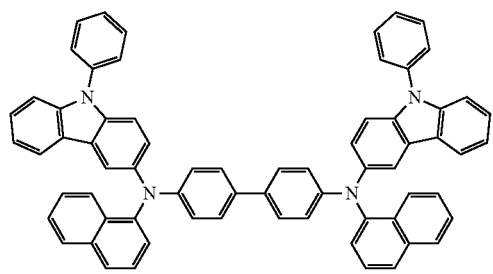
HT33
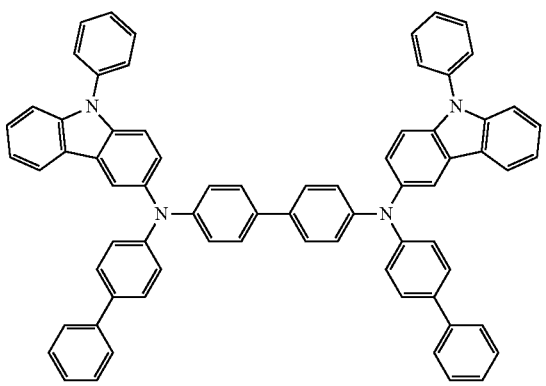
HT34
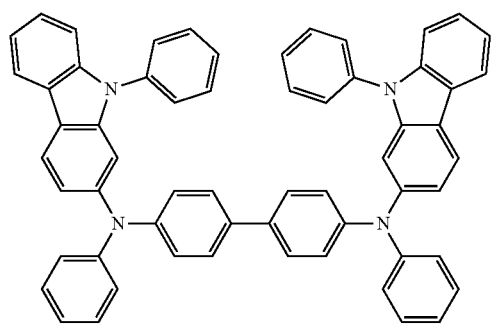
HT35
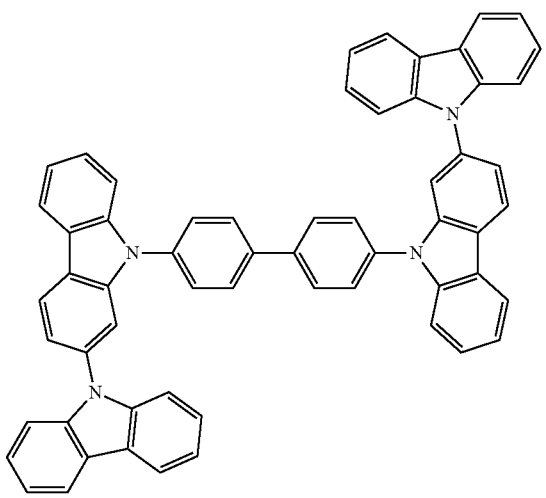

-continued
HT36
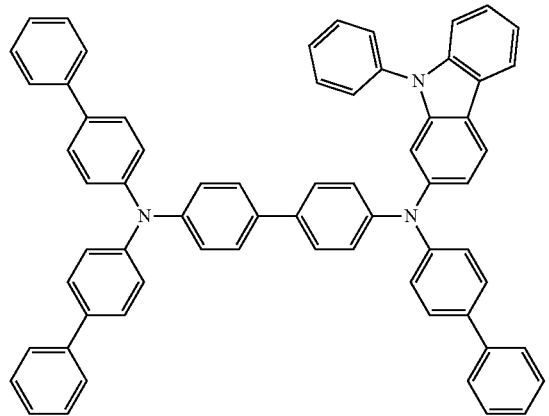
HT37
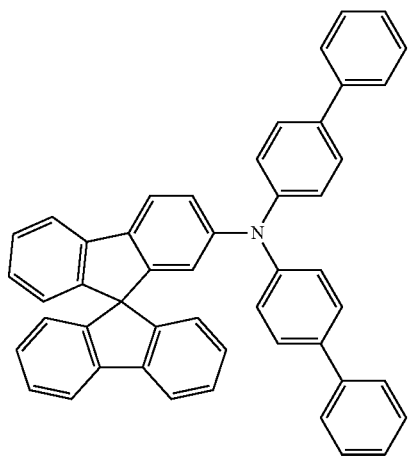
HT38
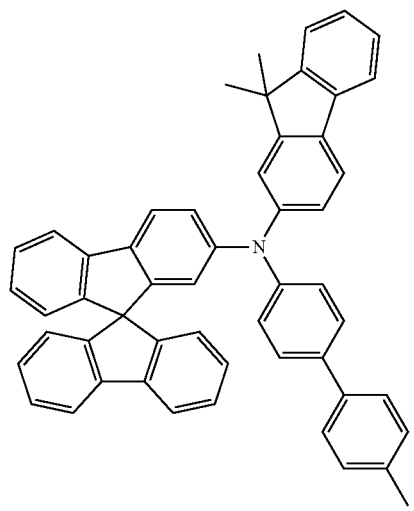
HT39
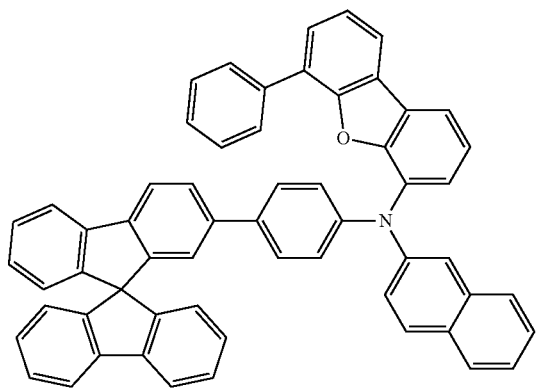
HT40
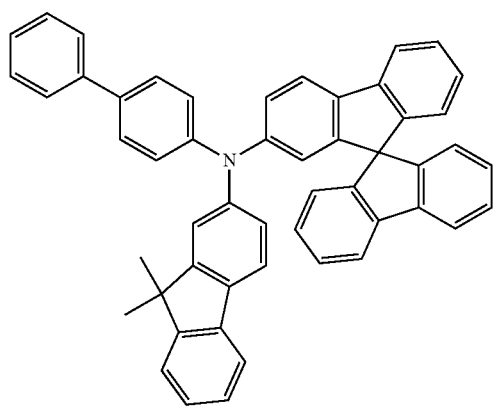
HT41
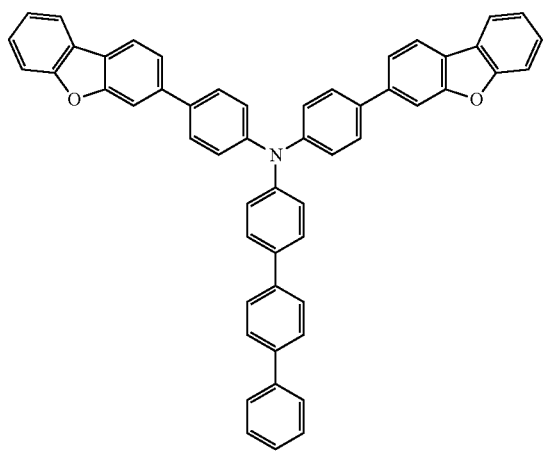

-continued
HT42
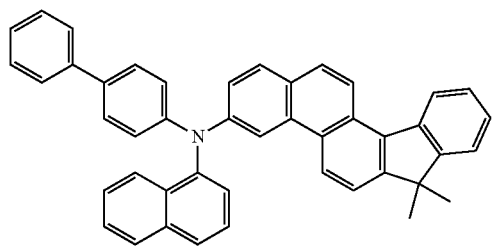
HT43
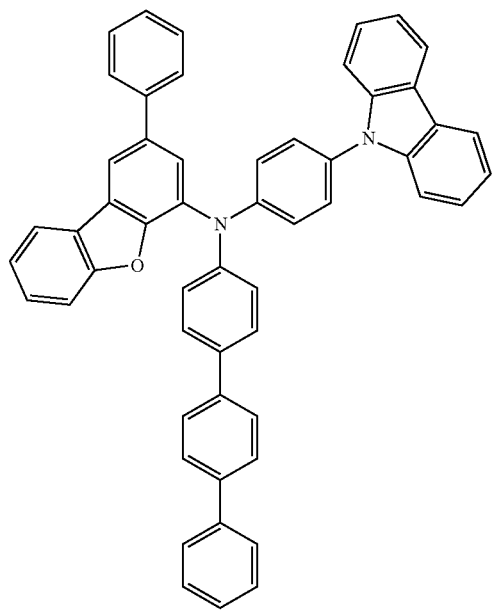
HT44
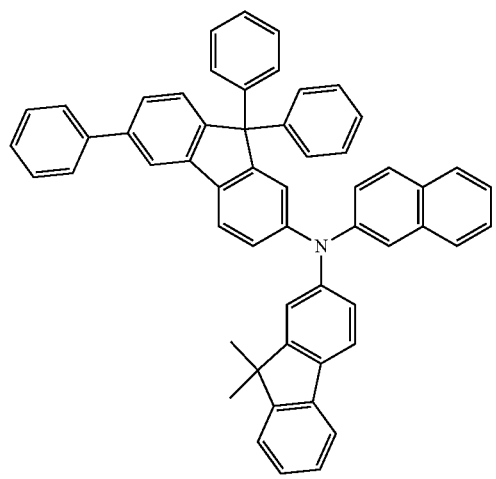
HT45
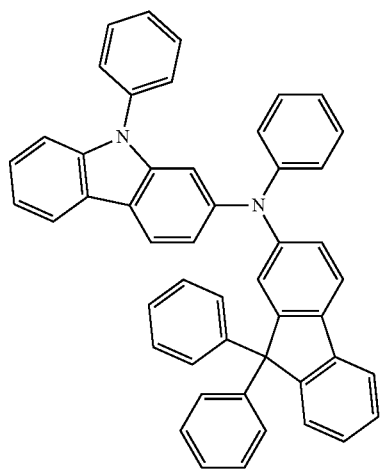
HT46
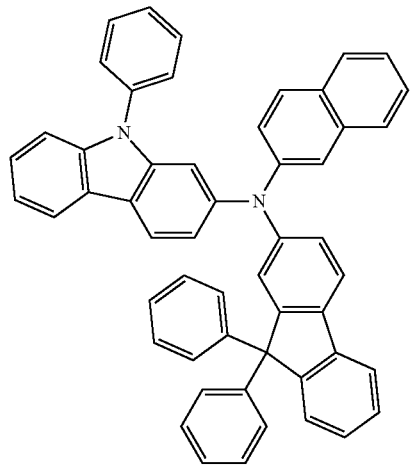
m-MTDATA
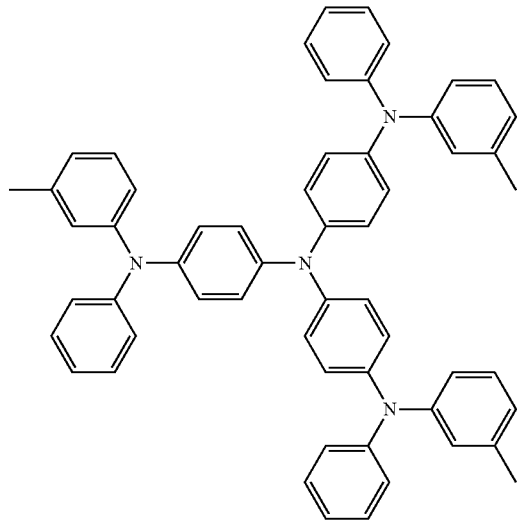

-continued
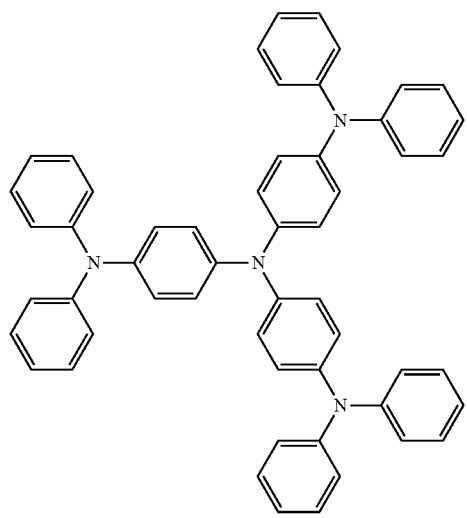
TDATA
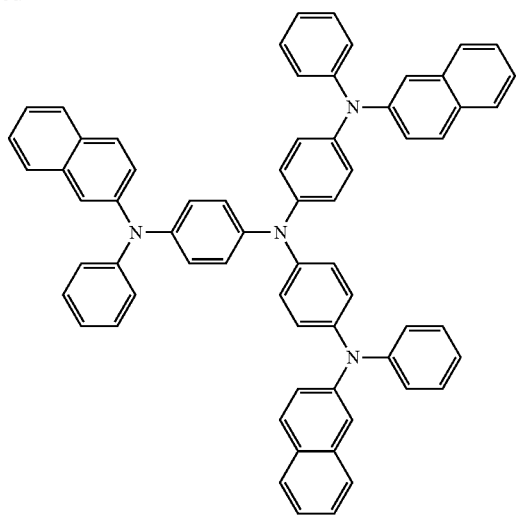
2-TNATA
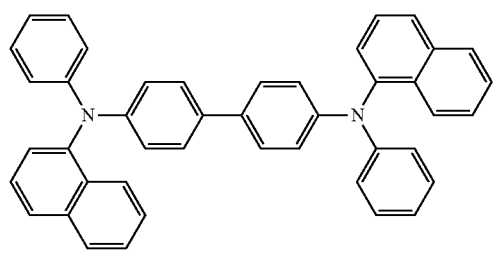
NPB
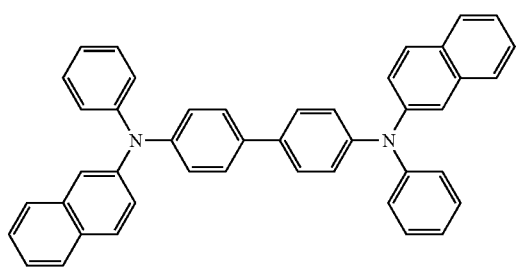
β-NPB
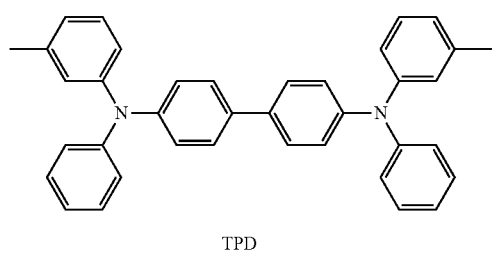
TPD
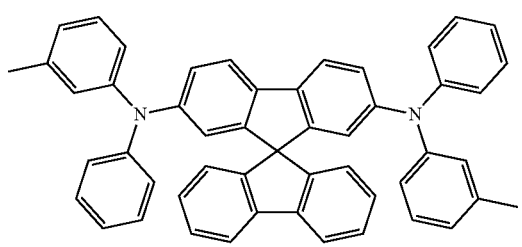
Spiro-TPD
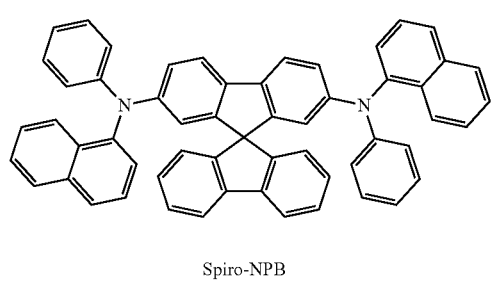
Spiro-NPB
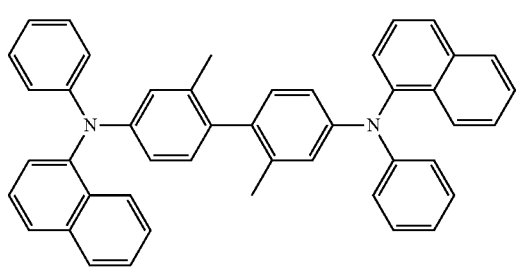
methylated-NPB

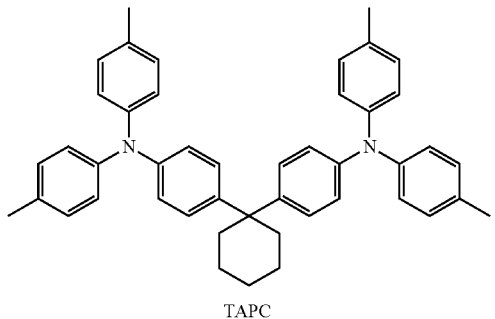

TAPC

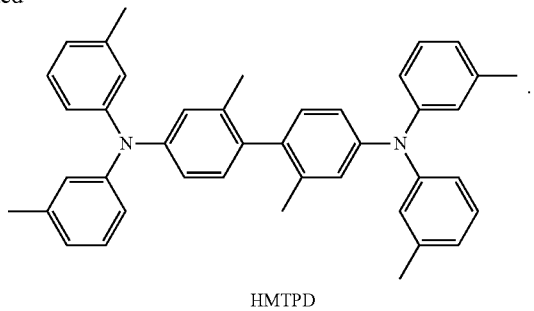

HMTPD

A thickness of the hole transport region may be in a range of about 50 Angstroms (Å) to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to a wavelength of light emitted by an emission layer. The electron blocking layer may prevent leakage of electrons to a hole transport region from the emission layer. Materials that may be included in the hole transport region may also be included in an emission auxiliary layer and an electron blocking layer.

[p-Dopant]

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a compound containing a cyano group, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

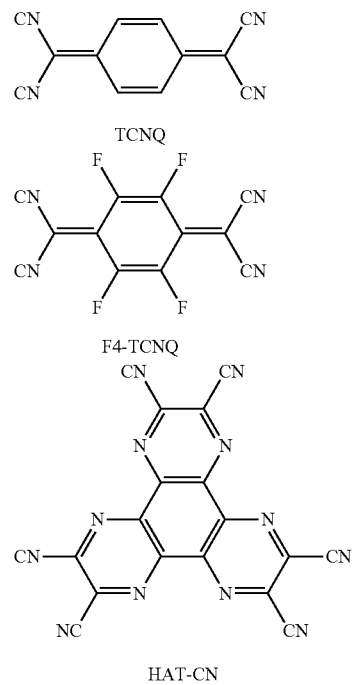

TCNQ

F4-TCNQ

HAT-CN

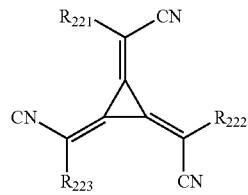

[Formula 221]

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the compound containing element EL1 and element EL2 may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (e.g., $ReO_3$ and the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcJ_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $Cob_2$, and the like), rhodium halide (e.g., $RhF_2$, $RhCl_2$, $RhBr_2$, $RhJ_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbJ_2$, $YbI_3$, $SmI_3$, and the like.

Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

[Emission Layer in Interlayer 130]

When the light-emitting device 10 is a full color light-emitting device, the emission layer may be patterned into a red emission layer, a green emission layer, and/or a blue emission layer, according to a sub-pixel. In embodiments, the emission layer may have a stacked structure. The stacked structure may include two or more layers selected from a red emission layer, a green emission layer, and a blue emission layer. The two or more layers may be in direct contact with each other. In embodiments, the two or more layers may be separated from each other. In embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

In embodiments, the emission layer may include the organometallic compound represented by Formula 1 only.

The emission layer may include a host and a dopant. The dopant may be a phosphorescent dopant, a fluorescent dopant, a delayed fluorescence dopant, or any combination thereof.

In embodiments, the dopant may be the organometallic compound represented by Formula 1. For example, in an embodiment, the emission layer may include the at least one organometallic compound represented by Formula 1, and the at least one organometallic compound may serve as a phosphorescent dopant to emit phosphorescence from the emission layer. For example, in another embodiment, the emission layer may include the at least one organometallic compound represented by Formula 1, and the at least one organometallic compound may serve as a delayed fluorescence dopant to emit delayed fluorescence from the emission layer.

An amount of the dopant in the emission layer may be in a range of about 0.01 parts to about 15 parts by weight based on 100 parts by weight of the host.

In embodiments, the emission layer may include a quantum dot.

The emission layer may include a delayed fluorescence material. The delayed fluorescence material may serve as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within any of these ranges, improved luminescence characteristics may be obtained without a substantial increase in driving voltage.

[Host]

The host may include a compound represented by Formula 301:

[Ar$_{301}$]$_{xb11}$-[(L$_{301}$)$_{xb1}$-R$_{301}$]$_{xb21}$  [Formula 301]

In Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ may each independently be the same as described in connection with Q$_1$ as provided herein.

In embodiments, when xb11 in Formula 301 is 2 or greater, at least two Ar$_{301}$(s) may be bound via a single bond.

In embodiments, the host may include a compound represented by Formula 301-1, a compound represented by Formula 301-2, or any combination thereof:

In Formulae 301-1 to 301-2, ring A$_{301}$ to ring A$_{304}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, L$_{301}$, xb1, and R$_{301}$ may each respectively be the same as described in connection with L$_{301}$, xb1, and R$_{301}$ as provided herein, L$_{302}$ to L$_{304}$ may each independently be the same as described in connection with L$_{301}$ as provided herein, xb2 to xb4 may each independently be the same as described in connection with xb1 as provided herein, and R$_{302}$ to R$_{305}$ and R$_{311}$ to R$_{314}$ may each independently be the same as described in connection with R$_{301}$ as provided herein.

In embodiments, the host may include an alkaline earth-metal complex, a post-transitional metal complex, or any combination thereof. For example, the host may include a Be complex (e.g., Compound H55), a Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), or any combination thereof:

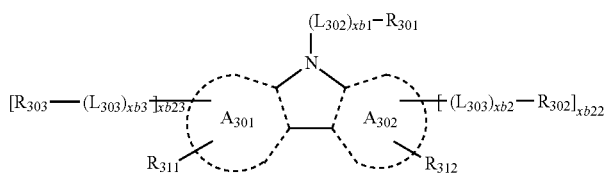

[Formula 301-1]

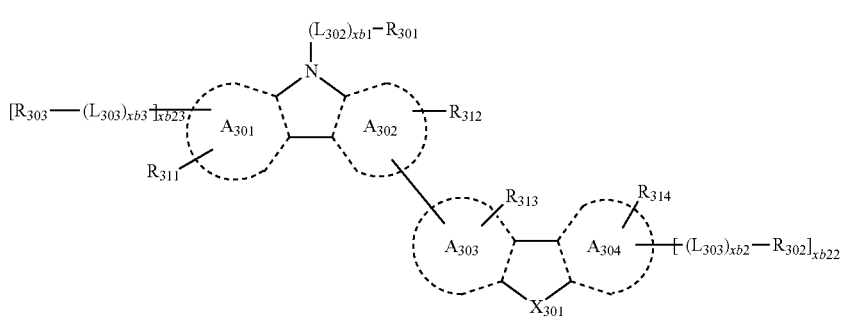

[Formula 301-2]

H1
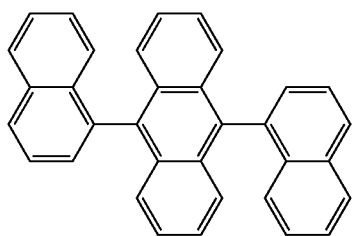
H2
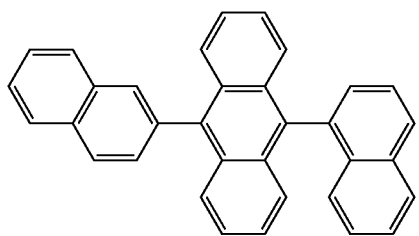
H3
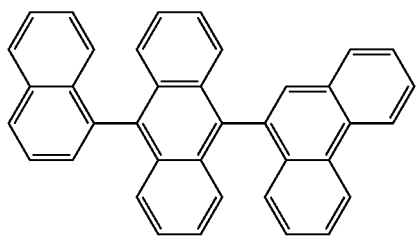
H4
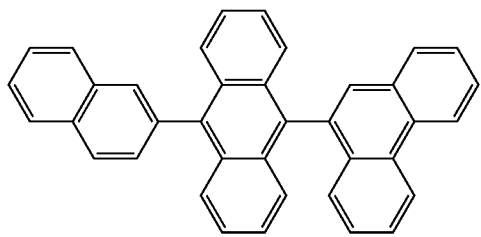
H5
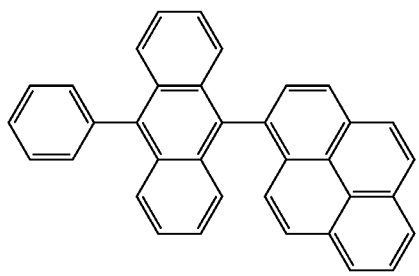
H6
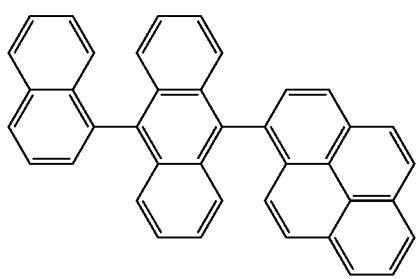
H7
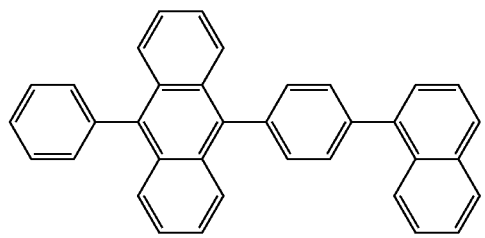
H8
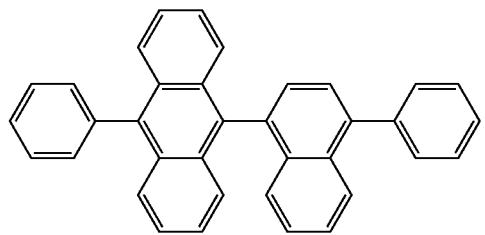
H9
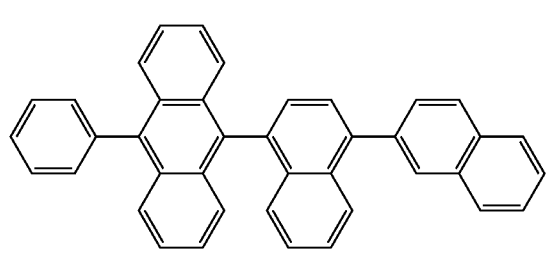
H10
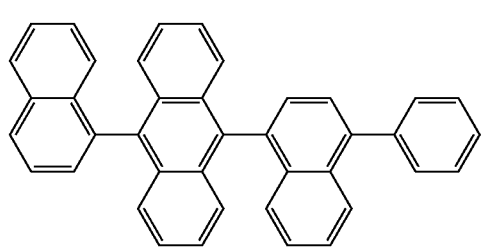
H11
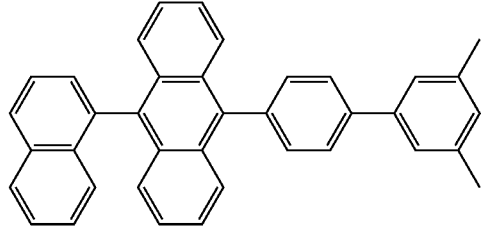
H12
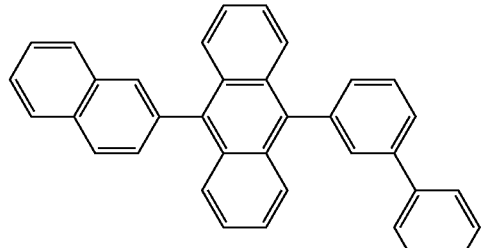

H13
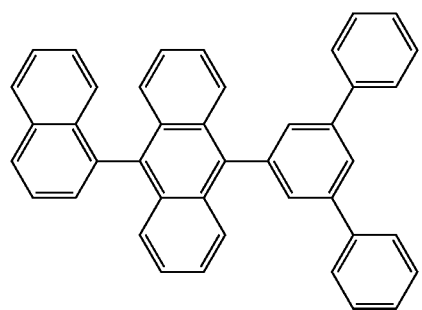
H14
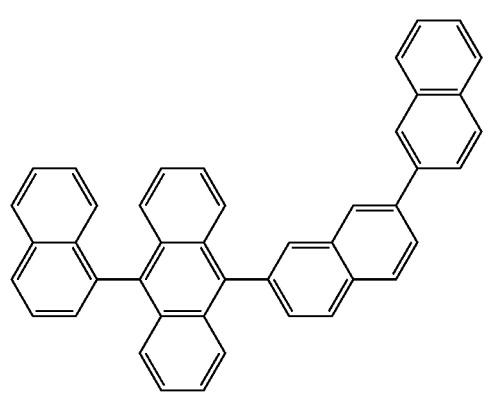
H15
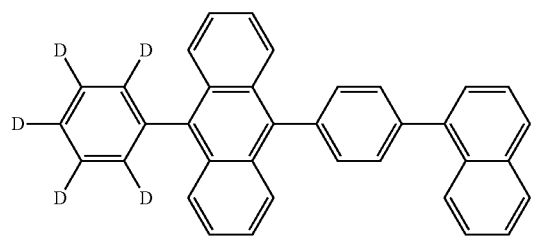
H16
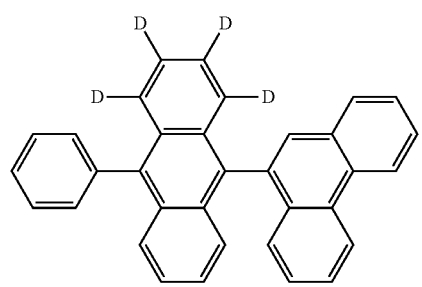
H17
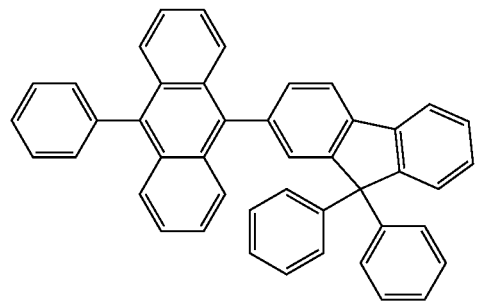
H18
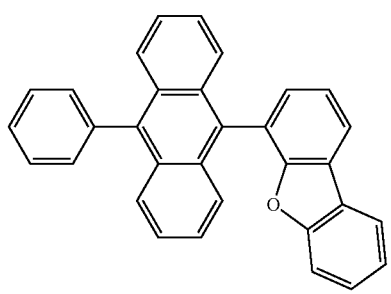
H19
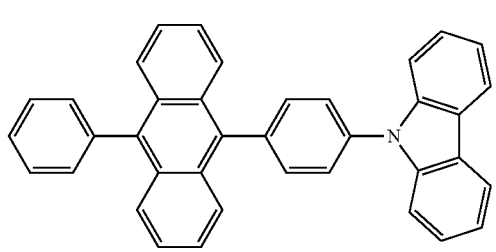
H20
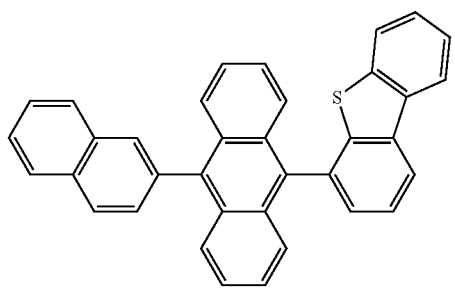
H21
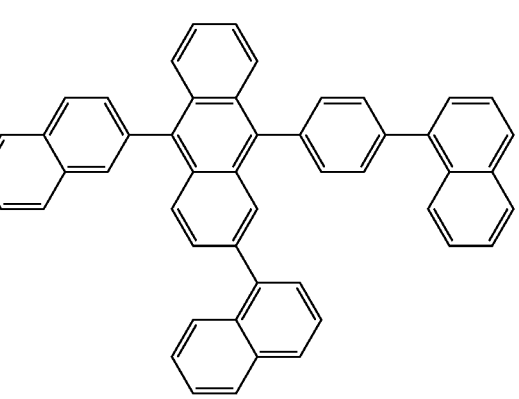
H22
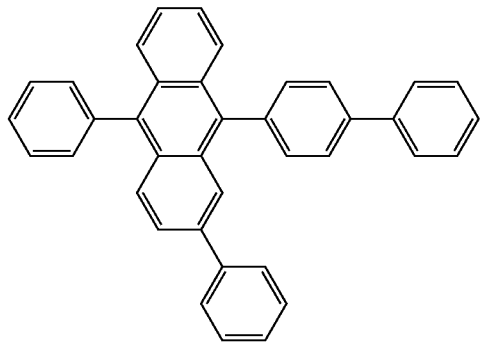

H23
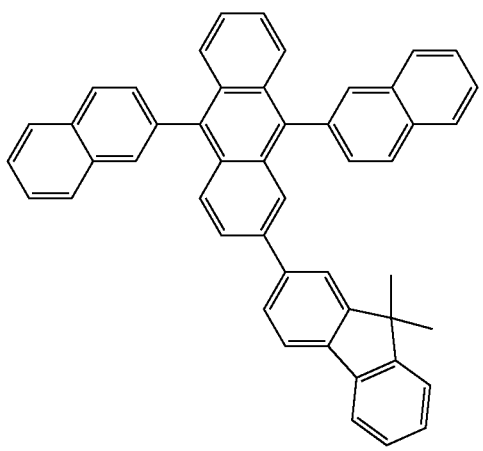
H24
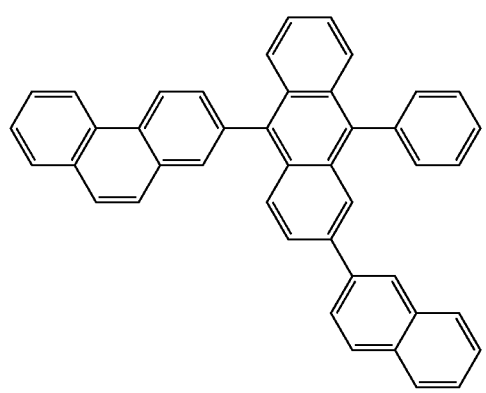
H25
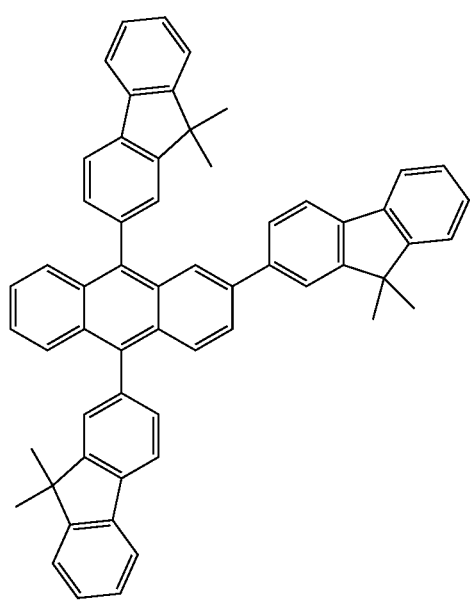
H26
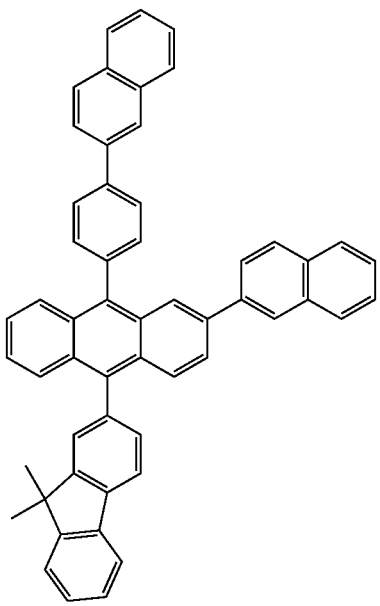
H27
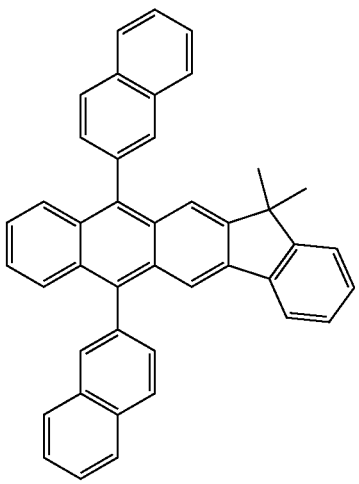
H28
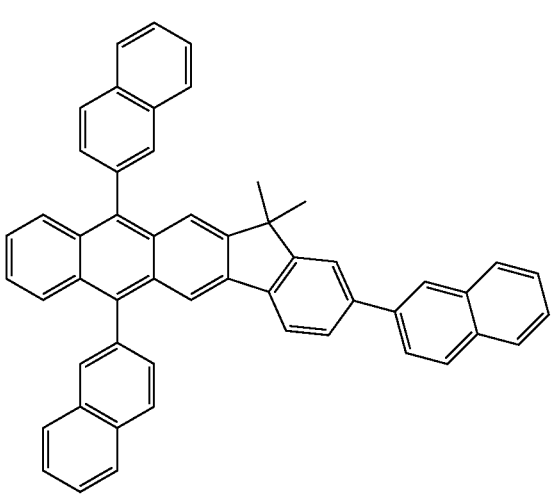

-continued
H29
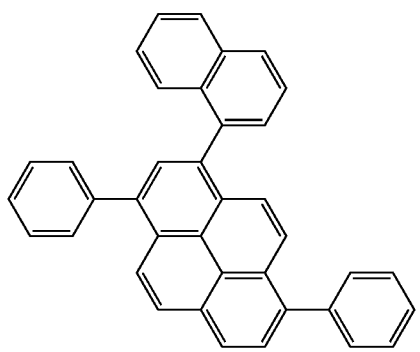
H30
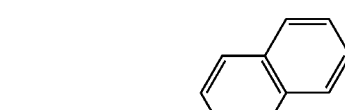
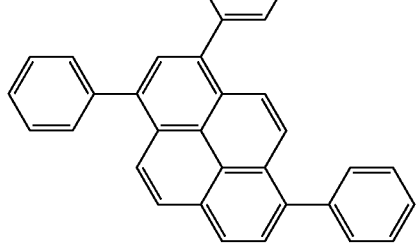
H31
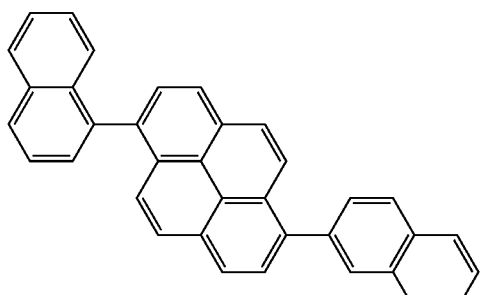
H32
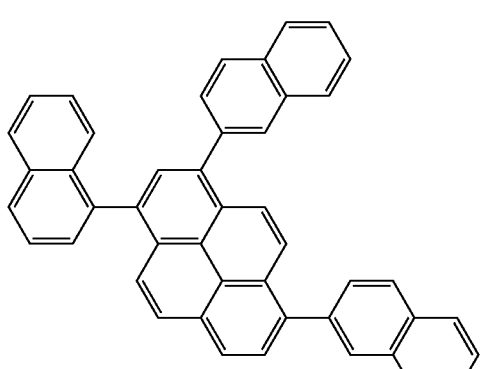
H33
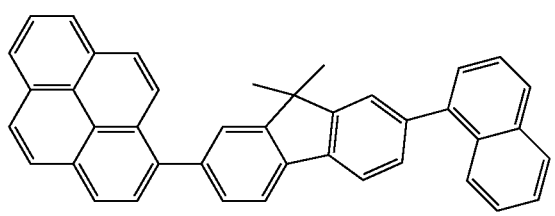
-continued
H34
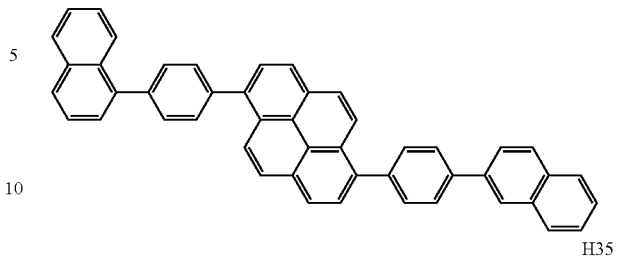
H35
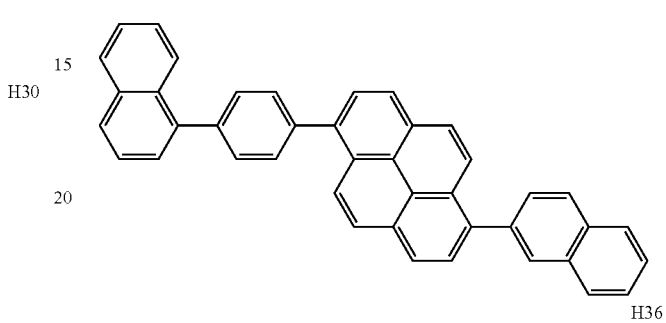
H36
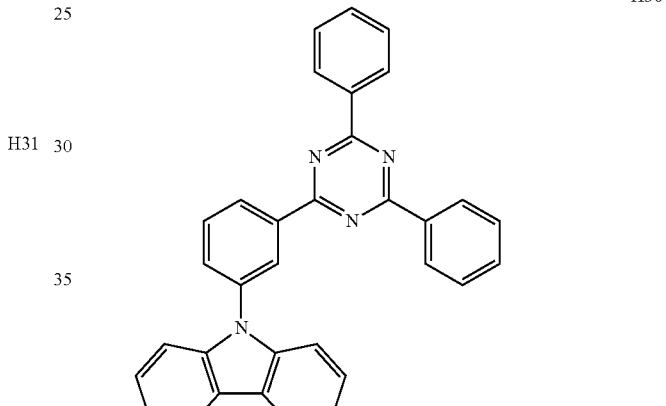
H37
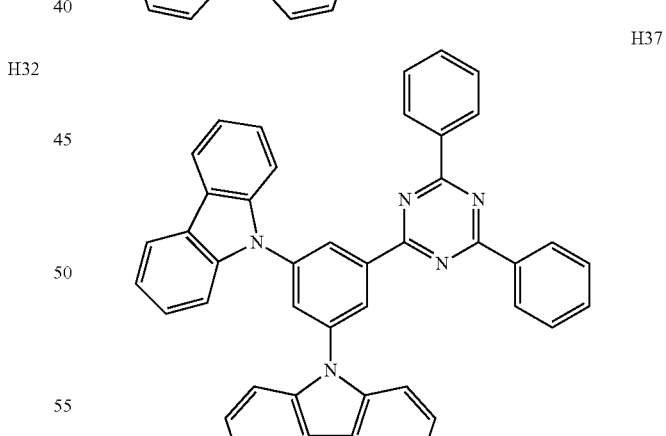
H38
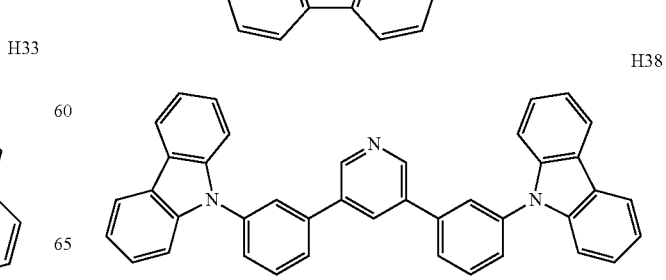

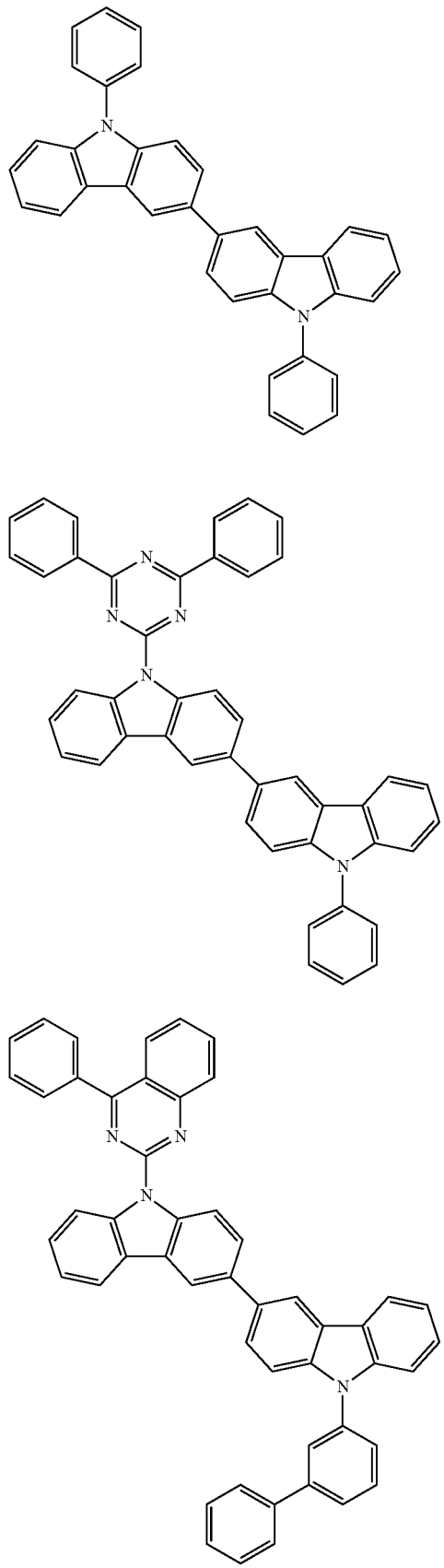
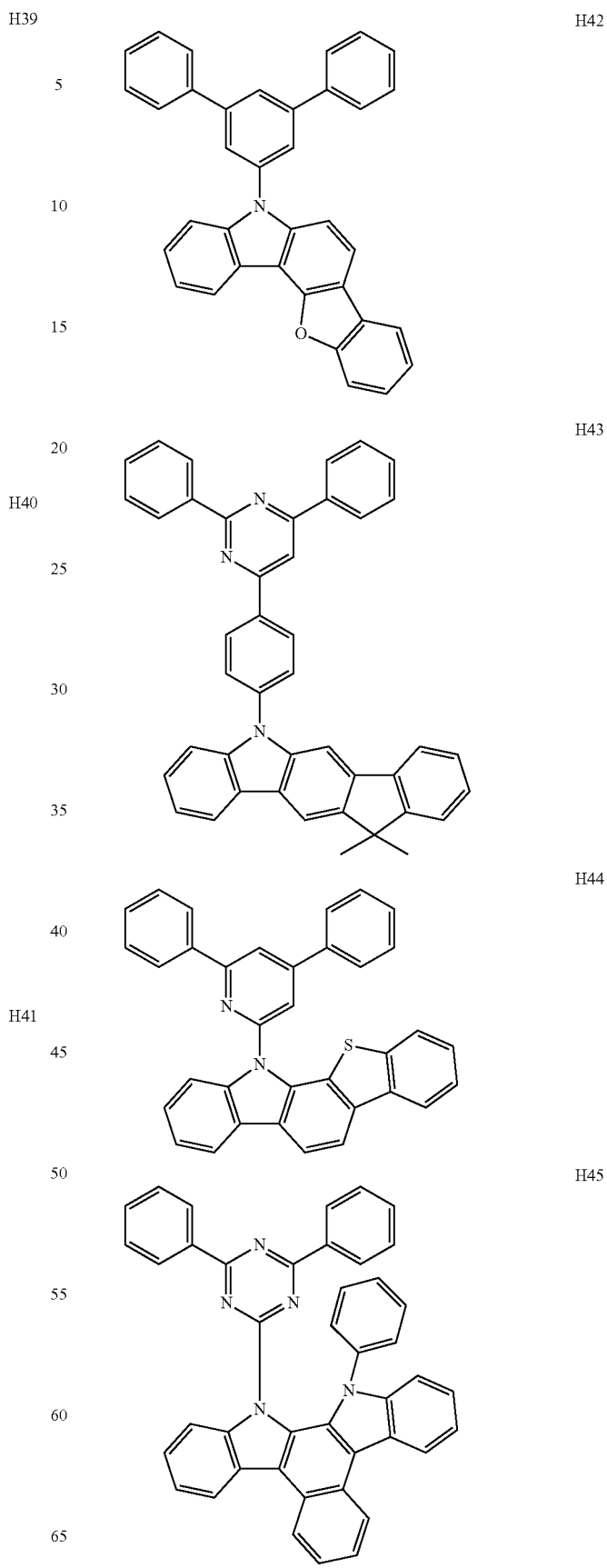

71
-continued
H47
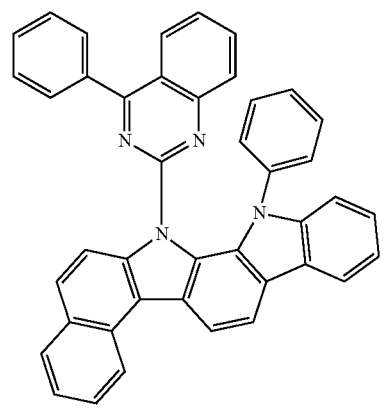
H48
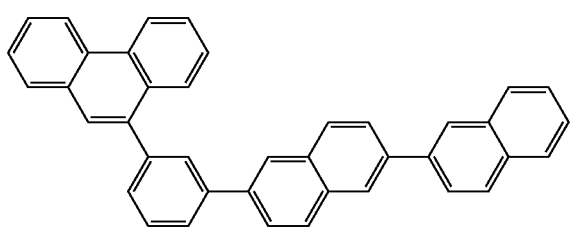
H49
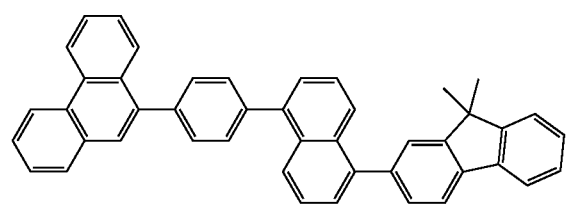
H50
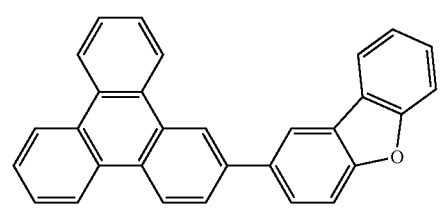
H51
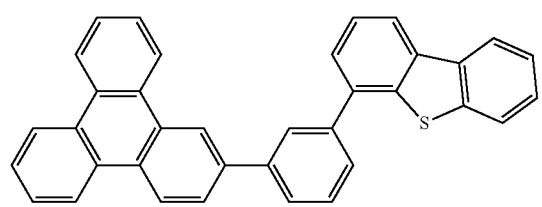
72
-continued
H46
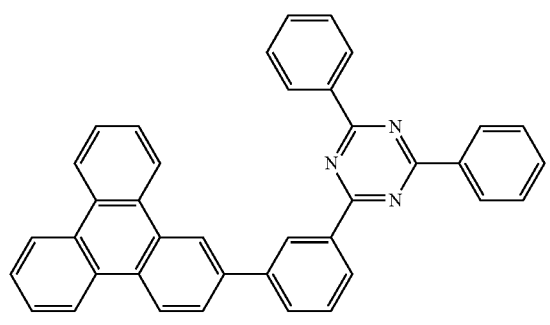
H52
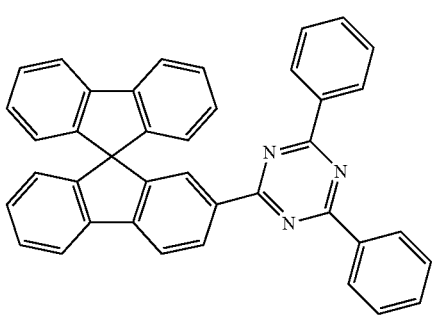
H53
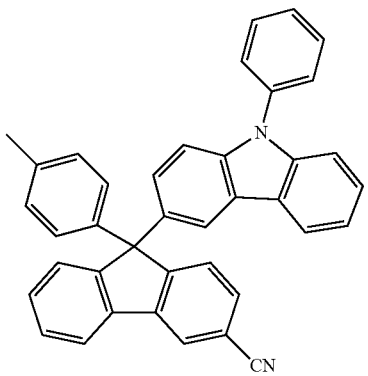
H54
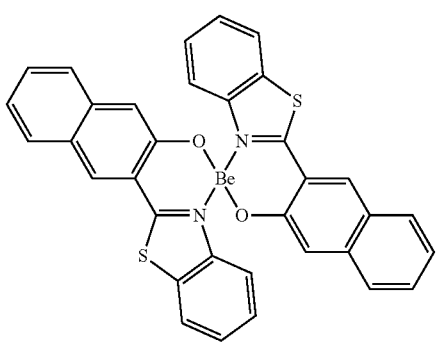
H55

-continued
H56
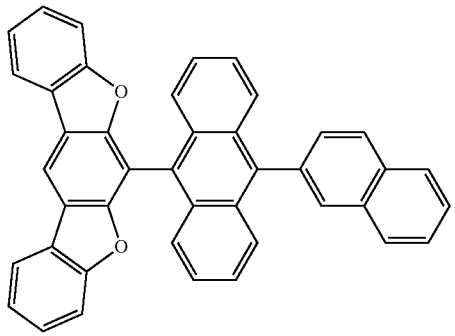
H57
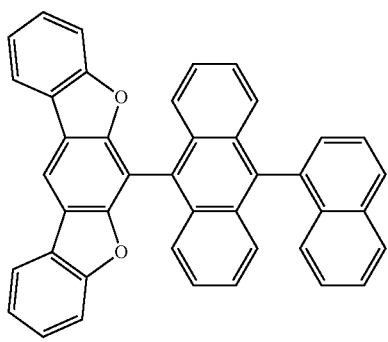
H58
H59
-continued
H60
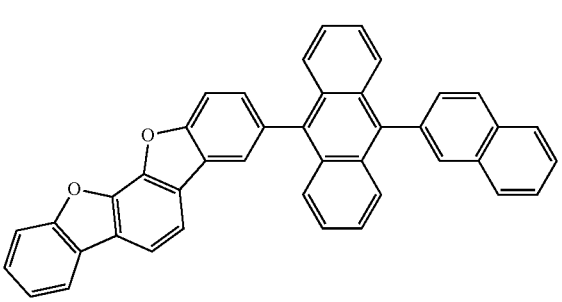
H61
H62
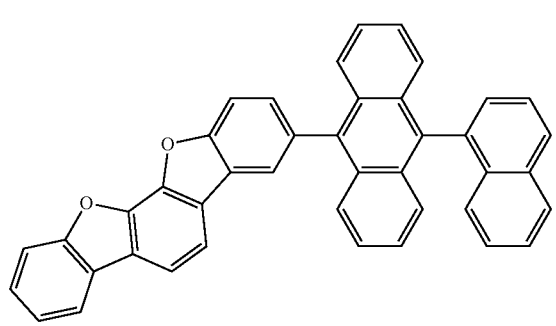
H63
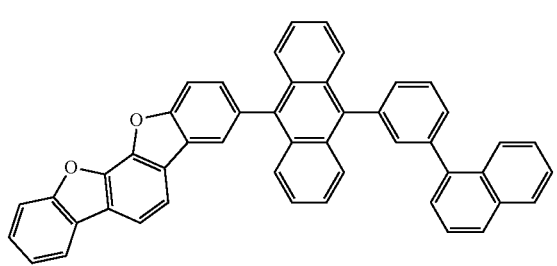
H64
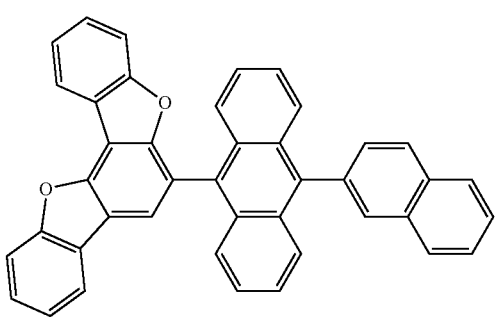
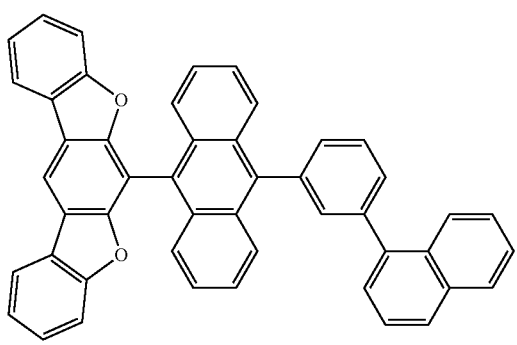

75
-continued
H65
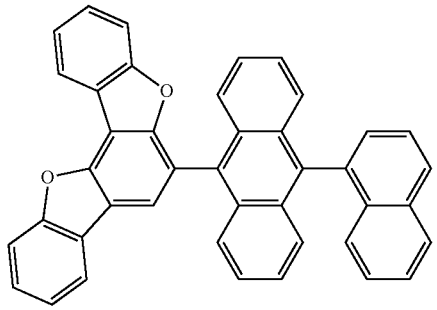
H66
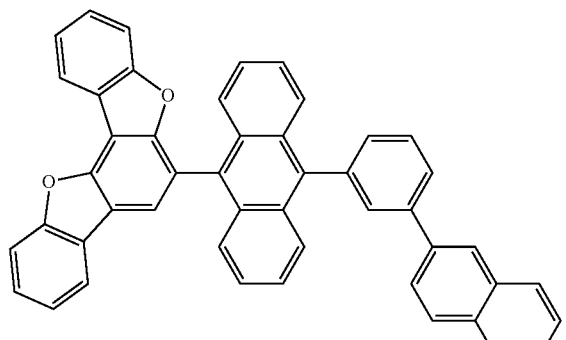
H67
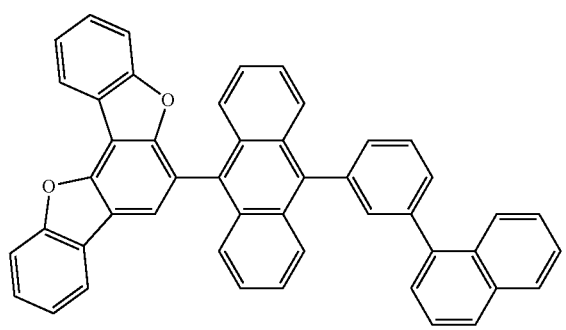
H68
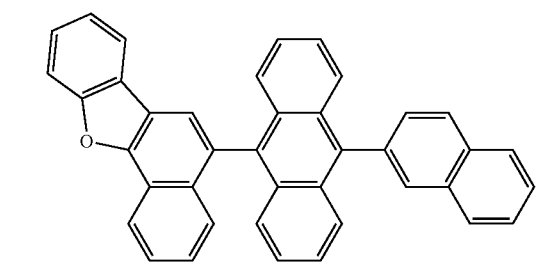
H69
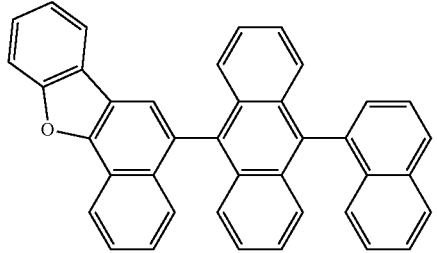
76
-continued
H70
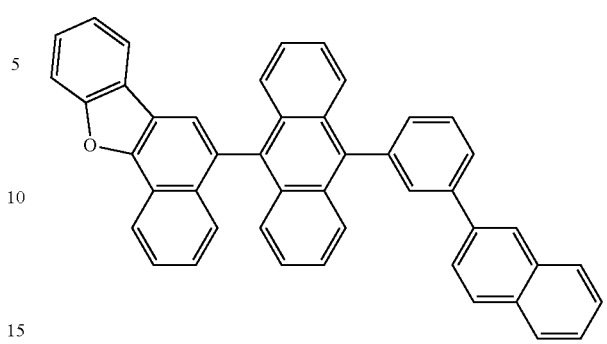
H71
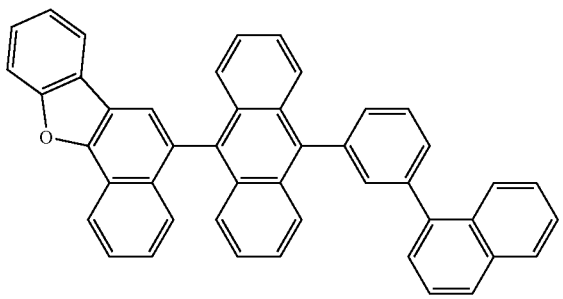
H72
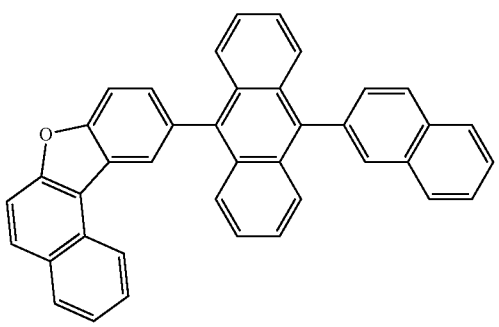
H73
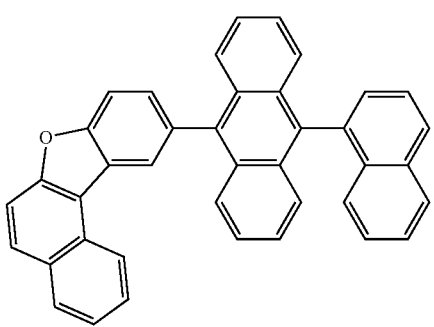

H74
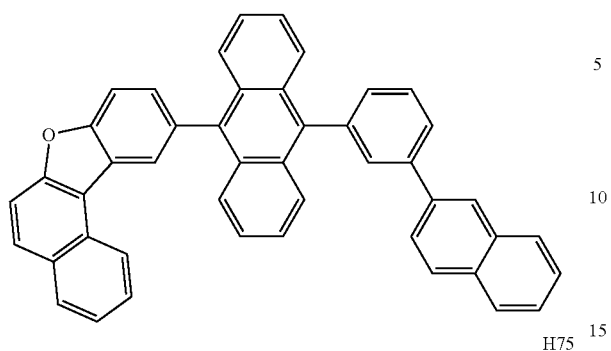
H75
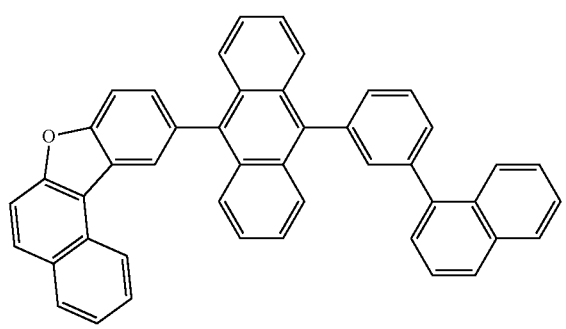
H76
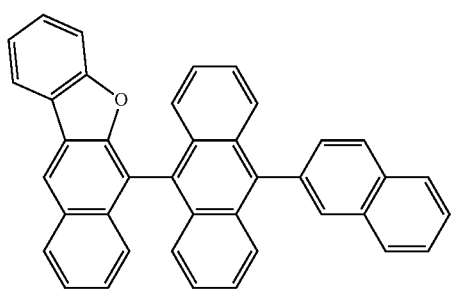
H77
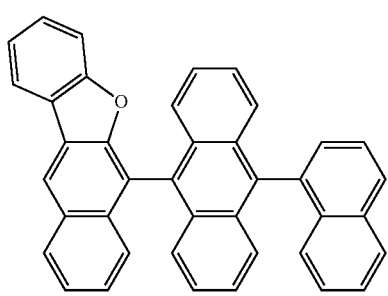
H78
H79
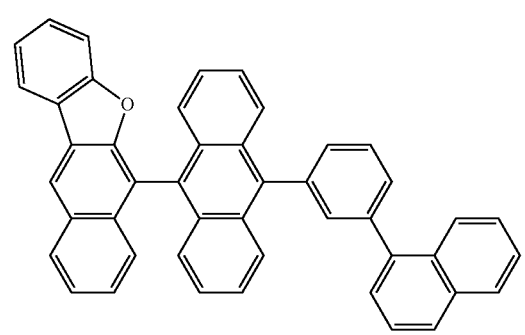
H80
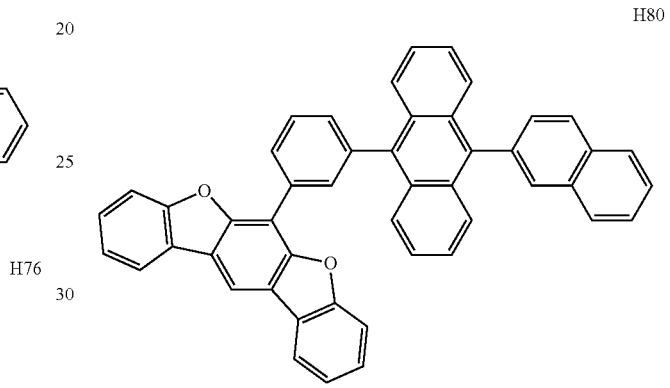
H81
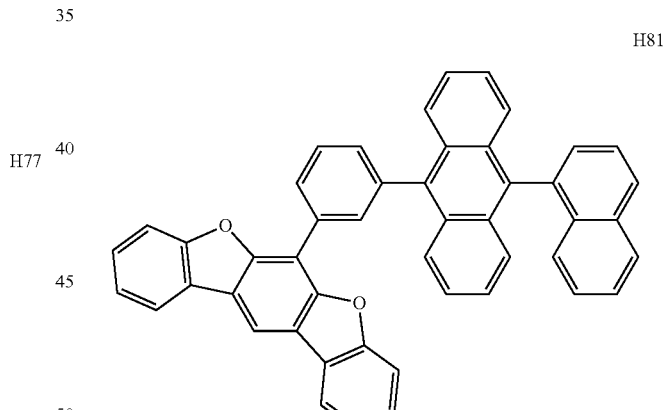
H82
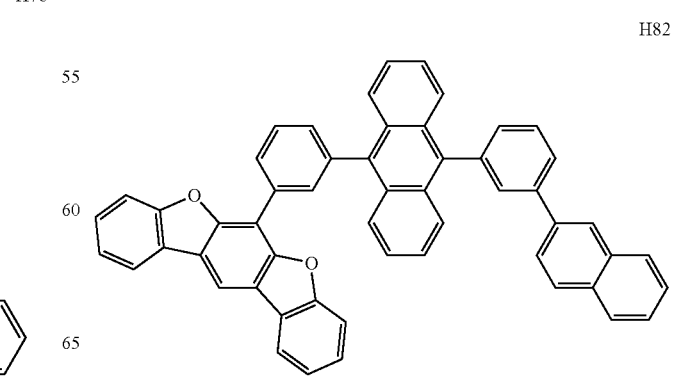

-continued
H83
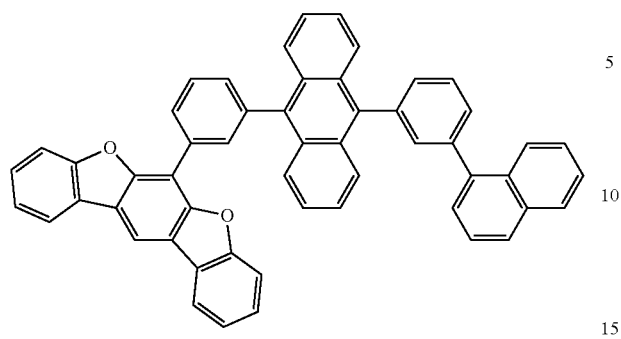
H84
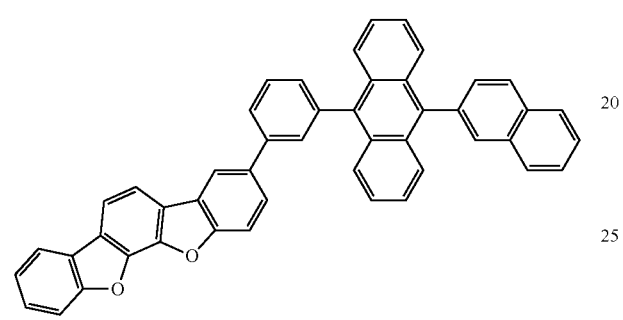
H85
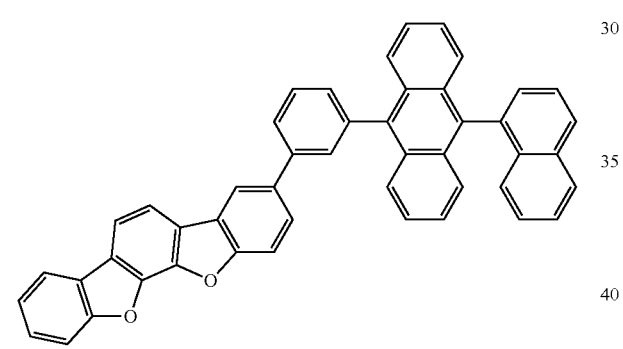
H86
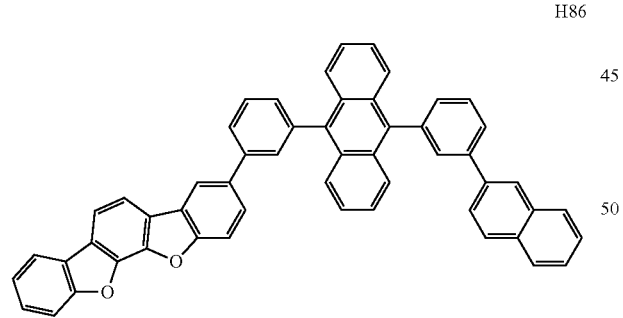
H87
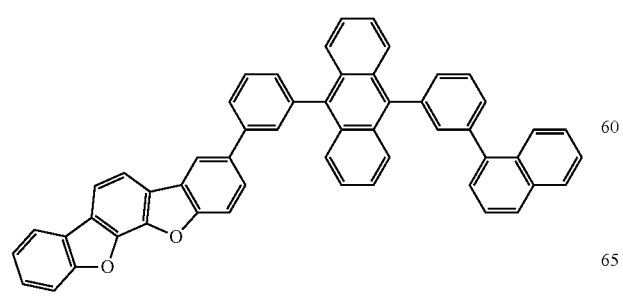
-continued
H88
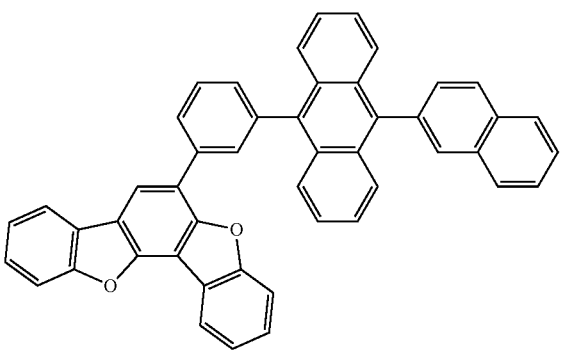
H89
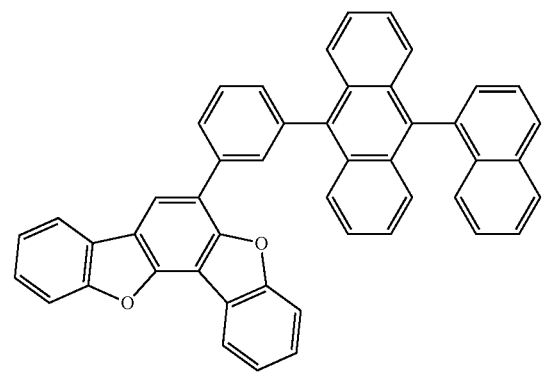
H90
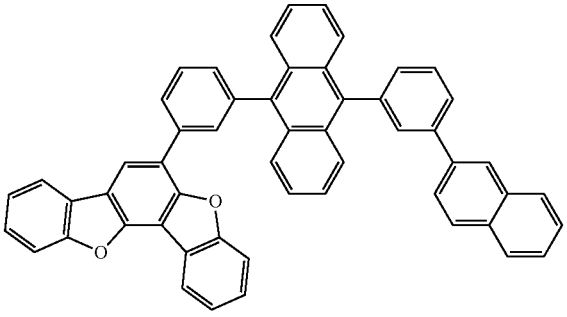
H91
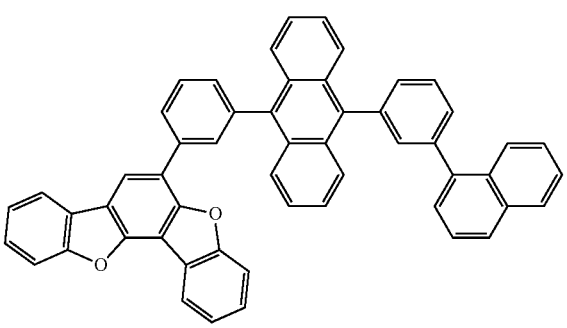

H92
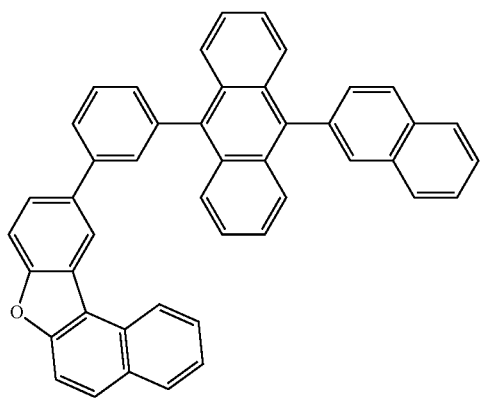
H93
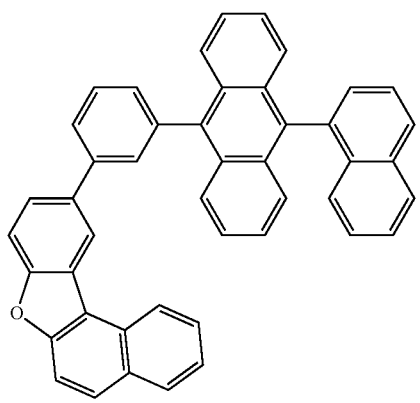
H94
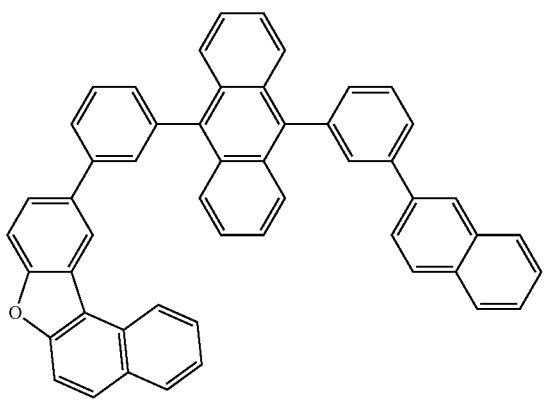
H95
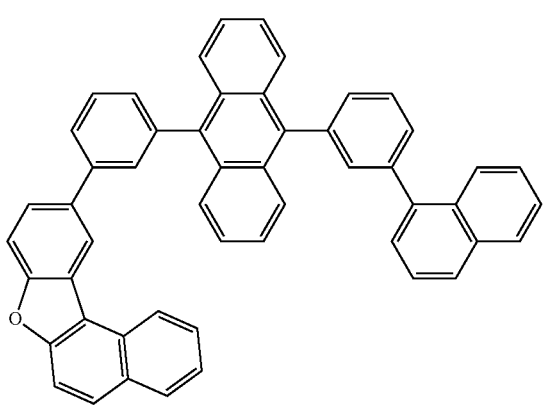
H96
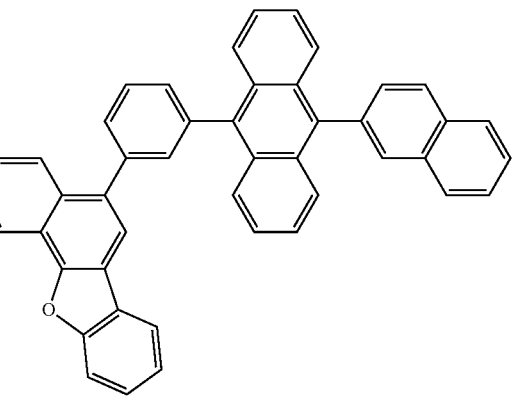
H97
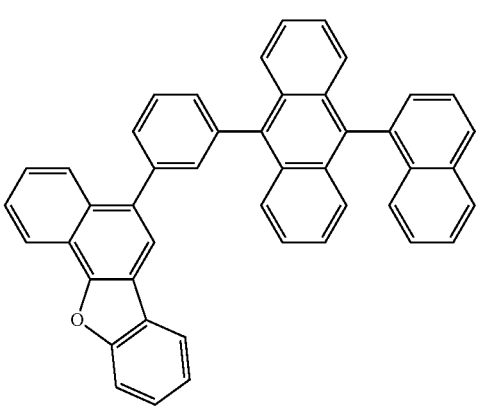
H98
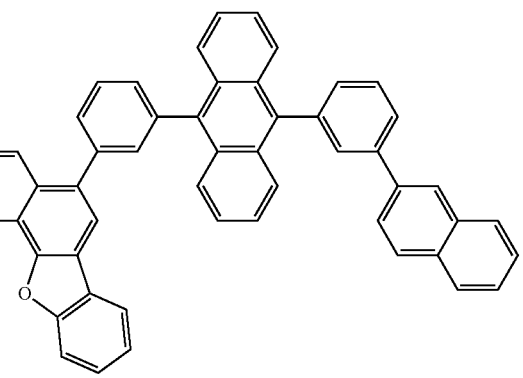
H99
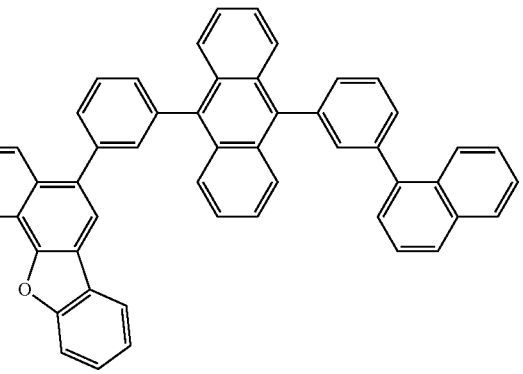

-continued
H100
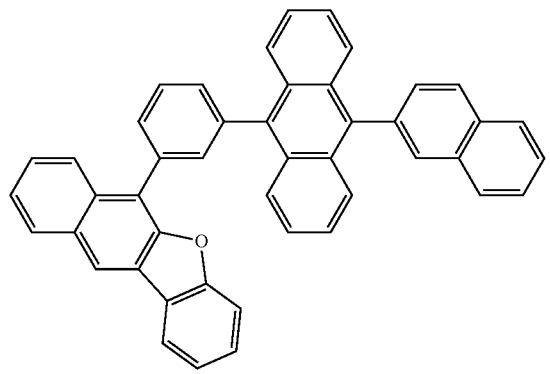
H101
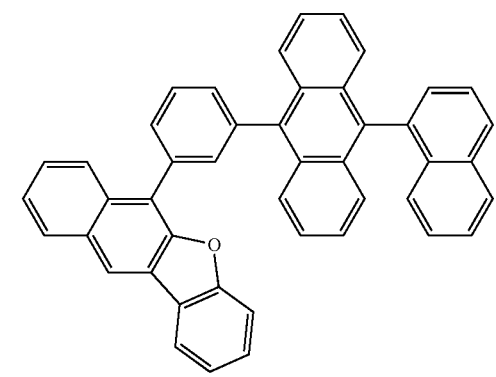
H102
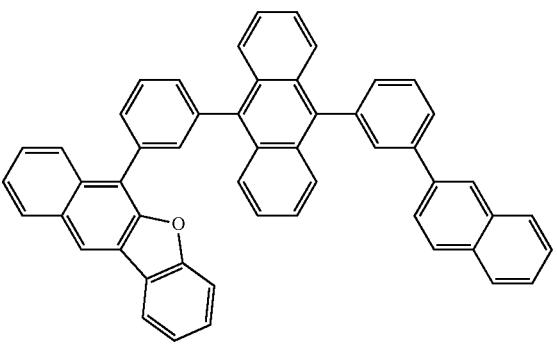
H103
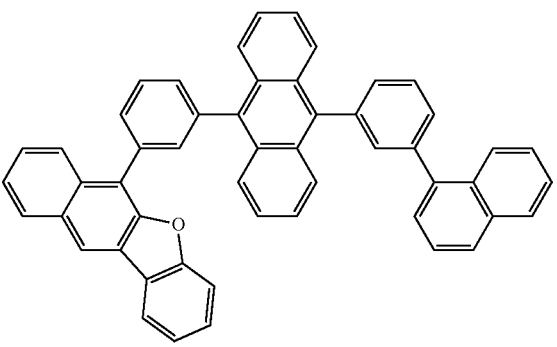
-continued
H104
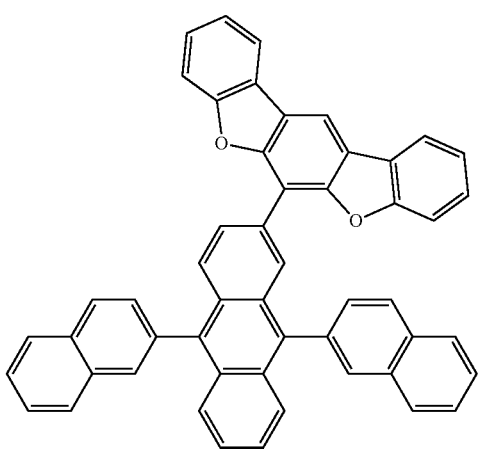
H105
H106
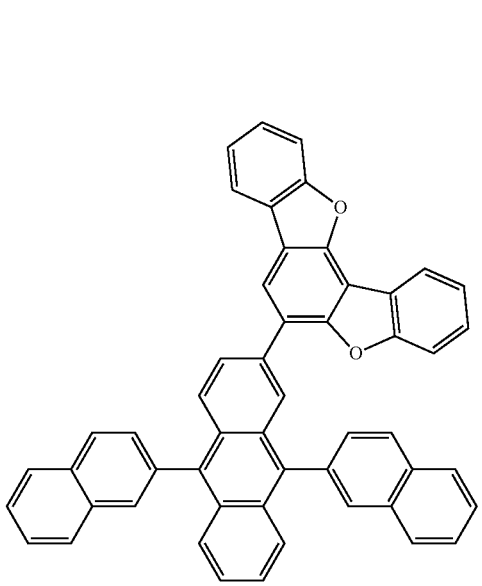

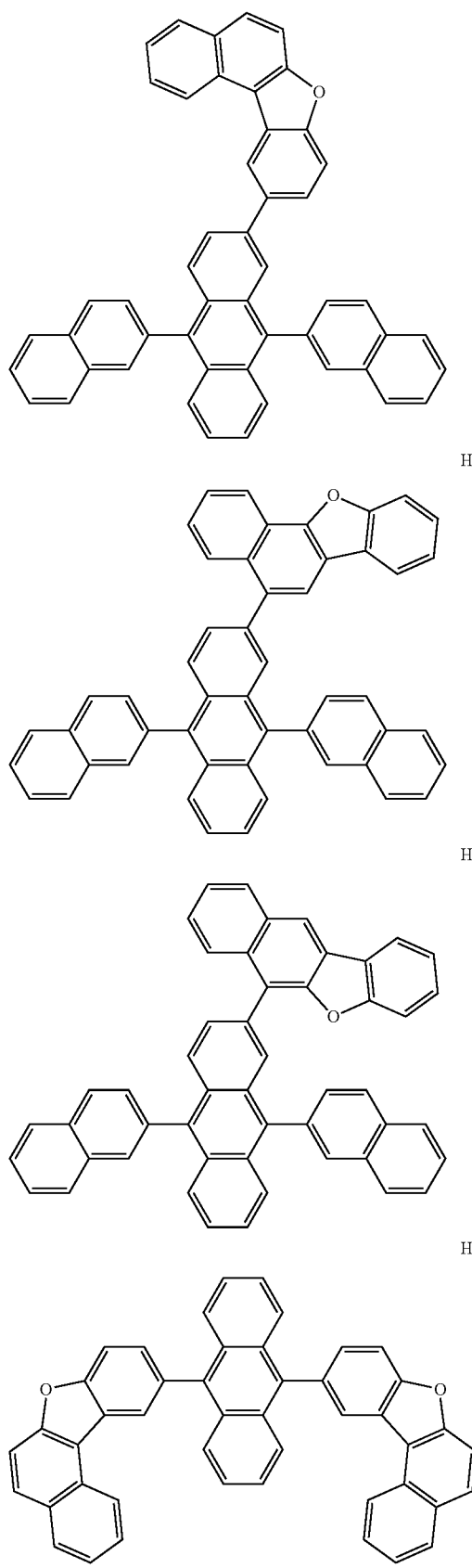
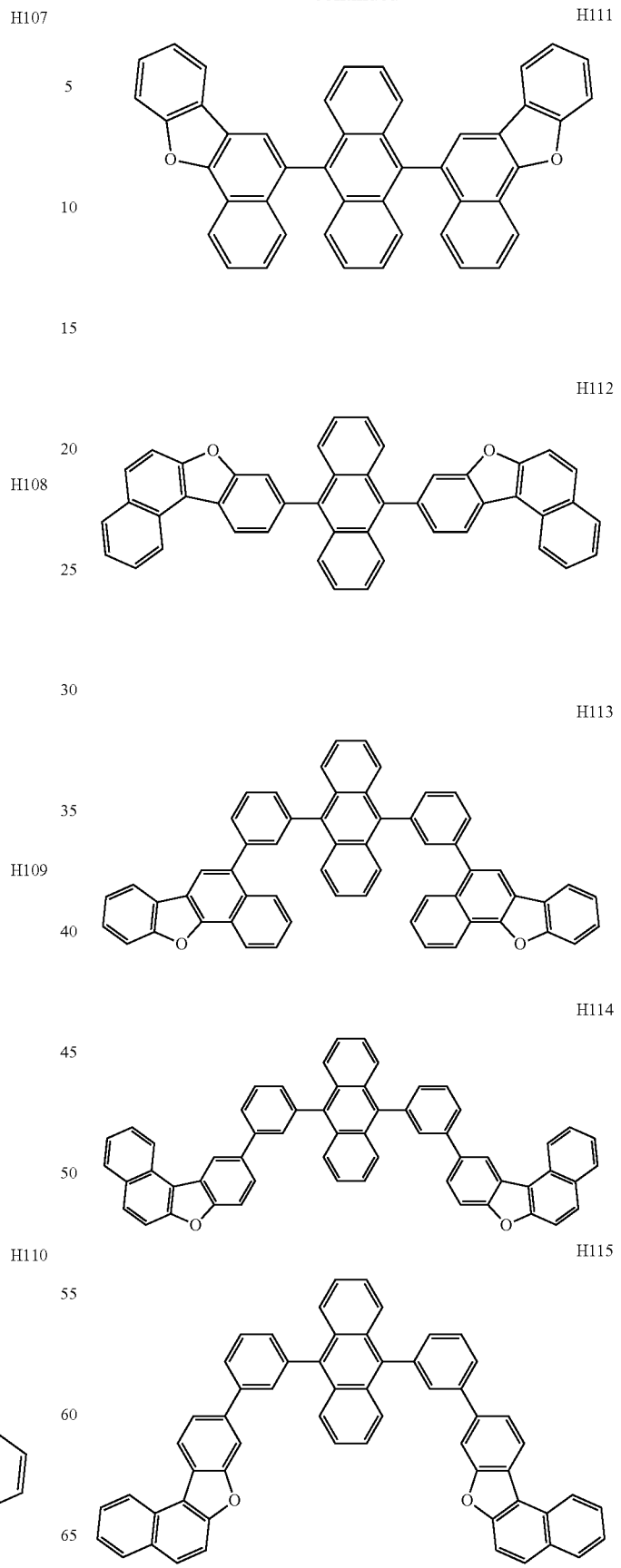

H116
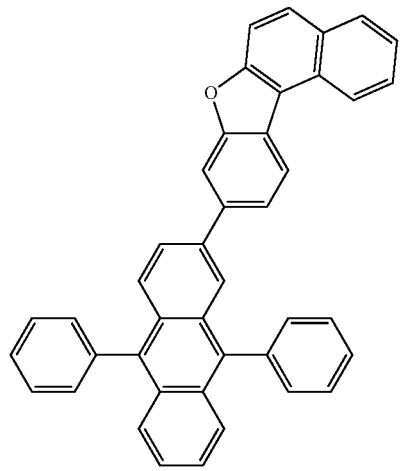
H117
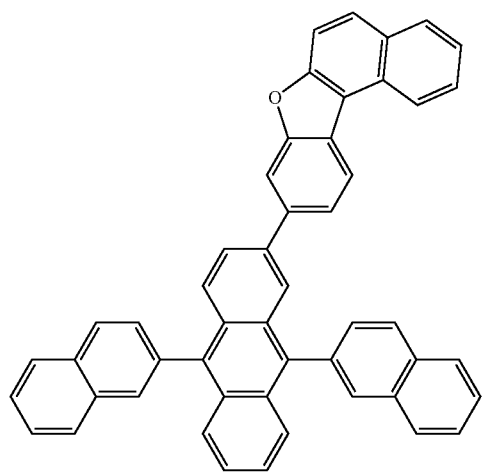
H118
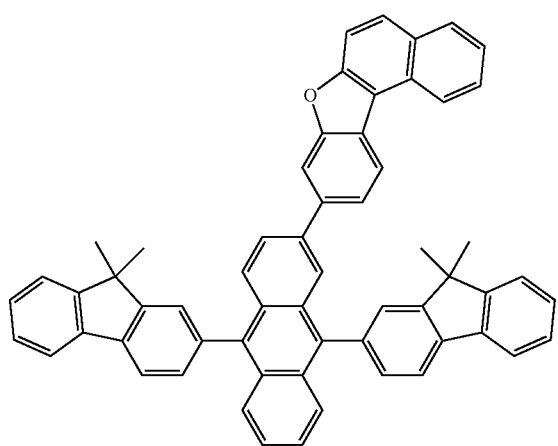
H119
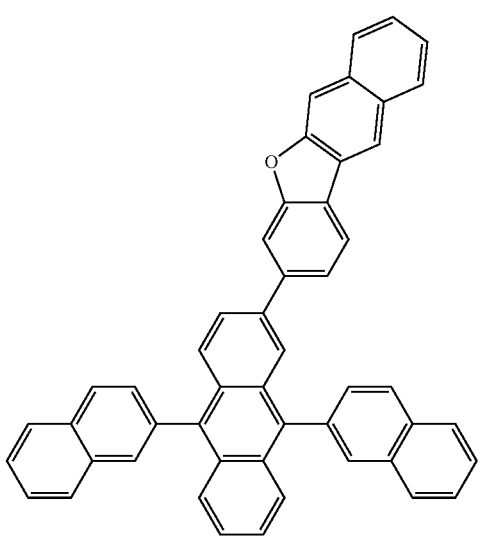
H120
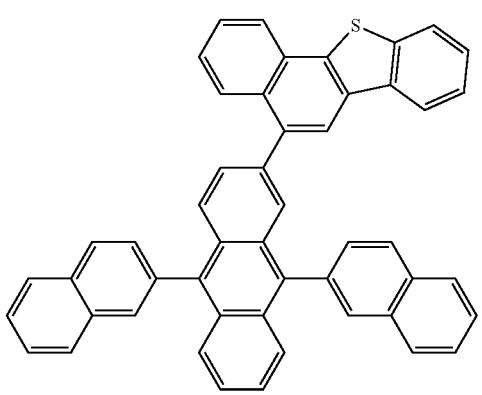
H121
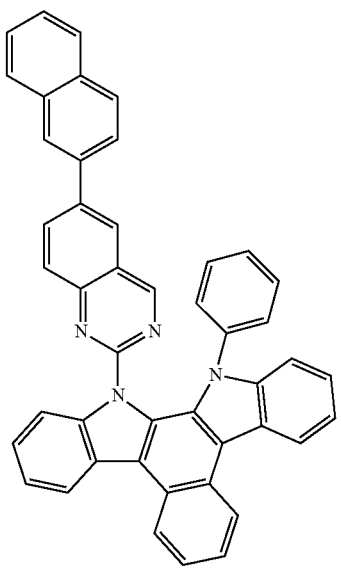

H122

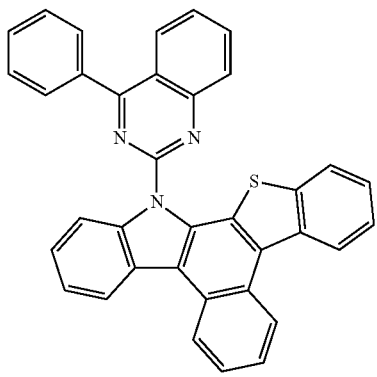

H123

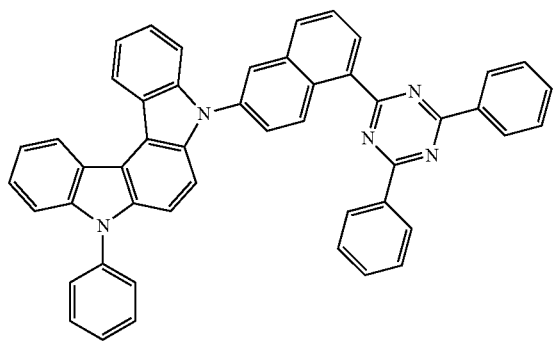

H124

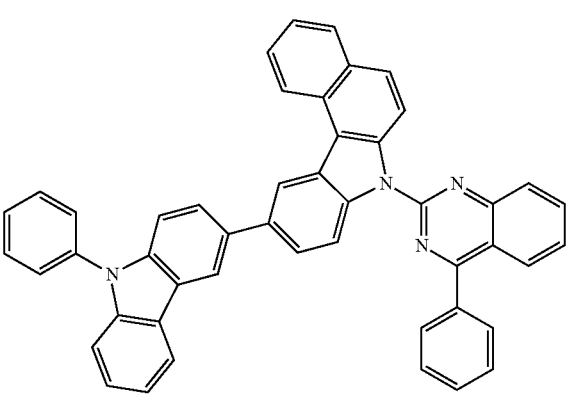

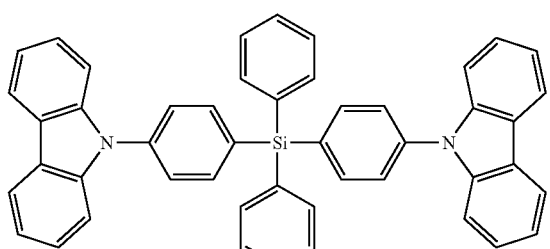

BCPDS

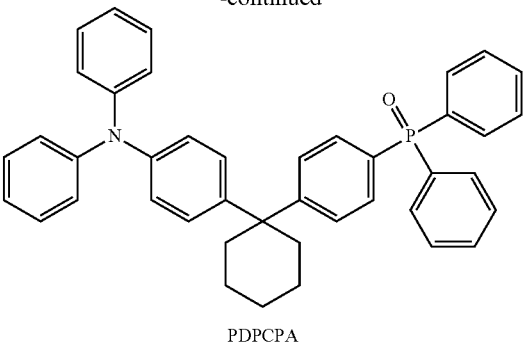

PDPCPA

[Phosphorescent Dopant]

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic complex represented by Formula 401:

$$M(L_{401})_{xc1}(L_{402})_{xc2} \quad \text{[Formula 401]}$$

[Formula 402]

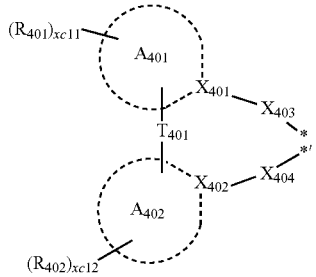

In Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{41}$)—*', *—C($Q_{411}$)($Q_{412}$)—*', *—C($Q_{411}$)=C($Q_{412}$)—*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$ as provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{401})(Q_{402})(Q_{403})$, —N$(Q_{401})(Q_{402})$, —B$(Q_{401})(Q_{402})$, —C(=O)$(Q_{401})$, —S(=O)$_2(Q_{401})$, or —P(=O)$(Q_{401})(Q_{402})$, $Q_{401}$ to $Q_{403}$ may each independently be the same as described in connection with $Q_1$ as provided herein, xc11 and xc12 may each independently be an integer from 0 to 10, and

* and *' in Formula 402 each indicate a binding site to M in Formula 401.

In embodiments, in Formula 402, $X_{401}$ may be nitrogen, and $X_{402}$ may be carbon, or $X_{401}$ and $X_{402}$ may each be nitrogen.

In embodiments, when xc1 in Formula 401 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each independently be the same as described in connection with $T_{401}$ as provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1
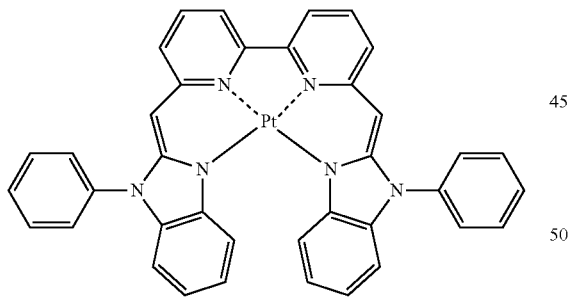

PD2
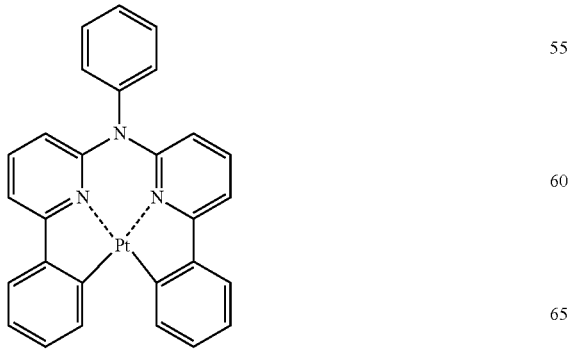

PD3
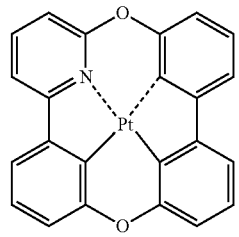

PD4
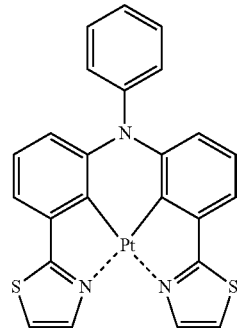

PD5
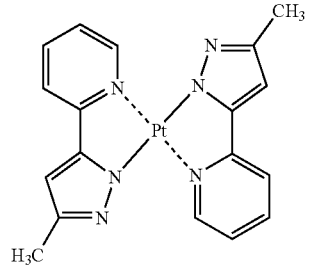

PD6
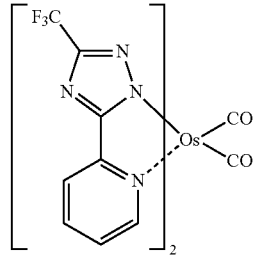

PD7
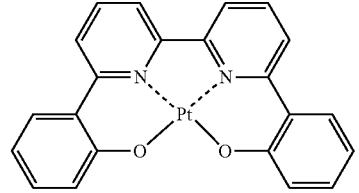

PD8
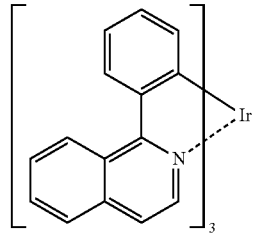

PD9 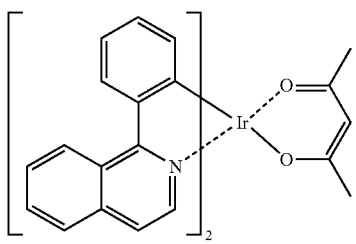
PD14 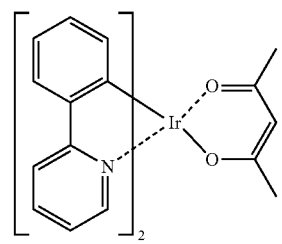
PD10 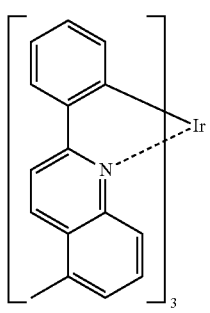
PD15 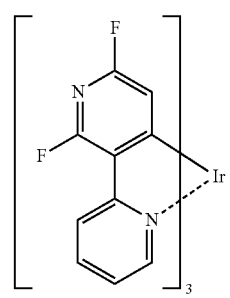
PD11 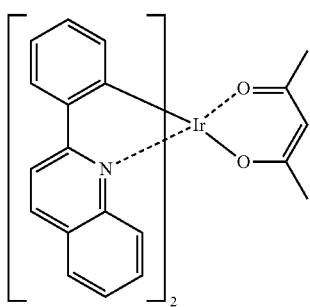
PD16 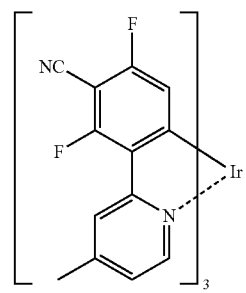
PD12 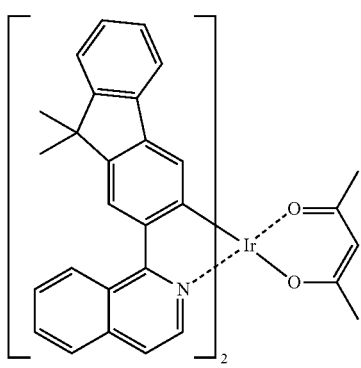
PD17 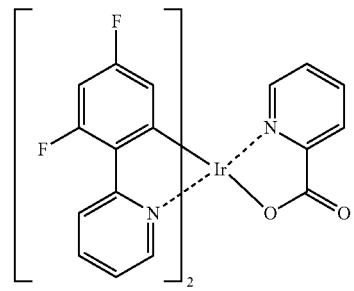
PD13 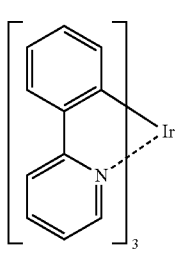
PD18 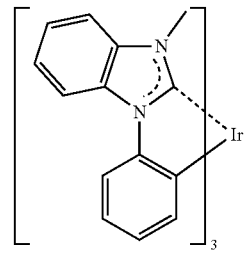

PD19 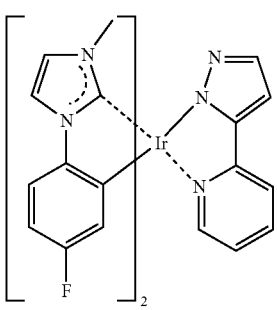

PD20 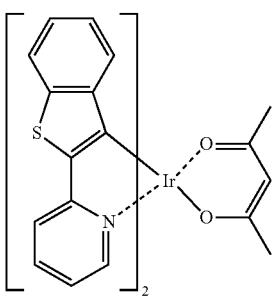

PD21 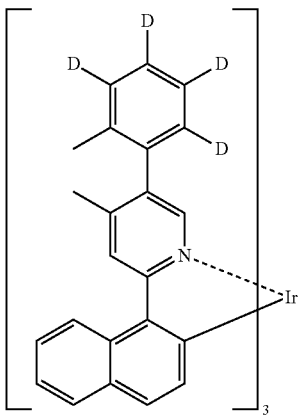

PD22 

PD23 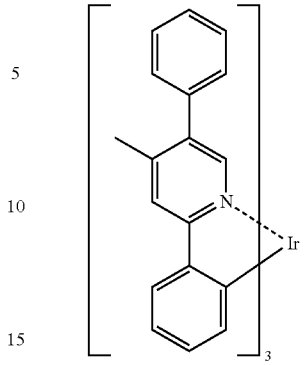

PD24 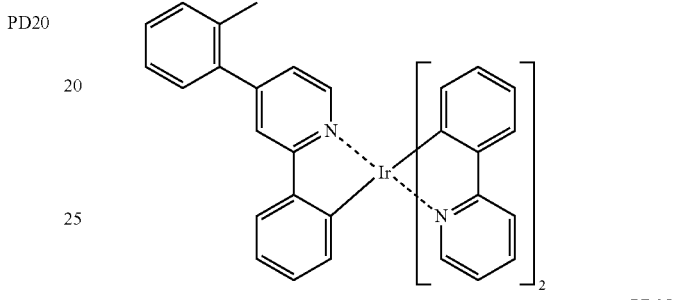

PD25 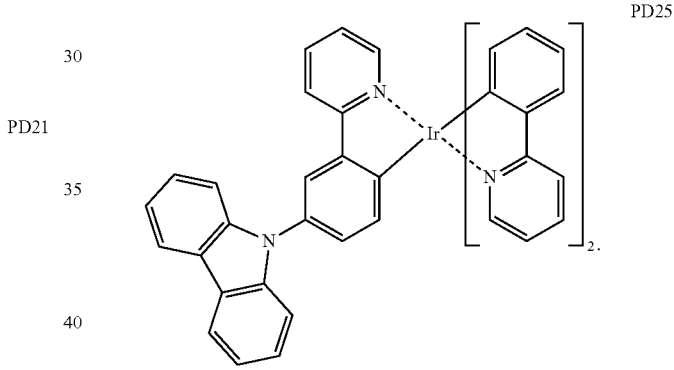

[Fluorescent Dopant]

The fluorescent dopant may include an amine group-containing compound, a styryl group-containing compound, or any combination thereof.

In embodiments, the fluorescent dopant may include a compound represented by Formula 501:

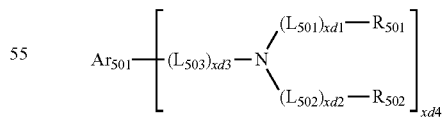

[Formula 501]

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In embodiments, in Formula 501, $Ar_{501}$ may include a condensed ring group (e.g., an anthracene group, a chrysene group, or a pyrene group) in which at least three monocyclic groups are condensed.
In embodiments, xd4 in Formula 501 may be 2.
In embodiments, the fluorescent dopant may include one of Compounds FD1 to FD36, DPVBi, DPAVBi, or any combination thereof:
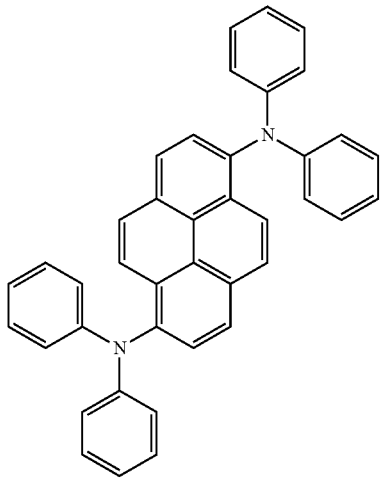
FD1
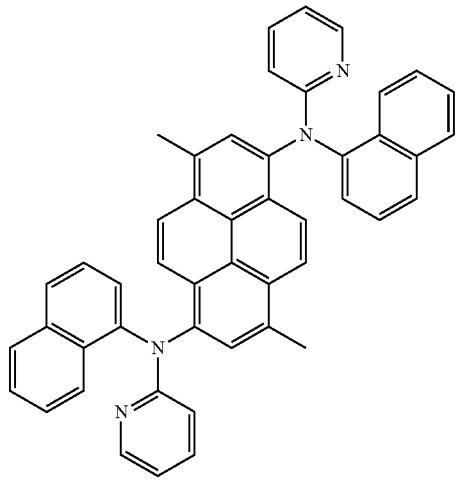
FD2
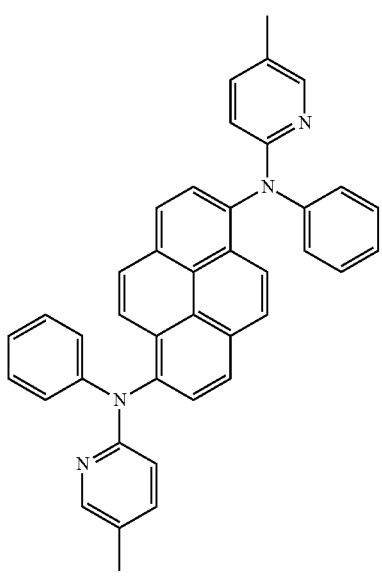
FD3
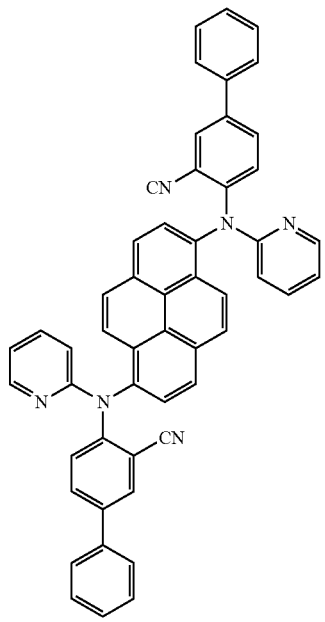
FD4

FD5
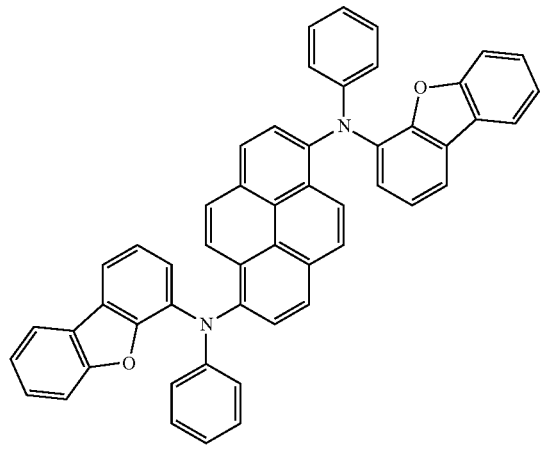
FD6
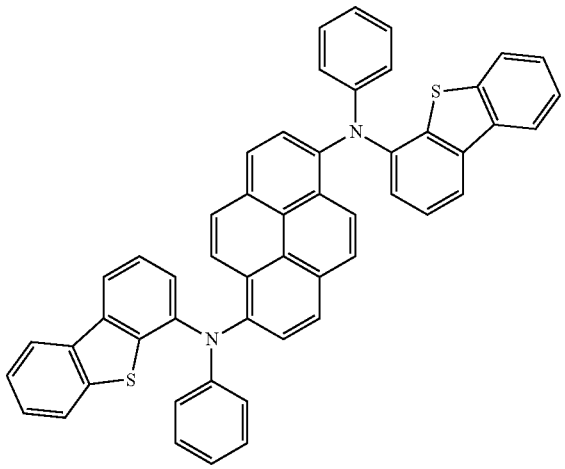
FD7
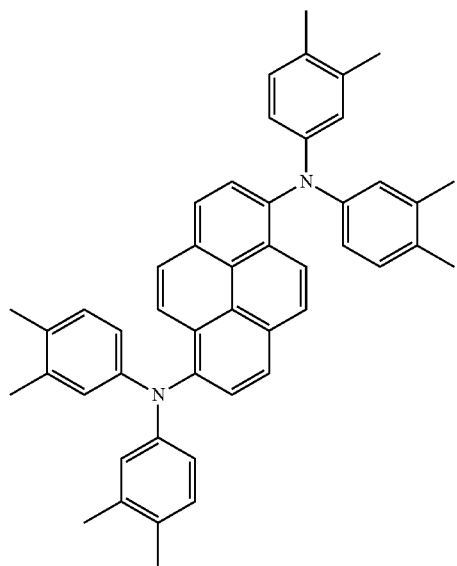
FD8
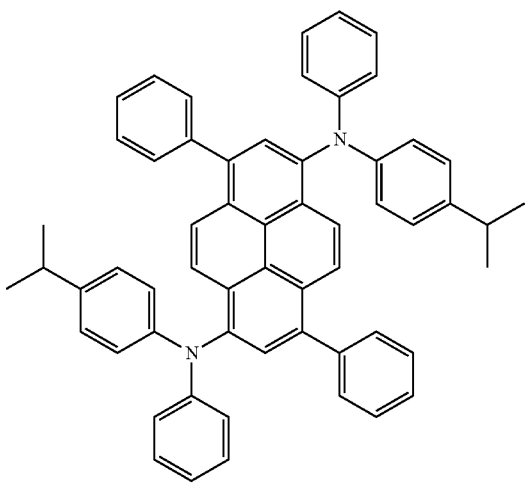
FD9
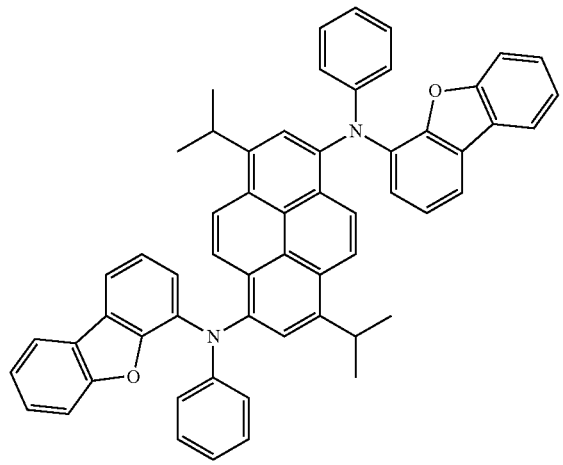
FD10
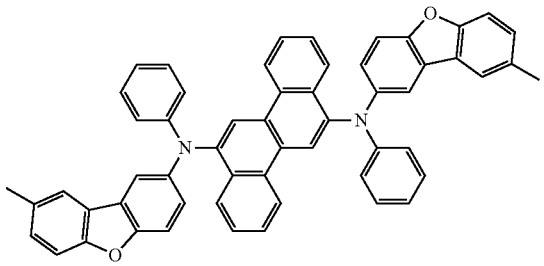

-continued
FD11
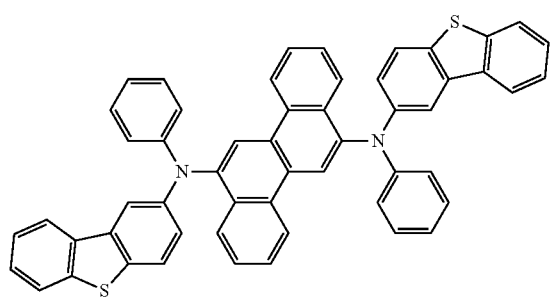
FD12
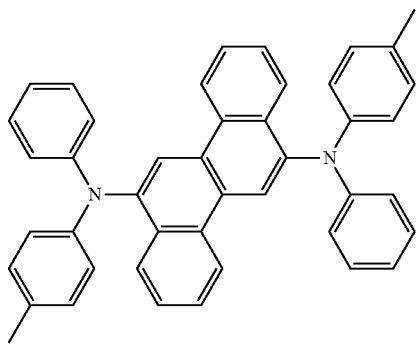
FD13
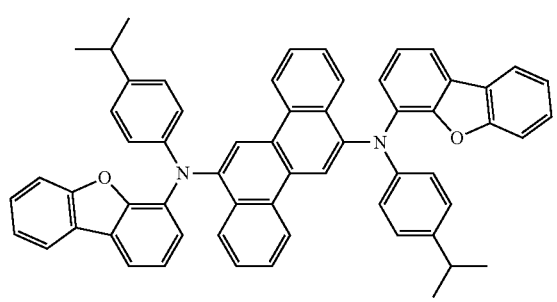
FD14
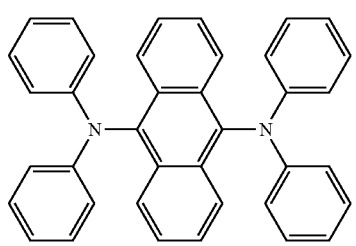
FD15
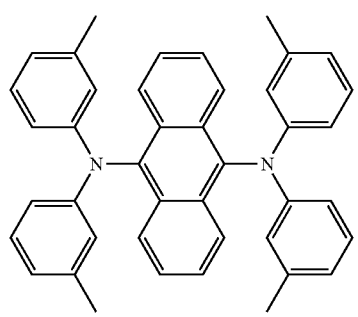
FD16
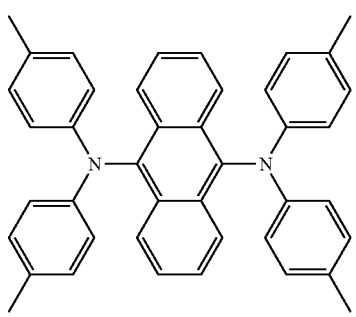
FD17
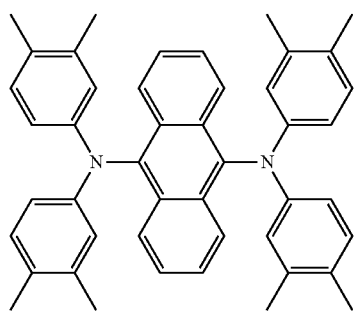
FD18
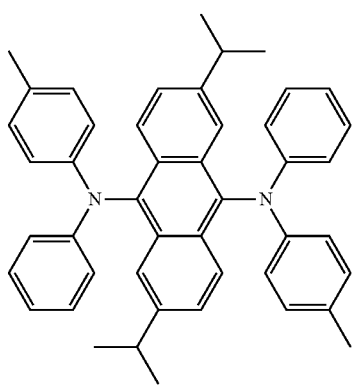

-continued
FD19
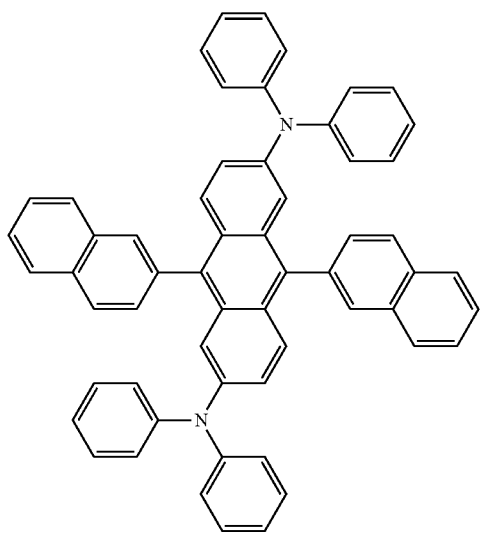
FD20
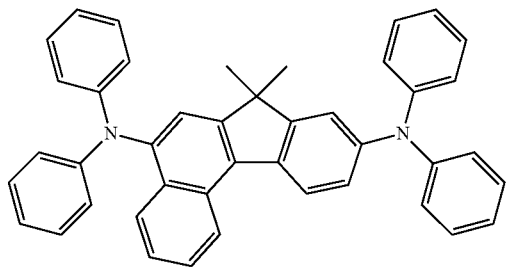
FD21
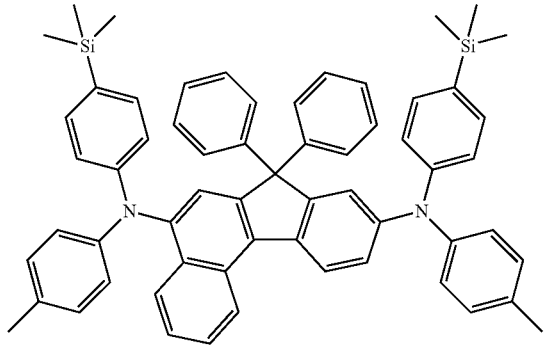
FD22
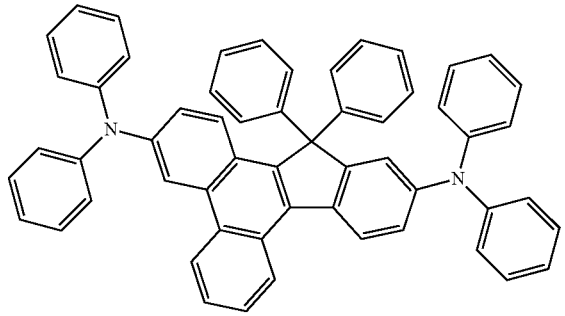
FD23
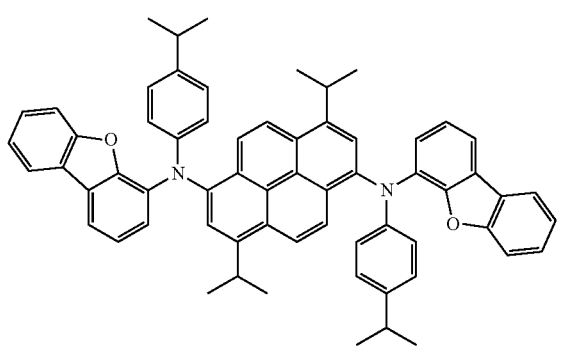
FD24
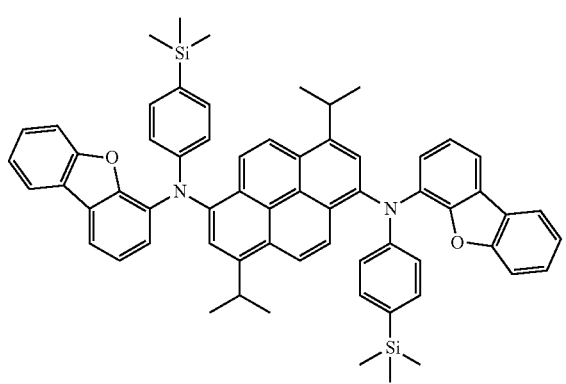

-continued
FD25
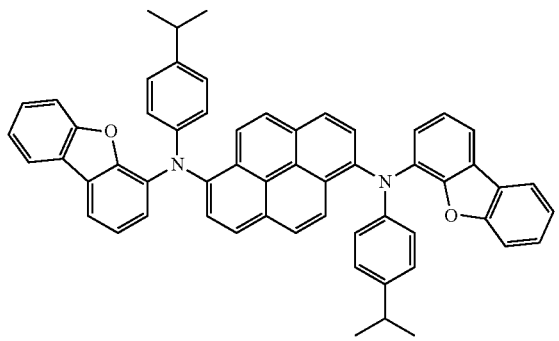
FD26
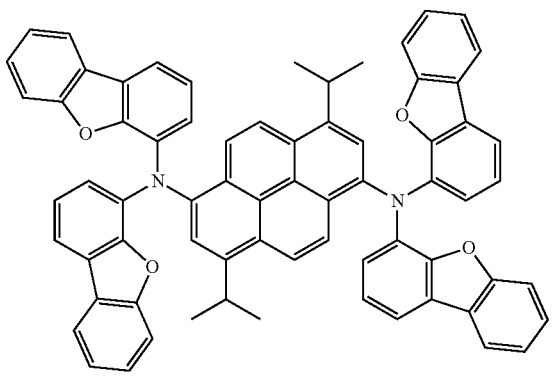
FD27
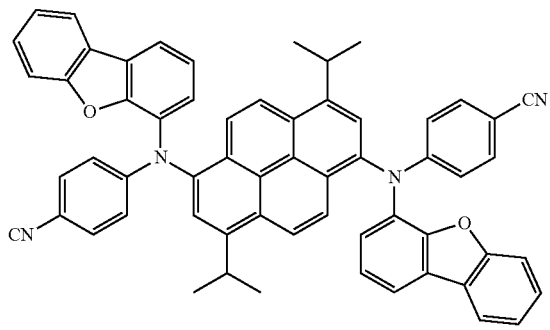
FD28
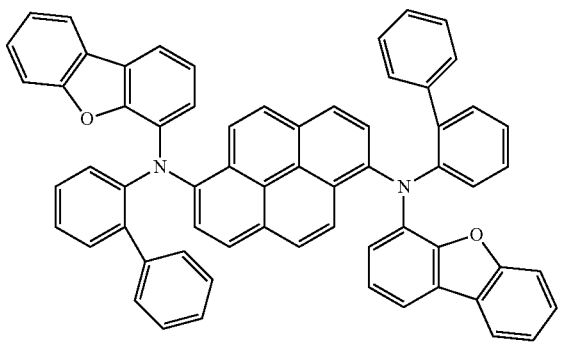
FD29
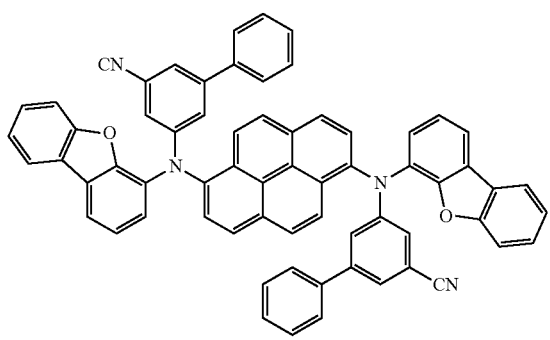
FD30
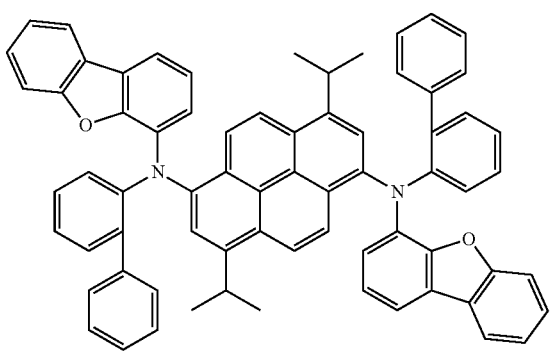
FD31
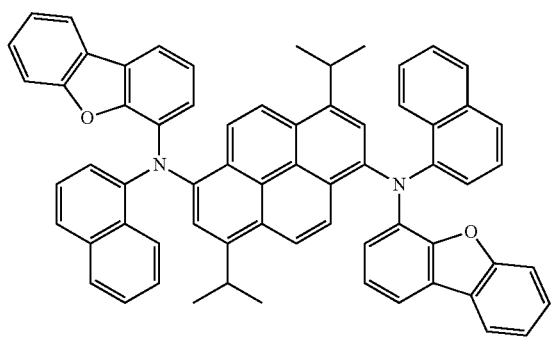
FD32
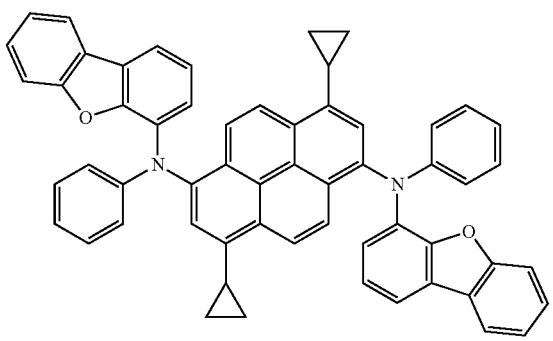

-continued

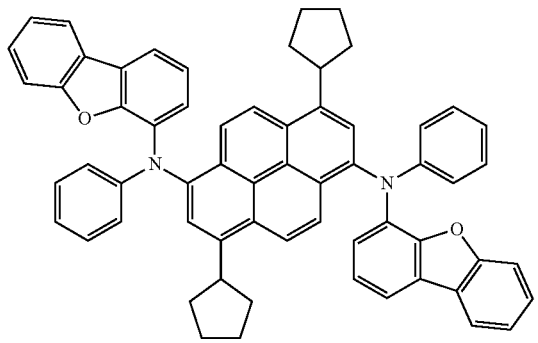
FD33

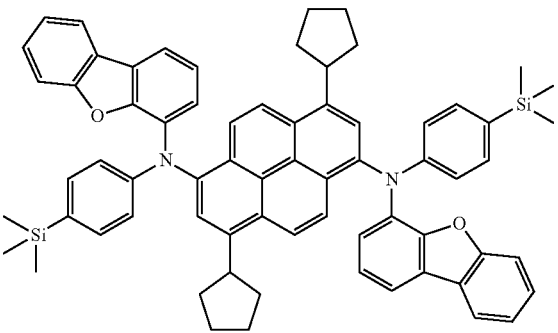
FD34

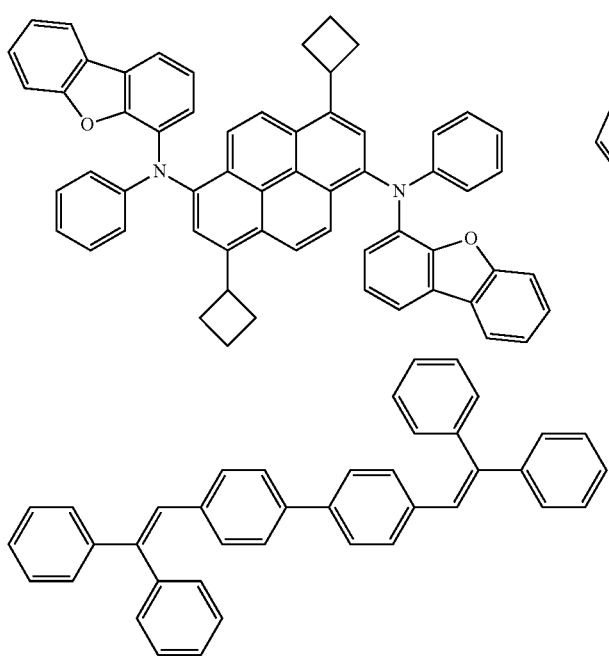
FD35

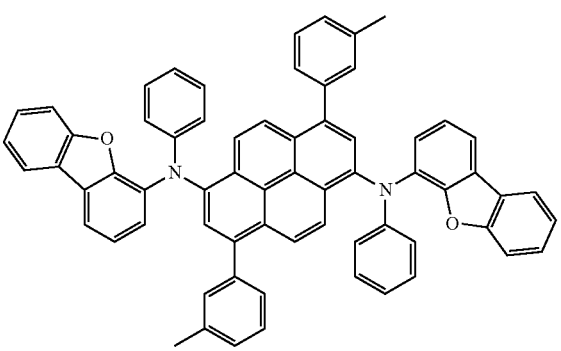
FD36

DPVBi

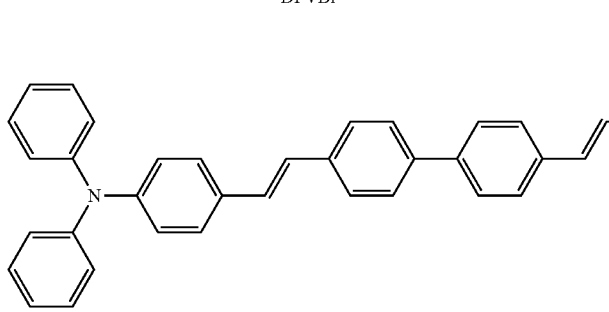

DPAVBi

[Delayed Fluorescence Material]

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In embodiments, a difference between a triplet energy level (eV) of the delayed fluorescence material and a singlet energy level (eV) of the delayed fluorescence material may be in a range of about 0 eV to about 0.5 eV. When the difference between a triplet energy level (eV) of the delayed fluorescence material and a singlet energy level (eV) of the delayed fluorescence material is within this range, up-conversion from a triplet state to a singlet state in the delayed fluorescence material may effectively occur, thus improving luminescence efficiency and the like of the light-emitting device 10.

In embodiments, the delayed fluorescence material may include a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), and a material including a $C_8$-$C_{60}$ polycyclic group including at least two cyclic groups condensed to each other and sharing boron (B), and the like.

Examples of the delayed fluorescence material may include at least one of Compounds DF 1 to DF9:

DF1

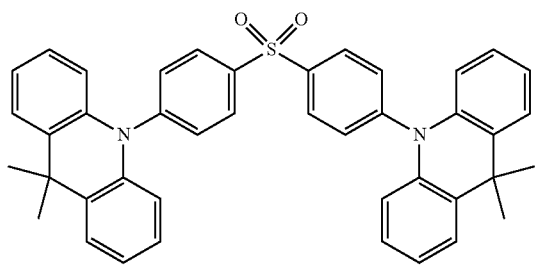

(DMAC-DPS)

DF2

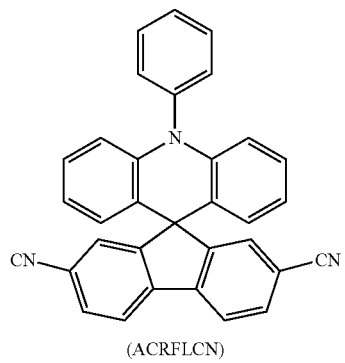

(ACRFLCN)

DF3

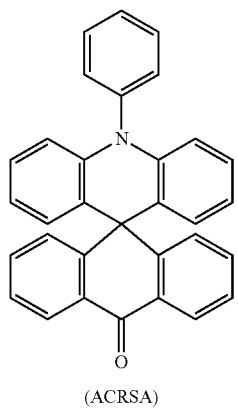

(ACRSA)

DF4

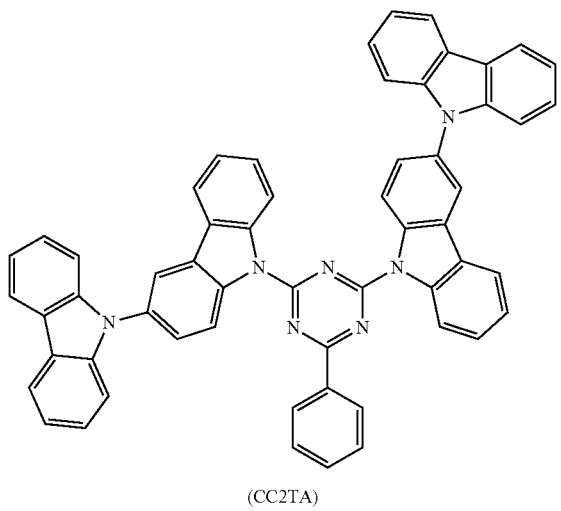

(CC2TA)

DF5

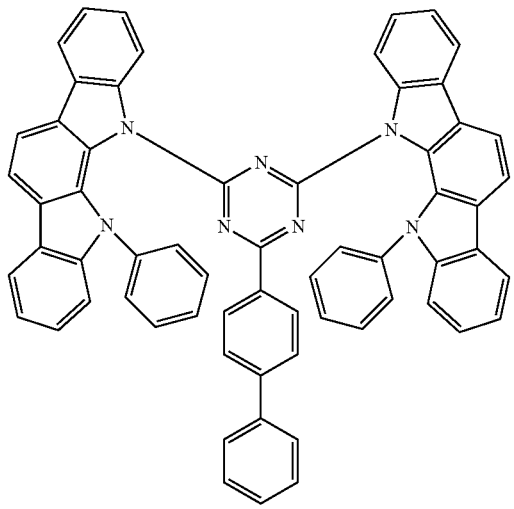

(PIC-TRZ)

DF6

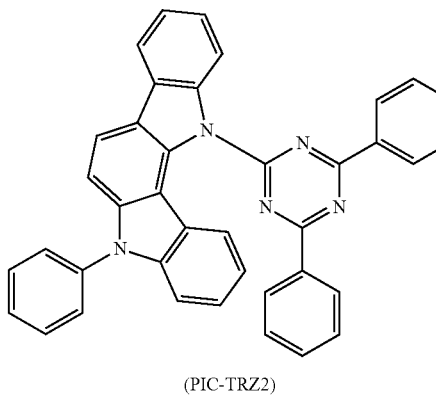

(PIC-TRZ2)

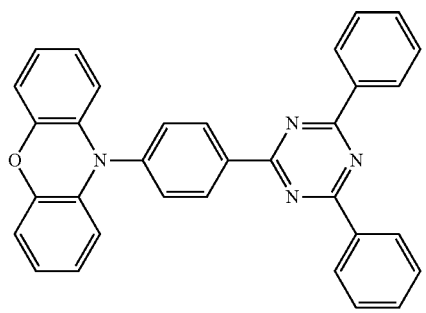

(PXZ-TRZ)

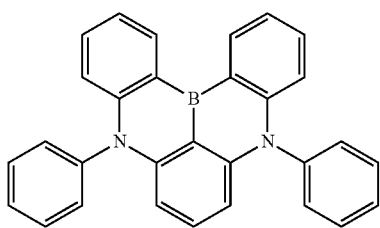

(DABNA-1)

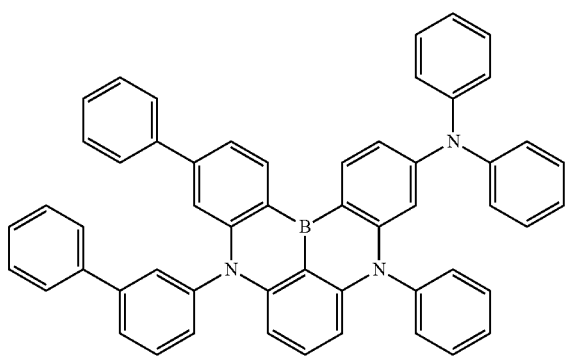

(DABNA-2)

[Quantum Dots]

The emission layer may include quantum dots.

The term "quantum dot" as used herein refers to a crystal of a semiconductor compound and may include any suitable material capable of emitting emission wavelengths of various lengths according to the size of the crystal.

A diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include a group II-VI semiconductor compound; a group III-V semiconductor compound; a group III-VI semiconductor compound; a group I-III-VI semiconductor compound; a group IV-VI semiconductor compound; a group IV element or compound; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In embodiments, the group III-V semiconductor compound may further include a group II element. Examples of the group III-V semiconductor compound further including the group II element may include InZnP, InGaZnP, InAlZnP, and the like.

Examples of the III-VI group semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, $InGaSe_3$, and the like; or any combination thereof.

Examples of the group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The group IV element or compound may be a single element compound such as Si or Ge; a binary compound such as SiC or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or may have a core-shell double structure. In embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be a monolayer or a multilayer. An interface between a core and a shell may have a concentration gradient where a concentration of elements which are present in the shell decreases toward the core.

Examples of the shell of the quantum dot may include a metal, metalloid, or nonmetal oxide, a semiconductor compound, or a combination thereof. Examples of the metal oxide, metalloid, or nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Examples of the semiconductor compound may include a group II-VI semiconductor compound; a group III-V semiconductor compound; a group III-VI semiconductor compound; a group I-III-VI semiconductor compound; a group IV-VI semiconductor compound; or any combination thereof. In embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength equal to or less than about 45 nm. For example, a FWHM of a spectrum of an emission wavelength of the quantum dot may be equal to or less than about 40 nm. For example, a FWHM of a spectrum of an emission wavelength of the quantum dot may be equal to or less than about 30 nm. When the FWHM of the quantum dot is within this range, color purity or color reproducibility may be improved. Light emitted through the quantum dot may be emitted in all directions, and an optical viewing angle may be improved.

The quantum dot may be a spherical, a pyramidal, a multi-arm, or a cubic nanoparticle, or the quantum dot may have a nanotube, a nanowire, a nanofiber, or a nanoplate shape.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In embodiments, the size of the quantum dot may be selected such that the quantum dot may emit red, green, and/or blue light. The size of the quantum dot may be selected such that the quantum dot may emit white light by combining various light colors.

[Electron Transport Region in Interlayer 130]

The electron transport region may have a structure consisting of a layer consisting of a single material, a structure consisting of a layer including different materials, or a multi-layered structure having layers including different materials.

The electron transport region may include a buffer layer, a hole blocking layer, an electron control layer, an electron transport layer, an electron injection layer, or any combination thereof.

In embodiments, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

$$[Ar_{601}]_{xe11}\text{-}[(L_{601})_{xe1}\text{-}R_{601}]_{xe21} \qquad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as defined in connection with $Q_1$ as provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In embodiments, when xe11 in Formula 601 is 2 or greater, at least two $Ar_{601}$(s) may be bound via a single bond.

In embodiments, in Formula 601, $Ar_{601}$ may be a substituted or unsubstituted anthracene group.

In embodiments, the electron transport region may include a compound represented by Formula 601-1:

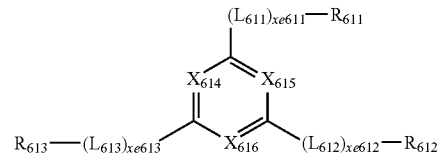

[Formula 601-1]

In Formula 601-1, $X_{614}$ may be N or $C(R_{614})$, $X_{615}$ may be N or $C(R_{615})$, $X_{616}$ may be N or $C(R_{616})$, wherein at least one selected from $X_{614}$ to $X_{616}$ may be N, $L_{611}$ to $L_{611}$ may each independently be the same as described in connection with $L_{601}$ as provided herein, xe611 to xe613 may each independently be the same as described in connection with xe1 as provided herein, $R_{611}$ to $R_{613}$ may each independently be the same as described in connection with $R_{601}$ as provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, diphenyl(4-(triphenylsilyl)phenyl)-phosphine oxide (TSPO1), or any combination thereof:

ET1
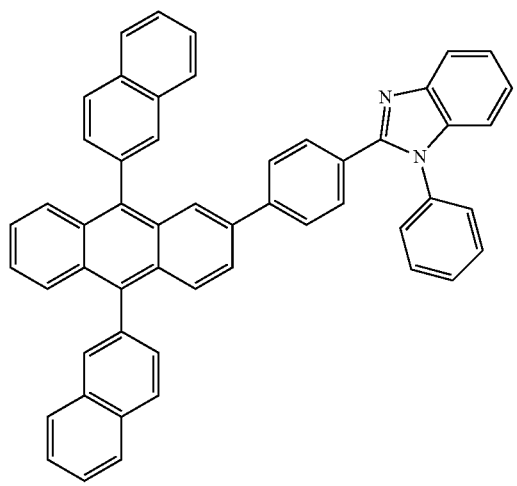
ET2
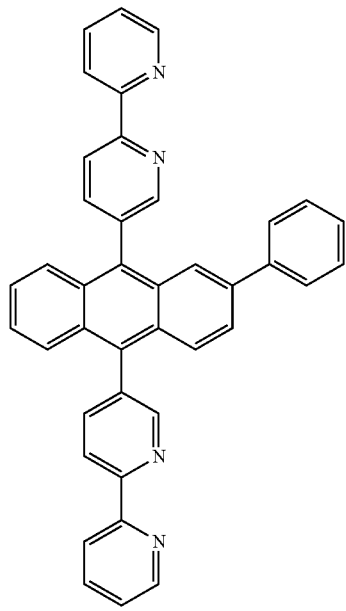
ET3
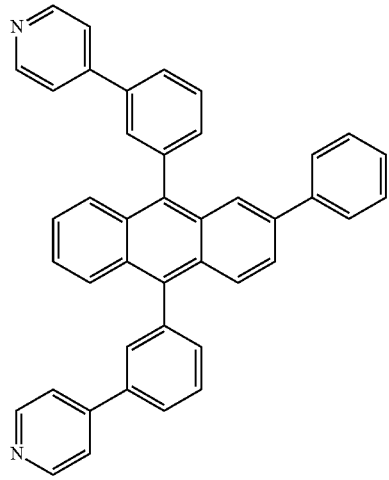
ET4
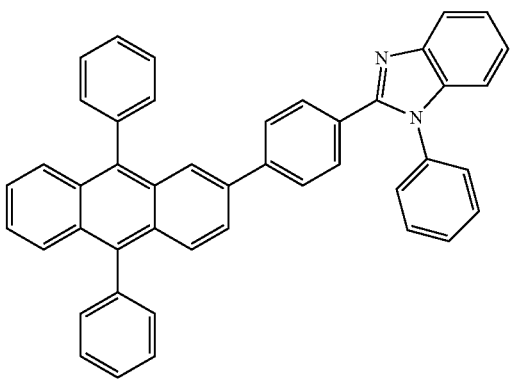
ET5
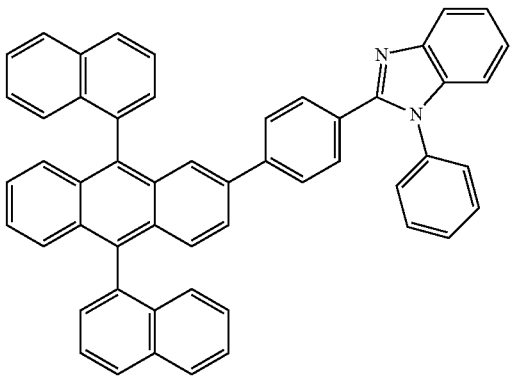
ET6

ET7
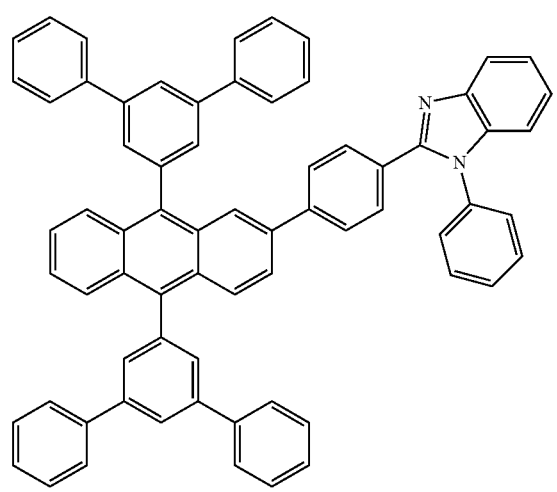
ET8
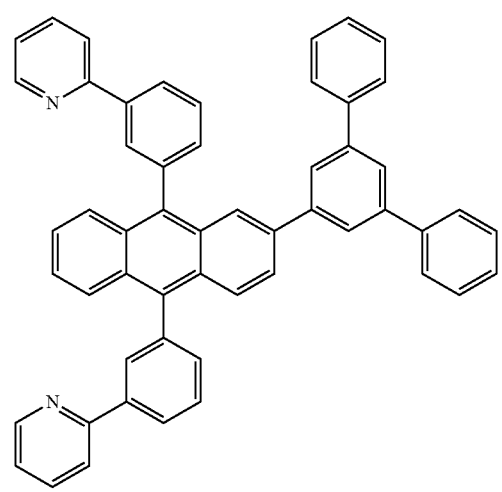
ET9
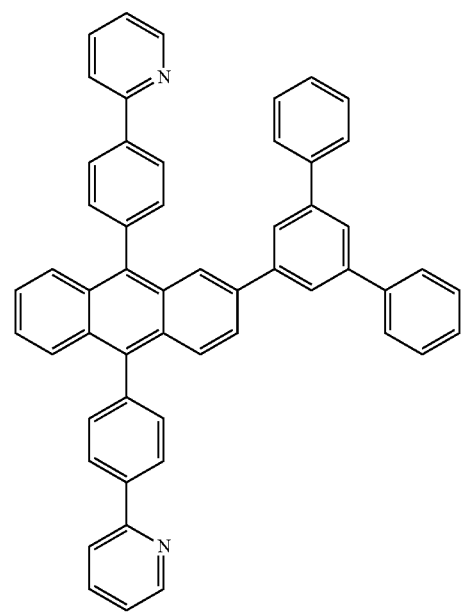
ET10
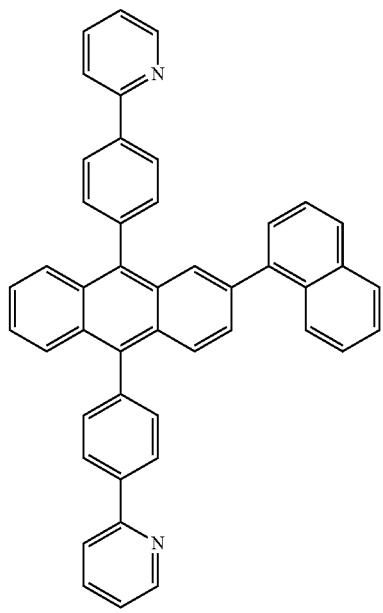
ET11
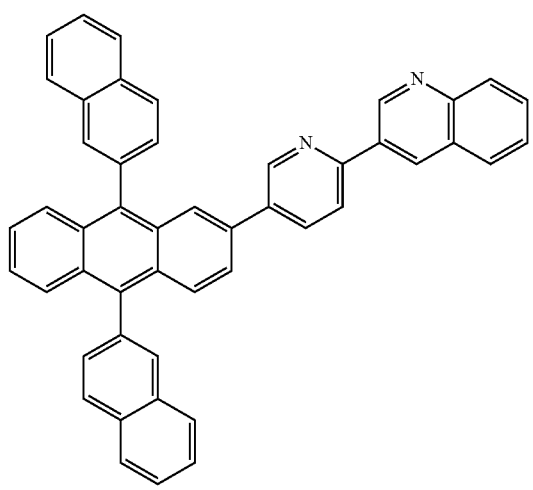
ET12
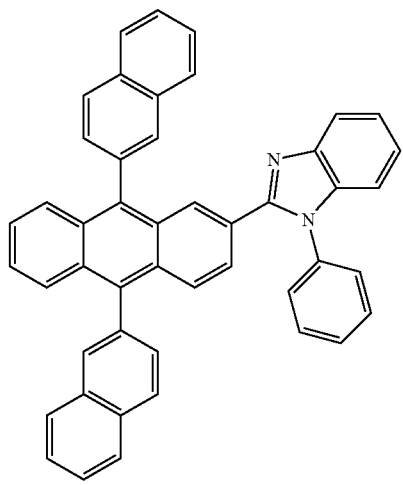

ET13
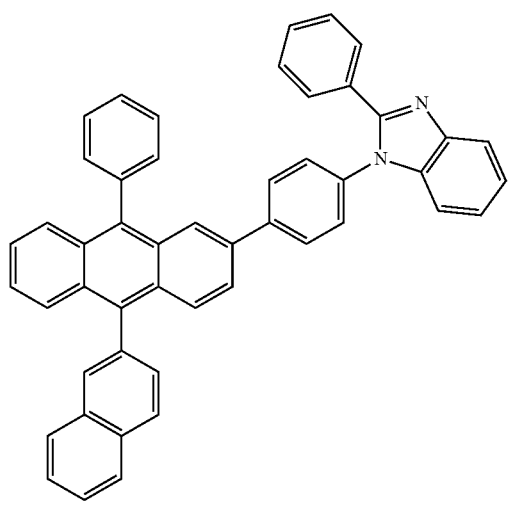
ET16
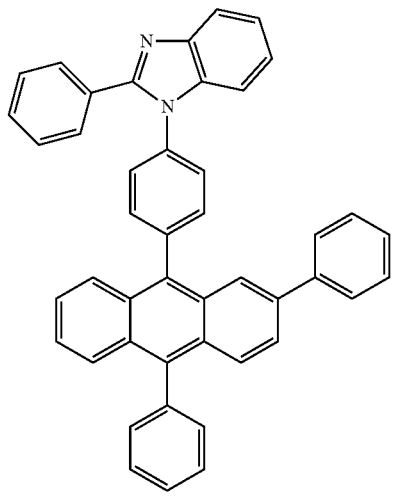
ET14
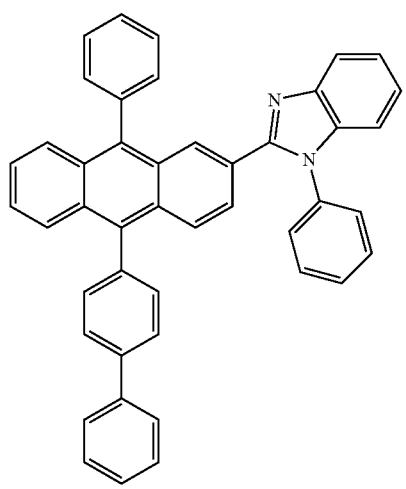
ET17
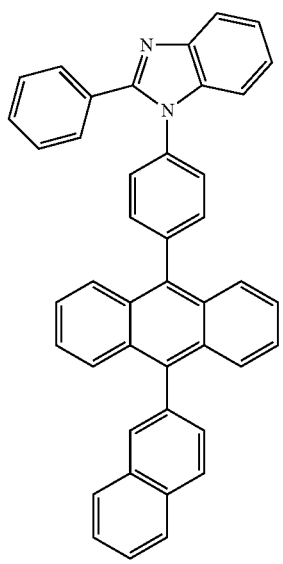
ET15
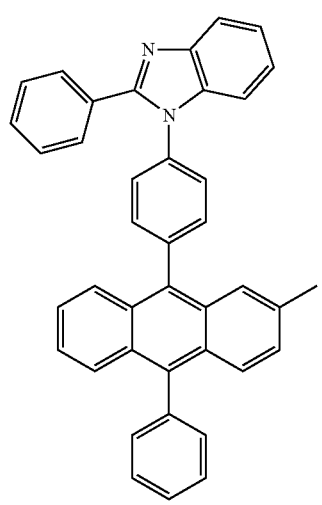
ET18
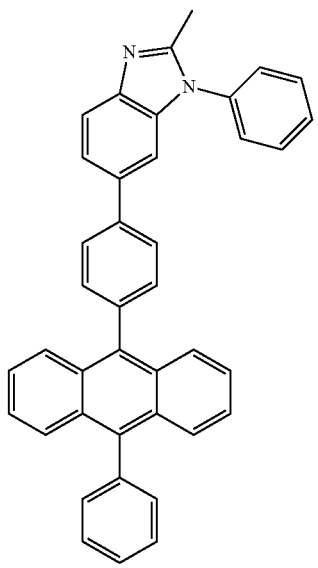

ET19
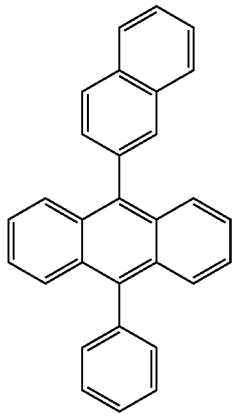
ET22
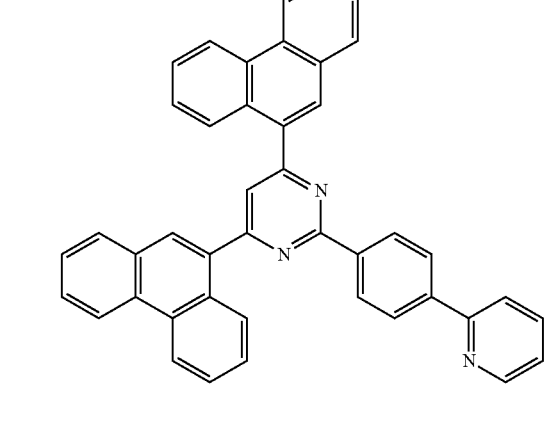
ET20
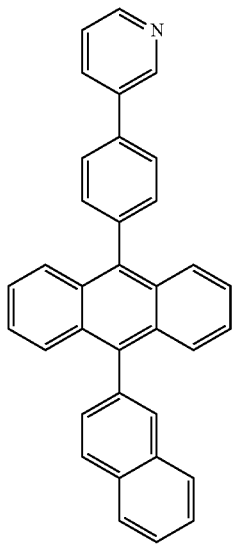
ET23
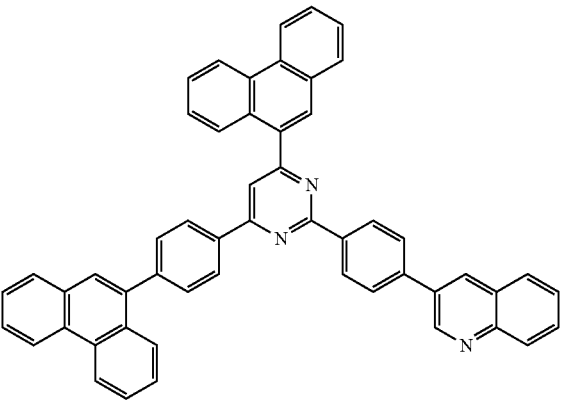
ET21
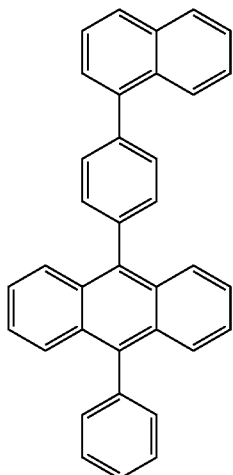
ET24
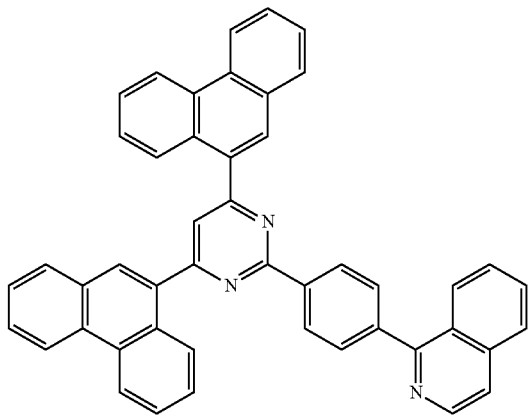

ET25
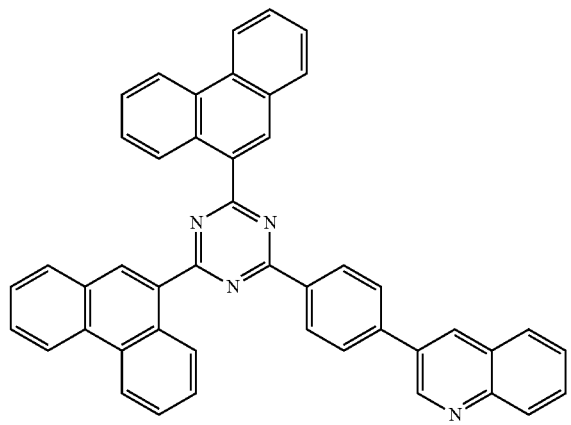
ET26
ET27
ET28
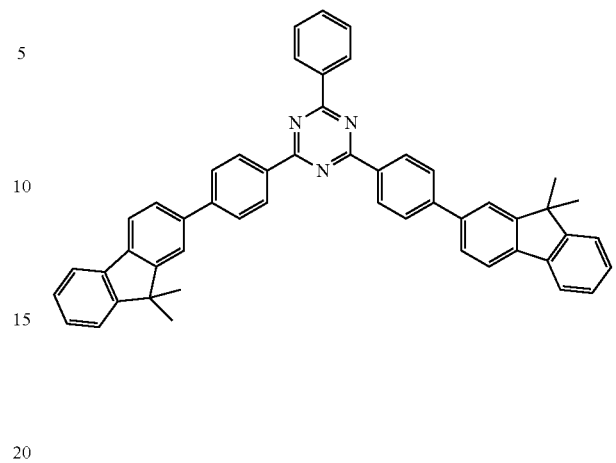
ET29
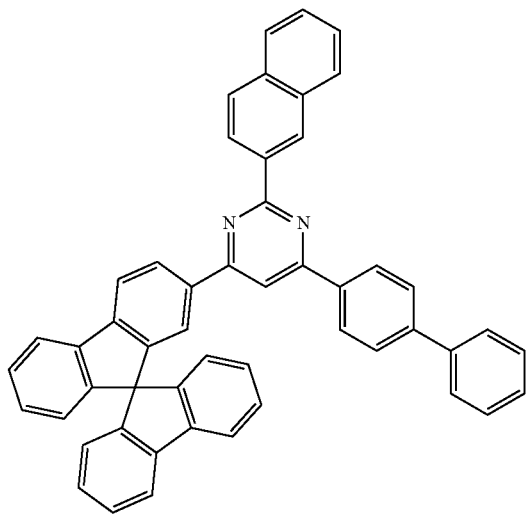
ET30
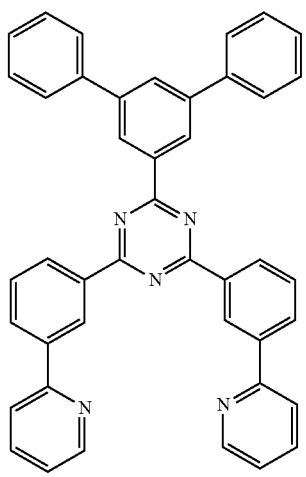

ET31
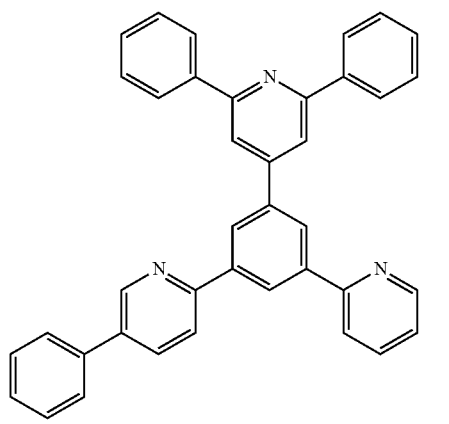
ET32
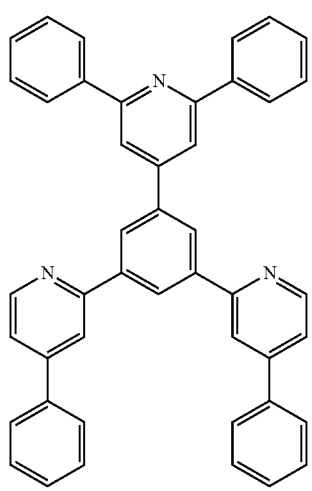
ET33
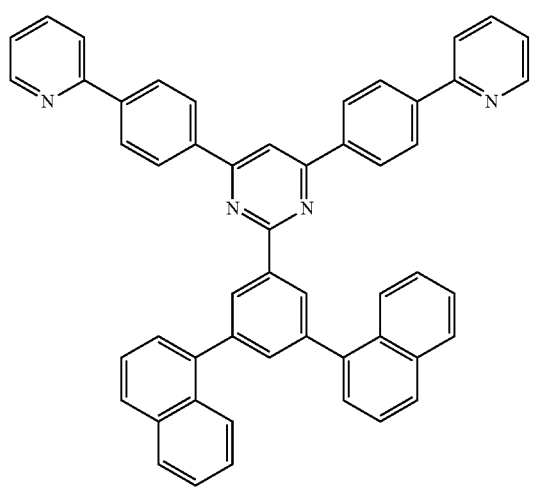
ET34
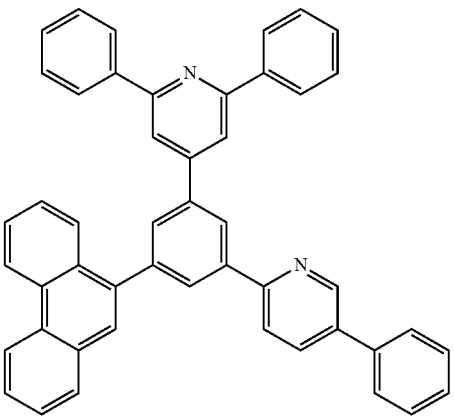
ET35
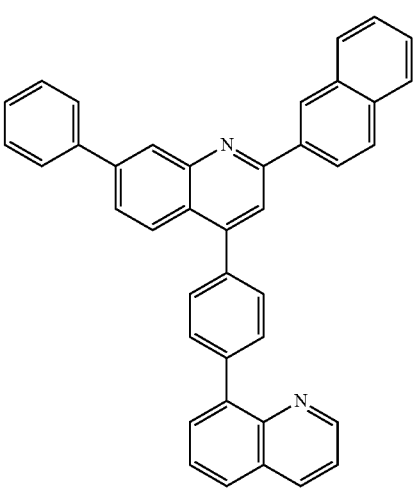
ET36
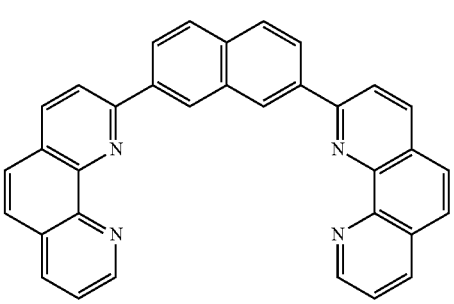
ET37
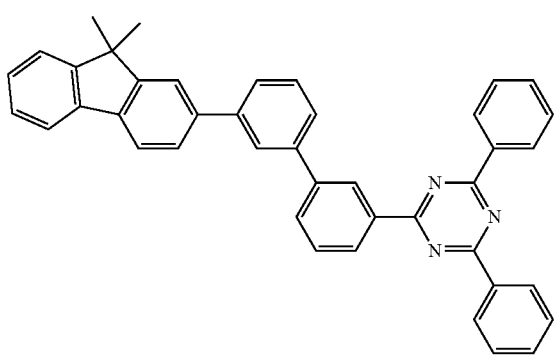

ET38
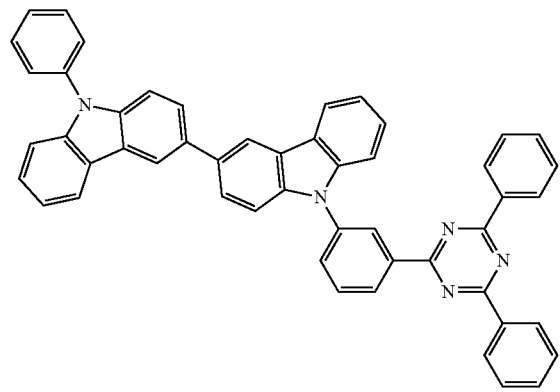
ET39
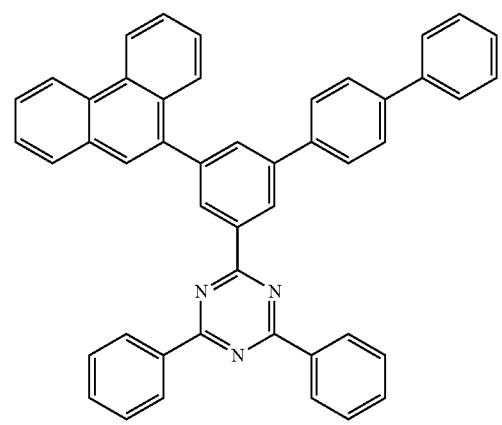
ET40
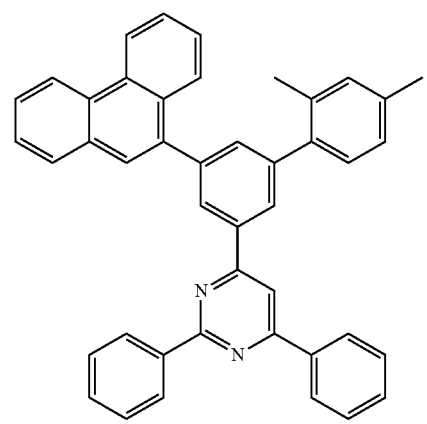
ET41
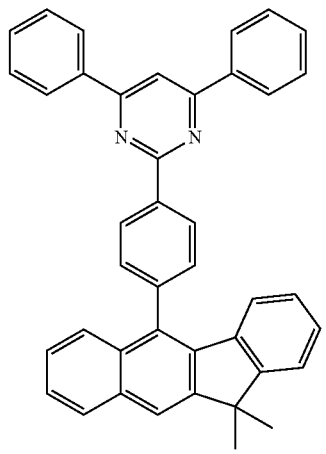
ET42
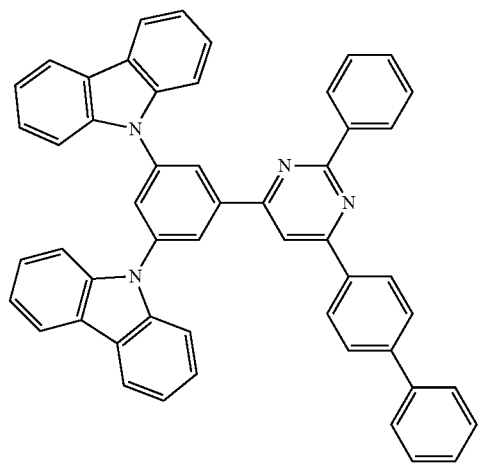
ET43
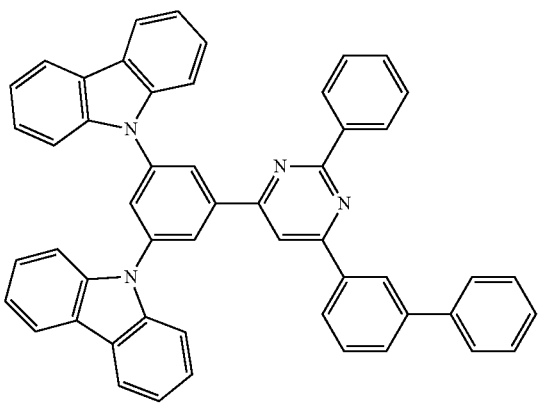

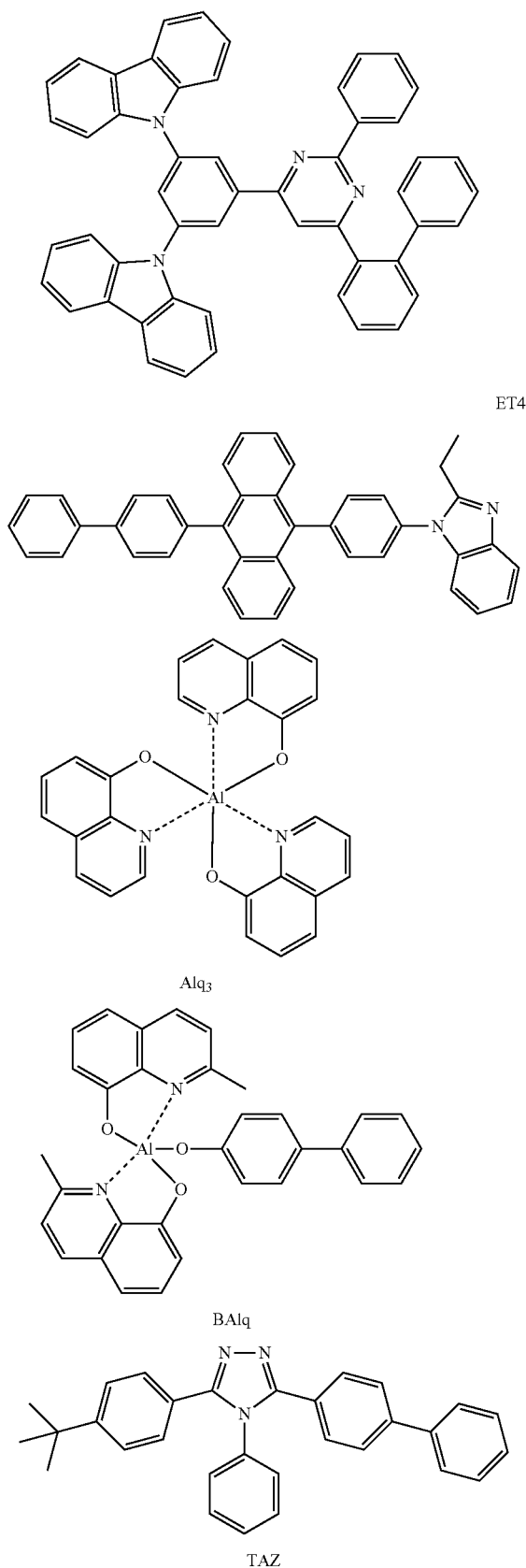

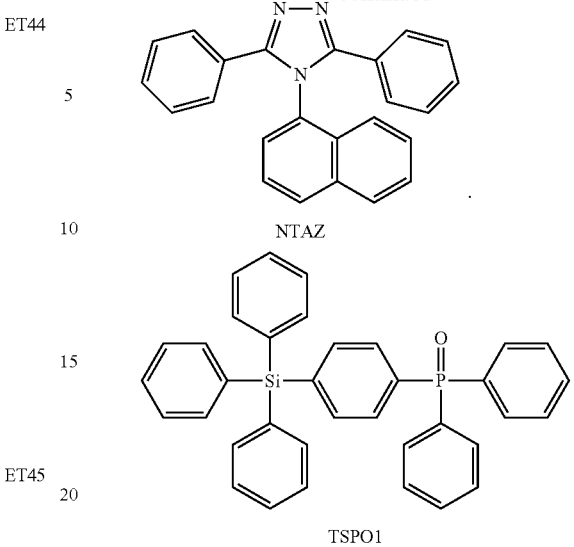

A thickness of the electron transport region may be in a range of about 160 Angstroms (Å) to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, and the electron control layer may each independently be in a range of about 20 Å to about 1,000 Å, for example, about 30 Å to about 300 Å, and a thickness of the electron transport layer may be in a range of about 100 Å to about 1,000 Å. For example, the thickness of the buffer layer, the hole blocking layer, and the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, and/or the electron transport layer are each within these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

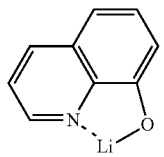

ET-D1

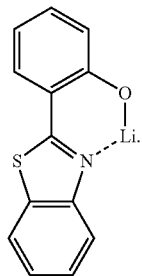

ET-D2

The electron transport region may include an electron injection layer that facilitates injection of electrons from the second electrode 150. The electron injection layer may directly contact the second electrode 150.

The electron injection layer may have a structure consisting of a layer consisting of a single material, a structure consisting of a layer including different materials, or a multi-layered structure having layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs, or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $Ba_xSr_{1-x}O$ (wherein x is a real number satisfying 0<x<1), or $Ba_xCa_{1-x}O$ (wherein x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include one of ions of the alkali metal, ions of the alkaline earth metal, and ions of the rare earth metal described above, and a ligand bonded to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (e.g., a compound represented by Formula 601).

In embodiments, the electron injection layer may consist of an alkali metal-containing compound (e.g., alkali metal halide); or an alkali metal-containing compound (e.g., alkali metal halide), and an alkali metal, an alkaline earth metal, a rare earth metal, or any combination thereof. In embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of these ranges, excellent electron injection characteristics may be obtained without a substantial increase in driving voltage.

[Second Electrode 150]

The second electrode 150 may be on the interlayer 130. In an embodiment, the second electrode 150 may be a cathode that is an electron injection electrode. A material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may each improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index equal to or greater than about 1.6 (at a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include the compound represented by Formula 201, the compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

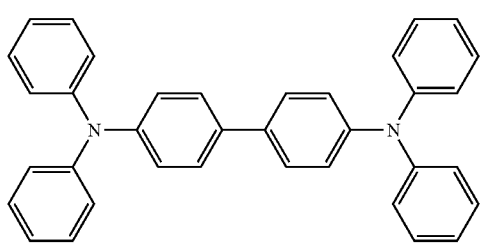

CP1

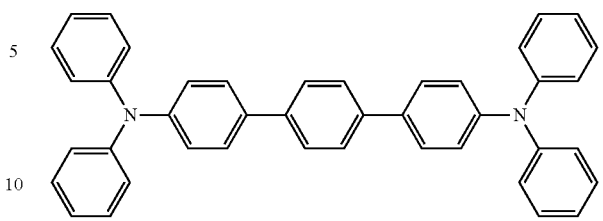

CP2

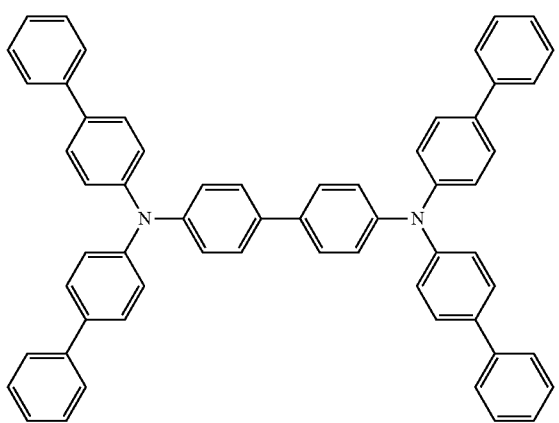

CP3

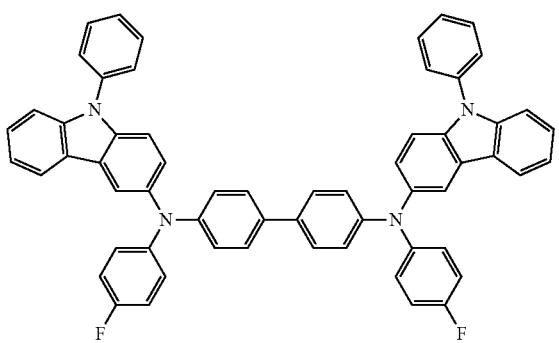

CP4

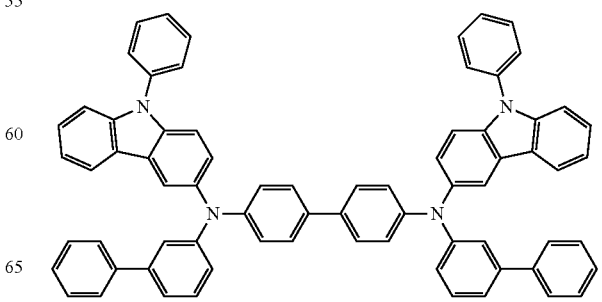

CP5

-continued

CP6

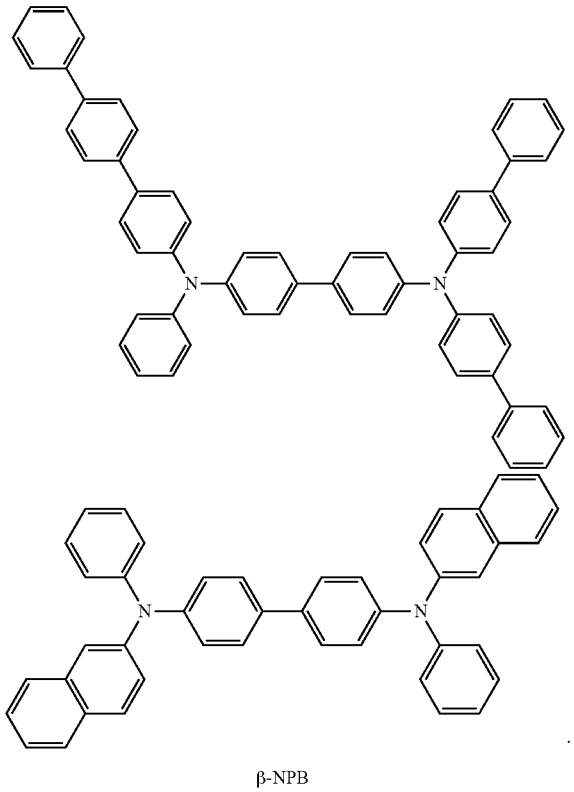

β-NPB

[Film]

The organometallic compound represented by Formula 1 may be included in various films. According to embodiments, a film including an organometallic compound represented by Formula 1 may be provided. The film may be, for example, an optical member (or, a light-controlling member) (e.g., a color filter, a color-conversion member, a capping layer, a light extraction efficiency improvement layer, a selective light-absorbing layer, a polarization layer, a quantum dot-containing layer, or the like), a light-blocking member (e.g., a light reflection layer or a light-absorbing layer), or a protection member (e.g., an insulating layer or a dielectric material layer).

[Electronic Apparatus]

The light-emitting device may be included in various electronic apparatuses. In embodiments, an electronic apparatus including the light-emitting device may be an emission apparatus or an authentication apparatus.

The electronic apparatus (e.g., an emission apparatus) may further include, in addition to the light-emitting device, a color filter, a color-conversion layer, or a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In embodiments, the color-conversion layer may include quantum dots. The quantum dot may be, for example, the quantum dot as described herein.

The electronic apparatus may include a first substrate. The first substrate may include sub-pixels, the color filter may include color filter areas respectively corresponding to the sub-pixels, and the color-conversion layer may include color-conversion areas respectively corresponding to the sub-pixels.

A pixel-defining film may be located between the sub-pixels to define each sub-pixel.

The color filter may further include color filter areas and light-blocking patterns between color filter areas, and the color-conversion layer may further include color-conversion areas and light-blocking patterns between the color-conversion areas.

The color filter areas (or color-conversion areas) may include a first area emitting first color light, a second area emitting second color light, and/or a third area emitting third color light, and the first color light, the second color light, and/or the third color light may have different maximum emission wavelengths. In embodiments, the first color light may be red light, the second color light may be green light, and the third color light may be blue light. In embodiments, the color filter areas (or the color-conversion areas) may each include quantum dots. In embodiments, the first area may include red quantum dots, the second area may include green quantum dots, and the third area may not include a quantum dot. The quantum dot may be understood by referring to the description of the quantum dot provided herein. The first area, the second area, and/or the third area may each further include a scatterer.

In embodiments, the light-emitting device may emit first light, the first area may absorb the first light to emit 1-1 color light, the second area may absorb the first light to emit 2-1 color light, and the third area may absorb the first light to emit 3-1 color light. In embodiments, the 1-1 color light, the 2-1 color light, and the 3-1 color light may each have a different maximum emission wavelength. In embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and may prevent air and moisture from permeating into the light-emitting device at the same time. The encapsulation unit may be a sealing substrate including transparent glass or a plastic substrate. The encapsulation unit may be a thin-film encapsulating layer including at least one of an organic layer and/or an inorganic layer. When the encapsulation unit is a thin film encapsulating layer, the electronic apparatus may be flexible.

Various functional layers may be disposed on the encapsulation unit depending on the use of an electronic apparatus, in addition to the color filter and/or the color-conversion layer. Examples of the functional layer may include a touch screen layer, a polarization layer, an authentication apparatus, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable, for example, to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 2:
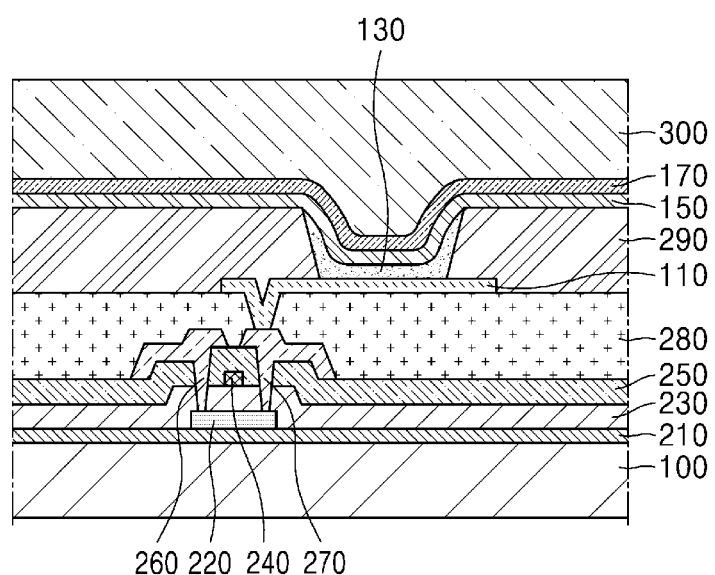
FIG. 2 is a schematic cross-sectional view of a light-emitting apparatus according to an embodiment.
Figure 3:
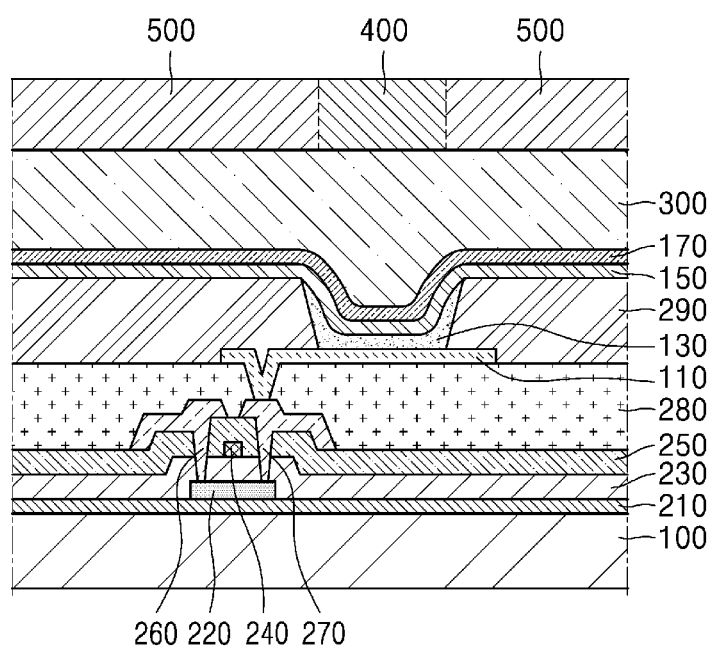
FIG. 3 is a schematic cross-sectional view of a light-emitting apparatus according to an embodiment.

[Descriptions of FIGS. 2 and 3]

FIG. 2 is a schematic cross-sectional view of a light-emitting apparatus according to an embodiment.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and may expose a specific area of the drain electrode 270, and the first electrode 110 may be disposed to electrically connect to the exposed area of the drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may include a polyimide or polyacryl organic film. Although it is not shown in FIG. 2, higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture and/or oxygen. The encapsulation unit 300 may include: an inorganic film including silicon nitride ($SiN_x$), silicon oxide ($SiO_x$), indium tin oxide, indium zinc oxide, or any combination thereof, an organic film including PET, polyethylene naphthalate, polycarbonate, polyimide, polyethylene sulfonate, polyoxy methylene, polyarylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 3 is a schematic cross-sectional view of another light-emitting apparatus according to an embodiment.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be a color filter area, a color-conversion area, or a combination of a color filter area and a color-conversion area. In embodiments, the light-emitting device shown in FIG. 3 included in the emission apparatus may be a tandem light-emitting device.

[Manufacturing Method]

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an emission layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

Definitions of Terms

The term "$C_3$-$C_{60}$ carbocyclic group" as used herein refers to a cyclic group consisting only of carbon atoms as ring-forming atoms and having 3 to 60 carbon atoms as ring-forming atoms. The term "$C_1$-$C_{60}$ heterocyclic group" as used herein refers to a cyclic group having 1 to 60 carbon atoms in addition to a heteroatom as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In embodiments, the $C_3$-$C_{60}$ carbocyclic group may be a T1 group or a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a group in which at least two T2 groups are condensed, or a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be a T1 group, a condensed group in which at least two T1 groups are condensed, a T3 group, a condensed group in which at least two T3 groups are condensed, or a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be a T4 group, a group in which at least two T4 groups are condensed, a group in which at least one T4 group is condensed with at least one T1 group, a group in which at least one T4 group is condensed with at least one T3 group, or a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "n electron-rich $C_3$-$C_{60}$ cyclic group", or "n electron-deficient nitrogen-containing $C_1$-$C_{60}$ cyclic group" as used herein may be refer to a monovalent or polyvalent group (for example, a divalent group, a trivalent group, a tetravalent group, or the like) that is condensed with (e.g., combined together with) a cyclic group, according to the structure of a formula described with corresponding terms. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothienyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothienyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms (e.g., 8 to 60 carbon atoms) as ring forming atoms, wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thienyl group, a furanyl group, an indolyl group, a benzoindolyl group, a naphthoindolyl group, an isoindolyl group, a benzoisoindolyl group, a naphthoisoindolyl group, a benzosilolyl group, a benzothienyl group, a benzofuranyl group, a carbazolyl group, a dibenzosilolyl group, a dibenzothienyl group, a dibenzofuranyl group, an azacarbazolyl group, an azafluorenyl group, an azadibenzosilolyl group, an azadibenzothienyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothienyl group, a benzonaphthosilolyl group, a benzofurodibenzofuranyl group, a benzofurodibenzothienyl group, and a benzothienodibenzothienyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein indicates —O$A_{102}$ (wherein $A_{102}$ is a $C_6$-$C_{60}$ aryl group), and a $C_6$-$C_{60}$ arylthio group as used herein indicates —S$A_{103}$ (wherein $A_{103}$ is a $C_6$-$C_{60}$ aryl group).

The term "$C_7$-$C_{60}$ aryl alkyl group" used herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as used herein may be:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, or any combination thereof.

A third-row transition metal as used herein may include hafnium (Hf), tantalum (Ta), tungsten (W), rhenium (Re), osmium (Os), iridium (Ir), platinum (Pt), and gold (Au).

"Ph" as used herein represents a phenyl group, "Me" as used herein represents a methyl group, "Et" as used herein represents an ethyl group, "ter-Bu" or "Bu$^t$" as used herein represents a tert-butyl group, and "OMe" as used herein represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

In the description, the symbols *, *', and *" as used herein, unless defined otherwise, each represents a binding site to an adjacent atom in a corresponding formula or moiety.

Hereinafter, compounds and a light-emitting device according to embodiments will be described in detail with reference to Synthesis Examples and Examples. The wording "B was used instead of A" used in describing Synthesis Examples means that an amount of B used was identical to an amount of A used in terms of molar equivalents.

EXAMPLES

Synthesis Example 1: Synthesis of Compound 1

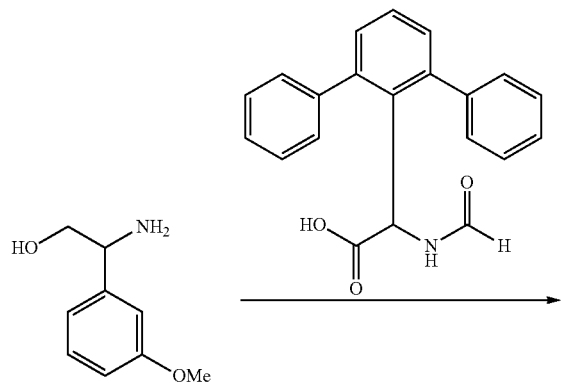

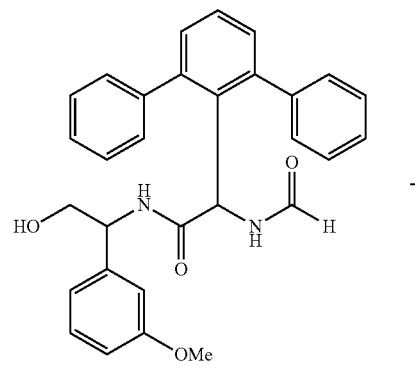

1-a 1-b

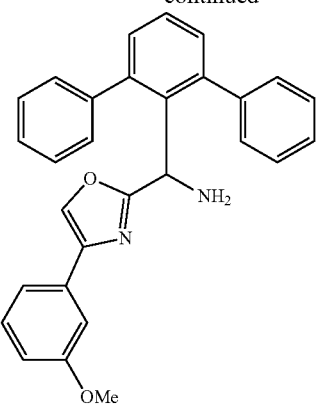

1-c

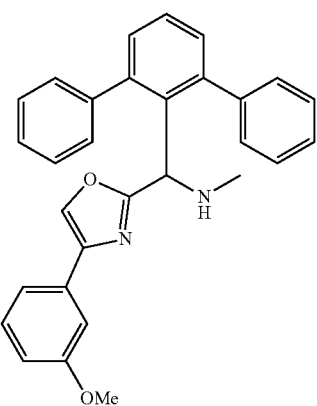

1-d

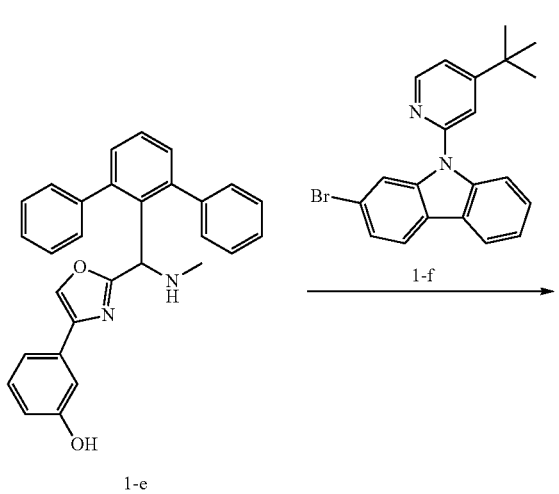

1-e  1-f

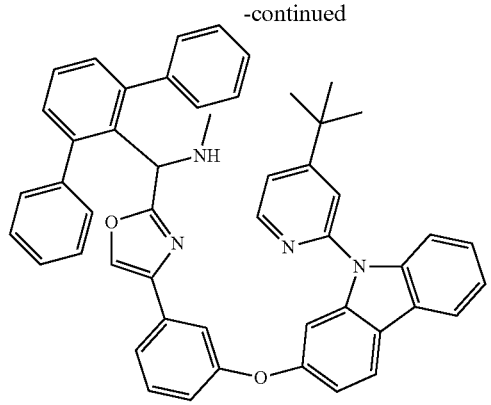

1-g

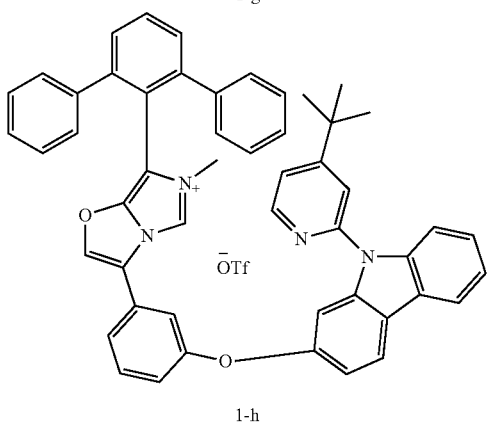

1-h

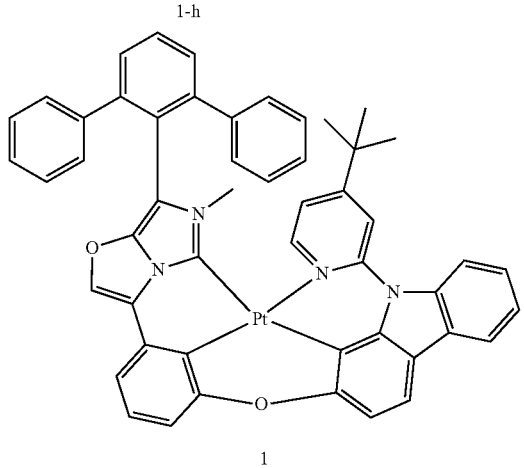

1

(1) Synthesis of Intermediate Compound [1-a]

2-amino-2-(3-methoxyphenyl)ethan-1-ol (1.0 eq.), 2-([1,1':3',1''-terphenyl]-2'-yl)-2-formamidoacetic acid (1.0 eq.), N-methylmorpholine (1.2 eq.), and isobutylchloroformate (1.0 eq.) were dissolved at a temperature of −15° C. under a nitrogen atmosphere and dissolved in anhydrous tetrahydrofuran (THF, 0.1 molar (M)), followed by stirring at room temperature for 2 hours. The reaction mixture was concentrated under reduced pressure, and a filtration process was performed using water to thereby synthesize Intermediate Compound [1-a]. (yield: 72%)

(2) Synthesis of Intermediate Compound [1-b]

Intermediate Compound [1-a] (1.0 eq.), N,N-dimethyl-4-aminopyridine (0.02 eq.), triethylamine (4.3 eq.), and p-toluenesulfonyl chloride (1.0 eq.) were dissolved at room temperature under a nitrogen atmosphere and dissolved in anhydrous 1,2-dichloroethane (1.0 M), followed by stirring at a temperature of 120° C. for 3 hours. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [1-b] was synthesized (yield: 79%).

(3) Synthesis of Intermediate Compound [1-c]

Intermediate Compound [1-b] (1.0 eq) and sodium hydroxide (1.0 eq) were dissolved in ethanol (1.0 M), followed by stirring at a temperature of 70° C. for 1 hour. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [1-c] was synthesized (yield: 97%).

(4) Synthesis of Intermediate Compound [1-d]

Intermediate Compound [1-c] (1.0 eq.), n-butyllithium (2.5 M in hexane) (1.0 eq.), and iodomethane (1.0 eq.) were sequentially dissolved at a temperature of −78° C. and stirred at room temperature for 20 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [1-d] was synthesized (yield: 97%).

(5) Synthesis of Intermediate Compound [1-e]

Intermediate Compound [1-d] (1.0 eq.), HBr, and acetic acid were stirred at a temperature of 120° C. for 16 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [1-e] was synthesized (yield: 93%).

(6) Synthesis of Intermediate Compound [1-f]

2-bromo-9H-carbazole (1.5 eq.), 2-bromo-4-(tert-butyl) pyridine (1.0 eq.), Pd$_2$(dba)$_3$ (5 mol %), Sphos (7 mol %), and sodium tert-butoxide (2.0 eq.) were dissolved in toluene (0.1 M) and stirred at a temperature of 110° C. for 12 hours. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [1-f] was synthesized (yield: 83%).

(7) Synthesis of Intermediate Compound [1-g]

Intermediate Compound [1-e], Intermediate Compound [1-f], CuI (0.1 eq.), N,N'-bis(2-phenylphenyl) oxalamide (BPPO) (0.1 eq.), and potassium phosphate tribasic (2.0 eq.) were dissolved in dimethyl formamide (DMF) (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [1-g] was synthesized (yield: 59%).

(8) Synthesis of Intermediate Compound [1-h]

Intermediate Compound [1-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [1-h] was synthesized (yield: 61%).

(9) Synthesis of Compound 1

Intermediate Compound [1-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % methylene chloride (MC):50 vol % hexane), Compound 1 was synthesized (yield: 21%).

Synthesis Example 2: Synthesis of Compound 2

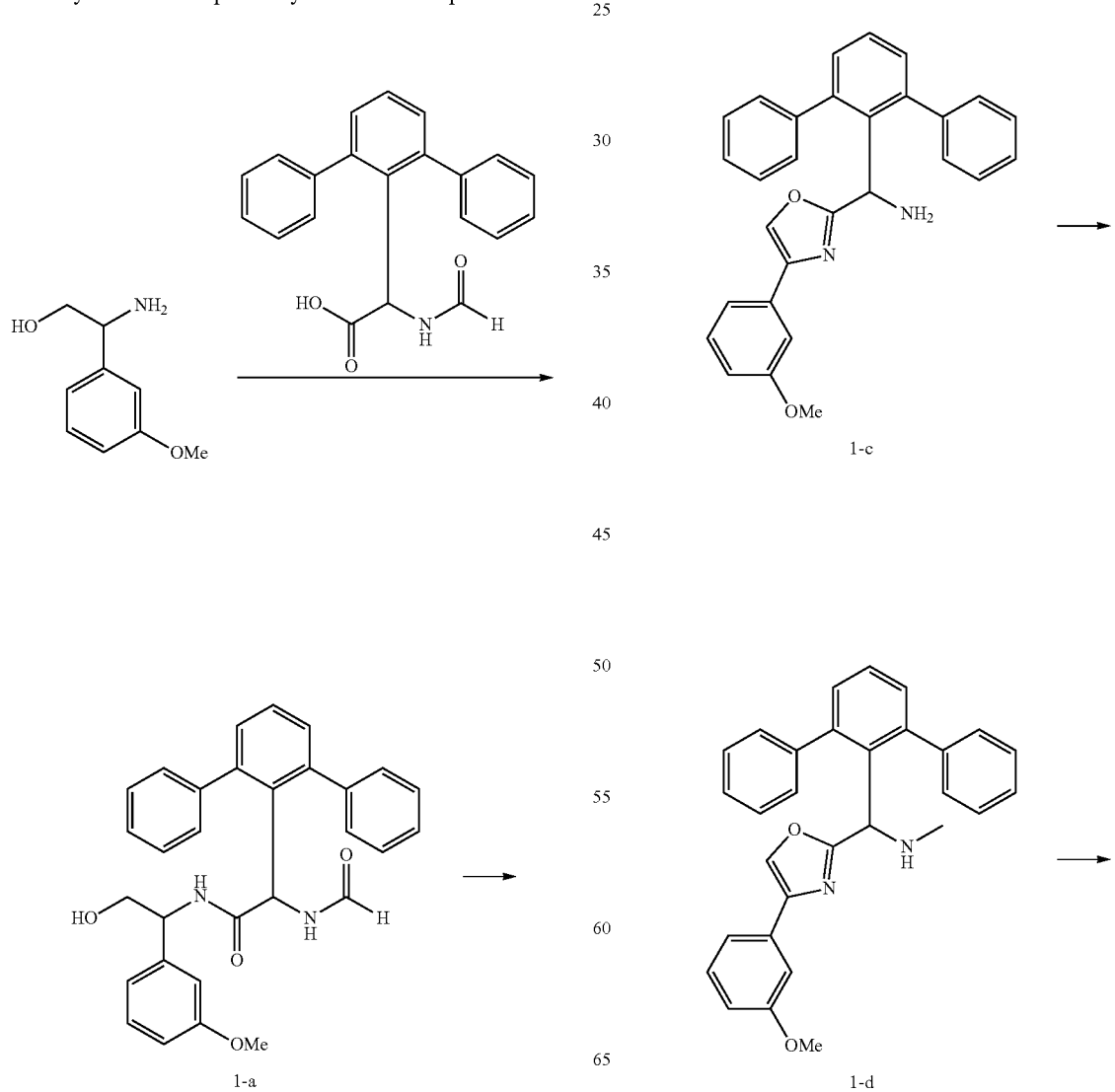

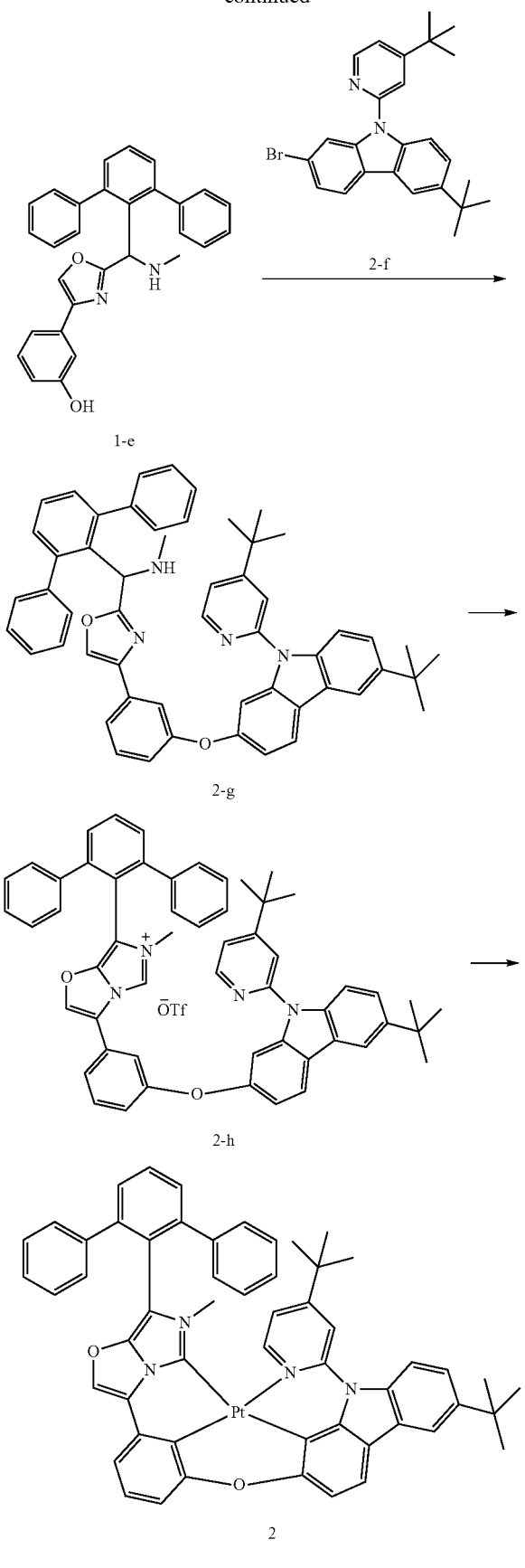

(1) Synthesis of Intermediate Compound [2-f]

2-bromo-(6-tert-butyl)-9H-carbazole (1.1 eq.), 2-bromo-4-(tert-butyl)pyridine (1.0 eq.), $Pd_2(dba)_3$ (5 mol %), Sphos (10 mol %), and sodium tert-butoxide (2.0 eq.) were dissolved in toluene (0.1 M) and stirred at a temperature of 110° C. for 12 hours. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [2-f] was synthesized (yield: 76%).

(2) Synthesis of Intermediate Compound [2-g]

Intermediate Compound [1-e], Intermediate Compound [2-f], CuI (0.1 eq.), BPPO (0.1 eq.), and potassium phosphate tribasic (2.0 eq.) were dissolved in dimethyl formamide (DMF) (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [2-g] was synthesized (yield: 55%).

(3) Synthesis of Intermediate Compound [2-h]

Intermediate Compound [2-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [2-h] was synthesized (yield: 60%).

(4) Synthesis of Compound 2

Intermediate Compound [2-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 2 was synthesized (yield: 20%).

Synthesis Example 3: Synthesis of Compound 3

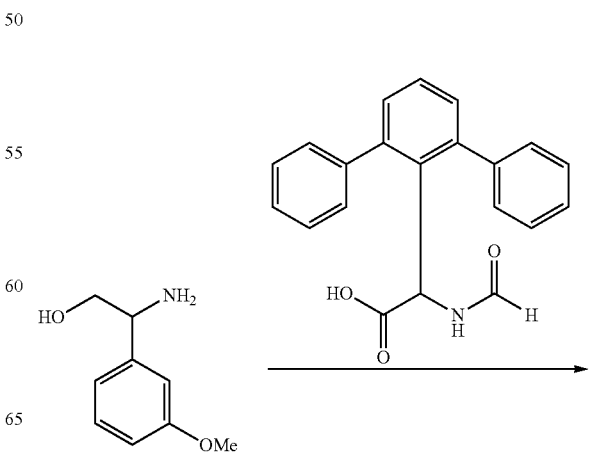

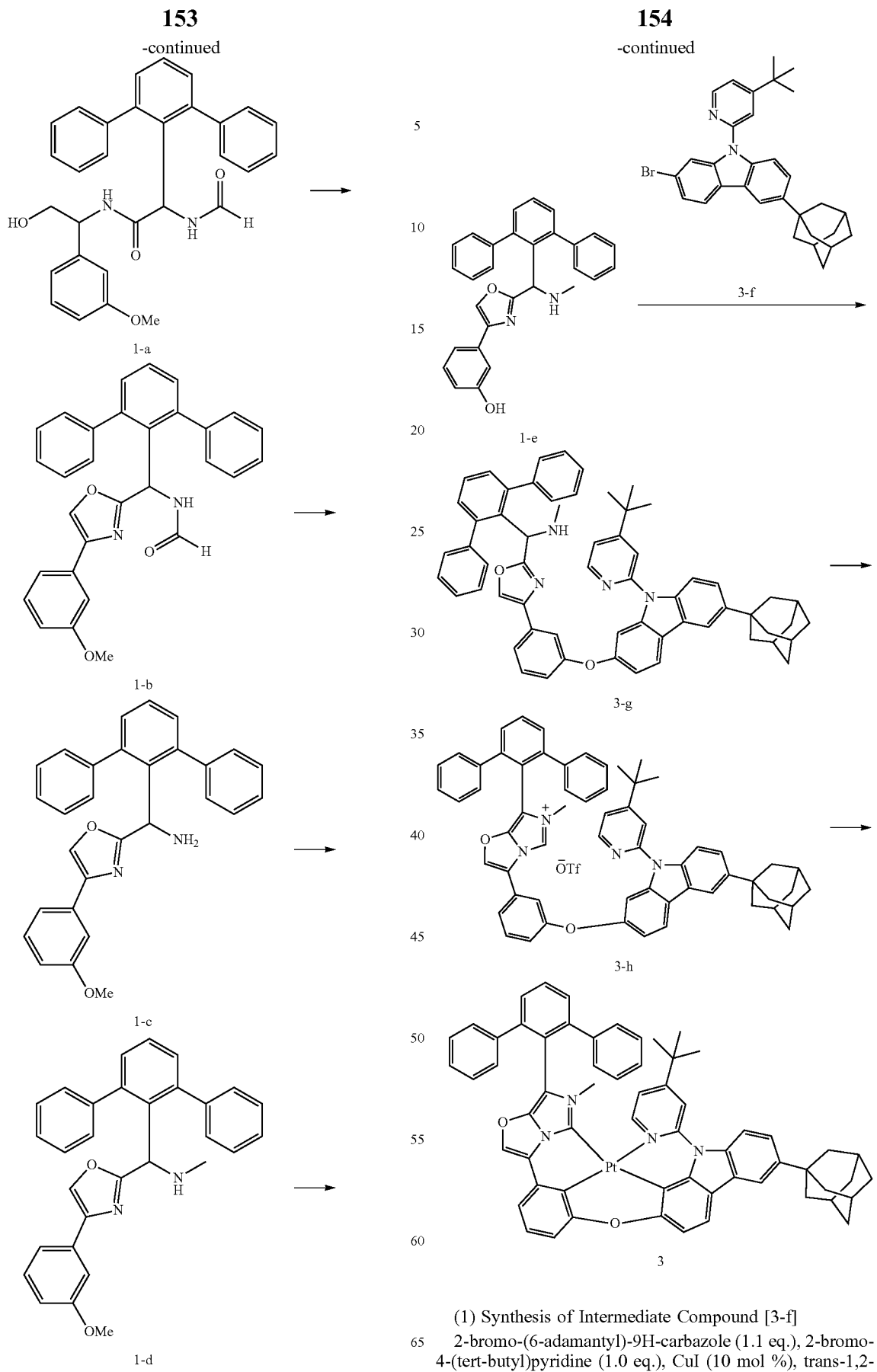
(1) Synthesis of Intermediate Compound [3-f]
2-bromo-(6-adamantyl)-9H-carbazole (1.1 eq.), 2-bromo-4-(tert-butyl)pyridine (1.0 eq.), CuI (10 mol %), trans-1,2-cyclohexanediamine (10 mol %), and $K_3PO_4$ (2.0 eq.) were dissolved in 1,4-dioxane (0.1 M) and stirred at a temperature of 110° C. for 12 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [3-f] was synthesized (yield: 82%).

(2) Synthesis of Intermediate Compound [3-g]

Intermediate Compound [1-e], Intermediate Compound [3-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [3-g] was synthesized (yield: 54%).

(3) Synthesis of Intermediate Compound [3-h]

Intermediate Compound [3-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [3-h] was synthesized (yield: 61%).

(4) Synthesis of Compound 3

Intermediate Compound [3-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 3 was synthesized (yield: 17%).

Synthesis Example 4: Synthesis of Compound 4

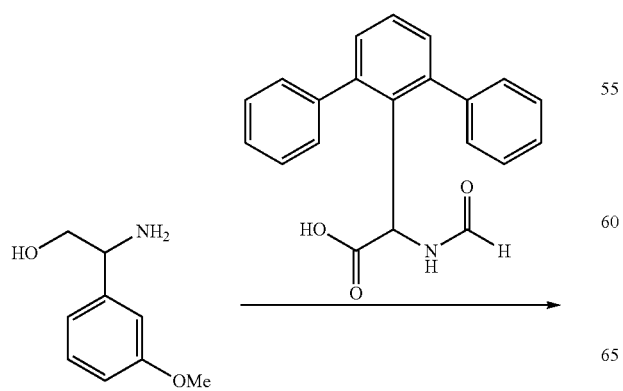

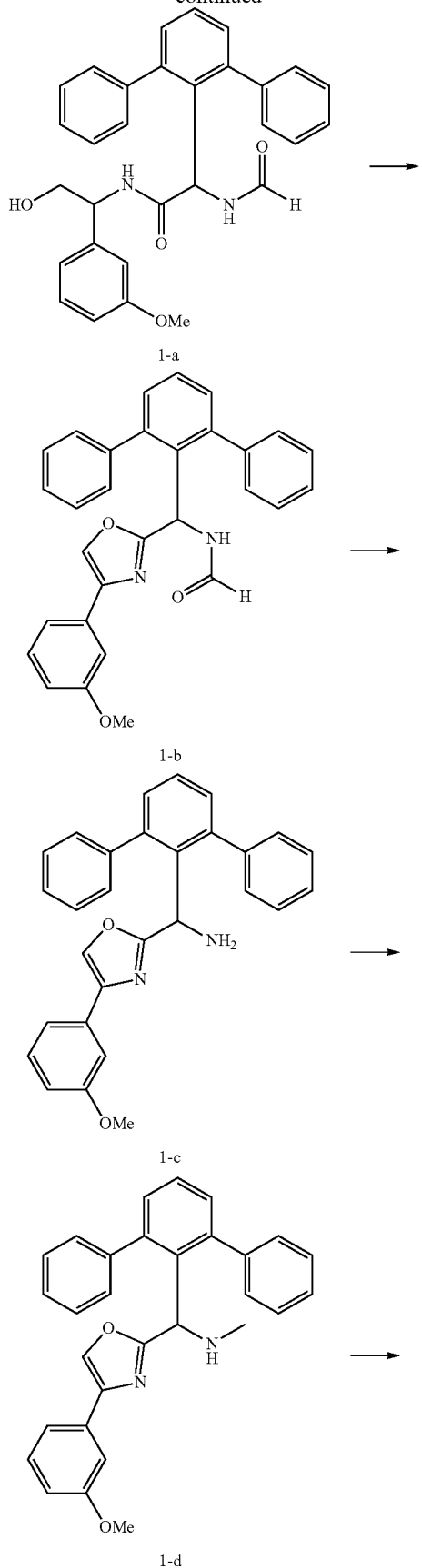

-continued

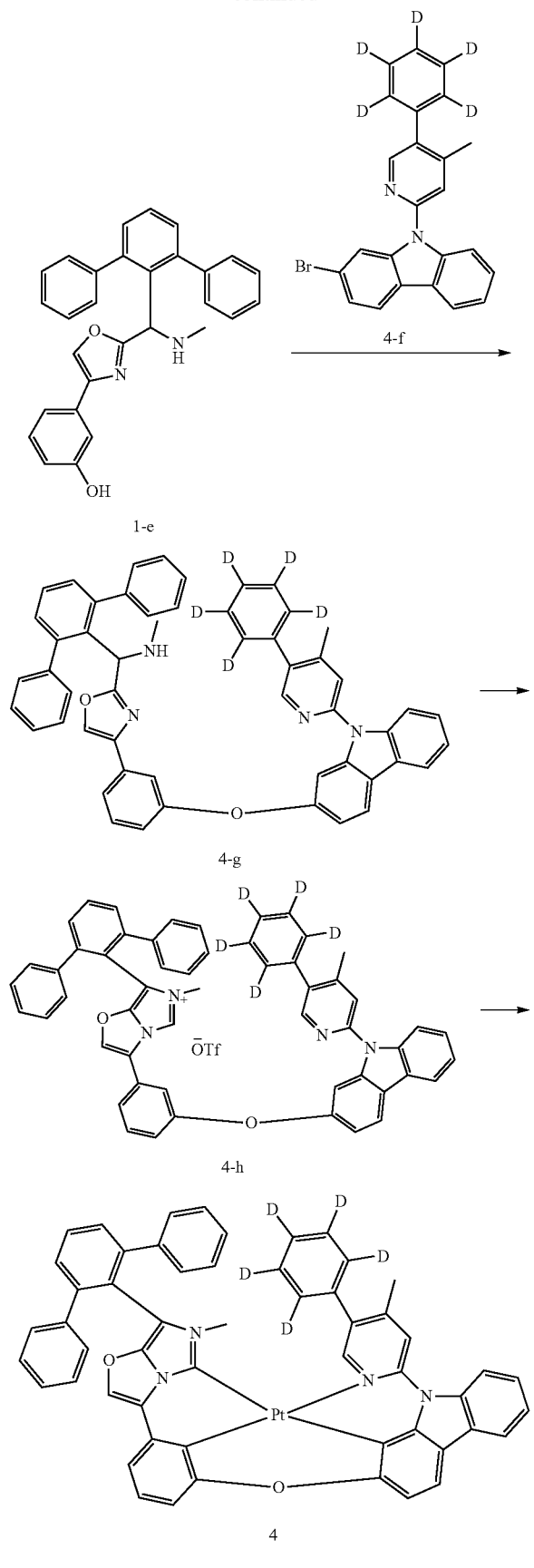

(1) Synthesis of Intermediate Compound [4-f]

2-bromo-9H-carbazole (1.1 eq.), 2-fluoro-4-methyl-5-(phenyl-$d^5$)pyridine (1.0 eq.), and $K_3PO_4$ (2.0 eq.) were dissolved in DMF (0.1 M) and stirred at a temperature of 160° C. for 12 hours. The reaction mixture was cooled to room temperature and concentrated under a reduced pressure, DMF was removed therefrom, and an extraction process was performed three times thereon using ethyl acetate and water to obtain an organic layer. The obtained organic layer was dried using magnesium sulfate and concentrated. By using column chromatography, Intermediate Compound [4-f] was synthesized (yield: 79%).

(2) Synthesis of Intermediate Compound [4-g]

Intermediate Compound [1-e], Intermediate Compound [4-f], CuI (0.1 eq.), BPPO (0.1 eq.), and potassium phosphate tribasic (2.0 eq.) were dissolved in dimethyl formamide (DMF) (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [4-g] was synthesized (yield: 56%).

(3) Synthesis of Intermediate Compound [4-h]

Intermediate Compound [4-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [4-h] was synthesized (yield: 60%).

(4) Synthesis of Compound 4

Intermediate Compound [4-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 4 was synthesized (yield: 20%).

Synthesis Example 5: Synthesis of Compound 5

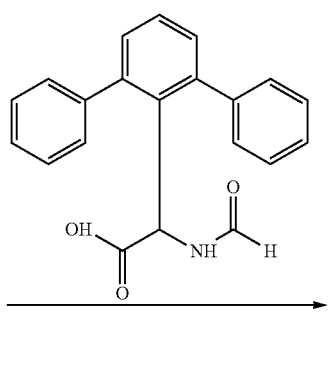

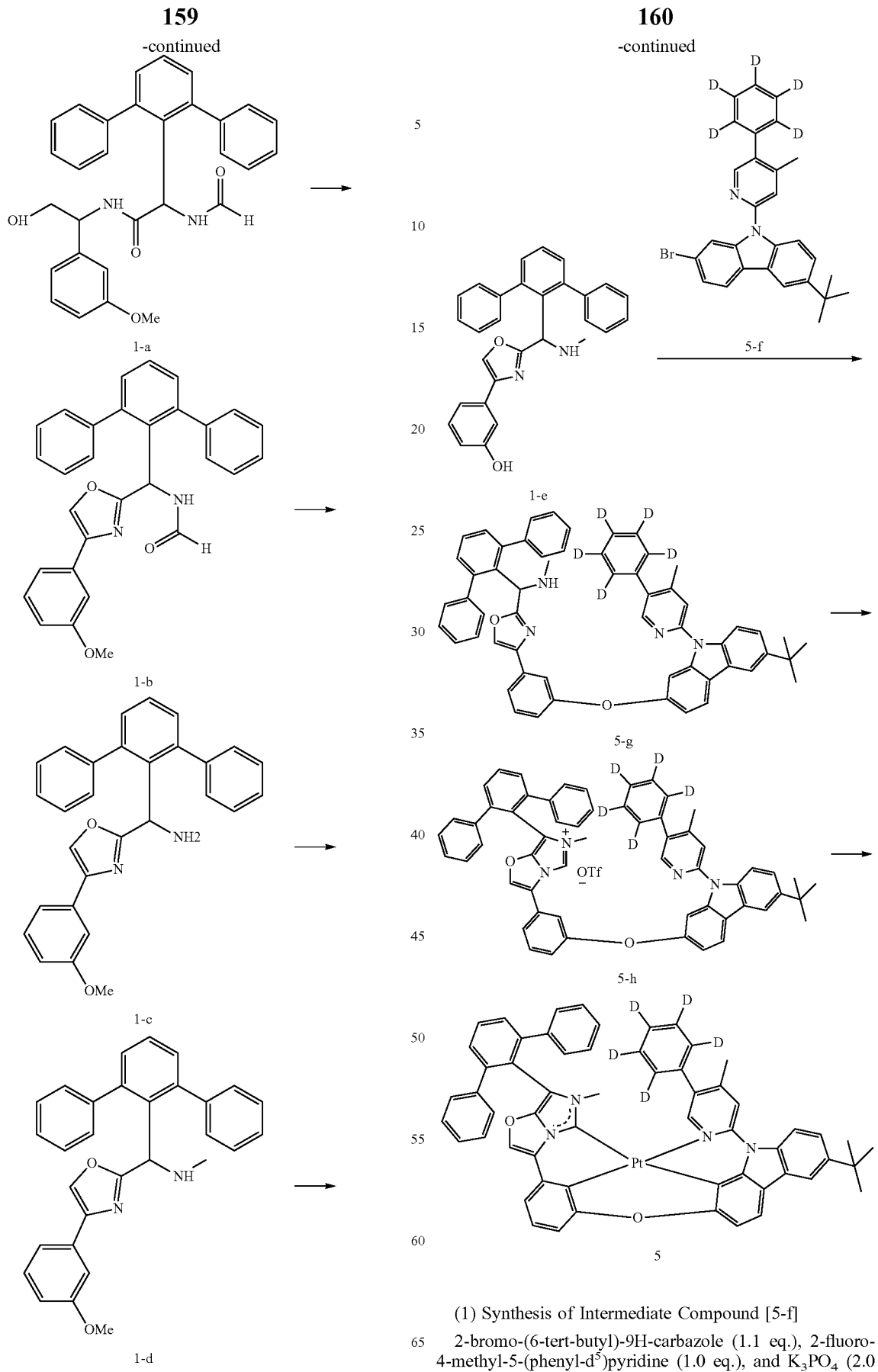
(1) Synthesis of Intermediate Compound [5-f]
2-bromo-(6-tert-butyl)-9H-carbazole (1.1 eq.), 2-fluoro-4-methyl-5-(phenyl-d$^5$)pyridine (1.0 eq.), and K$_3$PO$_4$ (2.0 eq.) were dissolved in DMF (0.1 M) and stirred at a temperature of 160° C. for 12 hours. The reaction mixture was cooled to room temperature and concentrated under a reduced pressure, DMF was removed therefrom, and an extraction process was performed three times thereon using ethyl acetate and water to obtain an organic layer. The obtained organic layer was dried using magnesium sulfate and concentrated. By using column chromatography, Intermediate Compound [5-f] was synthesized (yield: 75%).

(2) Synthesis of Intermediate Compound [5-g]

Intermediate Compound [1-e], Intermediate Compound [5-f], CuI (0.1 eq.), BPPO (0.1 eq.), and potassium phosphate tribasic (2.0 eq.) were dissolved in dimethyl formamide (DMF) (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [5-g] was synthesized (yield: 49%).

(3) Synthesis of Intermediate Compound [5-h]

Intermediate Compound [5-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [5-h] was synthesized (yield: 50%).

(4) Synthesis of Compound 5

Intermediate Compound [5-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 5 was synthesized (yield: 20%).

Synthesis Example 6: Synthesis of Compound 6

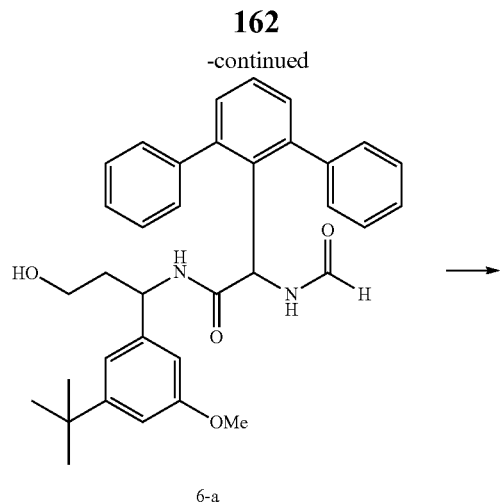

6-a

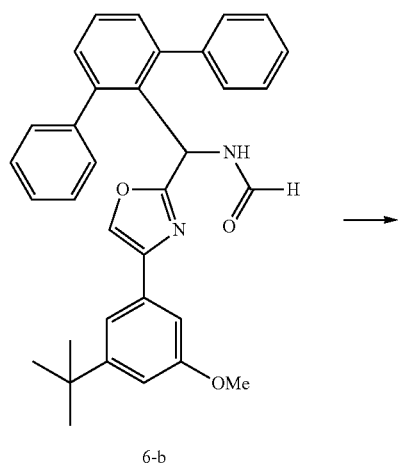

6-b

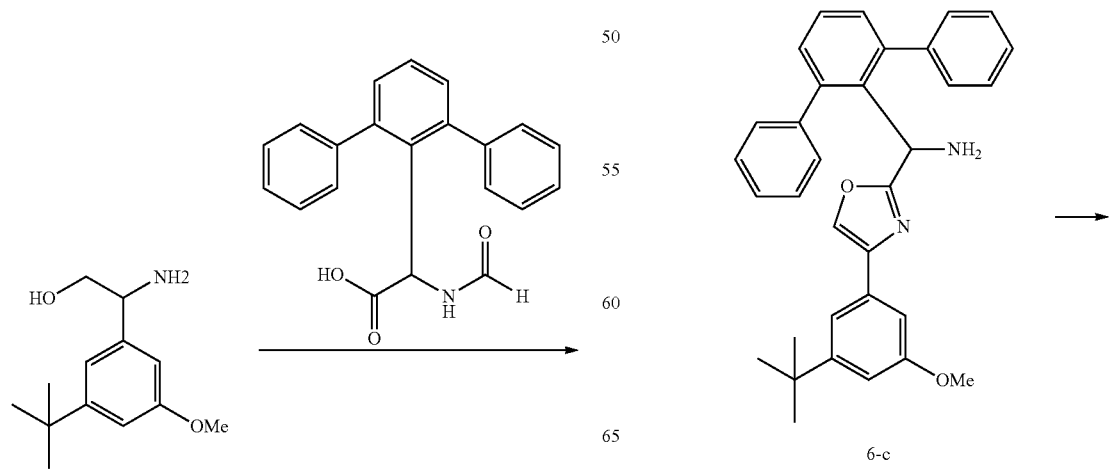

6-c

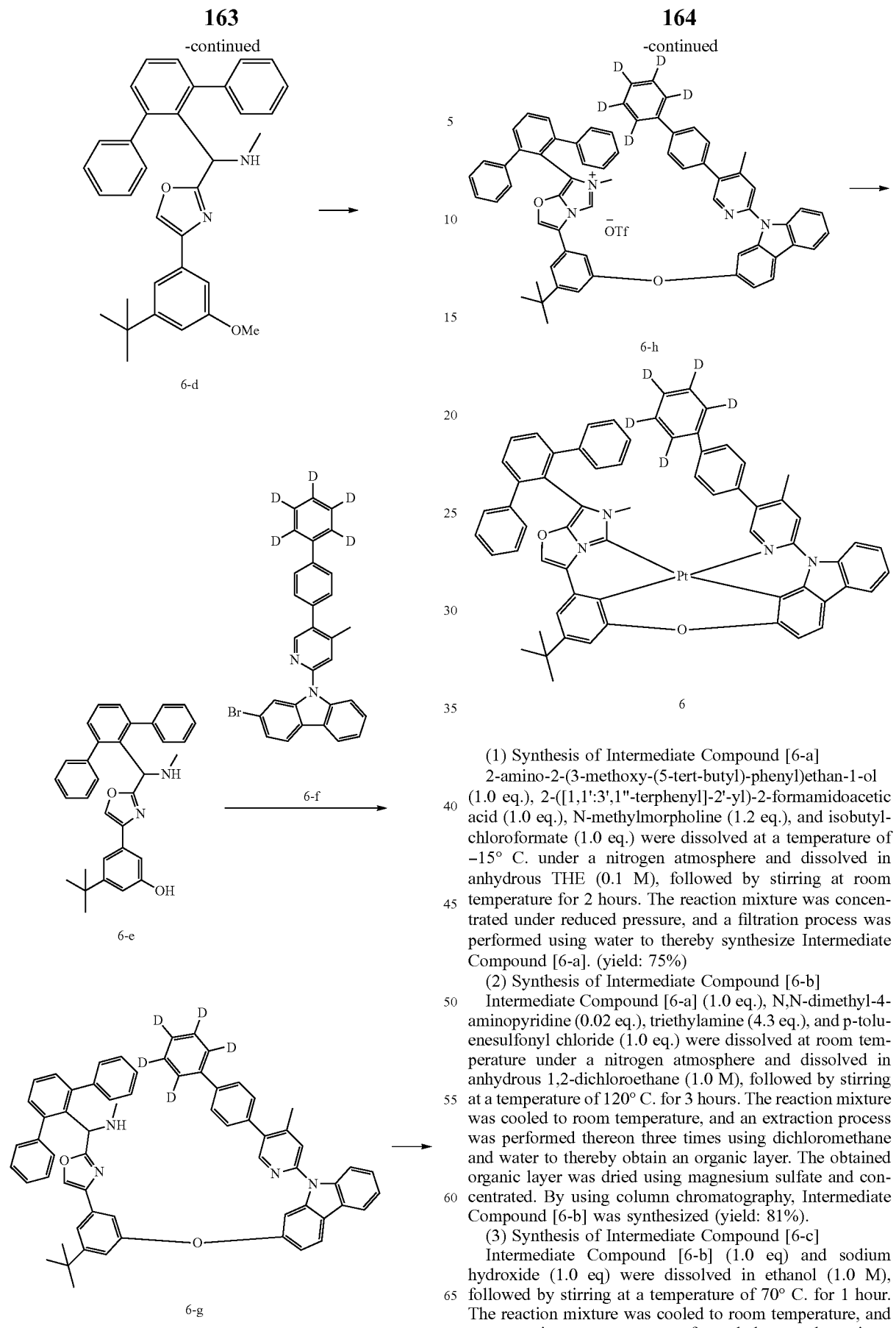

(1) Synthesis of Intermediate Compound [6-a]

2-amino-2-(3-methoxy-(5-tert-butyl)-phenyl)ethan-1-ol (1.0 eq.), 2-([1,1':3',1''-terphenyl]-2'-yl)-2-formamidoacetic acid (1.0 eq.), N-methylmorpholine (1.2 eq.), and isobutylchloroformate (1.0 eq.) were dissolved at a temperature of −15° C. under a nitrogen atmosphere and dissolved in anhydrous THF (0.1 M), followed by stirring at room temperature for 2 hours. The reaction mixture was concentrated under reduced pressure, and a filtration process was performed using water to thereby synthesize Intermediate Compound [6-a]. (yield: 75%)

(2) Synthesis of Intermediate Compound [6-b]

Intermediate Compound [6-a] (1.0 eq.), N,N-dimethyl-4-aminopyridine (0.02 eq.), triethylamine (4.3 eq.), and p-toluenesulfonyl chloride (1.0 eq.) were dissolved at room temperature under a nitrogen atmosphere and dissolved in anhydrous 1,2-dichloroethane (1.0 M), followed by stirring at a temperature of 120° C. for 3 hours. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [6-b] was synthesized (yield: 81%).

(3) Synthesis of Intermediate Compound [6-c]

Intermediate Compound [6-b] (1.0 eq) and sodium hydroxide (1.0 eq) were dissolved in ethanol (1.0 M), followed by stirring at a temperature of 70° C. for 1 hour. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [6-c] was synthesized (yield: 97%).

(4) Synthesis of Intermediate Compound [6-d]

Intermediate Compound [6-c] (1.0 eq.), n-butyllithium (2.5 M in hexane) (1.0 eq.), and iodomethane (1.0 eq.) were sequentially dissolved at a temperature of −78° C. and stirred at room temperature for 20 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [6-d] was synthesized (yield: 97%).

(5) Synthesis of Intermediate Compound [6-e]

Intermediate Compound [6-d] (1.0 eq.), HBr, and acetic acid were stirred at a temperature of 120° C. for 16 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [6-e] was synthesized (yield: 91%).

(6) Synthesis of Intermediate Compound [6-f]

2-bromo-9H-carbazole (1.1 eq.), 5-([1,1'-biphenyl]-4-yl-2',3',4',5',6'-d5)-2-fluoro-4-methylpyridine (1.0 eq.), and K$_3$PO$_4$ (2.0 eq.) were dissolved in DMF (0.1 M) and stirred at a temperature of 160° C. for 12 hours. The reaction mixture was cooled to room temperature and concentrated under a reduced pressure, DMF was removed therefrom, and an extraction process was performed three times thereon using ethyl acetate and water to obtain an organic layer. The obtained organic layer was dried using magnesium sulfate and concentrated. By using column chromatography, Intermediate Compound [6-f] was synthesized (yield: 79%).

(7) Synthesis of Intermediate Compound [6-g]

Intermediate Compound [6-e], Intermediate Compound [6-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [6-g] was synthesized (yield: 55%).

(8) Synthesis of Intermediate Compound [6-h]

Intermediate Compound [6-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [6-h] was synthesized (yield: 66%).

(9) Synthesis of Compound 6

Intermediate Compound [6-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 6 was synthesized (yield: 23%).

Synthesis Example 7: Synthesis of Compound 7

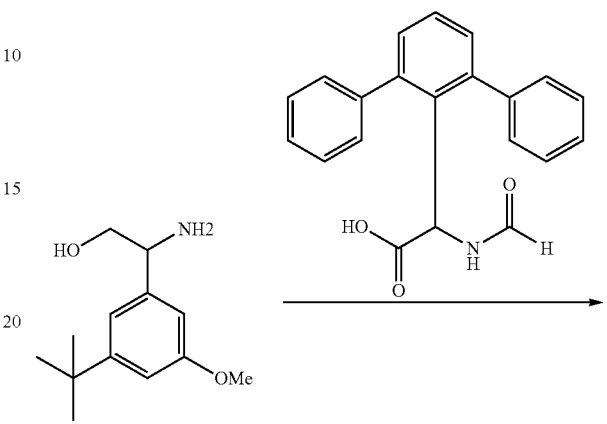

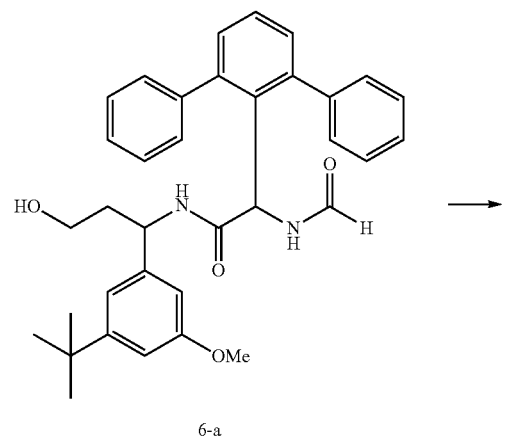

6-a

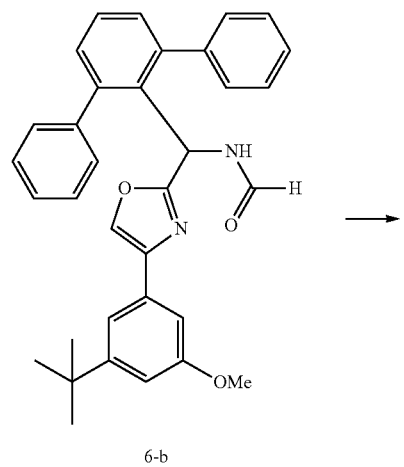

6-b

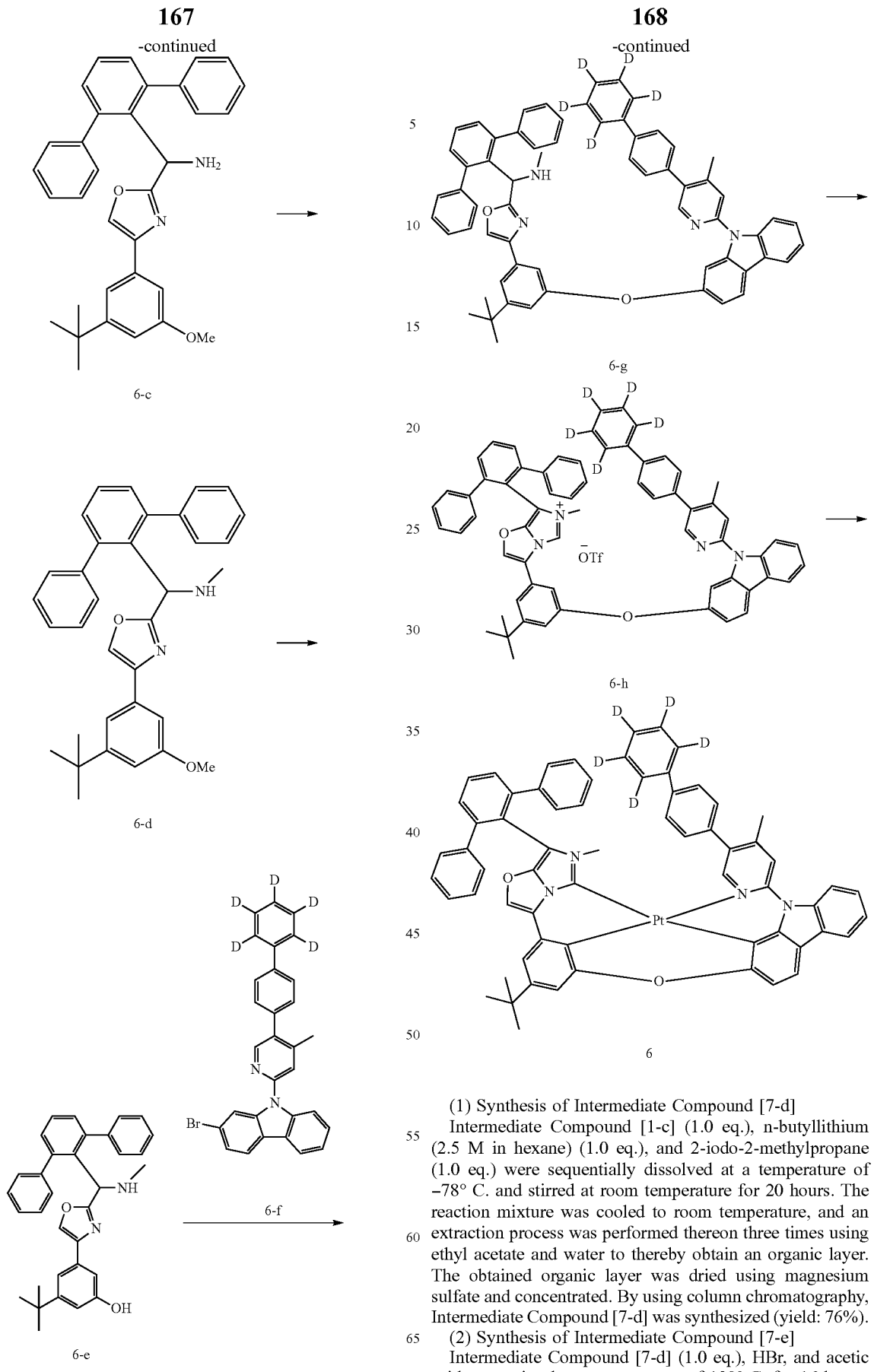

(1) Synthesis of Intermediate Compound [7-d]

Intermediate Compound [1-c] (1.0 eq.), n-butyllithium (2.5 M in hexane) (1.0 eq.), and 2-iodo-2-methylpropane (1.0 eq.) were sequentially dissolved at a temperature of −78° C. and stirred at room temperature for 20 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [7-d] was synthesized (yield: 76%).

(2) Synthesis of Intermediate Compound [7-e]

Intermediate Compound [7-d] (1.0 eq.), HBr, and acetic acid were stirred at a temperature of 120° C. for 16 hours.

The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [7-e] was synthesized (yield: 87%).

(3) Synthesis of Intermediate Compound [7-g]

Intermediate Compound [7-e], Intermediate Compound [1-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [7-g] was synthesized (yield: 55%).

(4) Synthesis of Intermediate Compound [7-h]

Intermediate Compound [7-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [7-h] was synthesized (yield: 60%).

(5) Synthesis of Compound 7

Intermediate Compound [7-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 7 was synthesized (yield: 19%).

Synthesis Example 8: Synthesis of Compound 8

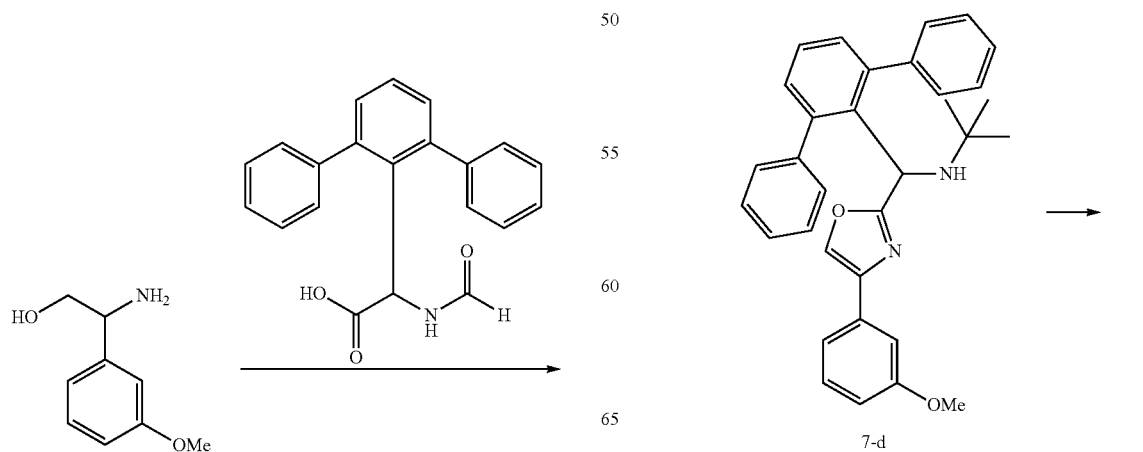

-continued

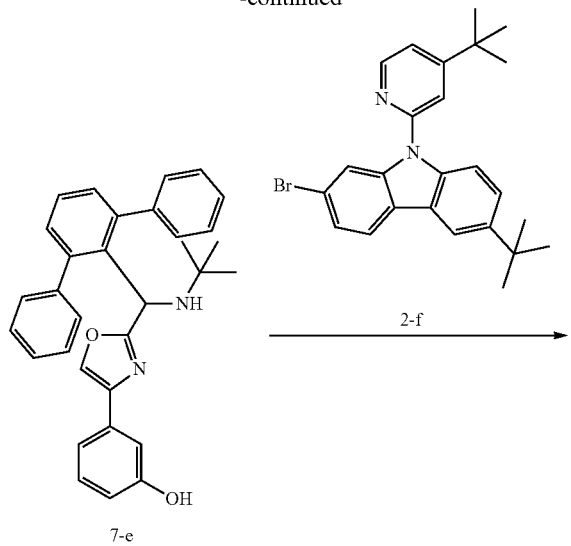

7-e

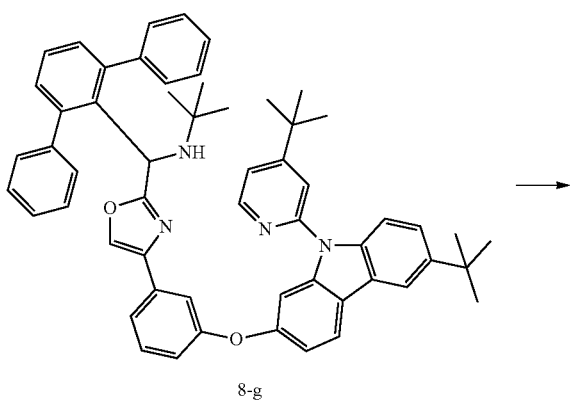

8-g

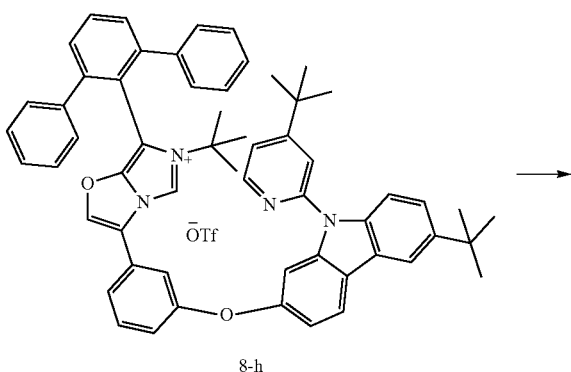

8-h

-continued

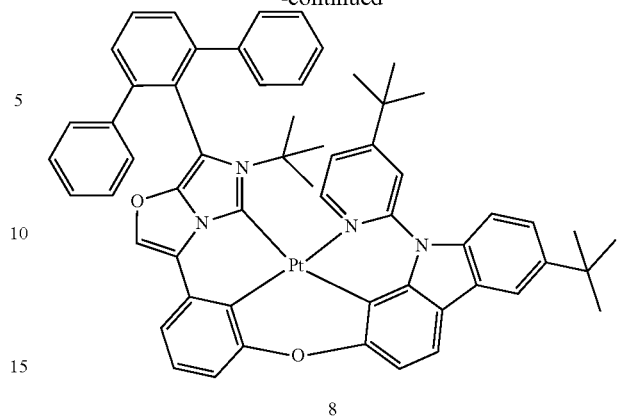

8

(1) Synthesis of Intermediate Compound [8-g]

Intermediate Compound [7-e], Intermediate Compound [2-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [8-g] was synthesized (yield: 51%).

(2) Synthesis of Intermediate Compound [8-h]

Intermediate Compound [8-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [8-h] was synthesized (yield: 60%).

(3) Synthesis of Compound 8

Intermediate Compound [8-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 8 was synthesized (yield: 20%).

Synthesis Example 9: Synthesis of Compound 9
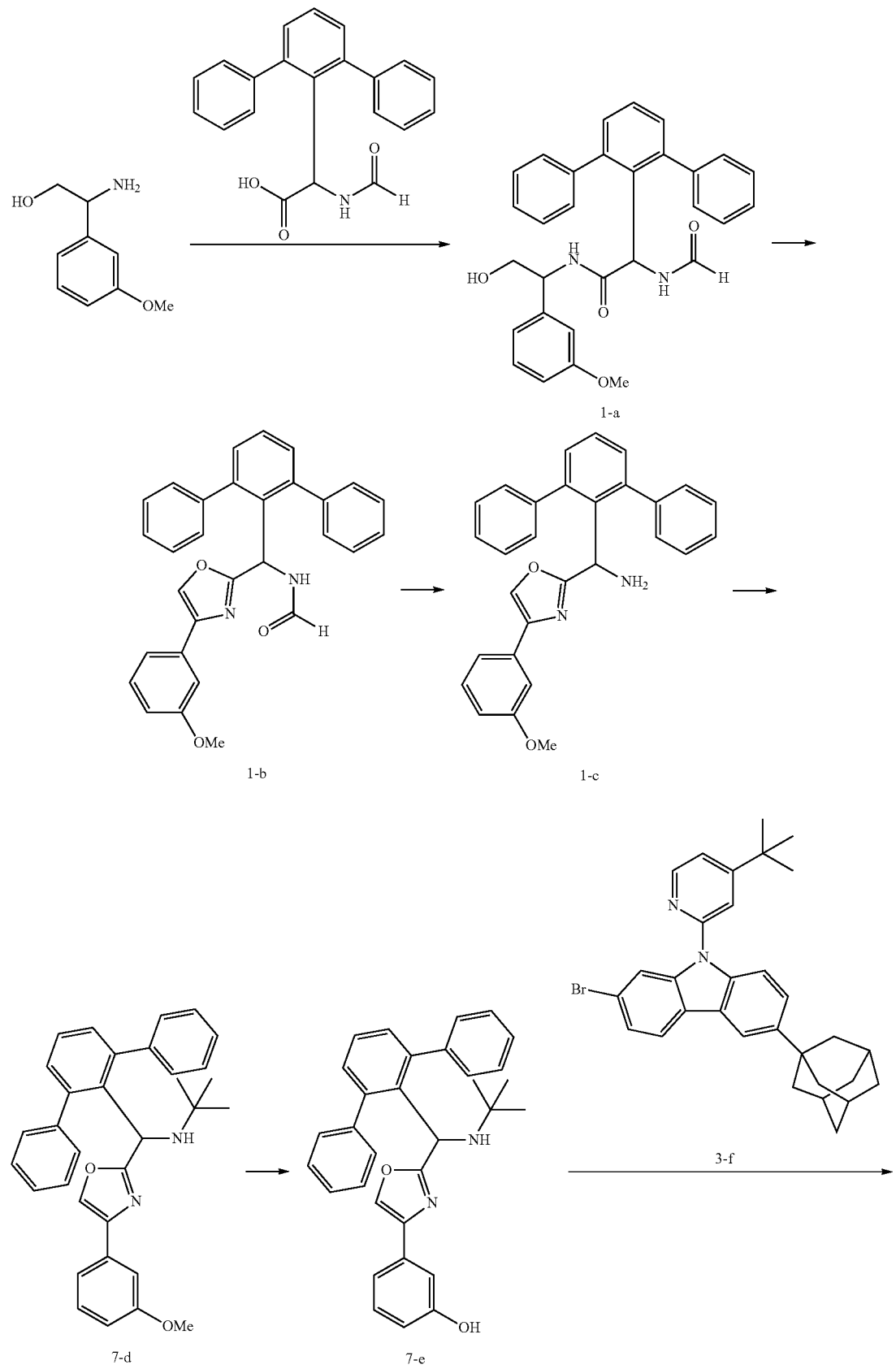

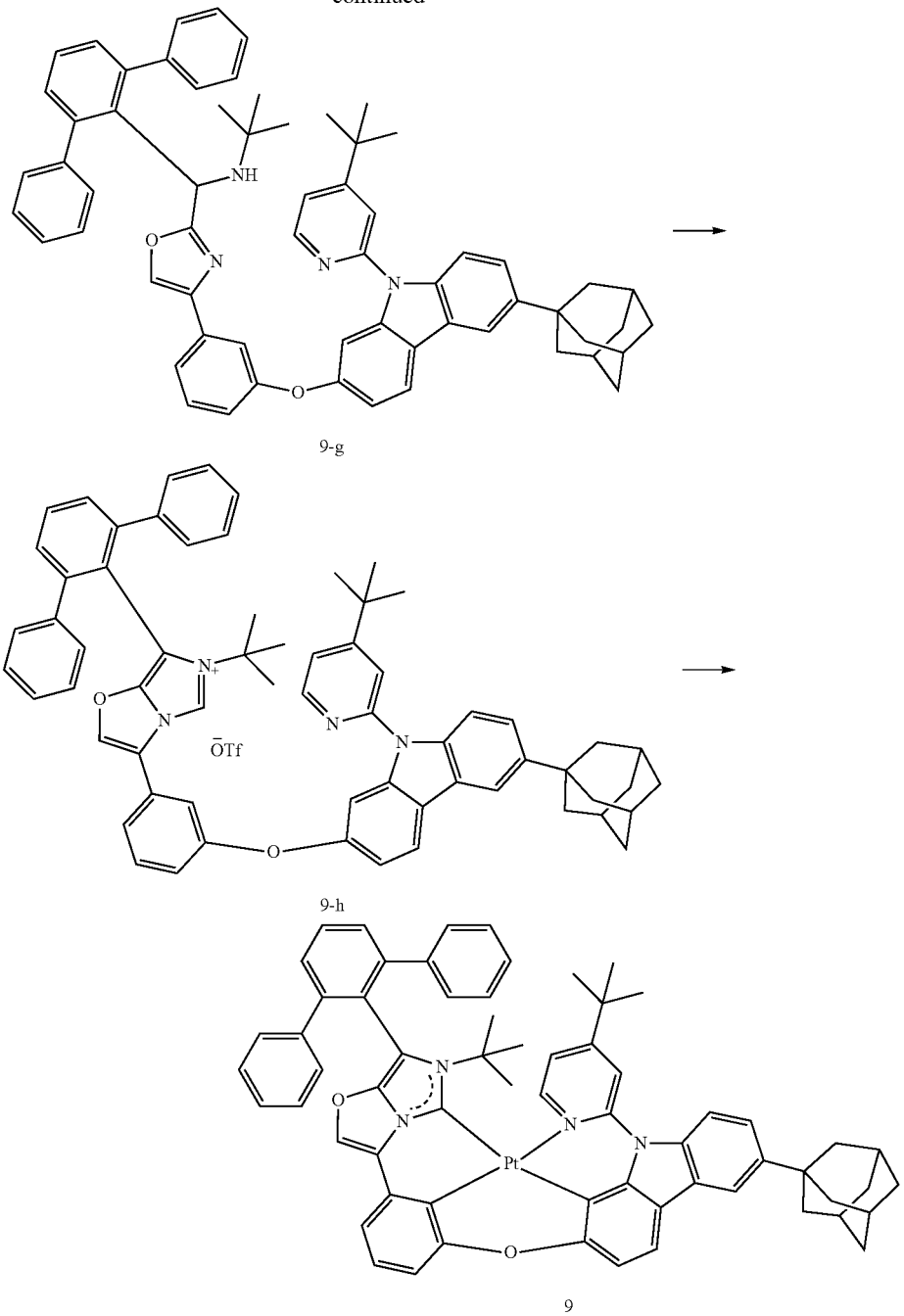

(1) Synthesis of Intermediate Compound [9-g]

Intermediate Compound [7-e], Intermediate Compound [3-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [9-g] was synthesized (yield: 53%).

(2) Synthesis of Intermediate Compound [9-h]

Intermediate Compound [9-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [9-h] was synthesized (yield: 50%).

(3) Synthesis of Compound 9

Intermediate Compound [9-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 9 was synthesized (yield: 20%).
Synthesis Example 10: Synthesis of Compound 10
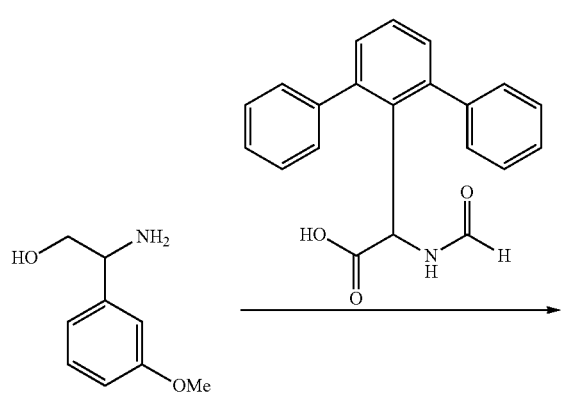
1-a
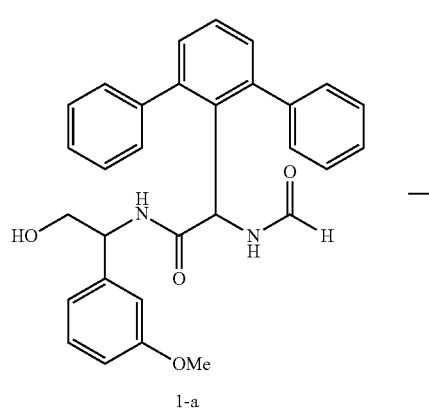
1-b
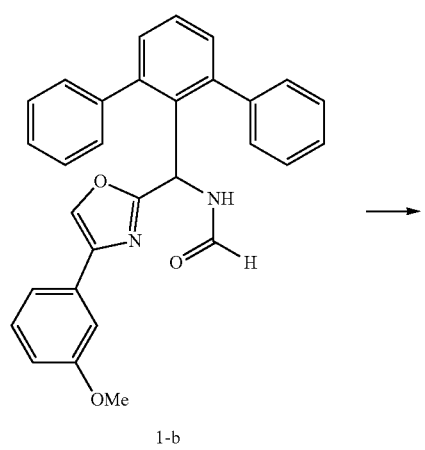
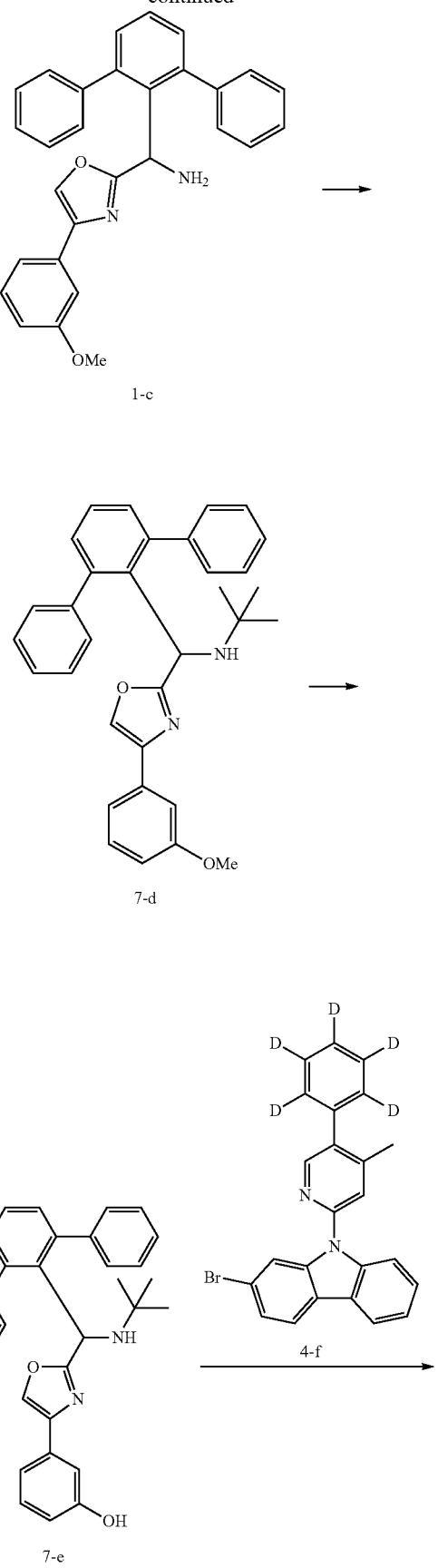

-continued

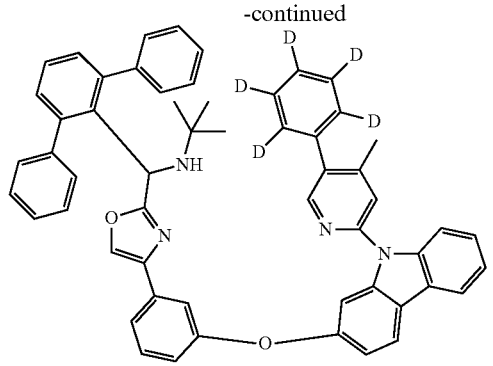
10-g

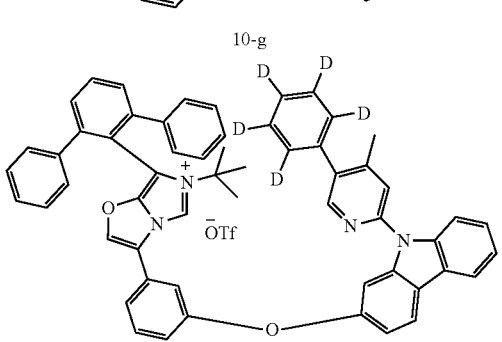
10-h

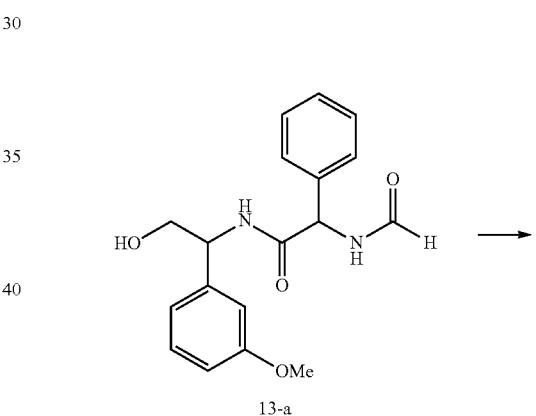
10

(1) Synthesis of Intermediate Compound [10-g]

Intermediate Compound [7-e], Intermediate Compound [4-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [10-g] was synthesized (yield: 57%).

(2) Synthesis of Intermediate Compound [10-h]

Intermediate Compound [10-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [10-h] was synthesized (yield: 60%).

(3) Synthesis of Compound 10

Intermediate Compound [10-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 10 was synthesized (yield: 23%).

Synthesis Example 11: Synthesis of Compound 13

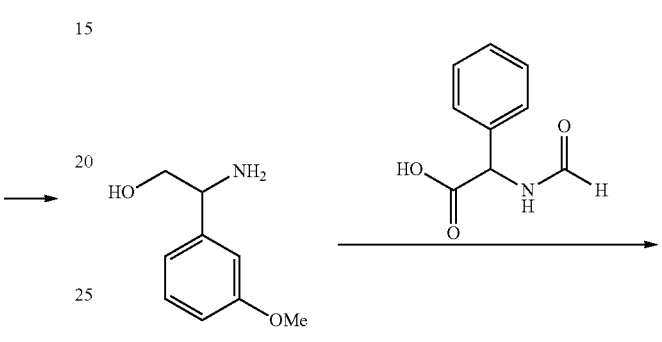

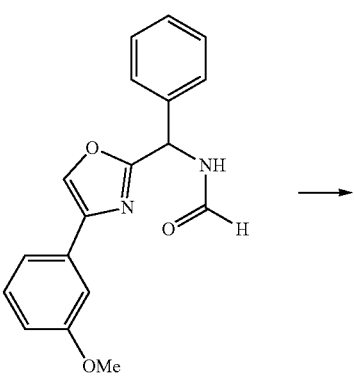
13-a

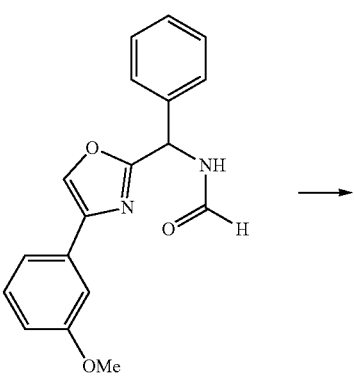
13-b

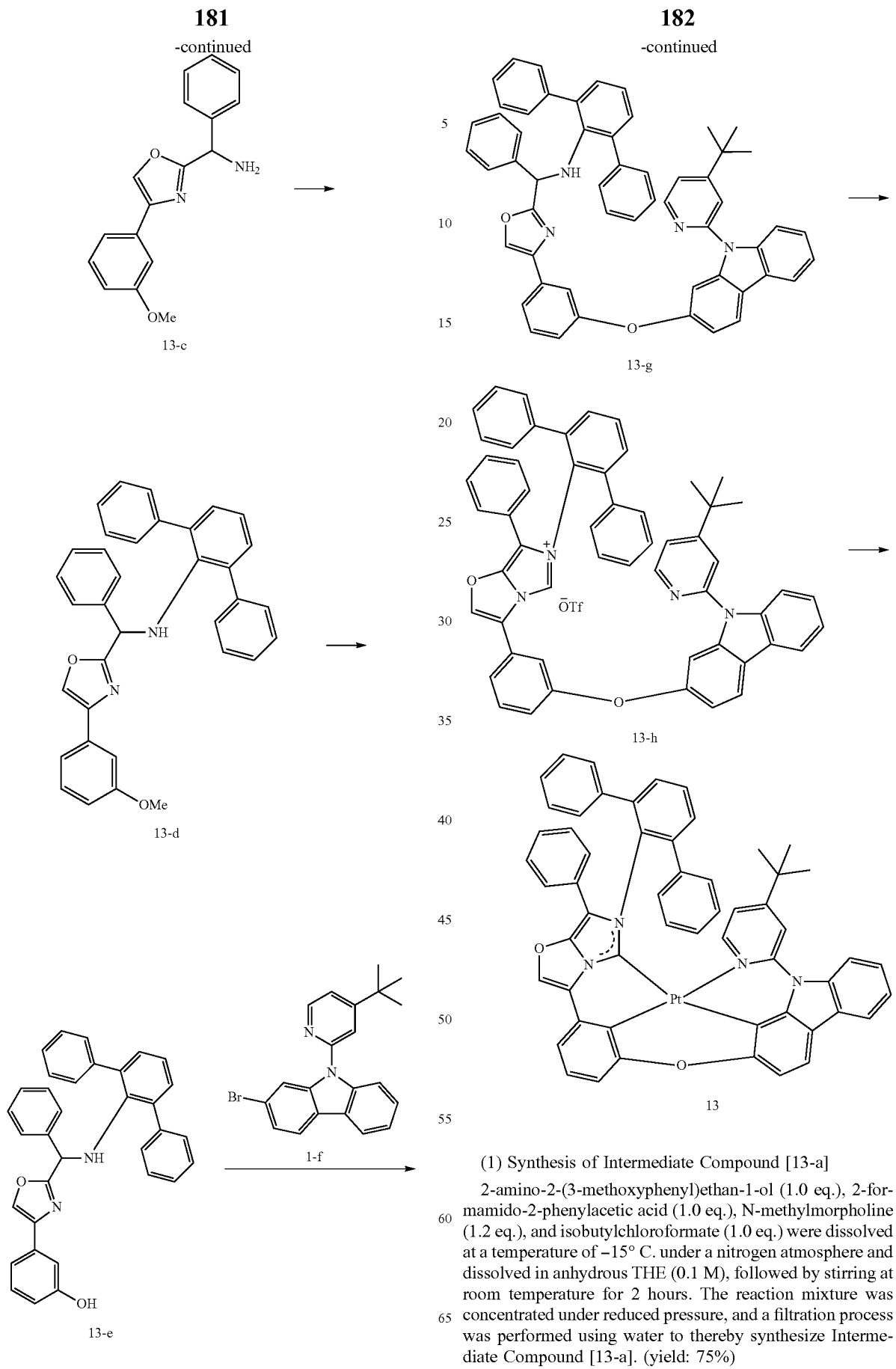

(1) Synthesis of Intermediate Compound [13-a]

2-amino-2-(3-methoxyphenyl)ethan-1-ol (1.0 eq.), 2-formamido-2-phenylacetic acid (1.0 eq.), N-methylmorpholine (1.2 eq.), and isobutylchloroformate (1.0 eq.) were dissolved at a temperature of −15° C. under a nitrogen atmosphere and dissolved in anhydrous THF (0.1 M), followed by stirring at room temperature for 2 hours. The reaction mixture was concentrated under reduced pressure, and a filtration process was performed using water to thereby synthesize Intermediate Compound [13-a]. (yield: 75%)

(2) Synthesis of Intermediate Compound [13-b]

Intermediate Compound [13-a] (1.0 eq.), N,N-dimethyl-4-aminopyridine (0.02 eq.), triethylamine (4.3 eq.), and p-toluenesulfonyl chloride (1.0 eq.) were dissolved at room temperature under a nitrogen atmosphere and dissolved in anhydrous 1,2-dichloroethane (1.0 M), followed by stirring at a temperature of 120° C. for 3 hours. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [13-b] was synthesized (yield: 71%).

(3) Synthesis of Intermediate Compound [13-c]

Intermediate Compound [13-b] (1.0 eq) and sodium hydroxide (1.0 eq) were dissolved in ethanol (1.0 M), followed by stirring at a temperature of 70° C. for 1 hour. The reaction mixture was cooled to room temperature, and an extraction process was performed thereon three times using dichloromethane and water to thereby obtain an organic layer. The obtained organic layer was dried using magnesium sulfate and concentrated. By using column chromatography, Intermediate Compound [13-c] was synthesized (yield: 85%).

(4) Synthesis of Intermediate Compound [13-d]

Intermediate Compound [13-c] (1.0 eq.), [1,1':3',1''-terphenyl]-2'-yl trifluoromethanesulfonate (1.1 eq.), Pd$_2$(dba)$_3$ (0.05 mol %), 2-dicyclohexylphosphino-2',4',6'-triisopropylbiphenyl (0.1 mol %), and sodium tert-butoxide (2.0 eq.) were sequentially dissolved in toluene and stirred at a temperature of 110° C. for 12 hours. The reaction mixture was cooled to room temperature, and an extraction process was performed thereon three times using ethyl acetate and water to thereby obtain an organic layer. The obtained organic layer was dried using magnesium sulfate and concentrated. By using column chromatography, Intermediate Compound [13-d] was synthesized (yield: 76%).

(5) Synthesis of Intermediate Compound [13-e]

Intermediate Compound [13-d] (1.0 eq.), HBr, and acetic acid were stirred at a temperature of 120° C. for 16 hours. The reaction mixture was cooled to room temperature, and the reaction mixture was neutralized at a temperature of 0° C. by using sodium hydroxide. An extraction process was performed three times thereon using ethyl acetate and water to thereby obtain an organic layer. The obtained organic layer was dried using magnesium sulfate and concentrated. By using column chromatography, Intermediate Compound [13-e] was synthesized (yield: 93%).

(6) Synthesis of Intermediate Compound [13-g]

Intermediate Compound [13-e], Intermediate Compound [1-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [13-g] was synthesized (yield: 55%).

(7) Synthesis of Intermediate Compound [13-h]

Intermediate Compound [13-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [13-h] was synthesized (yield: 61%).

(8) Synthesis of Compound 13

Intermediate Compound [13-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 13 was synthesized (yield: 20%).

Synthesis Example 12: Synthesis of Compound 19

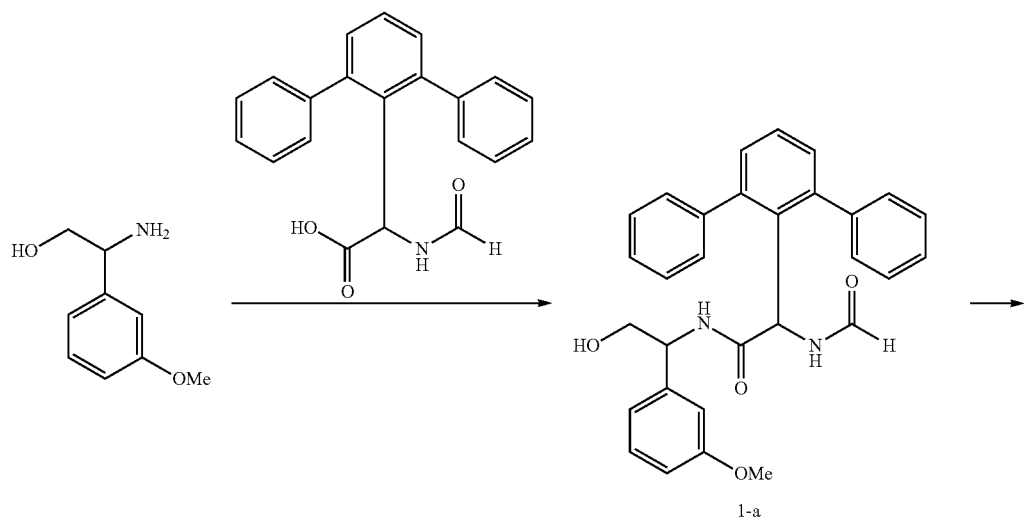

1-a

-continued
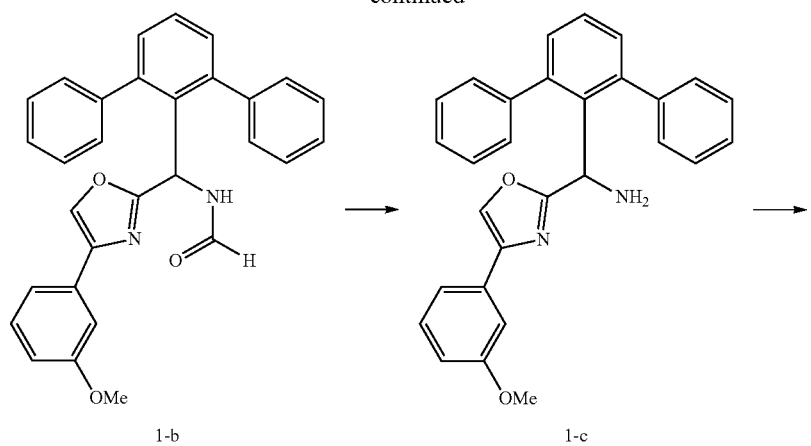
1-b → 1-c →
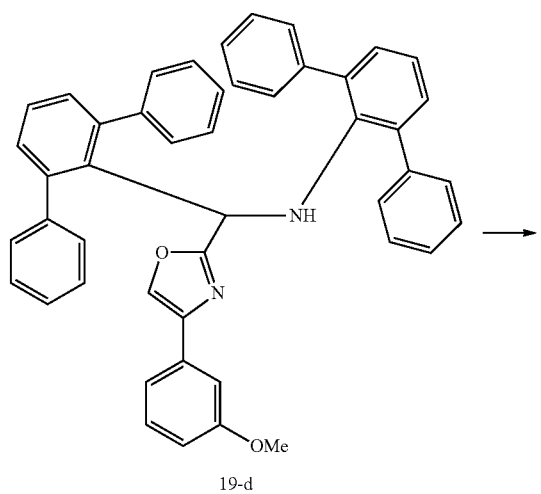
19-d
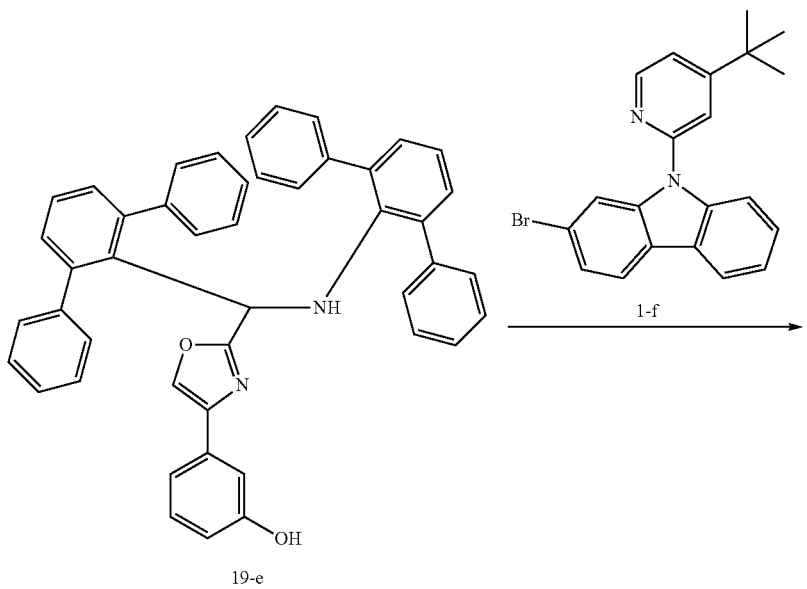
19-e

-continued

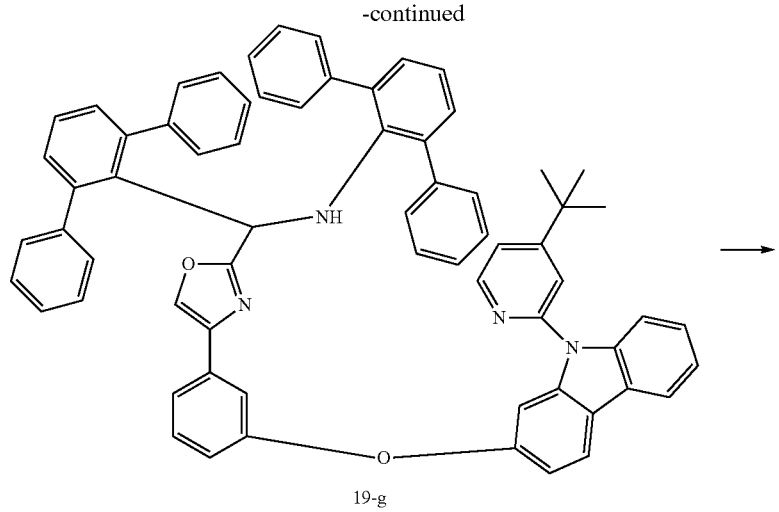
19-g

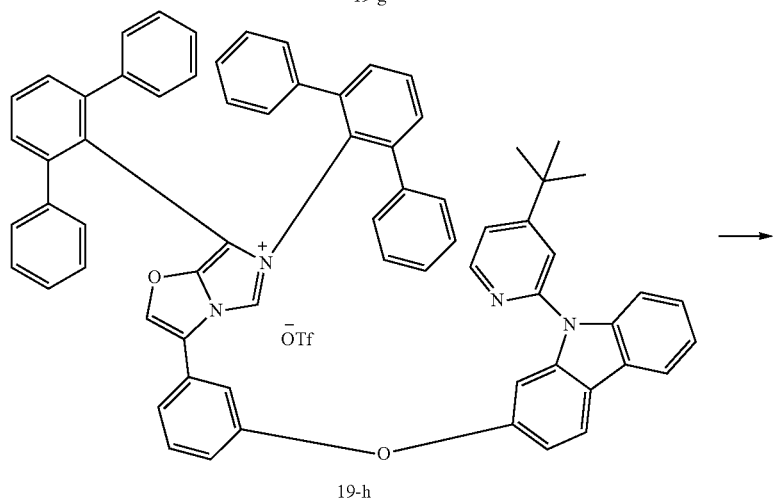
19-h

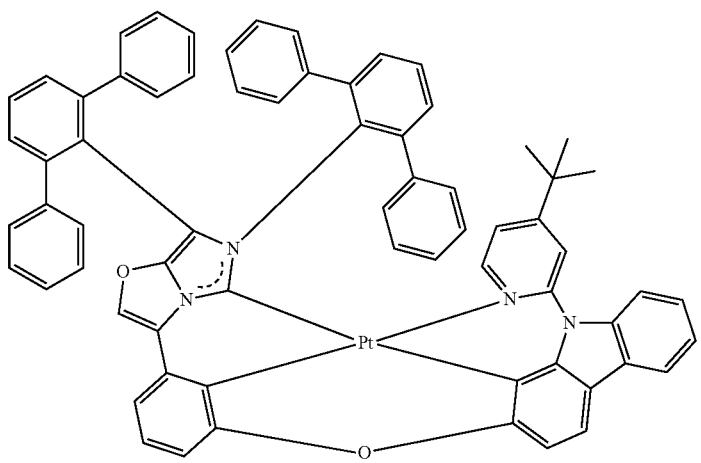
19

(1) Synthesis of Intermediate Compound [19-d]

Intermediate Compound [1-c] (1 eq.), [1,1':3',1''-terphenyl]-2'-yl trifluoromethanesulfonate (1.1 eq.), Pd$_2$(dba)$_3$ (0.05 mol %), 2-dicyclohexylphosphino-2',4',6'-triisopropylbiphenyl (0.1 mol %), and sodium tert-butoxide (2.0 eq.) were sequentially dissolved in toluene and stirred at a temperature of 110° C. for 12 hours. The reaction product was cooled to room temperature and distilled under reduced pressure to remove the solvent. The reaction mixture underwent an extraction process 2 times using MC and water to thereby obtain an organic layer. The obtained organic layer was dried using magnesium sulfate and concentrated. By using column chromatography, Intermediate Compound [19-d] was synthesized (yield: 72%).

(2) Synthesis of Intermediate Compound [19-e]

Intermediate Compound [19-d] (1.0 eq.), HBr, and acetic acid were stirred at a temperature of 120° C. for 16 hours. The reaction mixture was cooled to room temperature, and the reaction mixture was neutralized at a temperature of 0° C. by using sodium hydroxide. An extraction process was performed three times thereon using ethyl acetate and water to thereby obtain an organic layer. The obtained organic layer was dried using magnesium sulfate and concentrated. By using column chromatography, Intermediate Compound [19-e] was synthesized (yield: 89%).

(3) Synthesis of Intermediate Compound [19-g]

Intermediate Compound [19-e], Intermediate Compound [1-f], CuI (0.1 eq.), BPPO (0.1 eq.), and potassium phosphate tribasic (2.0 eq.) were dissolved in DMF (0.1 M) and stirred at a temperature of 160° C. for 12 hours. The reaction mixture was cooled to room temperature and distilled under reduced pressure, and an extraction process was performed thereon three times using ethyl acetate and water to thereby obtain an organic layer. The obtained organic layer was dried using magnesium sulfate and concentrated. By using column chromatography, Intermediate Compound [19-g] was synthesized (yield: 55%).

(4) Synthesis of Intermediate Compound [19-h]

Intermediate Compound [19-g] (1.0 eq.), AgOTf (1.2 eq.), and chloromethyl pivalate (1.2 eq.) were dissolved in dichloromethane (0.1 M) and stirred at room temperature for 24 hours. The reaction mixture was filtered using dichloromethane. By using column chromatography, Intermediate Compound [19-h] was synthesized (yield: 61%).

(5) Synthesis of Compound 19

Intermediate Compound [19-h] (1.0 eq.), dichloro(1,5-cyclooctadiene)platinum (II) (1.1 eq.), and sodium acetate (3.0 eq.) were dissolved in anhydrous 1,4-dioxane and stirred under a nitrogen atmosphere at a temperature of 120° C. for 4 days. The reaction mixture was cooled to room temperature, and an extraction process was performed thereon three times using dichloromethane and water to thereby obtain an organic layer. The obtained organic layer was dried using magnesium sulfate and concentrated. By using column chromatography (50 vol % MC:50 vol % hexane), Compound 19 was synthesized (yield: 20%).

Compounds synthesized in Synthesis Examples 1 to 12 were identified by $^1$H-NMR and mass spectroscopy/fast atom bombardment (MS/FAB). The results thereof are shown in Table 1. Methods of synthesizing compounds other than compounds shown in Table 1 may be easily understood to those skilled in the art by referring to the synthesis schemes and raw materials described above.

TABLE 1

| Compound | $^1$H NMR (δ) | MS/FAB Calc. | MS/FAB Found |
|---|---|---|---|
| 1 | 8.74 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (2H, dd), 7.40 (1H, s), 7.20 (1H, m), 7.06-7.10 (2H, m), 6.88 (1H, dd), 6.69 (1H, dd), 3.67 (3H, s), 1.32 (9H, s) | 933.98 | 933.70 |
| 2 | 8.74 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (1H, dd), 7.40 (1H, s), 7.06-7.10 (2H, m), 6.88 (1H, dd), 6.69 (1H, dd), 3.67 (3H, s), 1.33 (18H, s) | 990.08 | 990.11 |
| 3 | 8.74 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (1H, dd), 7.40 (1H, s), 7.06-7.10 (2H, m), 6.88 (1H, dd), 6.69 (1H, dd), 3.67 (3H, s), 1.87 (3H, m), 1.72-1.76 (12H, m), 1.33 (9H, s) | 1068.20 | 1068.33 |
| 4 | 8.94 (1H, s), 8.39 (3H, s), 8.19 (1H,dd), 7.61 (1H, s), 7.58 (1H, s), 7.51 (4H, m), 7.50 (1H, s), 7.46 (4H, m), 7.40 (1H, s), 7.20 (1H, m), 7.06-7.10 (2H, m), 6.88 (1H, dd), 6.69 (1H, dd), 3.67 (3H, s), 2.30 (3H, s) | 973.02 | 972.88 |
| 5 | 8.94 (1H, s), 8.39 (3H, s), 8.19 (1H, dd), 7.61 (1H, s), 7.58 (1H, s), 7.51 (4H, m), 7.50 (1H, s), 7.46 (4H, m), 7.40 (1H, s), 7.06-7.10 (2H, m), 6.88 (1H, dd), 6.69 (1H, dd), 3.67 (3H, s), 2.30 (3H, s), 1.33 (9H, s) | 1029.13 | 1029.33 |
| 6 | 9.08 (1H, s), 8.39 (2H, dd), 8.19 (1H, m), 7.41-7.61 (14H, m), 7.25 (4H, m), 7.10 (1H, s), 7.03 (1H, s), 6.92 (1H, dd), 6.69 (1H, dd), 3.67 (3H, s), 2.68 (3H, s), 1.33 (9H, s) | 1105.23 | 1105.55 |
| 7 | 8.74 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (2H, dd), 7.40 (1H, s), 7.20 (1H, m), 7.06-7.10 (2H, m), 6.88 (1H, dd), 6.69 (1H, dd), 1.33 (9H, s), 1.32 (9H, s) | 976.06 | 976.11 |
| 8 | 8.94 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (2H, dd), 7.40 (1H, s), 7.06-7.10 (2H, m), 6.88 (1H, dd), 6.69 (1H, dd), 1.33 (18H, s), 1.32 (9H, s) | 1032.16 | 1032.00 |
| 9 | 8.94 (1H, dd), 8.38 (3H, s), 8.19 (1H,dd), 7.61 (1H, s), 7.58 (1H, s), 7.51 (4H, m), 7.50 (1H, s), 7.46 (4H, m), 7.41 (2H, dd), 7.40 (1H, s), 7.06-7.10 (2H, m), 6.88 (1H, dd), 6.69 (1H, dd), 1.87 (3H, m), 1.76-1.72 (12H, m), 1.33 (9H, s), 1.32 (9H, s) | 1110.28 | 1110.50 |
| 10 | 8.84 (1H, s), 8.39 (3H, s), 8.19 (1H,dd), 7.61 (1H, s), 7.58 (1H, s), 7.51 (4H, m), 7.50 (1H, s), 7.46 (4H, m), 7.40 (1H, s), 7.20 (1H, m), 7.10-7.06 (2H, m), 6.88 (1H, dd), 6.69 (1H, dd), 2.30 (3H, s), 1.33 (9H, s) | 973.02 | 973.44 |
| 13 | 8.74 (1H, dd), 8.39 (1H, d), 8.19 (1H, dd), 8.09 (2H, dd), 7.71 (2H, dd), 7.58 (1H, s), 7.52 (3H, m), 7.50 (1H, s), 7.44-7.40 (9H, m), 7.20 (2H, m), 7.10-7.06 (6H, m), 6.88 (1H, dd), 6.69 (1H, dd), 1.32 (9H, s) | 996.05 | 996.55 |
| 19 | 8.74 (1H, dd), 8.39 (3H, m), 8.19 (1H, dd), 8.09 (2H, dd), 7.61 (1H, s), 7.58 (1H, s), 7.51 (4H, m), 7.50 (1H, s), 7.46 (4H, m), 7.44-7.40 (11H, m), 7.20 (2H, m), 7.10-7.06 (6H, m), 6.88 (1H, dd), 6.69 (1H, dd), 1.32 (9H, s) | 1148.24 | 1148.54 |

Evaluation Example 1

The $^3$MLCT(%), simulation maximum emission wavelength ($\lambda\text{max}^{sim}$), actual maximum emission wavelength ($\lambda_{max}^{exp}$), and $^3$MC state energy level of the compounds of Synthesis Examples 1 to 7, 11, and 12 and Comparative Examples 1 to 5 were measured using quantum simulation. The results thereof are shown in Table 2.

Characteristics of Compounds 1 to 7, 13, and 19 and Compounds A, B, C, D, and E as comparative compounds were evaluated. The highest occupied molecular orbital (HOMO) and lowest unoccupied molecular orbital (LUMO) were measured according to energy differential pulse voltammetry. $^3$MC state energy level value was evaluated at a degree of B3LYP. $^3$MLCT(%) value was evaluated by using a Gaussian according to a density functional theory (DFT), wherein structure optimization is performed at a degree of B3LYP and 6-31G(d,p).

TABLE 2

| Compound | | HOMO (eV) | LUMO (eV) | $\lambda_{max}^{sim}$ (nm) | $\lambda_{max}^{exp}$ (nm) | $^3$MC (kcal/mol) | $^3$MLCT (%) |
|---|---|---|---|---|---|---|---|
| Synthesis Example 1 | 1 | −5.07 | −1.68 | 464.56 | 458 | 0.83 | 14.1 |
| Synthesis Example 2 | 2 | −4.92 | −1.59 | 467.77 | 461 | 0.81 | 13.9 |
| Synthesis Example 3 | 3 | −5.00 | −1.56 | 465.55 | 463 | 0.80 | 13.8 |
| Synthesis Example 4 | 4 | −5.07 | −1.68 | 462.13 | 459 | 0.83 | 14.0 |
| Synthesis Example 5 | 5 | −5.06 | −1.69 | 463.33 | 458 | 0.80 | 14.5 |
| Synthesis Example 6 | 6 | −4.99 | −1.59 | 465.10 | 457 | 0.81 | 14.1 |
| Synthesis Example 7 | 7 | −5.07 | −1.67 | 461.13 | 456 | 0.81 | 13.5 |
| Synthesis Example 11 | 13 | −5.11 | −1.47 | 455.23 | 455 | 0.82 | 13.0 |
| Synthesis Example 12 | 19 | −5.06 | −1.68 | 455.23 | 456 | 0.80 | 14.6 |
| Comparative Example 1 | A | −4.76 | −1.77 | 469.46 | 461 | 0.41 | 9.0 |
| Comparative Example 2 | B | −4.83 | −1.75 | 468.00 | 462 | 0.77 | 10.1 |
| Comparative Example 3 | C | −5.04 | −1.63 | 471.13 | 468 | 0.70 | 8.1 |
| Comparative Example 4 | D | −5.05 | −1.67 | 461.03 | 459 | 0.61 | 11.2 |
| Comparative Example 5 | E | −5.00 | −1.68 | 465.22 | 461 | 0.50 | 8.9 |

1

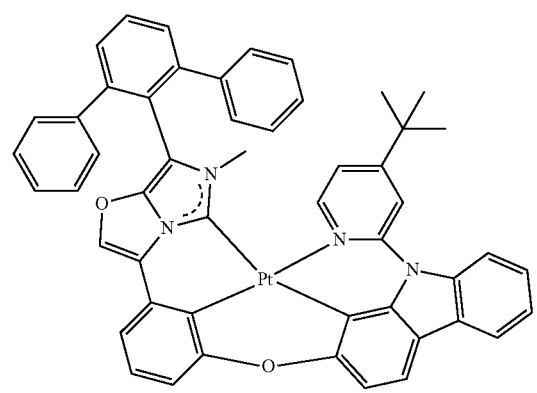

2

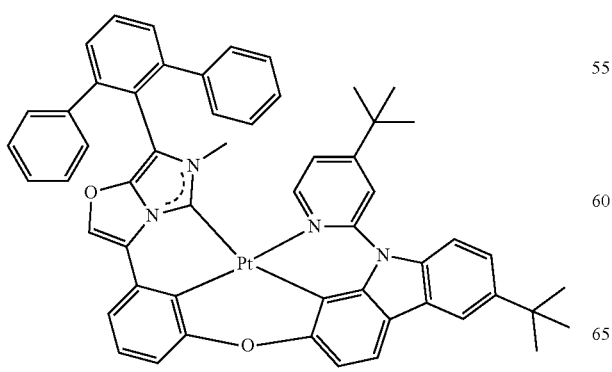

-continued

3

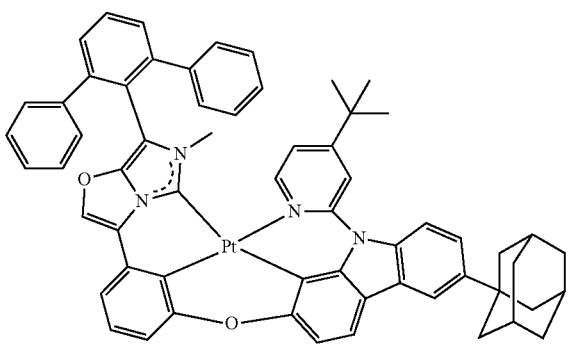

4

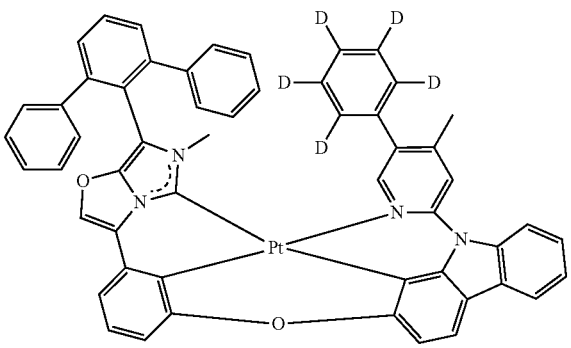

5
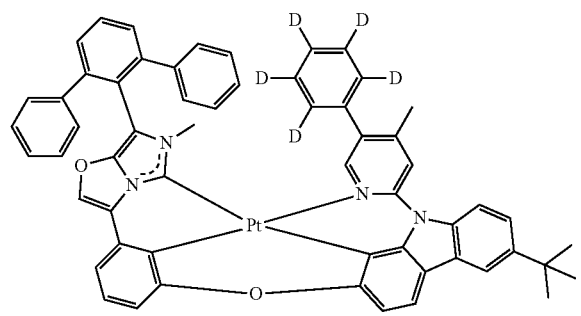
6
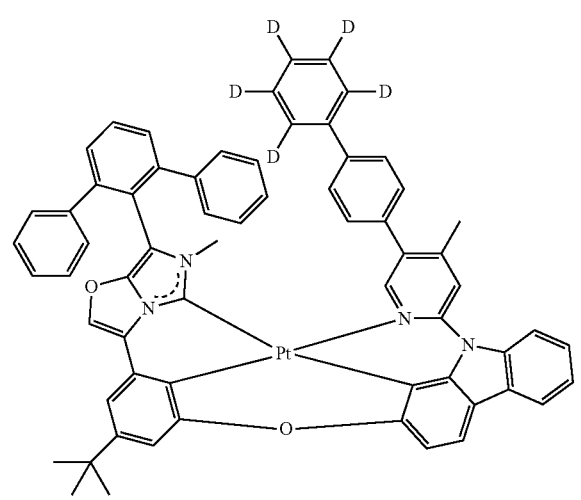
7
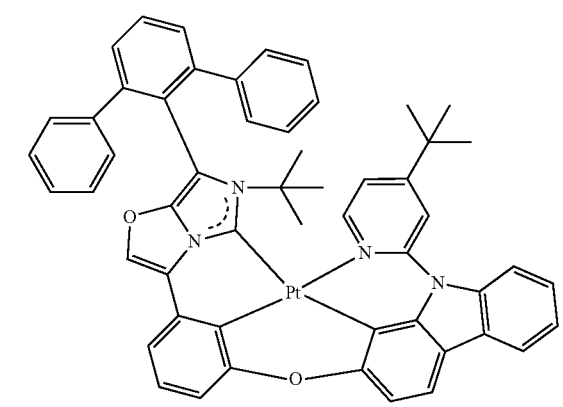
13
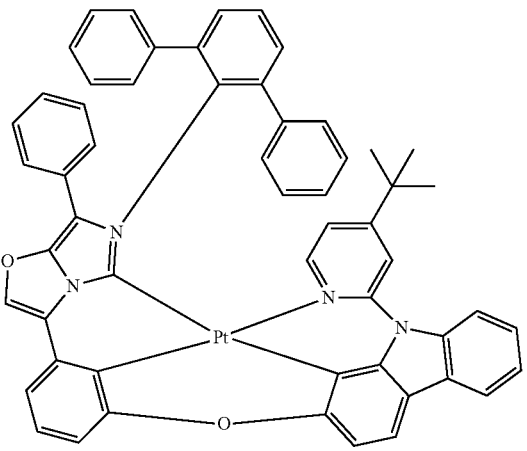
19
A
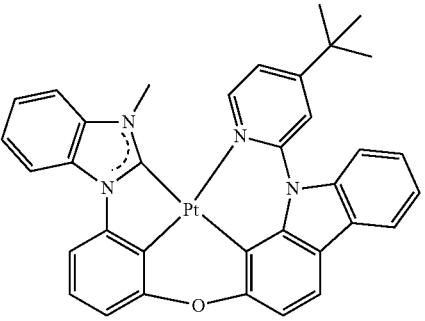

-continued

B
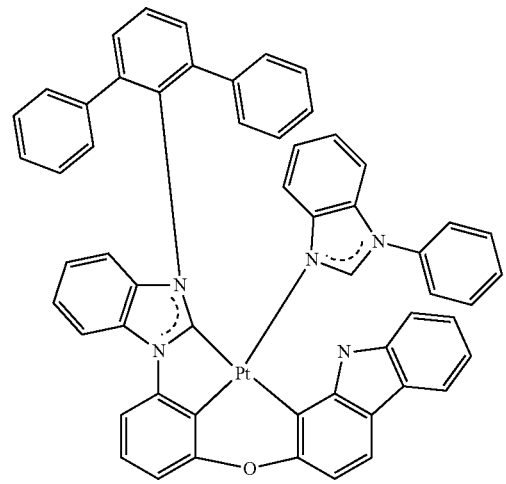

C
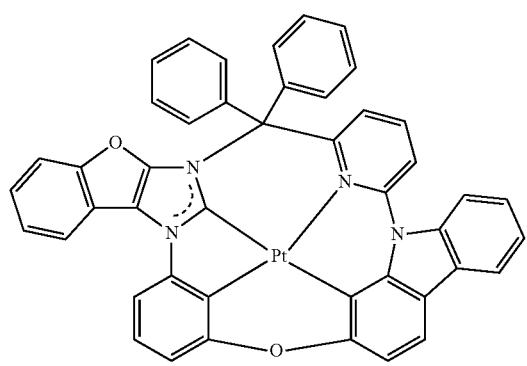

D
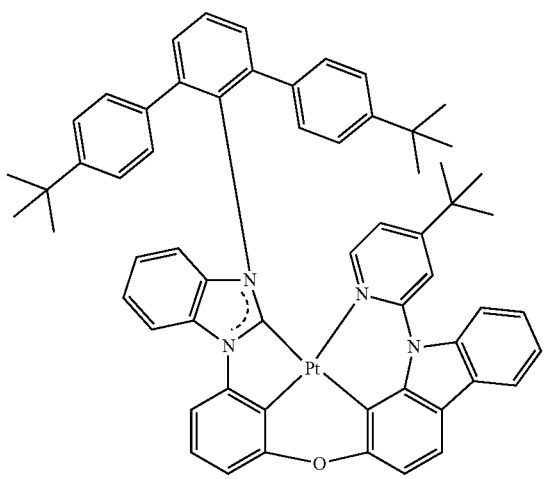

E
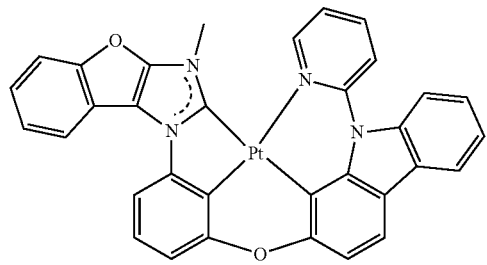

Example 1

As for a substrate and an anode, a Corning 15 Ω/cm² (1,200 Å) ITO glass substrate was cut to a size of 50 mm×50 mm×0.7 mm, sonicated by using isopropyl alcohol and deionized water for 5 minutes, respectively, and cleaned by exposure to ultraviolet rays with ozone. The glass substrate was mounted on a vacuum deposition device.

2-TNATA was vacuum-deposited on the ITO anode formed on the glass substrate to form a hole injection layer having a thickness of about 600 Å NPB was deposited on the hole injection layer to form a hole transport layer having a thickness of about 300 Å.

Co-hosts, i.e., bis(4-(9H-carbazol-9-yl)phenyl)diphenyl-silane (BCPDS) and (4-(1-(4-(diphenylamino)phenyl)cyclo-hexyl)phenyl)diphenyl-phosphine oxide (POPCPA), (at a weight ratio of 1:1) and a dopant, Compound 1, were co-deposited on the hole transport layer at a weight ratio of 90:10 to form an emission layer having a thickness of 300 Å.

Diphenyl(4-(triphenylsilyl)phenyl)-phosphine oxide (TSPO1) was deposited on the emission layer to form a hole blocking layer having a thickness of 50 Å, Alq₃ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer having a thickness of 3,000 Å, thereby completing the manufacture of an organic light-emitting device.

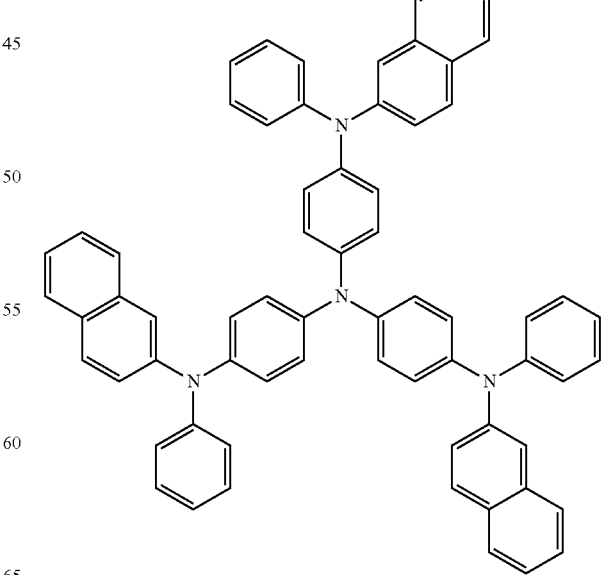

2-TNATA

-continued

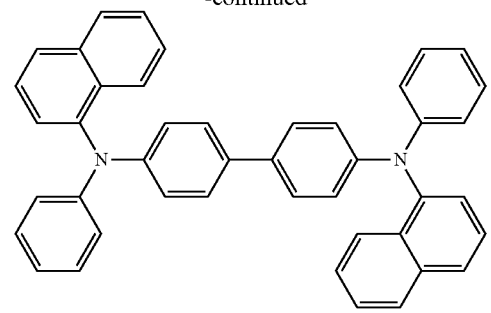

NPB

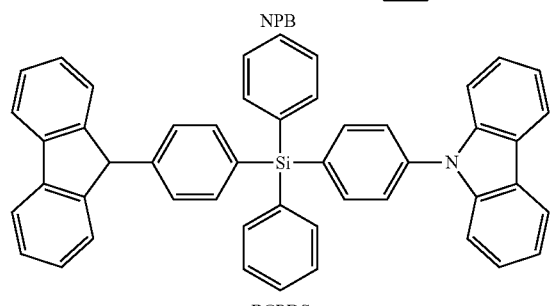

BCPDS

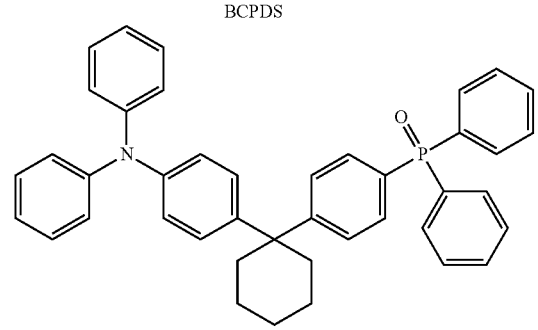

POPCPA

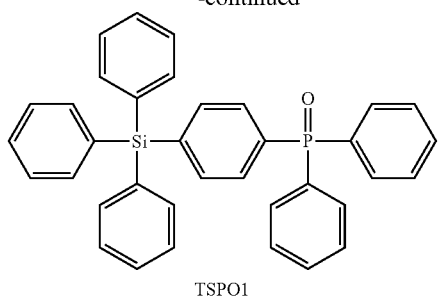

TSPO1

Examples 2 to 9 and Comparative Examples 1 to 5

Organic light-emitting devices were manufactured in substantially the same manner as in Example 1, except that the compounds shown in Table 2 were used instead of Compound 1 as a dopant in the formation of an emission layer.

Evaluation Example 2

The driving voltage, current density, luminance, luminescence efficiency, emission color, and maximum emission wavelength of the organic light-emitting devices manufactured according to Examples 1 to 9 and Comparative Examples 1 to 5 were measured by using Keithley SMU 236 and a luminance meter PR650. The results thereof are shown in Table 3. In Table 3, the lifespan ($T_{90}$) indicates a time (hour) for the luminance of each light-emitting device to decline to 90% of its initial luminance.

TABLE 3

| | Dopant in emission layer | Driving voltage (V) | Current density (mA/cm$^2$) | Luminance (cd/m$^2$) | Luminescence Efficiency (cd/A) | Emission color | Maximum emission wavelength (nm) | Device lifespan ($T_{90}$, hours) (at 1,000 cd/m$^2$) |
|---|---|---|---|---|---|---|---|---|
| Example 1 | 1 | 5.30 | 50 | 4260 | 8.40 | Blue | 458 | 57 |
| Example 2 | 2 | 5.28 | 50 | 4200 | 8.28 | Blue | 461 | 58 |
| Example 3 | 3 | 5.28 | 50 | 4400 | 8.68 | Blue | 463 | 58 |
| Example 4 | 4 | 5.30 | 50 | 4350 | 8.50 | Blue | 459 | 55 |
| Example 5 | 5 | 5.30 | 50 | 4320 | 8.52 | Blue | 458 | 49 |
| Example 6 | 6 | 5.28 | 50 | 4520 | 8.91 | Blue | 457 | 50 |
| Example 7 | 7 | 5.29 | 50 | 4110 | 8.10 | Blue | 456 | 40 |
| Example 8 | 13 | 5.28 | 49 | 3950 | 7.92 | Blue | 455 | 55 |
| Example 9 | 19 | 5.26 | 49 | 4500 | 8.87 | Blue | 456 | 50 |
| Comparative Example 1 | A | 5.60 | 50 | 3220 | 6.35 | Blue | 461 | 11 |
| Comparative Example 2 | B | 5.34 | 50 | 3300 | 6.53 | Blue | 462 | 13 |
| Comparative Example 3 | C | 5.30 | 50 | 3670 | 7.21 | Blue | 468 | 9 |
| Comparative Example 4 | D | 5.30 | 50 | 3800 | 7.49 | Blue | 459 | 45 |
| Comparative Example 5 | E | 6.00 | 50 | 2560 | 5.05 | Blue | 461 | 11 |

Referring to Table 3, it was found that the organic light-emitting devices of Examples 1 to 9 had similar or improved driving voltage, luminescence efficiency, and lifespan characteristics, as compared with the organic light-emitting devices of Comparative Examples 1 to 5.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:
a first electrode;
a second electrode facing the first electrode; and
an interlayer disposed between the first electrode and the second electrode, wherein
the interlayer comprises an emission layer and at least one organometallic compound represented by Formula 1:

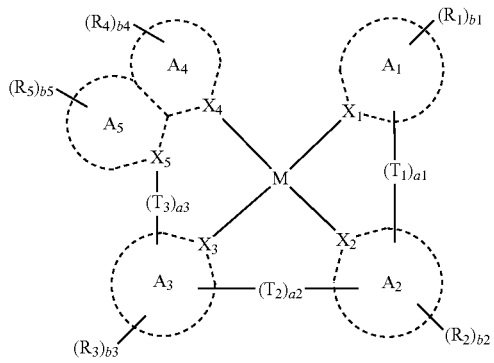

[Formula 1]

wherein in Formula 1,
M is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm),
$X_1$ to $X_3$ are each independently C or N,
$X_4$ is a carbon atom of a carbene moiety,
$X_5$ is C,
$A_1$ to $A_3$ are each independently a $C_3$-$C_{60}$ carbocyclic group or a $C_1$-$C_{60}$ heterocyclic group,
$A_4$ is an $X_4$-containing imidazole group or an $X_4$-containing imidazole group to which at least one 5-membered ring is condensed,
$A_5$ is an $X_5$-containing 5-membered heterocyclic group,
$T_1$ to $T_3$ are each independently a single bond, a double bond, *—$N(Z_{11})$—*', *—B $(Z_{11})$—*', *—P $(Z_{11})$—*', *—$C(Z_{11}) (Z_{12})$—*', *—Si $(Z_{11}) (Z_{12})$—*', *—Ge $(Z_{11}) (Z_{12})$—*', *—S—*', *—Se—*', *—O—*', *—C(=O)—*', *—S(=O)—*', *—S(=O)_2$—*', *—C $(Z_{11})$= *', *=C $(Z_{11})$—*', *—$C(Z_{11})$=$C(Z_{12})$—*',

*—$C(=S)$—*', or *—C=C—*', and * and *' each indicate a binding site to an adjacent atom,
a1 to a3 are each independently an integer from 1 to 3,
$R_1$ to $R_5$, $Z_{11}$, and $Z_{12}$ are each independently hydrogen, deuterium, —F, —Cl, —Br, —I, a hydroxyl group, a cyano group, a nitro group, a $C_1$—$C_{60}$ alkyl group unsubstituted or substituted with at least one $R_{10a}$, a $C_2$—$C_{60}$ alkenyl group unsubstituted or substituted with at least one $R_{10a}$, a $C_2$—$C_{60}$ alkynyl group unsubstituted or substituted with at least one $R_{10a}$, a $C_1$—$C_{60}$ alkoxy group unsubstituted or substituted with at least one $R_{10a}$, a $C_3$—$C_{60}$ carbocyclic group unsubstituted or substituted with at least one $R_{10a}$, a $C_1$—$C_{60}$ heterocyclic group unsubstituted or substituted with at least one $R_{10a}$, a $C_6$—$C_{60}$ aryloxy group unsubstituted or substituted with at least one $R_{10a}$, a $C_6$—$C_{60}$ arylthio group unsubstituted or substituted with at least one $R_{10a}$, —Si $(Q_1) (Q_2) (Q_3)$, —N($Q_1$) $(Q_2)$, —B $(Q_1) (Q_2)$, —C(=O) $(Q_1)$, —S(=O)$_2$ $(Q_1)$, or —P (=O) $(Q_1) (Q_2)$,
b1 to b5 are each independently an integer from 0 to 10,
when b4 is 2 or greater, at least two $R_4$ (s) of $R_4$ (s) in the number of b4 are optionally combined to form a $C_3$—$C_{60}$ carbocyclic group unsubstituted or substituted with at least one $R_{10a}$ or a $C_1$—$C_{60}$ heterocyclic group unsubstituted or substituted with at least one $R_{10a}$,
when b5 is 2 or greater, at least two $R_5$ (s) of Rs(s) in the number of b5 are optionally combined to form a $C_3$—$C_{60}$ carbocyclic group unsubstituted or substituted with at least one $R_{10a}$ or a $C_1$—$C_{60}$ heterocyclic group unsubstituted or substituted with at least one $R_{10a}$, and
$R_{10a}$ is:
deuterium, —F, —$C_1$, —Br, —I, a hydroxyl group, a cyano group, or a nitro group;
a $C_1$—$C_{60}$ alkyl group, a $C_2$—$C_{60}$ alkenyl group, a $C_2$—$C_{60}$ alkynyl group, or a $C_1$—$C_{60}$ alkoxy group, each unsubstituted or substituted with deuterium, —F, —$C_1$, —Br, —I, a hydroxyl group, a cyano group, a nitro group, a $C_3$—$C_{60}$ carbocyclic group, a $C_1$—$C_{60}$ heterocyclic group, a $C_6$—$C_{60}$ aryloxy group, a $C_6$—$C_{60}$ arylthio group, —Si $(Q_{11}) (Q_{12}) (Q_{13})$, —N($Q_{11}$) $(Q_{12})$, —B $(Q_{11}) (Q_{12})$, —C(=O) $(Q_{11})$, —S(=O)$_2$ $(Q_{11})$, —P (=O) $(Q_{11}) (Q_{12})$, or a combination thereof;
a $C_3$—$C_{60}$ carbocyclic group, a $C_1$—$C_{60}$ heterocyclic group, a Co—$C_{60}$ aryloxy group, or a $C_6$—$C_{60}$ arylthio group, each unsubstituted or substituted with deuterium, —F, —$C_1$, —Br, —I, a hydroxyl group, a cyano group, a nitro group, a $C_1$—$C_{60}$ alkyl group, a $C_2$—$C_{60}$ alkenyl group, a $C_2$—$C_{60}$ alkynyl group, a $C_1$—$C_{60}$ alkoxy group, a $C_3$—$C_{60}$ carbocyclic group, a $C_1$—$C_{60}$ heterocyclic group, a $C_6$—$C_{60}$ aryloxy group, a $C_6$—$C_{60}$ arylthio group, —Si $(Q_{21}) (Q_{22}) (Q_{23})$, —N($Q_{21}$) $(Q_{22})$, —B $(Q_{21}) (Q_{22})$, —C(=O) $(Q_{21})$, —S(=O)$_2$ $(Q_{21})$, —P (=O) $(Q_{21}) (Q_{22})$, or a combination thereof; or
—Si $(Q_{31}) (Q_{32}) (Q_{33})$, —N($Q_{31}$) $(Q_{32})$, —B $(Q_{31}) (Q_{32})$, —C(=O) $(Q_{31})$, —S(=O)$_2$ $(Q_{31})$, or-P (=O) $(Q_{31}) (Q_{32})$,
wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium;—F;— $C_1$;—Br;—I; a hydroxyl group; a cyano group; a nitro group; a $C_1$—$C_{60}$ alkyl group; a $C_2$—$C_{60}$ alkenyl group; a $C_2$—$C_{60}$ alkynyl group; a $C_1$—$C_{60}$ alkoxy group; or a $C_3$—$C_{60}$ carbocyclic group or a $C_1$—$C_{60}$ heterocyclic group, each unsubstituted or substituted with deuterium, —F, a cyano group, a $C_1$—$C_{60}$ alkyl group, a $C_1$—$C_{60}$ alkoxy group, a phenyl group, a biphenyl group, or a combination thereof.

2. The light-emitting device of claim 1, wherein
the first electrode is an anode,
the second electrode is a cathode,
the interlayer further comprises a hole transport region between the first electrode and the emission layer and an electron transport region between the emission layer and the second electrode,
the hole transport region comprises a hole injection layer, a hole transport layer, an emission auxiliary layer, an electron blocking layer, or a combination thereof, and
the electron transport region comprises a buffer layer, a hole blocking layer, an electron control layer, an electron transport layer, an electron injection layer, or a combination thereof.

3. The light-emitting device of claim 1, wherein the emission layer comprises the at least one organometallic compound represented by Formula 1.

4. The light-emitting device of claim 3, wherein
the at least one organometallic compound represented by Formula 1 comprised in the emission layer serves as a phosphorescent dopant that emits phosphorescence from the emission layer, or
the at least one organometallic compound represented by Formula 1 comprised in the emission layer serves as a delayed fluorescence dopant that emits delayed fluorescence from the emission layer.

5. The light-emitting device of claim 1, wherein
the emission layer comprises a host and a dopant, and
the dopant comprises the at least one organometallic compound represented by Formula 1.

6. An electronic apparatus comprising the light-emitting device of claim 1.

7. The electronic apparatus of claim 6, further comprising a thin-film transistor, wherein
the thin-film transistor comprises a source electrode and a drain electrode, and
the first electrode of the light-emitting device is electrically connected to at least one of the source electrode and the drain electrode of the thin-film transistor.

8. The electronic apparatus of claim 6, further comprising a color filter, a color-conversion layer, a touchscreen layer, a polarization layer, or a combination thereof.

9. An organometallic compound represented by Formula 1:

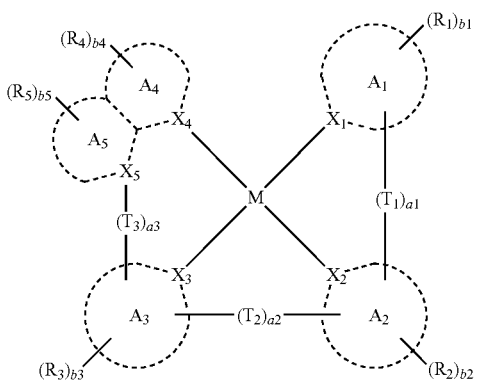

[Formula 1]

wherein in Formula 1,

M is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm),
$X_1$ to $X_3$ are each independently C or N,
$X_4$ is a carbon atom of a carbene moiety,
$X_5$ is C,
$A_1$ to $A_3$ are each independently a $C_3$—$C_{60}$ carbocyclic group or a $C_1$—$C_{60}$ heterocyclic group,
$A_4$ is an $X_4$-containing imidazole group or an $X_4$-containing imidazole group to which at least one 5-membered ring is condensed,
$A_5$ is an $X_5$-containing 5-membered heterocyclic group,
$T_1$ to $T_3$ are each independently a single bond, a double bond, *—$N(Z_{11})$—*', *—B $(Z_{11})$—*', *—P $(Z_{11})$—*', *—C$(Z_{11})$ $(Z_{12})$—*', *—Si $(Z_{11})$ $(Z_{12})$—*', *—Ge $(Z_{11})$ $(Z_{12})$—*', *—S—*', *—Se—*', *—O—*', *—C(=O)—*', *—S(=O)—*', *—S(=O)$_2$—*', *—C$(Z_{11})$=*', *=C $(Z_{11})$—*', *—C$(Z_{11})$=C $(Z_{12})$—*', *—C(=S)—*', or *—C≡C—*', and * and *' each indicate a binding site to an adjacent atom,
a1 to a3 are each independently an integer from 1 to 3,
$R_1$ to $R_5$, $Z_{11}$, and $Z_{12}$ are each independently hydrogen, deuterium, —F, —$C_1$, —Br, —I, a hydroxyl group, a cyano group, a nitro group, a $C_1$—$C_{60}$ alkyl group unsubstituted or substituted with at least one $R_{10a}$, a $C_2$—$C_{60}$ alkenyl group unsubstituted or substituted with at least one $R_{10a}$, a $C_2$—$C_{60}$ alkynyl group unsubstituted or substituted with at least one $R_{10a}$, a $C_1$—$C_{60}$ alkoxy group unsubstituted or substituted with at least one $R_{10a}$, a $C_3$—$C_{60}$ carbocyclic group unsubstituted or substituted with at least one $R_{10a}$, a $C_1$—$C_{60}$ heterocyclic group unsubstituted or substituted with at least one $R_{10a}$, a $C_6$—$C_{60}$ aryloxy group unsubstituted or substituted with at least one $R_{10a}$, a $C_6$—$C_{60}$ arylthio group unsubstituted or substituted with at least one $R_{10a}$, —Si $(Q_1)$ $(Q_2)$ $(Q_3)$, —N$(Q_1)$ $(Q_2)$, —B $(Q_1)$ $(Q_2)$, —C(=O) $(Q_1)$, —S(=O)$_2$ $(Q_1)$, or —P (=O) $(Q_1)$ $(Q_2)$,
b1 to b5 are each independently an integer from 0 to 10,
when b4 is 2 or greater, at least two $R_4$ (s) of $R_4$ (s) in the number of b4 are optionally combined to form a $C_3$—$C_{60}$ carbocyclic group unsubstituted or substituted with at least one $R_{10a}$ or a $C_1$—$C_{60}$ heterocyclic group unsubstituted or substituted with at least one $R_{10a}$,
when b5 is 2 or greater, at least two Rs(s) of $R_5$ (s) in the number of b5 are optionally combined to form a $C_3$—$C_{60}$ carbocyclic group unsubstituted or substituted with at least one $R_{10a}$ or a $C_1$—$C_{60}$ heterocyclic group unsubstituted or substituted with at least one $R_{10a}$, and
$R_{10a}$ is:
deuterium, —F, —$C_1$, —Br, —I, a hydroxyl group, a cyano group, or a nitro group;
a $C_1$—$C_{60}$ alkyl group, a $C_2$—$C_{60}$ alkenyl group, a $C_2$—$C_{60}$ alkynyl group, or a $C_1$—$C_{60}$ alkoxy group, each unsubstituted or substituted with deuterium, —F, —$C_1$, —Br, —I, a hydroxyl group, a cyano group, a nitro group, a $C_3$—$C_{60}$ carbocyclic group, a $C_1$—$C_{60}$ heterocyclic group, a $C_6$—$C_{60}$ aryloxy group, a $C_6$—$C_{60}$ arylthio group, —Si $(Q_{11})$ $(Q_{12})$ $(Q_{13})$, —N$(Q_{11})$ $(Q_{12})$, —B $(Q_{11})$ $(Q_{12})$, —C(=O) $(Q_{11})$, —S(=O)$_2$ $(Q_{11})$, —P (=O) $(Q_{11})$ $(Q_{12})$, or a combination thereof;
a $C_3$—$C_{60}$ carbocyclic group, a $C_1$—$C_{60}$ heterocyclic group, a $C_6$—$C_{60}$ aryloxy group, or a $C_6$—$C_{60}$ arylthio group, each unsubstituted or substituted with deuterium, —F, —C₁, —Br, —I, a hydroxyl group, a cyano group, a nitro group, a C₁—C₆₀ alkyl group, a C₂—C₆₀ alkenyl group, a C₂—C₆₀ alkynyl group, a C₁—C₆₀ alkoxy group, a C₃—C₆₀ carbocyclic group, a C₁—C₆₀ heterocyclic group, a C₆—C₆₀ aryloxy group, a C₆—C₆₀ arylthio group, —Si (Q₂₁) (Q₂₂) (Q₂₃), —N(Q₂₁) (Q₂₂), —B (Q₂₁) (Q₂₂), —C(=O) (Q₂₁), —S(=O)₂ (Q₂₁), —P (=O) (Q₂₁) (Q₂₂), or a combination thereof; or —Si (Q₃₁) (Q₃₂) (Q₃₃), —N(Q₃₁) (Q₃₂), —B (Q₃₁) (Q₃₂), —C(=O) (Q₃₁), —S(=O)₂ (Q₃₁), or—P (=O) (Q₃₁) (Q₃₂), wherein Q₁ to Q₃, Q₁₁ to Q₁₃, Q₂₁ to Q₂₃, and Q₃₁ to Q₃₃ are each independently hydrogen;

deuterium;—F;—C₁;—Br;—I; a hydroxyl group; a cyano group; a nitro group; a C₁—C₆₀ alkyl group; a C₂—C₆₀ alkenyl group; a C₂—C₆₀ alkynyl group; a C₁—C₆₀ alkoxy group; or a C₃—C₆₀ carbocyclic group or a C₁—C₆₀ heterocyclic group, each unsubstituted or substituted with deuterium, —F, a cyano group, a C₁—C₆₀ alkyl group, a C₁—C₆₀ alkoxy group, a phenyl group, a biphenyl group, or a combination thereof.

10. The organometallic compound of claim 9, wherein a bond between X₁ and M and a bond between X₄ and M are each a coordinate bond, and a bond between X₂ and M and a bond between X₃ and M are each a covalent bond.

11. The organometallic compound of claim 9, wherein X₁ is N, and

X₂ and X₃ are each C.

12. The organometallic compound of claim 9, wherein A₁ is a X₁-containing 6-membered ring.

13. The organometallic compound of claim 12, wherein the X₁-containing 6-membered ring of A₁ is a benzene group, a pyridine group, or a pyrimidine group, and the 5-membered ring which is condensed to the X₄-containing imidazole group of A₄, and the X₅-containing 5-membered heterocyclic group of A₅ are each independently a pyrrole group, a pyrazole group, an imidazole group, a triazole group, a furan group, an oxazole group, a thiazole group, an isothiazole group, an oxadiazole group, or a thiadiazole group.

14. The organometallic compound of claim 9, wherein a group represented by

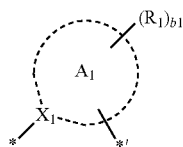

in Formula 1 is a group represented by one of Formulae A1-1 to A1-3:

A1-1
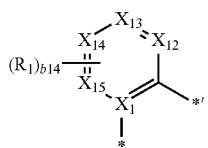

A1-2
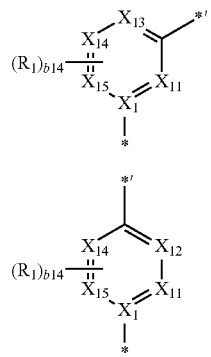

A1-3 wherein in Formulae A1-1 to A1-3,

X₁ and R₁ are respectively the same as described in connection with X₁ and R₁ in Formula 1, X₁₁ to X₁₅ are each independently the same as described in connection with X₁ in Formula 1, b14 is an integer from 0 to 4,

* indicates a binding site to M in Formula 1, and

*' indicates a binding site to T₁ in Formula 1.

15. The organometallic compound of claim 9, wherein a group represented by

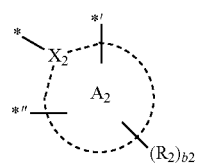

in Formula 1 is represented by one of Formulae A2-1 to A2-7:

A2-1
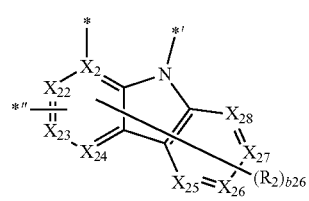

A2-2
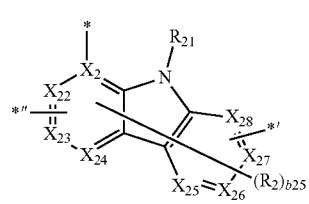

A2-3
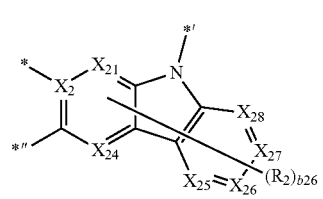

-continued

A2-4
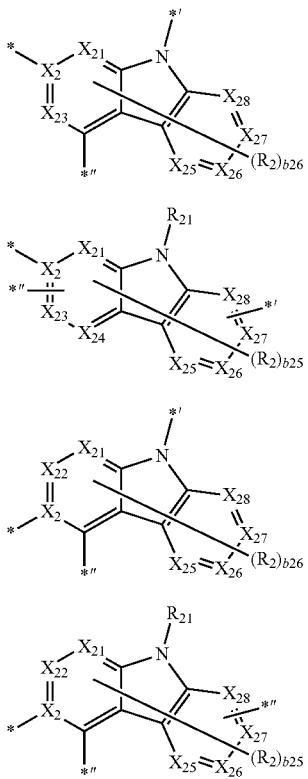

A2-5

A2-6

A2-7 wherein in Formulae A2-1 to A2-7, $X_2$ and $R_2$ are respectively the same as described in connection with $X_2$ and $R_2$ in Formula 1, $R_{21}$ is the same as described in connection with $R_2$ in Formula 1, $X_{21}$ to $X_{28}$ are each independently the same as described in connection with $X_2$ in Formula 1, b25 is an integer from 0 to 5, b26 is an integer from 0 to 6,

* indicates a binding site to M in Formula 1,

*' indicates a binding site to $T_1$ in Formula 1, and

*" indicates a binding site to $T_2$ in Formula 1.

16. The organometallic compound of claim 9, wherein a group represented by

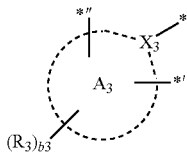

in Formula 1 is a group represented by one of Formulae A3-1 to A3-8:

A3-1
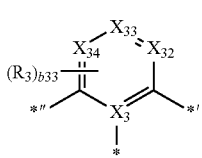

A3-2
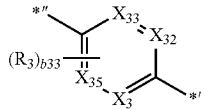

A3-3
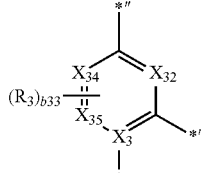

A3-4
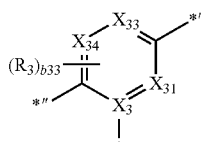

A3-5
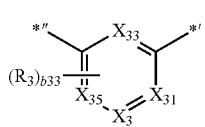

A3-6
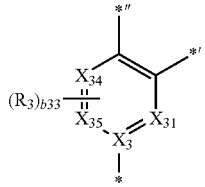

A3-7
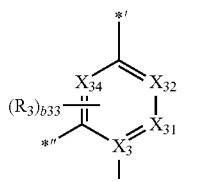

A3-8
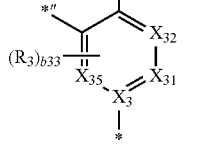

wherein in Formulae A3-1 to A3-8, $R_3$ is the same as described in connection with $R_3$ in Formula 1, $X_{31}$ to $X_{35}$ are each independently the same as described in connection with $X_3$ in Formula 1, b33 is an integer from 0 to 3,

* indicates a binding site to M in Formula 1,

*' indicates a binding site to $T_2$ in Formula 1, and

*" indicates a binding site to $T_3$ in Formula 1.

17. The organometallic compound of claim 9, wherein a group represented by
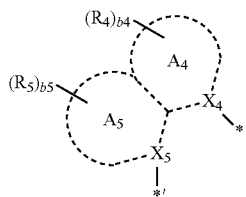
in Formula 1 is represented by one of Formulae A45-1 to A45-16:
A45-1
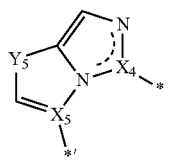
A45-2
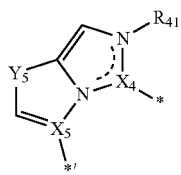
A45-3
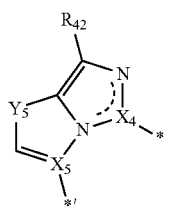
A45-4
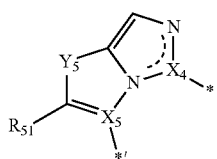
A45-5
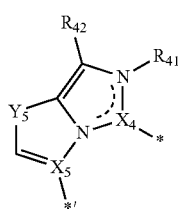
A45-6
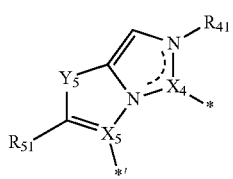
-continued
A45-7
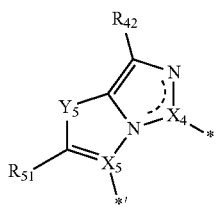
A45-8
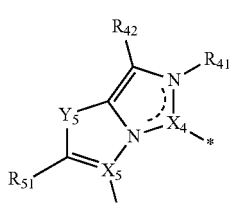
A45-9
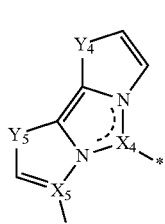
A45-10
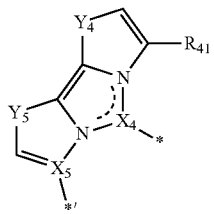
A45-11
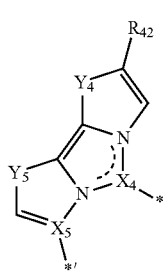
A45-12
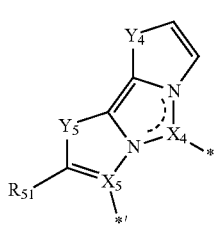
A45-13
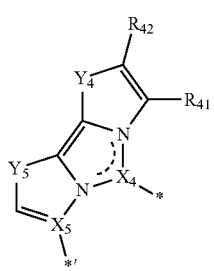

A45-14

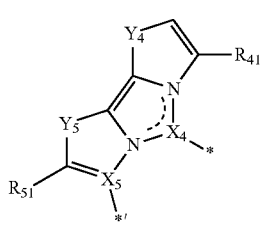

A45-15

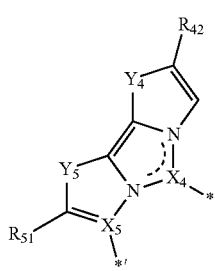

A45-16

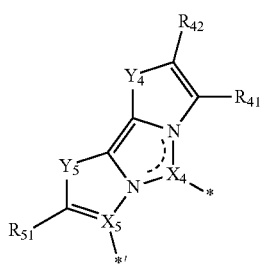

wherein in Formulae A45-1 to A45-16, $Y_4$ is O, S, N ($R_{4a}$), C ($R_{4a}$) ($R_{4b}$), or Si ($R_{4a}$) ($R_{4b}$), $Y_5$ is O, S, N ($R_{5a}$), C ($R_{5a}$) ($R_{5b}$), or Si ($R_{5a}$) ($R_{5b}$), $R_{41}$ and $R_{42}$ are each independently the same as described in connection with $R_4$ in Formula 1, except that $R_{41}$ and $R_{42}$ are not each hydrogen, $R_{51}$ is the same as described in connection with $R_5$ in Formula 1, except that $R_{51}$ is not hydrogen, $X_4$ and $X_5$ are each independently the same as described in connection with $X_4$ and $X_5$ in Formula 1, $R_{4a}$ and $R_{4b}$ are each independently the same as described in connection with $R_4$ in Formula 1, $R_{5a}$ and $R_{5b}$ are each independently the same as described in connection with $R_5$ in Formula 1,

* indicates a binding site to M in Formula 1, and

*' indicates a binding site to $T_3$ in Formula 1.

18. The organometallic compound of claim 17, wherein at least one of $R_{41}$ and $R_{42}$ comprises a group represented by Formula 2:

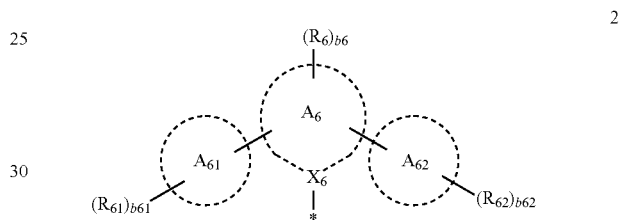

2 wherein in Formula 2, $X_6$ is C or N, $A_6$, $A_{61}$, and $A_{62}$ are each independently a $C_3$—$C_{60}$ carbocyclic group or a $C_1$—$C_{60}$ heterocyclic group, $R_6$, $R_{61}$, and $R_{62}$ are each independently the same as described in connection with $R_4$ in Formula 1, b6, b61, and b62 are each independently the same as described in connection with b4 in Formula 1, and

* indicates a binding site to an adjacent atom.

19. The organometallic compound of claim 9, wherein the organometallic compound is selected from Compounds 1 to 30:

1

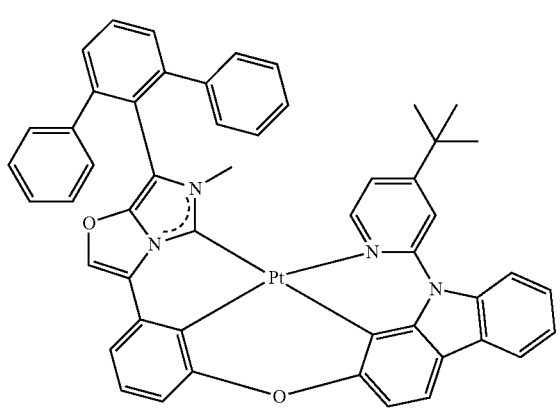

2

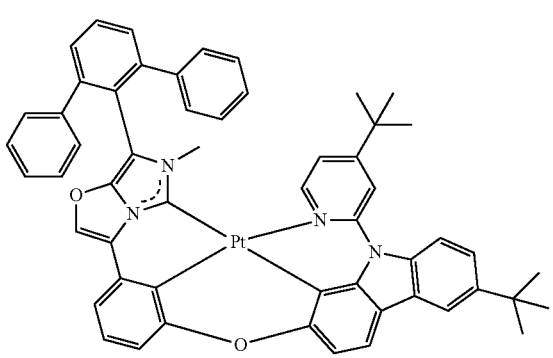

-continued
3
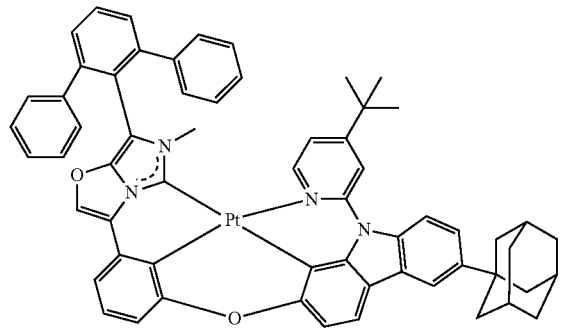
4
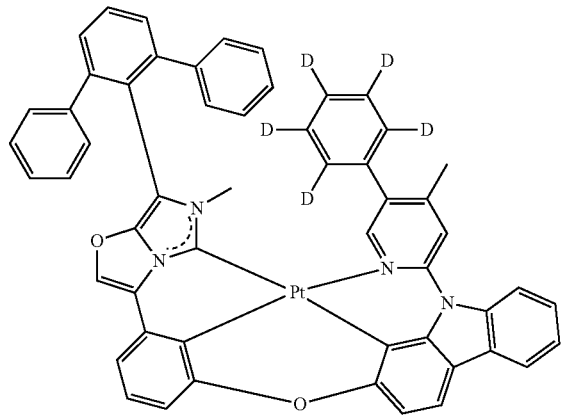
5
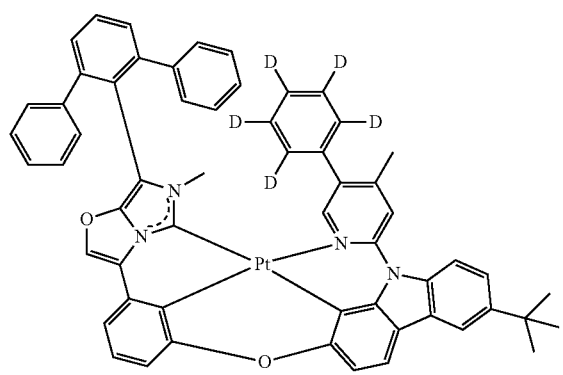
6
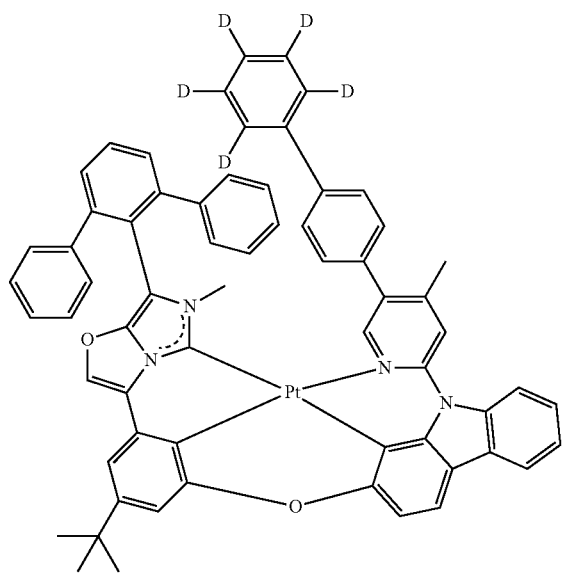
7
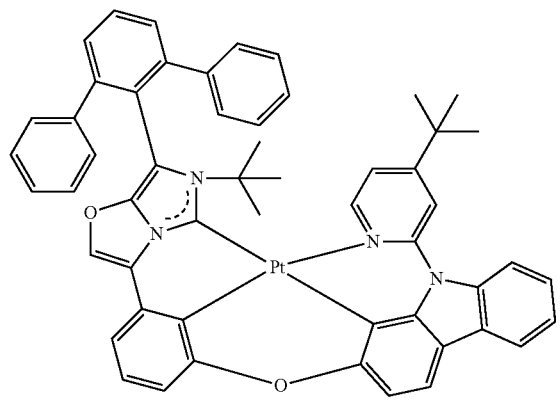
8
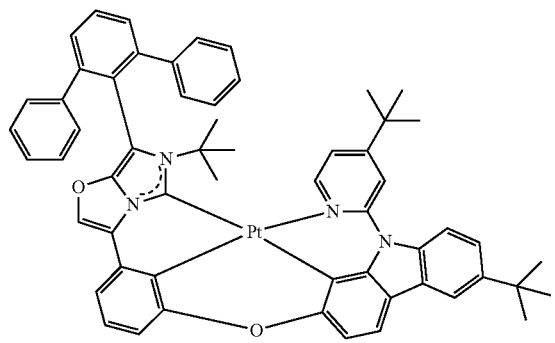

-continued
9
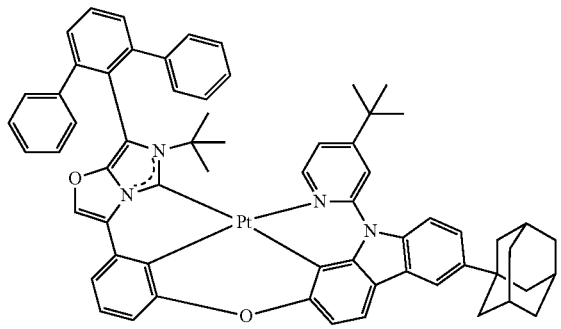
10
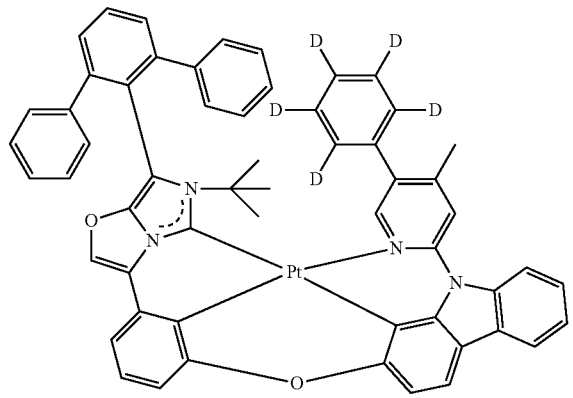
11
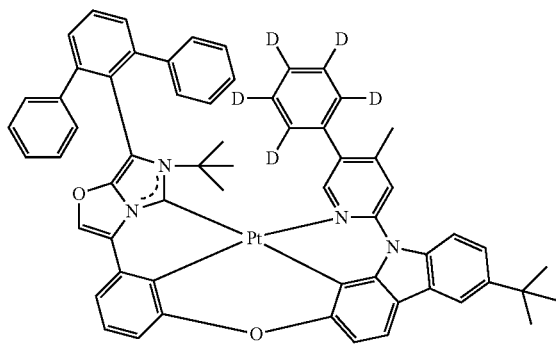
12
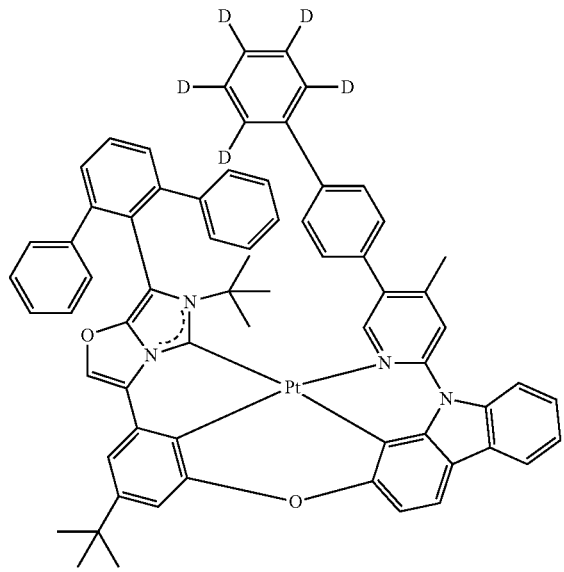
13
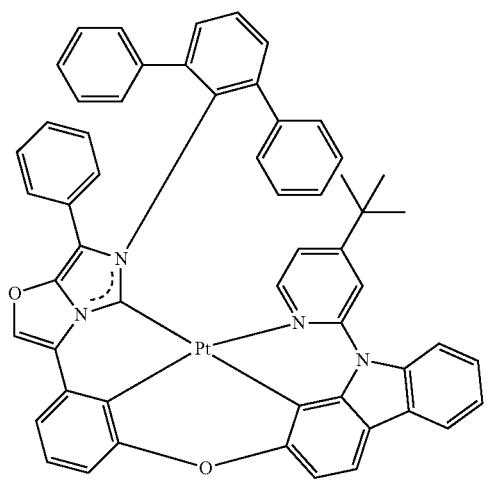
14
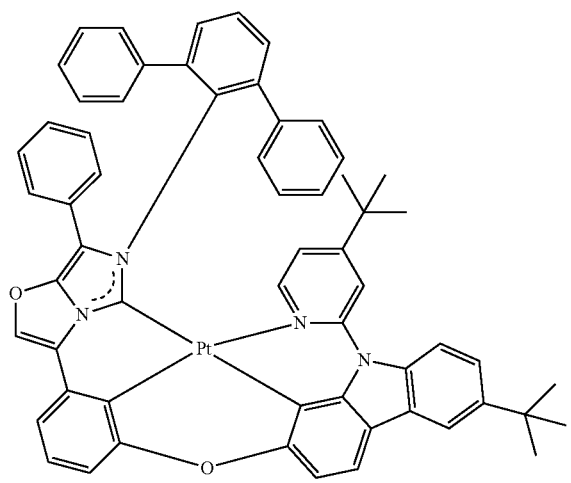

-continued
15
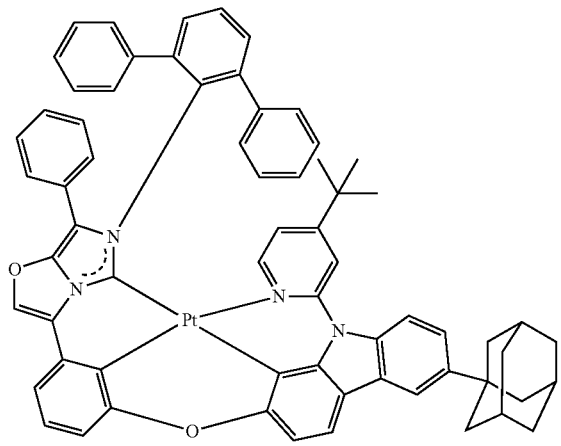
16
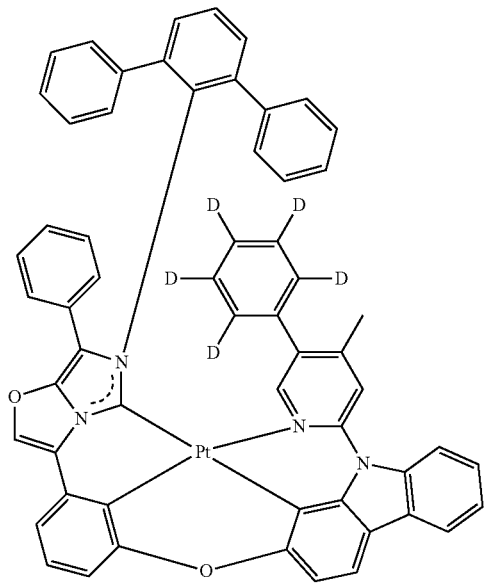
17
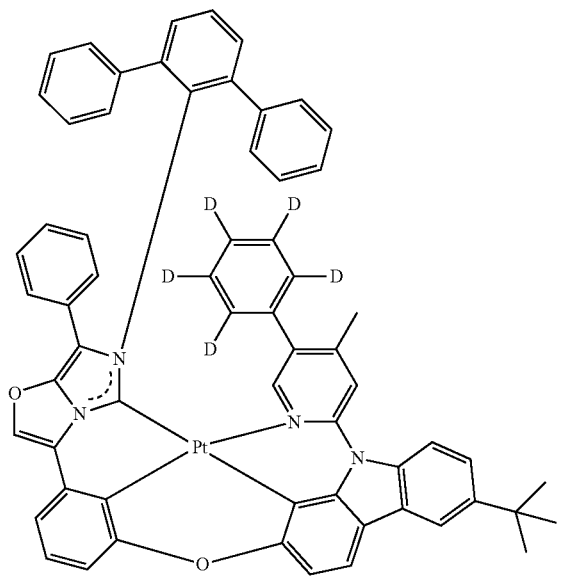
18
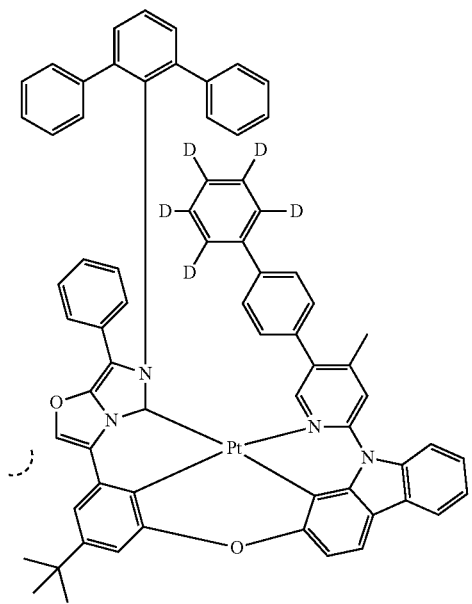
19
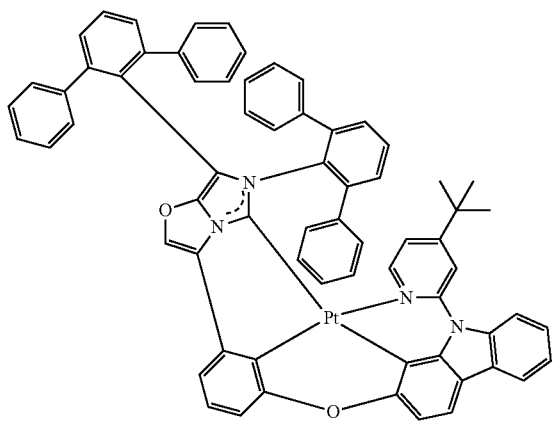
20
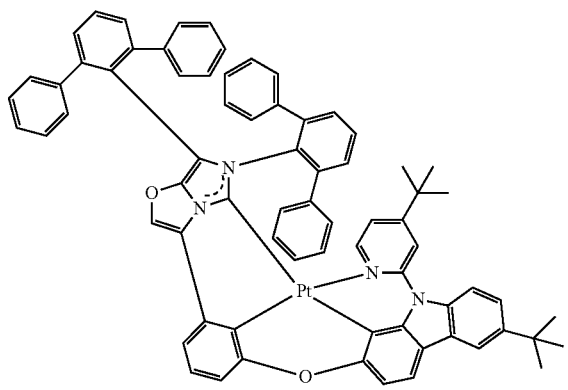

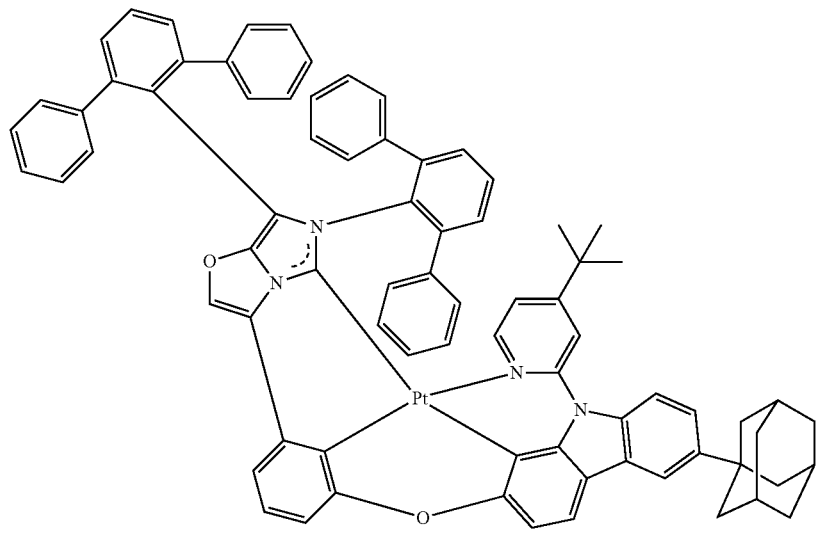
21
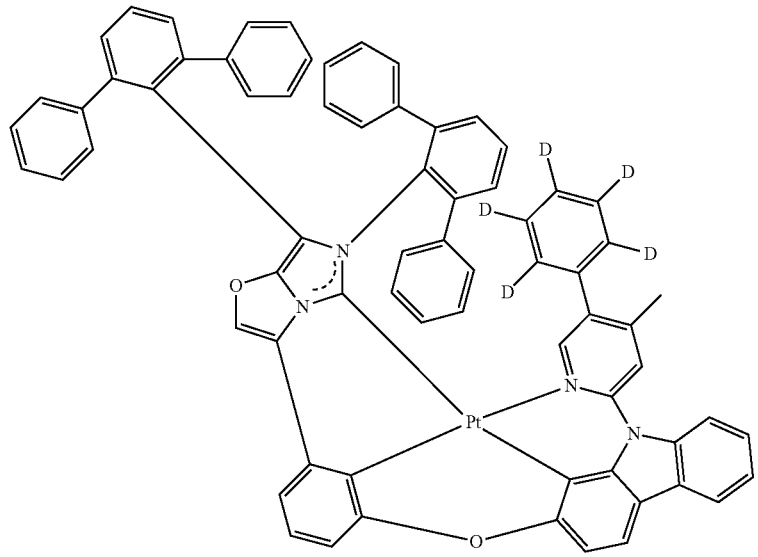
22
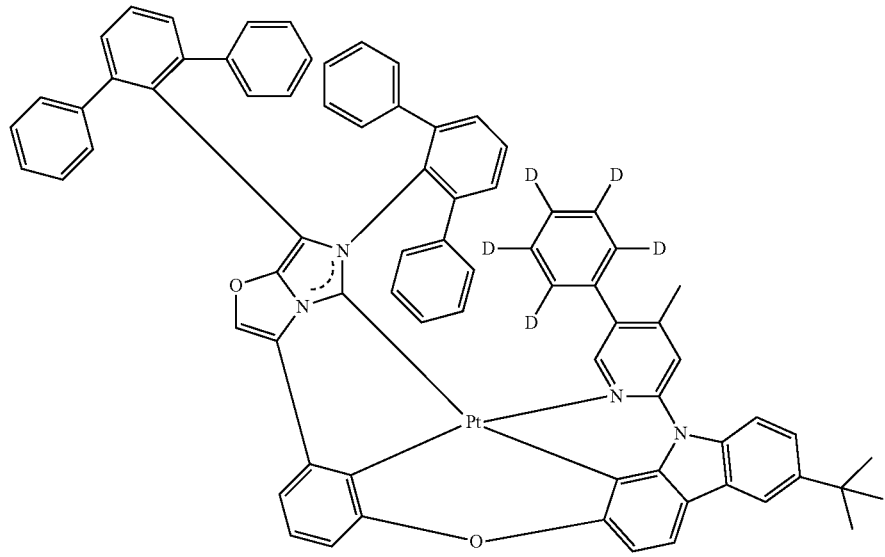
23

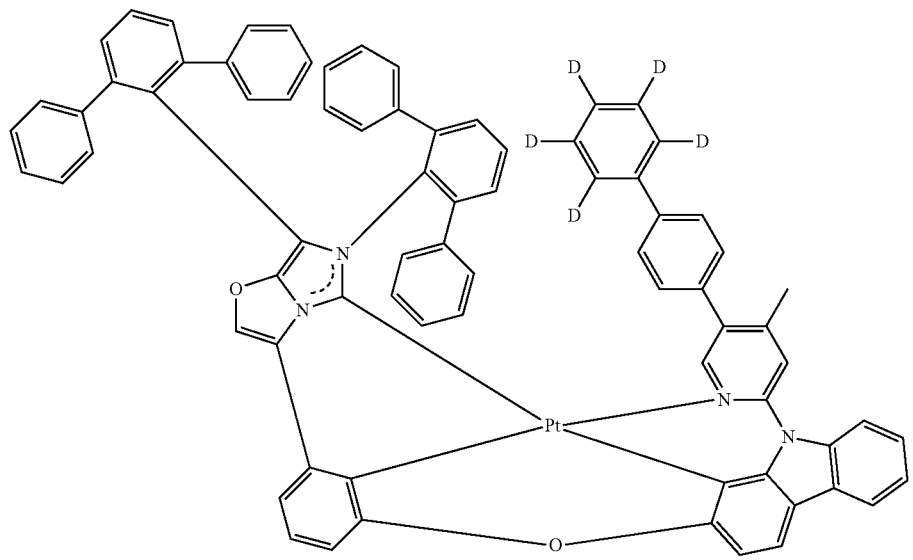
24
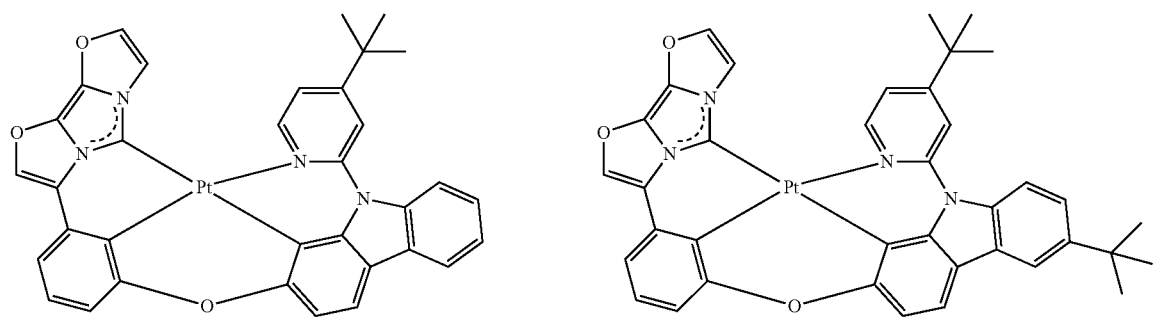
25
26
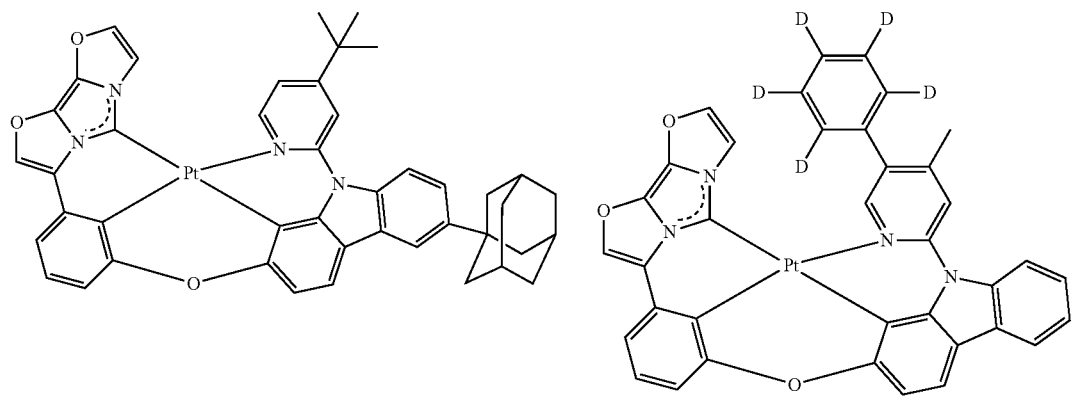
27
28

| 29 | 30 |
|---|---|
| 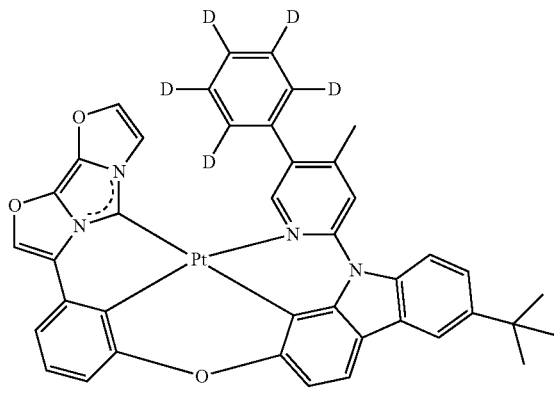 | 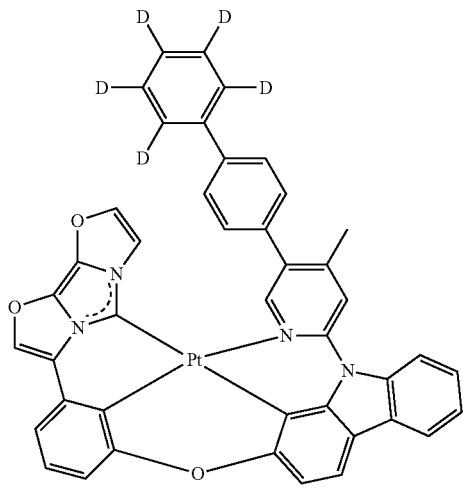 |
20. The organometallic compound of claim 9, wherein the organometallic compound emits blue light having a maximum emission wavelength in a range of about 400 nanometers (nm) to about 490 nm.
* * * * *